US012787662B2

(12) United States Patent
Xiao et al.

(10) Patent No.: US 12,787,662 B2
(45) Date of Patent: Nov. 3, 2026

(54) RESISTIVE SWITCHING DEVICES AND METHODS FOR THEIR MANUFACTURE AND OPERATION

(71) Applicant: Cambridge Enterprise Limited, Cambridge (GB)

(72) Inventors: Ming Xiao, Cambridge (GB); Judith Driscoll, Cambridge (GB); Markus Hellenbrand, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 121 days.

(21) Appl. No.: 18/842,751

(22) PCT Filed: Mar. 8, 2023

(86) PCT No.: PCT/EP2023/055928
§ 371 (c)(1),
(2) Date: Aug. 29, 2024

(87) PCT Pub. No.: WO2023/170172
PCT Pub. Date: Sep. 14, 2023

(65) Prior Publication Data

US 2025/0176446 A1 May 29, 2025

(30) Foreign Application Priority Data

Mar. 8, 2022 (GB) ..................................... 2203210
Nov. 18, 2022 (GB) ..................................... 2217303

(51) Int. Cl.
*H10N 70/20* (2023.01)
*G11C 13/00* (2006.01)
(Continued)

(52) U.S. Cl.
CPC ......... *H10N 70/24* (2023.02); *G11C 13/0007* (2013.01); *G11C 13/004* (2013.01);
(Continued)

(58) Field of Classification Search
CPC .. H10N 70/24; H10N 70/026; H10N 70/8833; H10N 70/8836; H10N 70/826;
(Continued)

(56) References Cited

U.S. PATENT DOCUMENTS

2015/0102281 A1 4/2015 Lu et al.
2016/0225442 A1* 8/2016 Asnaashari ........ G11C 13/0069
2018/0351093 A1 12/2018 Wu et al.

FOREIGN PATENT DOCUMENTS

WO WO2022086597 4/2022

OTHER PUBLICATIONS

Basnet et al., (2019) "Substrate Dependent Resistive Switching in Amorphous-HfOx Memristors: An Experimental and Computational Investigation," arxiv.org 1-8.
(Continued)

*Primary Examiner* — Fernando Hidalgo
(74) *Attorney, Agent, or Firm* — Rudy J. Ng; Bozicevic, Field & Francis LLP

(57) ABSTRACT

A resistive switching memory device comprises an active layer comprising an ionic conducting material. The active layer is disposed on a substrate. The device further comprises: a first electrode, a second electrode and optionally a first semiconductor layer. One of the first electrode, second electrode and first semiconductor layer, when present, is the substrate for the active layer and wherein the active layer and the first semiconductor layer, when present, contact each other at an interface. The device exhibits hysteretic I-V behaviour to permit switching of the electrical resistance of the device between different resistance states. The active layer is non-epitaxial with respect to the substrate.

22 Claims, 63 Drawing Sheets

(51) Int. Cl.
*H10B 63/00* (2023.01)
*H10N 70/00* (2023.01)

(52) U.S. Cl.
CPC ......... *G11C 13/0069* (2013.01); *H10B 63/00* (2023.02); *H10N 70/026* (2023.02); *H10N 70/8833* (2023.02); *H10N 70/8836* (2023.02); *G11C 2213/15* (2013.01); *G11C 2213/31* (2013.01); *G11C 2213/32* (2013.01); *G11C 2213/33* (2013.01)

(58) Field of Classification Search
CPC .............. H10N 70/883; G11C 13/0007; G11C 13/004; G11C 13/0069; G11C 2213/15; G11C 2213/31; G11C 2213/32; G11C 2213/33; G11C 2013/0073; G11C 13/0097; G11C 2213/10; H10B 63/00
USPC .......................................................... 365/148
See application file for complete search history.

(56) References Cited

OTHER PUBLICATIONS

Lee et al., (2012) "Unipolar Resistive Switching Characteristics of a ZrO2 Memory Device With Oxygen Ion Conductor Buffer Layer," IEEE Electron Device Letters, 33(6): 803-805.

Panda and Yuen-Tseng (2013) "Growth, dielectric properties, and memory device applications of ZrO2 thin films," Thin Solid Films, 531: 1-20.

Tyagi et al., (2006) "Synthesis of Nanocrystalline Zirconia Using Sol—Gel and Precipitation Techniques," Ind. Eng. Chem. Res., 45: 8643-8650.

Wang et al., (2010) "Improved resistive switching properties of Ti/ZrO2/Pt memory devices for RRAM application," Microelectronic Engineering, 88: 1628-1632.

Karkkanen Irina et al: "Study of atomic layer deposited ZrO2 and ZrO2/TiO2 films for resistive switching application", Physica Status Solidi. A: Applications and Materials Science, vol. 211, No. 2, Sep. 16, 2013 (Sep. 16, 2013), DE, pp. 301-309.

Muhammad Ismail et al: "Eradicating negative-Set behavior of TiO-based devices by inserting an oxygen vacancy rich zirconium oxide layer for data storage applications", Nanotechnology IOP Publishing, England, vol. 31, No. 32, May 25, 2020 (May 25, 2020), pp. 325201.

Rahaman SK. Ziaur et al: "The Role of Ti Buffer Layer Thickness on the Resistive Switching Properties of Hafnium Oxide-Based Resistive Switching Memories", Langmuir, vol. 33, No. 19, Apr. 18, 2017 (Apr. 18, 2017), pp. 4654-4665.

* cited by examiner

Region I

Region II

Region III (f)

RESISTIVE SWITCHING DEVICES AND METHODS FOR THEIR MANUFACTURE AND OPERATION

FIELD OF THE INVENTION

The present invention relates to resistive switching devices and methods for the manufacture of resistive switching devices and to methods for the operation of resistive switching devices. Such devices are of particular, although not necessarily exclusive, interest as non-volatile memory devices.

BACKGROUND

Resistive switching (RS) based random access memory (RRAM) devices (or "memristors") are promising candidates for next-generation non-volatile memory and neuromorphic computing applications due to their simplicity, high performance and compatibility with conventional semiconductor processes. Achieving high uniformity, stability, and large ON/OFF ratios are important goals and are being actively studied. Filamentary-type RS devices based on high-k insulating binary oxides (such as $HfO_x$, $TiO_2$, $TaO_x$ and NiO) can exhibit high ON/OFF ratios and other advantages. However, an initial high-voltage electroforming process is needed to enable stable resistive switching operations in many insulating-oxide-materials-based memristors. It is noted that the electroforming process can vary from device to device and/or cell to cell, which limits device scaling and can lead to device failure. Even in materials systems without the requirement of high forming voltages, local filament formation is often needed, leading to non-uniformity due to its stochastic nature.

Compared to RS which relies on filamentary processes, tuning of the interfacial Schottky barrier height in interface devices to control the switching usually excels in better uniformity, endurance, and scaling. However, such devices are not without problems. For instance, in the well-studied $TiO_2$ system, interfacial-type switching using $TiO_2/TiO_{2-x}$ bilayer structures grown by atomic layer deposition gives reasonable ON/OFF ratios of $10^3$, but has poor data retention. An amorphous $TiO_2$ layer between the top and bottom metal electrodes has been shown to improve the interface to improve the retention, but the ON/OFF ratio is reduced. Indeed, low ON/OFF ratios are often observed in amorphous thin films of many binary oxides. While a low ($\leq 10^2$) ON/OFF ratio is less problematic for neuromorphic computing applications, much higher ratios ($\geq 10^4$) are required for digital RRAM. To achieve both uniform RS and a high ON/OFF ratio, many methods have been tried such as surface modification, insertion of oxygen reservoirs, and complex layout designs such as multilayer heterostructures or doping. However, these routes add extra complex fabrication steps and require special treatments.

There are some systems which exhibit RS resulting from non-electrochemical mechanisms of the memristors. Many of these systems use $ABO_3$ perovskites or binary oxides owing to their wide range of functional effects which are voltage-tuneable (e.g. ferroic ordering, anion migration, cation valence change and electron correlation effects). While they can show intrinsically high ON/OFF ratios ($>10^4$) and stable endurance or retention without degradation, a range of challenges still remains for these systems, e.g. the need for relatively large (50 nm and above) thickness of films, high growth temperatures (700° C. and above), and often poor uniformity owing to uncontrolled defects.

The present invention has been devised in light of the above considerations.

SUMMARY OF THE INVENTION

In a first preferred aspect, the present invention provides a resistive switching memory device comprising an active layer comprising an ionic conducting material, the active layer being disposed on a substrate, the device further comprising:

a first electrode a second electrode optionally, a first semiconductor layer wherein one of the first electrode, second electrode and first semiconductor layer, when present, is the substrate for the active layer and wherein the active layer and the first semiconductor layer, when present, contact each other at an interface, wherein the device exhibits hysteretic I-V behaviour to permit switching of the electrical resistance of the device between different resistance states, and wherein the active layer is non-epitaxial with respect to the substrate.

In a second preferred aspect, the present invention provides a resistive switching memory device comprising an active layer comprising an ionic conducting material, the active layer being disposed on a substrate, the device further comprising:

a first electrode a second electrode a first semiconductor layer wherein one of the first electrode, second electrode and first semiconductor layer is the substrate for the active layer and wherein the active layer and the first semiconductor layer contact each other at an interface, wherein the device exhibits hysteretic I-V behaviour to permit switching of the electrical resistance of the device between different resistance states, and wherein the active layer is non-epitaxial with respect to the substrate.

In a third preferred aspect, the present invention provides a method of operating a resistive switching memory device according to the first aspect or the second aspect, the method including carrying out a set and read operation by, with the device in a first, high resistance state, setting the resistance to a second, lower resistance state, and subsequently reading the second, lower resistance state.

In a fourth preferred aspect, the present invention provides a method of operating a resistive switching memory device according to the first aspect or the second aspect, the method including carrying out a set and read operation by, with the device in a first, low resistance state, setting the resistance to a second, higher resistance state, and subsequently reading the second, higher resistance state.

In a fifth preferred aspect, the present invention provides a method of manufacturing a resistive switching memory device comprising an ionic conducting material, the active layer being disposed on a substrate, the device further comprising:

a first electrode a second electrode optionally, a first semiconductor layer wherein one of the first electrode, second electrode and first semiconductor layer, when present, is the substrate for the active layer and wherein the active layer and the first semiconductor layer, when present contact each other at an interface, wherein the device exhibits hysteretic I-V behaviour to permit switching of the electrical resistance of the device between different resistance states, and wherein the active layer is deposited at a temperature of not more than 400° C.

In a sixth preferred aspect, the present invention provides a method of manufacturing a resistive switching memory device comprising an ionic conducting material, the active layer being disposed on a substrate, the device further comprising:

a first electrode a second electrode a first semiconductor layer wherein one of the first electrode, second electrode and first semiconductor layer is the substrate for the active layer and wherein the active layer and the first semiconductor layer contact each other at an interface, wherein the device exhibits hysteretic I-V behaviour to permit switching of the electrical resistance of the device between different resistance states, and wherein the active layer is deposited at a temperature of not more than 400° C.

In a seventh preferred aspect, the present invention provides a resistive switching memory device obtained by or obtainable by a process according to the fifth aspect or the sixth aspect.

In an eighth preferred aspect, the present invention provides a resistive switching memory device comprising an active layer comprising an ionic conducting material, the active layer being disposed on a substrate, the device further comprising:

a first electrode a second electrode a first semiconductor layer wherein one of the first electrode, second electrode and first semiconductor layer is the substrate for the active layer and wherein the active layer and the first semiconductor layer contact each other at an interface, wherein the active layer exhibits hysteretic I-V behaviour to permit switching of the electrical resistance of the device between different resistance states.

In a ninth preferred aspect, the present invention provides a resistive switching memory device comprising an active layer comprising an ionic conducting material, wherein the device exhibits hysteretic I-V behaviour to permit switching of the electrical resistance of the device between different resistance states, wherein the active layer is amorphous or nanocrystalline and wherein the active layer comprises a nanocomposite structure with an arrangement of columns of a second phase extending in a thickness direction of the active layer within a matrix of a first phase, and wherein, in use of the device, the columns guide the formation of conductive filaments in the active layer.

In respect of the ninth preferred aspect, the active layer may be deposited on a substrate. The device may further comprise a first electrode and a second electrode. The device may further comprise a first semiconductor layer. For example, one of the first electrode, second electrode and first semiconductor layer may be the substrate for the active layer. The active layer and the first semiconductor layer may contact each other at an interface.

Also in respect of the ninth preferred aspect, the conductive filaments formed in the active layer may be partial conductive filaments in the sense that they extend only partially through the thickness of the active layer. Alternatively they may extend fully through the thickness of the active layer.

The first and second phases may be compositionally different. For example, the active layer may be formed of a host material with an aliovalent dopant. The concentration of the aliovalent dopant may be different (e.g. greater) in the second phase compared with the first phase.

Further optional features of the invention will now be set out. These can be applied singly or in any combination with any aspect of the invention, unless the context demands otherwise.

The substrate may be a single crystal substrate. The single crystal substrate may be self-supporting. Alternatively, the substrate may itself be a substrate layer formed on an underlying substrate. In that case, the substrate layer may be epitaxial with its underlying substrate.

In the field of thin film deposition, the concept of epitaxy is well-understood. Where the substrate is a single crystal, for example, an epitaxial layer formed on the substrate is then itself single crystalline with a well-defined crystalline orientation with respect to the substrate. As the skilled person understands, the non-epitaxial status of the active layer with respect to the substrate can be investigated by techniques such as XRD, GIXRD, TEM, HRTEM and SAED.

In some embodiments, the first semiconductor layer is interposed between the first electrode and the active layer. In this case, for example, the second electrode may be formed directly in contact with the opposing surface of the active layer. Alternatively, the first semiconductor layer may be interposed between the active layer and the second electrode. In this case, for example, the first electrode may be formed directly in contact with the opposing surface of the active layer.

In some embodiments, when the first semiconductor layer is interposed between the first electrode and the active layer, a second semiconductor layer may be interposed between the active layer and the second electrode. In that case, the second electrode may be formed in contact with the second semiconductor layer.

As will be understood, the purpose of the first and second electrodes is to conduct electrical current to and from the device. The first and second electrodes may therefore be arranged to pass electrical current across the interface between the first semiconductor layer and the active layer and through the active layer.

The active layer is preferably itself not single crystalline. Again, as the skilled person understands, the level of crystallinity of the active layer (and/or of other layers in the device) can be investigated by techniques such as XRD, GIXRD, TEM, HRTEM and SAED.

In some embodiments, the active layer is nanocrystalline. This refers to a configuration of the active layer in which locally there is crystalline order (nanocrystals, e.g. of the order of diameter less than 20 nm, more preferably less than 10 nm, more preferably less than 5 nm) but there is no long-range order in the plane of the active layer. Nanocrystallinity of the active layer can also be assessed by XRD, GIXRD, TEM, HRTEM and SAED.

In some embodiments, the active layer is amorphous. In an amorphous active layer, there is still further reduced local crystalline order compared with nanocrystalline. There is no long-range order in the plane of the active layer. The amorphous nature of the active layer can also be assessed by XRD, GIXRD, TEM, HRTEM and SAED.

In some embodiments, the active layer may be nanocrystalline in some places and amorphous in others.

In some embodiments, there is additionally provided an epitaxial layer of said ionic conducting material between the substrate and the non-epitaxial active layer. The thickness of the epitaxial layer may be at most 15 unit cells. This can be determined by TEM examination of a cross section through the device.

The active layer, in its pristine state, may have an electronic conductivity of not higher than 2.86 S/m. This corresponds to an electronic resistivity of not less than 0.35 Ωm. The electronic conductivity is determined by measuring the electrical resistance of the active layer in-plane by a four-point probe method at room temperature, converting to resistivity and converting the resistivity to conductivity. In view of the very low ionic conductivity of the active layer at room temperature, it is a reasonable assumption that the electrical conductivity at room temperature is dominated by the electronic conductivity. In some embodiments, the active layer, in its pristine state, may have an electronic conductivity of not higher than 1.43 S/m. This corresponds to an electronic resistivity of not less than 0.7 Ωm, The active layer, in its pristine state, may have an ionic conductivity of at least $10^{-10}$ S/cm, measured at 500° C. The active layer, in its pristine state, may have an ionic conductivity of at least $10^{-9}$ S/cm, measured at 500° C. The active layer, in its pristine state, may have an ionic conductivity of at least $10^{-8}$ S/cm, measured at 500° C. The active layer, in its pristine state, may have an ionic conductivity of at least $10^{-7}$ S/cm, measured at 500° C. The active layer, in its pristine state, may have an ionic conductivity of at least $10^{-6}$ S/cm, measured at 500° C. The active layer, in its pristine state, may have an ionic conductivity of at most $10^{-3}$ S/cm, measured at 500° C. The active layer, in its pristine state, may have an ionic conductivity of at most $10^{-4}$ S/cm, measured at 500° C. The active layer, in its pristine state, may have an ionic conductivity of at most $10^{-5}$ S/cm, measured at 500° C.

At room temperature (e.g. 25° C.), the ionic conductivity of the material may be difficult to measure directly even though its ionic conductivity at that temperature is considered to have a meaningful impact on the performance of the device for the reasons explained in detail below (without wishing to be limited to the mechanisms proposed for the operation of the device). At room temperature, the measured electrical conductivity is typically dominated by electronic conductivity, allowing the electronic resistivity to be measured simply using the method outlined above. Accordingly, a measurement of the ionic conductivity for typical active layer materials requires a different approach and is instead measured at elevated temperature (here 500° C.).

The device, with the active layer in its pristine state, may have an electrical resistivity at room temperature, of at least $10^6$ Ωm, considering that the resistivity of the device takes into account the resistance through the device including the contacts. The resistivity is determined by measuring the electrical resistance and normalising based on the area of the contacts. The device, in its low resistance state, may have an electrical resistivity at room temperature of at least $10^3$ Ωm. The device, in its high resistance state, may have an electrical resistivity at room temperature of at most $10^8$ Ωm. Here we refer to the resistivity of the device itself, rather than of the active layer. Accordingly, measurements to determine the resistivity of the device are made through the device. In order to explain further, we provide an example. From FIG. 7, it could be estimated that the low resistance state (LRS) value is about 5 kΩ and the high resistance state (HRS) value is about $2\times10^8$ Ω. Based on the electrode size of 100 μm and film thickness of 28 nm, the electrical resistivity ρ for the LRS/HRS for the devices is:

$$\rho_{LRS} = 5000\times\pi\times(50\times10^{-6})^2/(28\times10^{-9}) = 1.4\times10^3\ \Omega\text{m}$$

$$\rho_{HRS} = 2\times10^8\times\pi\times(50\times10^{-6})^2/(28\times10^{-9}) = 5.7\times10^7\ \Omega\text{m}$$

In some embodiments, the thickness of the active layer may be not more than 100 nm. The thickness may be measured in a direction perpendicular to the interface between the active layer and the semiconductor layer. The thickness of the active layer may be not more than 50 nm, or not more than 40 nm or not more than 30 nm or not more than 25 nm or not more than 20 nm or not more than 10 nm. It is considered that manufacturing layers of thickness of less than 50 nm fits more readily with known industrial processes for the manufacture of thin film devices. The thickness of the active layer may be at least 5 nm.

The electrical resistance of the device (as measured at room temperature between the first and second electrodes) depends on the history of the device, i.e. whether it has been subjected to a set operation. The electrical resistance of the device in its LRS may for example be in the range $10^3$ to $10^7$ Ω. The electrical resistance of the device in its HRS is different to the electrical resistance in the LRS and may for example be in the range $10^6$ to $10^{10}$ Ω. Of greater interest than the absolute value of the resistance in either LRS or HRS is the ON/OFF ratio. This may be at least 10, more preferably at least $10^2$, $10^3$, $10^4$, $10^5$ or $10^6$.

The device may have an endurance of at least $10^4$ cycles at room temperature. A cycle is defined as a cycle from the LRS to the HRS and back to the LRS. In order to satisfy this test, the ON/OFF ratio should remain at least 10 over the stated number of cycles. In some embodiments, the device may have an endurance of at least $10^5$ cycles, or at least $10^6$ cycles, or at least $10^7$ cycles.

The device may have a retention of at least $10^4$ seconds at room temperature. Retention is intended to specify the maintenance of LRS and/or HRS for the device without cycling over time. In order to satisfy this test, the ON/OFF ratio should remain at least 10 over the stated time. In some embodiments, the device may have a retention of at least $10^5$ seconds, or at least $10^6$ seconds, or at least $10^7$ seconds.

As will be appreciated, in some embodiments the device is a non-volatile resistive switching memory device.

In some embodiments, a setting voltage applied to the device to set the resistance to LRS, HRS and some of the intermediate resistance states is in the range −10 V to +10 V.

In some embodiments, a reading voltage applied to the device to determine the resistance without setting or resetting the device is in the range −2 V to +2 V. In some embodiments, a reading voltage applied to the device to determine the resistance without setting or resetting the device is in the range −1 V to +1 V. In some embodiments, a reading voltage applied to the device to determine the resistance without setting or resetting the device is in the range −0.5 V to +0.5 V.

In a method of operating the device according to some embodiments of the invention, the device is capable of being set to one of a plurality of different available non-volatile resistance states. In this context, "non-volatile" can be considered to be that the resistance state is substantially constant for at least 10 seconds, at least 20, at least 30, at least 40, at least 50, at least 60, at least 70, at least 80, at least 90, at least 100 or at least 120 seconds. The resistance state may be substantially constant for at least 1000 seconds, for example. In terms of "substantially constant", an allowable fluctuation level for each of the resistance states (defined by standard deviation/mean value of the resistance) may be not more than 3%. The plurality of different available non-volatile resistance states may be at least 4, or at least 8, more preferably at least 10, at least 20, at least 30, at least 40, at least 50, at least 60, at least 70, at least 80, at least 90, at least 100 or at least 120 different available non-volatile resistance states.

The selection of the non-volatile resistance state may be achieved by appropriate selection of resistance state set conditions. For example, the selection of the non-volatile resistance state may be achieved by appropriate selection of the set or reset voltage level.

In some embodiments, the ionic conducting material has a certain oxygen ion conductivity. The ionic conducting material may include oxygen vacancies. The concentration of mobile oxygen vacancies may be controlled by aliovalent ion doping and/or by electric field application. Suitable control over the oxygen pressure, for example, during or after the deposition of the active layer, can be used to assist with control of the oxygen vacancy concentration. In the present disclosure, the inventors demonstrate for some embodiments that controlled doping of the ionic conducting material can lead to improved resistive switching performance such as improved uniformity. Without wishing to be limited by theory, the inventors speculate that this implies that vacancies in the ionic conducting material play a significant role in the resistive switching mechanism.

In some embodiments, the active material may support oxygen mobility. This is mentioned in particular in the context of amorphous or nanocrystalline active materials, in which it is not well understood as to whether the mobile oxygen species is $O^-$, $O^{2-}$ or O, for example.

Suitable materials for the active layer include (but are not necessarily limited to) aliovalent-ion-doped $HfO_x$, aliovalent ion doped $ZrO_x$ (e.g., the well-known ionic conductor, YSZ), indium gallium zinc oxide (IGZO), sodium bismuth titanate (NBT), aliovalent-ion-doped $SiO_x$ and other mixed ionic electronic conductivity (MIEC) materials.

The first semiconductor layer may be an oxide semiconductor layer.

The first semiconductor layer may have a lower electrical resistivity than the active layer. For example, the first semiconductor layer may have an electrical resistivity of not more than $10^{-3}$ Ωm.

The second semiconductor layer, if present, may have the same features as set out with respect to the first semiconductor layer.

The first and second electrodes may be metallic.

The invention includes the combination of the aspects and optional features described except where such a combination is clearly impermissible or expressly avoided.

SUMMARY OF THE FIGURES

Embodiments and experiments illustrating the principles of the invention will now be discussed with reference to the accompanying figures in which:

FIG. 16 shows AFM images of the surface of the NBT film grown on Nb:STO single crystal substrates at deposition temperatures of 600, 630, and 670° C.

FIG. 17 shows a cross-sectional TEM image for an NBT film grown on Nb:STO single crystal substrate at a deposition temperature of 630° C. The indicated parts of the sample were used to take Fast Fourier Transform (FFT) images.

FIG. 18 shows an STEM image of the NBT film of FIG. 17.

FIG. 20 (bottom part) shows a summary of the calculated ON/OFF ratios for the devices which differ in view of different Nb dopant concentrations in the Nb:STO substrates and also shows for comparison the sheet resistivity of the different Nb:STO substrates.

FIG. 25 shows schematic diagrams of the electronic conduction process at the Schottky barrier between the NBT film and Nb:STO electrode: (a) the pristine unbiased state; (b) with a positive bias applied; (c) with a negative bias applied. For (b) and (c), the effect of a lower and higher NBT deposition temperature is illustrated.

FIG. 49(*b*) shows endurance of $10^4$ switching cycles with a memory window of at least 10 for ten different devices (amorphous nanocomposite devices with Ba:$HfO_x$) from two different samples. Thin films for both deposited at 400° C., (in the original plot there is a different colour for each device). Note that a corresponding endurance figure with logarithmic x-axis is shown in in FIG. 55(*f*). For endurance, $t_{write}=t_{read}$ of about 22 ms.

FIG. 49(*c*) shows measurements of device switching speed (amorphous nanocomposite devices with Ba:$HfO_x$). Each data point is the mean value of 20 switching iterations and the error bars represent the measurement standard deviation. The inset shows the switching sequence for endurance and switching speed measurements. For switching speed, $t_{write}$ is displayed on the x-axis and $t_{read}$ was a few ms.

FIG. 49(*d*) shows a CAFM scan of a bare film with −7 V. (Amorphous nanocomposite Ba:$HfO_x$.) After the first scan with −10 V without any measurable current (not shown), small regions of increased conductivity appear.

FIG. 49(*e*) shows a CAFM scan for the film of FIG. 49(*d*) of an area where the central 100×100 $nm^2$ area had been scanned a few times before to make it conductive.

FIG. 49(*f*) shows a plot of CAFM current as a function of voltage (ten repetitions, different colour each in the original plot, absolute values as negative voltage was applied to the BE) with the tip kept inside the conductive area in FIG. 49(*e*). A clear hysteresis is observed with the same orientation as the IV curves in FIG. 49(*a*). Different from FIG. 49(*a*), the voltage had to be applied to the bottom electrode with the CAFM tip grounded, as illustrated in the inset. As the tip was drifting during the measurement, the ten repetitions are measured effectively in slightly different position, but all within the conductive area in FIG. 49(*e*).

FIG. 50(*c*) shows the same as FIG. 50(*b*) but with a logarithmic time axis. Under the assumption that the state decay is governed by the fitted power laws for the whole duration, it is evident that the devices are not sufficiently stable for long term memory applications.

FIG. 50(*d*) shows results for a different device, time t until the initial resistance has changed by 10% plotted vs. the inverse temperature 1/T, and where appropriate, fitted with an Arrhenius equation $\propto \exp[-E_a/(k_B T)]$. Based on extrapolation of the Arrhenius dependences, cryogenic temperatures are required to achieve 10 years state retention.

FIG. 51(*b*) shows synaptic potentiation (decrease of resistance) as a result of the applied voltage profiles for three different devices. The difference between the measurements with the same ±1 V voltage amplitudes was the profile width.

FIG. 51(*c*) shows synaptic depression (increase of resistance) as a result of the applied voltage profiles. From FIGS. 51(*b*) and (*c*) it is clear that potentiation has a larger dynamic range than depression by a factor of at least 10.

FIG. 51(*d*) shows relative synaptic weight change normalized to the minimum (maximum) resistance for potentiation (depression) with $\Delta t = t_{pre} - t_{post}$ and $\Delta t=0$ corresponding to this minimum (maximum) in FIGS. 51(*b*) and (*c*), respectively. This figure only takes into account the weight change after the minimum/maximum in FIGS. (*b*)/(*c*) due to the choice of the $\Delta t=0$ point.

FIG. 52(*a*) shows TEM of pure $HfO_x$ deposited at 400° C. Clear crystallites are visible in the film; arrows indicate some of the grain boundaries.

FIG. 52(*b*) shows TEM of pure $HfO_x$ deposited at 30° C. While these films are not polycrystalline like pure $HfO_x$ deposited at 400° C., neither are they as uniform as the composite films presented in FIG. 52(*c*).

FIG. 52(*c*) shows TEM of the thin films which resulted in stable electrical performance and that these are amorphous or nanocrystalline. Some pillar-like structures can be discerned, indicated by arrows. The addition of Ba to the films clearly leads to material uniformity by suppressing crystallization.

FIG. 52(*d*) shows HAADF-STEM, zoomed in on some of the pillars of the film of FIG. 52(*c*). In addition, darker nanoparticles can be discerned throughout the films; four randomly chosen particles are marked by circles.

FIG. 52(*e*) shows a HAADF-STEM image of the film of FIG. 52(*c*) to indicate the area scanned for EDX and the elemental distribution of Hf and Ba.

FIG. 52(*f*) shows line scan EDX results acquired from the area indicated in FIG. 52(*e*). The dark areas in the HAADF-STEM image contain more Ba than the brighter ones. The ratio between Ba and Hf in the pillars is about 0.25-0.33, consistent with the Rutherford backscattering analysis discussed later.

FIGS. 53(*a*) & (*b*) show RBS measurement (circles) and modelling (lines with colour in the original plots) to identify the elemental compositions of the hafnium oxide references in FIG. 53(*a*) and Ba:$HfO_x$ films in FIG. 53(*b*). The relative oxygen content in the Ba:$HfO_x$ films is lower than in the pure references.

FIGS. 53(*c*) & (*d*) show Hf 4f core spectra for the hafnium oxide and Ba:$HfO_x$ sample, respectively, from which the relative concentrations of different oxidation states in FIGS. 53(*e*) and (*f*) were derived. Corresponding spectra for Ba 3d and O 1 s can be found in FIG. 67. The increase in Hf sub-oxides with increasing etching time can be derived from the increasing low-energy shoulder.

FIGS. 53(*e*) & (*f*) show the relative concentrations of hafnium oxidation states for a pure hafnium oxide reference (FIG. 53(*e*) and a Ba:$HfO_x$ film (FIG. 53(*f*). The x-axes start at 720 s as this was the time required to etch a protective TiN top layer. This means that the actual film surface lies between t=720 s and 960 s (indicated by shading) and in this area, different Hf—N—O compounds were detected. At t=1680 s, the etching approached the substrate. The most notable difference between the two samples is the amount of $HfO_{2-x}$ sub oxides in the composite films with a maximum of up to 63% relative concentration in Ba:$HfO_x$ (FIG. 53(*f*)) vs. a maximum of about 40-55% in pure hafnium oxide (FIG. 53(*e*)).

FIG. 54(*b*) shows cross-sectional TEM, the same as FIG. 52(*d*), but overlaid with shading (colours in the original of the image) to indicate the spatial locations of the different switching components. The areas marked Enhanced Conduction (green in the original) are Ba-rich enhanced conduction channels. The rea marked Thermionic Barrier (red in the original) is a thermionic barrier which controls the resistance states. The circles indicate ions such as oxygen (vacancies) which move towards and away from the barrier and thus change its height.

FIG. 54(*c*) shows a schematic of electronic conduction in the low and high resistances states. The voltage-driven accumulation/depletion of positive/negative ions in or close to the barrier area decreases (darker line in the top views, blue line in the original) the barrier height, the depletion/accumulation of positive/negative ions increases it (darker line in the bottom views, red in the original). Grey references for comparison with the respective other barrier shape. With the partial filament defect bands (green shading in the original of FIG. 54(*b*)) 'short-circuiting' the TE/Ba:$HfO_x$ barrier, the barrier area shaded (in red in the original in FIG. 54(*b*)) acts as the limiting barrier for both positive and negative voltage polarity and it appears almost symmetric from either direction due to the position of the defect band. (There is still a difference of a factor of about 10 in the maximum currents in positive and negative voltages.)

DETAILED DESCRIPTION OF THE INVENTION

Figure 1:
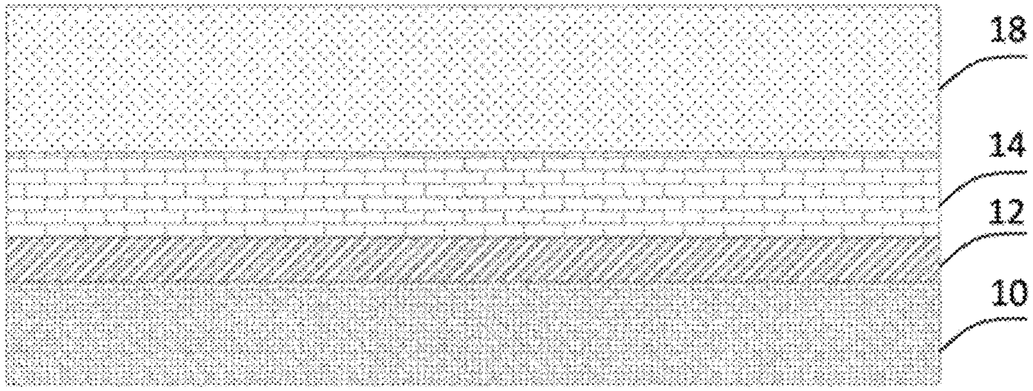
FIGS. 1, 2 and 3 show schematic cross-sectional views through RS devices according to embodiments of the invention.

Aspects and embodiments of the present invention are discussed below with reference to the accompanying figures. Further aspects and embodiments will be apparent to those skilled in the art. All documents mentioned in this text are incorporated herein by reference.

In order to aid in the technical understanding of the disclosure of the present invention, it is first of interest to consider previous work arising from the inventors' research group. This is discussed below in order to provide a comparison with the new results and insights disclosed herein and to aid an understanding of the technical significance of the new results and insights. Some of the previous work arising from the inventors' research group is published as:

Chao Yun, Matthew Webb, Weiwei Li, Rui Wu, Ming Xiao, Markus Hellenbrand, Ahmed Kursumovic, Hongyi Dou, Xingyao Gao, Samyak Dhole, Di Zhang, Aiping Chen, Jueli Shi, Kelvin H. L. Zhang, Haiyan Wang, Quanxi Jia and Judith L. MacManus-Driscoll, *High performance, electroforming-free, thin film memristors using ionic* $Na_{0.5}Bi_{0.5}TiO_3$, J. Mater. Chem. C, 2021, 9, 4522, DOI: 10.1039/d1tc00202c We will refer to this paper and its Electronic Supplementary Information (ESI) as Yun et al. (2021). The entire contents of this paper and its Electronic Supplementary Information is hereby incorporated by reference. The references included in Yun et al. (2021) are not reproduced in the present disclosure since they can be retrieved from Yun et al. (2021) itself.

Resistive switching (RS) based resistive random access memory (RRAM) devices (or memristors) are promising candidates for next-generation non-volatile memory and neuromorphic computing applications due to their simplicity, high performance, and compatibility with conventional semiconductor processes. Achieving high uniformity, stability, and large ON/OFF ratios are important goals and are being actively studied. Filamentary-type RS devices based on high-k insulating binary oxides (such as $HfO_x$, $TiO_2$, $TaO_x$ and NiO) can exhibit high ON/OFF ratios and other advantages. However, an initial high-voltage electroforming process is needed to enable stable resistive switching operations in many insulating-oxide-materials-based memristors. It is noted that the electroforming process can vary from device to device and/or cell to cell, which limits device scaling and can lead to device failure. Even in materials systems without the requirement of high forming voltages, local filament formation is often needed, leading to non-uniformity due to its stochastic nature.

Compared to RS which relies on filamentary processes, tuning the interfacial Schottky barrier height to control the switching usually excels in better uniformity, endurance, and scaling. However, they are not without problems. For instance, in the well-studied $TiO_2$ system, interfacial-type switching using $TiO_2/TiO_{2-x}$ bilayer structures grown by atomic layer deposition gives reasonable ON/OFF ratios of $10^3$, but has poor data retention. An amorphous $TiO_2$ layer between the top and bottom metal electrodes has been shown to improve the interface to improve the retention, but the ON/OFF ratio is sacrificed a lot. Indeed, low ON/OFF ratios are often observed in amorphous thin films of many binary oxides. While a low ($\leq 10^2$) ON/OFF ratio is less problematic for neuromorphic computing applications, much higher ratios ($>10^4$) are required for digital RRAM. To achieve both uniform RS and high ON/OFF ratio, many methods have been tried such as surface modification, insertion of oxygen reservoirs, and complex layout designs such as multilayer/heterostructures or doping. However, these routes add extra complex fabrication steps and require special treatments.

There are some systems which exhibit RS resulting from non-electrochemical mechanisms of the memristors. Many of these systems use $ABO_3$ perovskites or binary oxides owing to their wide range of functional effects which are voltage-tuneable (e.g. ferroic ordering, anion migration, cation valence change, and electron correlation effects). While they can show intrinsically high ON/OFF ratios ($\geq 10^4$) and stable endurance or retention without degradation, a range of challenges still remains for these systems, e.g. the need for relatively large (50 nm and above) thickness of films, high growth temperatures (700° C. and above), and often poor uniformity owing to uncontrolled defects.

Accordingly, Yun et al. (2021) reported certain materials parameters considered in that disclosure necessary to achieve high performance memristors. Yun et al. (2021) used $Na_{0.5}Bi_{0.5}TiO_3$ (NBT) as a model system to determine the optimum parameters because it is an ionic conductor with a controllable and tuneable concentration of oxygen vacancies ($V_o$), arising from the charge compensation due to Bi loss. The controllable $V_o$ is important for controlling the interfacial barrier height in the switching process. Also, NBT can be grown with good crystallinity at relatively low temperatures compared with other perovskites.

While the RS properties of ionic conductors have been studied before, the performance has not been optimum, i.e. they require high-voltage electroforming (>10 V), filaments or high SET voltages (>5 V). Yun et al. (2021) showed new understandings about the critical factors for optimising performance, namely control of both oxygen vacancies and electronic conduction in the interfacial switching process. NBT has a low intrinsic electronic conductivity resulting from the defect-induced charge compensation. A low level of electronic conduction is highly beneficial for the resistive switching device operation (by giving a moderate initial resistance or $R_{HRS}$ in the GΩ range), since highly insulating materials in general require filament formation to form a low resistance state, while highly conductive materials cannot achieve sufficiently high resistance values for a high resistance state and also suffer from Joule heating. Furthermore, NBT has potential industrial interest as it can be sputtered at relatively low temperatures. However, while a report on NBT has shown ferroelectric-polarization-controlled RS with $10^3$ ON/OFF ratio, $V_o$ controlled RS has not been demonstrated.

In Yun et al. (2021), thin (about 20 nm) NBT films were grown by pulsed laser deposition (PLD) in the temperature range of 600-670° C. PLD is used due to the better ability to study the structural and compositional parameters of materials, as compared with e.g. ALD. The lowest growth temperature studied in Yun et al. (2021), 600° C., gives the most stoichiometric material, indicative of a high concentration of $V_o$ active for resistive switching. RS at room temperature was obtained with ON/OFF ratios of $>10^4$ at low switching voltages (<1.2 V), with high endurance ($>10^3$ cycles, the largest number tested) and excellent memory cell uniformity (low deviation in triggered resistance states). Overall, the factors for achieving high performance memristive behaviour are demonstrated, namely use of an ionic conductor with high concentration of $V_o$, which also has a low level of electronic conductivity.

In more detail, the experimental details reported in Yun et al. (2021) were as follows.

Sample preparation: $Na_{0.5}Bi_{0.5}TiO_3$ films were grown on single crystalline 0.5% wt Nb-doped $SrTiO_3$ (001) substrates using pulsed laser deposition (PLD). The composite PLD target was prepared using a conventional solid-state sintering: stoichiometric and high-purity $Na_2CO_3$ (99.99%), $Bi_2O_3$ (99.99%, 10% excess), $TiO_2$ (99.99%) powders were mixed, ground, and then sintered at 850° C. for 2 h, then re-ground again and pelletized, followed by additional sintering at 1100° C. for 3 h. During PLD, the oxygen partial pressure was maintained at 0.3 mbar and the growth temperature was varied from 600 to 670° C. The substrate temperature was measured using an infrared pyrometer. A KrF excimer laser with a 248 nm wavelength was used. The repetition rate and laser fluency were 1 Hz and 1.5 J $cm^{-2}$, respectively.

Sample characterization: The phase and crystallinity of the films were characterized with a Panalytical Empyrean high-resolution X-ray diffraction (XRD) system using Cu-$K_\alpha$ radiation (λ=1.5405 Å). Cross-sectional images of the film were obtained by high-resolution transmission electron microscopy (HRTEM) in a FEI TALOS F200X system at 200 kV equipped with ultrahigh-resolution high angle annular dark field detectors and Super-X™ electron-dispersive X-ray spectroscopy. Both cross-sectional TEM and scanning TEM (STEM) were undertaken. The samples for the TEM analyses were obtained through mechanical grinding, dimpling, and a final ion milling step. For characterization of the electrical properties, platinum electrodes were deposited by DC sputtering or e-beam evaporation. We measured the resistances using a Signatone two-probe station with a Tungsten tip (25 μm) and a Keithley 2400 source-meter. To measure ionic transport characteristics, we used an HP 4294A Precision Impedance Analyser. For all measurements, Nb-doped STO substrates were grounded and the voltage was applied to the Pt electrodes. X-ray photoelectron spectroscopy (XPS) was used to study the valence band of the films by a monochromatic Al $K_{\alpha 1}$ X-ray source (hv=1486.6 eV) using a SPECS PHOIBOS 150 electron energy analyzer with a total energy resolution of 500 meV. The Fermi level of the films was calibrated by a polycrystalline Au foil.

FIG. 1 of Yun et al. (2021) shows the influence of the film growth temperature (600° C., 630° C., and 670° C.) on the RS performance for three $Na_{0.5}Bi_{0.5}TiO_3$ RS devices made from about 20-nm-thickness films. The measurement configuration, as shown in FIG. 1*a* of Yun et al. (2021), is a standard two-terminal layout with Pt electrodes and a Nb-doped $SrTiO_3$ (Nb:STO) substrate as the top and bottom contacts, respectively. The Nb:STO substrate is connected to the measurement setup using conductive Ag paint and is grounded. FIG. 1*b* of Yun et al. (2021) shows the typical I-V characteristics of samples prepared at different processing temperatures and FIG. S1 of the ESI of Yun et al. (2021) also shows the I-V curves under five consecutive cycles for the sample grown at 630° C. All Pt/NBT/Nb:STO/Ag devices tested under a DC sweeping cycle (from −8 V to +8 V) exhibit hysteretic I-V curves without the need of a high-voltage electroforming process. The devices are SET to the low resistance state (LRS) at a positive voltage of less than 1.2 V, and then RESET back to the high resistance state (HRS) when the voltage is swept to negative values. The SET voltage is defined as the voltage where the largest current jump occurs. The inset of FIG. 1*b* of Yun et al. (2021) shows endurance tests on the same memory cell of each sample for over 1000 cycles. The cell was 'written' to LRS and HRS at +8V and −8 V, respectively, and a 'read' voltage of −0.5 V was used. The sample grown at 600° C. not only shows a large ON/OFF ratio (up to $10^4$) but also exhibits uniform ON and OFF states without degradation in $>10^3$ cycles in the measurement range. The sample grown at 630° C. (second graph of FIG. 1*b* plus inset in Yun et al. (2021)) shows an ON/OFF ratio of about $10^2$-$10^3$ and the distribution of resistance states is less uniform. The sample grown at 670° C. (third graph of FIG. 1*b* plus inset in Yun et al. (2021)) shows an ON/OFF ratio $<10^2$ and the endurance cannot be maintained well over about 200 cycles.

The endurance of the same samples was measured (for 200 cycles) over many different cells (>10) using the same voltages as in FIG. 1*b* of Yun et al. (2021). The results are shown in FIG. 1*c* of Yun et al. (2021). First, we notice that the number of memory cells where uniform readout resistance states are observed without any failure decreases from 9 to 7 to 3 with increasing growth temperature from 600 to 670° C. We observe that the absolute resistance values are spaced much more tightly for each memory cell for the lower growth temperatures. Furthermore, they show less variation between different cells. Hence, the films grown at lower temperatures show much more uniform resistive switching. This is confirmed by FIG. S2 of the ESI of Yun et al. (2021), which shows the increased standard deviation in the statistical average of the HRS and LRS values with increasing growth temperature. Also, the average ON/OFF ratio decreases from 5000 to 3000 and then to 20 (the largest ON/OFF ratio decreases from 11000 to 6000 and then to 100) in these three samples with the increase of the growth temperature.

The retention properties of the films grown at 600 and 630° C. are shown in FIG. S3A and B of the ESI of Yun et al. (2021). An ON/OFF ratio of $>10^3$ is maintained even after 2000 s (20000 read cycles), despite a slight degradation of the HRS and LRS. FIG. S4 of the ESI of Yun et al. (2021) shows the current response of the NBT sample grown at 630° C. to voltage pulses, where the instantaneous current responds fast to the applied voltage pulse and a fast switching speed is exhibited (butterfly I-V curve still appears for pulse widths down to 20 ns and rise times down to 200 ns).

$R_{HRS}$ changes little with deposition temperature of the resistive NBT layer (FIG. 1*c* of Yun et al. (2021)) with values of around $10^8$-$10^9$ Ω. However, $R_{LRS}$ changes drastically with deposition temperature (from $10^4$ to $10^7$ Ω when the growth temperature increases from 600 to 670° C.) which therefore controls the magnitude of the ON/OFF ratio. The reason for this strong influence of the deposition temperature on $R_{LRS}$ is explored more later.

FIG. 1*d* of Yun et al. (2021) show the I-V curves taken from memory cells with different electrode sizes (with diameters of 50, 100, 150, 200, and 250 μm) for an NBT film grown at 630° C. with e-beam-evaporated Pt top electrodes. We observe similar shapes of the I-V curves when sputtered Pt is used as the top electrodes (FIG. 1*b* of Yun et al. (2021)), indicating little influence of the deposition technique of the top electrodes on the overall RS properties of the devices. A clear linear increase in the measured current (at maximum negative voltage −8 V, LRS and HRS taken at −3 V) with the electrode area indicates a very uniform distribution of the electronic conduction throughout the whole electrode area in both the HRS and LRS. The dependence of $R_{HRS}$ and $R_{LRS}$ on the electrode area of the sample grown at 600° C. using pulsed voltages is shown in FIG. 1*e* of Yun et al. (2021). The average current values for the high resistance state and low resistance state of the 300 μm electrodes are around nine times as high as those of the 100 μm electrodes, which is consistent with the area ratio of the two electrodes. These observations all suggest that the current conduction of the Pt/NBT/Nb:STO/Ag device does not rely on the formation of local conduction filaments but instead on an interfacial effect or a uniform bulk effect. The electrode area dependence of the HRS indicates also that there is a homogeneous electronic conduction background inside the NBT for the HRS or pristine state. The room temperature resistivity of the NBT film measured using a standard in-line four-probe configuration is $\geq 10^6$ Ωcm, which is at the boundary between semiconductor and insulator behaviour. As discussed above, this low but non-zero level of electronic conduction is important for bringing the pristine resistance of the NBT-based RS device to a suitable range (in the MΩ range) and to prevent the need of a high-voltage forming process of very-high-resistance films, while also preventing current losses of low resistance films. As extrapolated from the low-voltage I-V curves in FIG. S5 of the ESI of Yun et al. (2021), we have a device resistance of about $10^6$ Ω (film+contact) in the initial state, which is within the suitable resistance range mentioned above. This value eliminates the need to apply a large voltage to 'electroform' conducting filaments. Details of the conduction mechanism will be discussed later when we show the fitting of the I-V curves with typical conduction mechanisms.

FIG. 1 of Yun et al. (2021) clearly indicates that highly uniform RS properties of Pt/NBT/Nb:STO/Ag devices can be achieved by the use of lower growth temperatures for the NBT films. To exclude the Nb:STO/metal interface contribution on the overall I-V characteristics of the device, we tested Pt/Nb:STO/Ag structures without NBT films (where the Nb:STO was treated using the same conditions for NBT deposition). All the Pt/Nb:STO/Ag devices exhibit similar and minimal I-V hysteresis loops and a negligible variation of readout resistances, and FIG. S6 of the ESI of Yun et al. (2021) shows the results for one treated at 630° C. as an example. We also measured energy-dispersive X-ray (EDX) spectra for Ag in multiple areas on the samples (including substrates) that had undergone electrical measurements and found no evidence of Ag diffusion into the films or the substrates (FIG. S7 of the ESI of Yun et al. (2021)). Therefore, although it has been reported that Ag could diffuse into Nb:STO or that Ag/Nb:STO could show RS effects under certain circumstances, none of them occur or are relevant to the results observed in Yun et al. (2021) and hence the Ag/Nb:STO interface itself has a negligible contribution to the results of FIG. 1 of Yun et al. (2021) for the growth and measurement conditions. Also, it is noted that previous work referenced in Yun et al. (2021) showed an Ohmic contact nature between the Pt and the NBT interface. Hence, the contribution from the Pt/NBT top interface to the RS properties of the device can also be excluded and we can conclude that the NBT/Nb:STO interface controls the overall device performance (we review this in more detail later). Since the Nb:STO substrate has a stable structure and composition, it is the variation of the composition and structure of NBT with growth temperature that most likely influences the performance of NBT/Nb:STO junction and therefore dominates the RS behaviour.

As the NBT composition is quite sensitive to the growth temperature (because of the relatively volatile elements Na and Bi), we therefore next study the compositional change of the NBT films with growth temperature. We used X-ray Photoelectron Spectroscopy (XPS) to assess the stoichiometry change of the NBT films as a function of the growth temperature. The ratio of the XPS spectra area between respective elements can qualitatively reflect the relative elemental ratio between different samples. The detailed plots and fitting of the Na, Bi, Ti, and O XPS spectra are shown in FIG. S8 of the ESI of Yun et al. (2021). FIG. 2*a* and b of Yun et al. (2021) show the Ti $2p_{3/2}$ VS. Bi $4f_{7/2}$ and Na 1s vs. Bi $4f_{7/2}$ spectra with normalizing the Ti $2p_{3/2}$ and Na 1s spectra intensity to be the same value, respectively. The relative Bi/Ti and Bi/Na ratios show similar decreasing trends with an increase in growth temperature, as plotted in FIG. 2*c* of Yun et al. (2021). This is understandable by considering that Bi is more volatile than Na and Ti. For instance, the volatilization temperature of $Na_2O$ is 1132° C. whereas it is 825° C. for $Bi_2O_3$. The volatilization of Bi is well known in the growth of films containing Bi, and for $BiFeO_3$ it has been reported that lower growth temperatures (≤700° C.) are important for optimising the Bi stoichiometry.

As shown in FIG. 2*d* of Yun et al. (2021), the relative spectra area of the Bi $4f_{7/2}$ VS. Ti $2p_{3/2}$ (which qualitatively indicates the relative Bi content, assuming negligible Ti loss with increasing growth temperature) shows an inverse relationship with $R_{LRS}$ and a direct correlation with the ON/OFF ratio. This indicates that the lower the Bi content (i.e. the more loss of Bi) in the film, the worse is the RS performance. The question is how and why the RS performance is related to the Bi content. In fact, it has been reported that slightly Bi-deficient (with x≤0.01 in $Na_{0.5}Bi_{0.5-x}TiO_3$) NBT leads to a fast migration of $V_o$ whereas more Bi-deficient films result in defect association of Bi vacancies, $V_{Bi}$ and $V_o$, which reduces the concentration of mobile $V_o$. We will return to this point later.

Structural analysis was conducted to find out if there is any drastic structural change with varying growth temperature. FIG. 3*a* of Yun et al. (2021) shows the XRD 2θ-ω diffraction patterns. All films show clear NBT (00I) peaks with no noticeable peak shift, indicating no obvious structural change with change in growth temperature. Laue fringes are also observed in the film grown at 600° C., indicating good crystal quality and smooth surfaces. It is also noted that the Laue fringes of FIG. 3*a* become less clear with an increase of the growth temperature. This indicates that the NBT film is more homogeneous and uniform when the growth temperature is lower. This is very important for potential applications, where the use of low growth temperatures is necessary. Furthermore, the reciprocal space maps (RSMs) of FIG. 3*b* of Yun et al. (2021) clearly indicate that the NBT film is fully strained to the STO substrate. The out-of-plane lattice constant is determined to be $c_{NBT}$=3.883±0.003 to 3.889±0.003 Å from 2θ-ω scans when the growth temperature increases from 600 to 670° C., corresponding to 0.56% to 0.41% out-of-plane compressive strain. The slight increase in the lattice constants is consistent with the increase in the off-stoichiometry in perovskite films. The out-of-plane compressive strain is consistent with the fact that the bulk lattice constant of NBT ($a_{NBT}$=3.886 Å) is smaller than that of STO ($a_{STO}$=3.905 Å), hence the NBT is tensed in-plane by the STO, leading to the out-of-plane compression to conserve the unit-cell volume.

Atomic Force Microscopy (AFM) images shown in FIG. 3*c* of Yun et al. (2021) indicate that the surface feature sizes (as measured by the distance between the surface indentations where more than 2 grains meet at a junction) increase rapidly when the growth temperature increases from 600° C. to 630° C. to 670° C. (from about 100 nm to 200 nm to 500 nm). The increasing grain size is likely related not only to the growth temperature, but also to the changing film stoichiometry. Indeed, a previous report showed that the grain size in NBT increases with an increasing Na/Bi ratio. This is consistent with the XPS results (FIG. 2*b* of Yun et al. (2021)) showing the increase of Na/Bi ratio with increasing growth temperature. FIG. 3*e* of Yun et al. (2021) shows a high-resolution cross-sectional transmission electron microscopy (TEM) image of the NBT film grown at 630° C., confirming a high-quality epitaxial NBT film on the Nb:STO substrate with a very smooth surface, uniform structure, and atomically sharp interface between the film and the substrate. The Fast Fourier Transform (FFT) diffraction patterns shown in FIG. 3*d* of Yun et al. (2021) confirm the high-quality epitaxial nature of the film. The STEM image in FIG. 3*f* of Yun et al. (2021) further illustrates the overall high film quality.

The above results clearly indicate that the growth temperature in our investigated region strongly influences the stoichiometry of the NBT films without any obvious structural change, except for improved film perfection and homogeneity for the growth at a lower temperature. This is opposite to most perovskite metal oxides which have improved film perfection with an increased growth temperature. The better film perfection at low growth temperatures is linked to the high volatilisation of Na and Bi at high temperatures. With increased growth temperature on the other hand, the volatility of these elements will lead to cation non-stoichiometry. The 600° C. (the lowest growth temperature in this work) films show the highest ON/OFF ratio with the best device uniformity. The minimum growth temperature of 600° C. that we tried in our work is within the optimum growth temperature (600-650° C.) reported in many works for PLD growth of NBT films (although one study reported a substrate temperature of 550° C., where they used a lower oxygen pressure during deposition).

Figure 4:
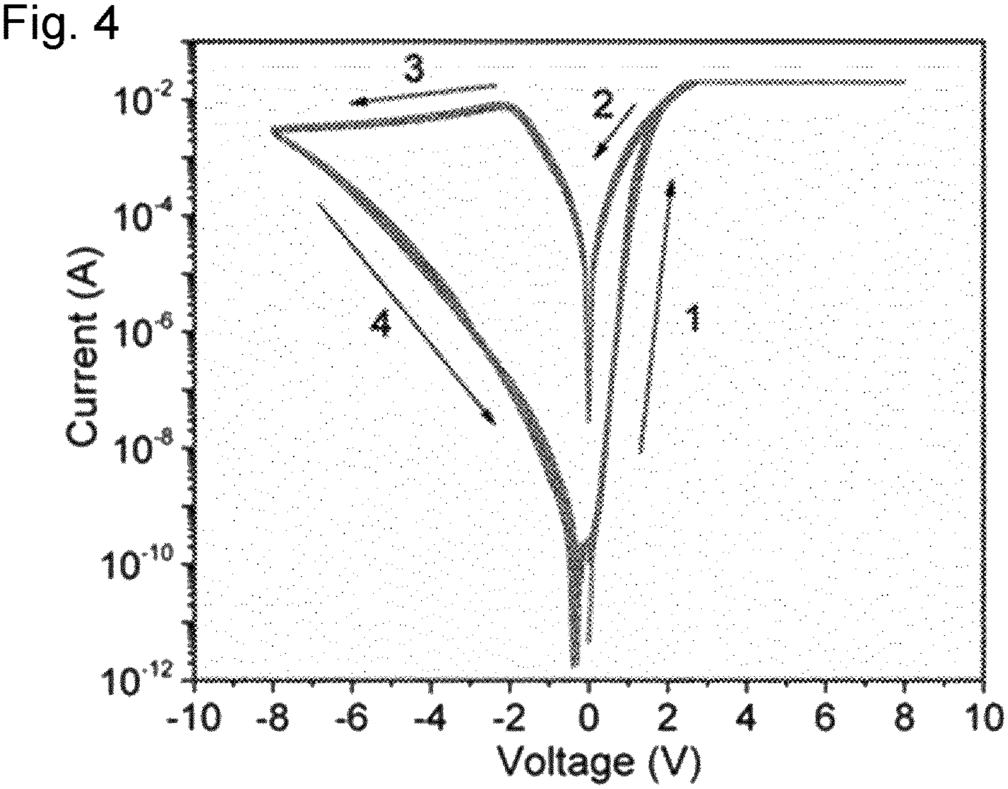
FIG. 4 shows an I-V curve for an NBT-based resistive switching memory device according to an embodiment of the invention. The film was grown at 400° C.

To gain a fundamental understanding of the optimisation of these two properties (ON/OFF ratio and uniformity), it is crucial to first understand the conduction mechanism and then its influence on the RS. Pt is a metal with a high work function (≥5.3 eV). NBT (with Bi loss) has been reported to be a partly compensated p-type semiconductor, while Nb:STO is a degenerately doped, highly conductive n-type semiconductor oxide due to its high carrier concentration of $10^{21}$ $cm^{-3}$. Considering the degenerate semiconductor Nb:STO to be a metal, the Pt/NBT/Nb:STO sandwich structure consists of two Schottky diodes connected to each other with two Schottky barriers. In the low-bias regime (−1 V to 1 V), the devices show forward rectification (FIG. S6 of the ESI of Yun et al. (2021)), which indicates that the bottom p-type NBT/metal Nb:STO interface has a larger and hence more dominant Schottky barrier height. Therefore, the RS behaviour of the device is mainly controlled by the NBT/Nb:STO interface with a simplified band diagram as illustrated in FIG. 4 of Yun et al. (2021). The depletion layer will be located mainly inside the NBT due to the very high carrier concentration of Nb:STO. Considering that the work function of Bi- or Ti-perovskite oxides are usually ≤4.7 eV while the work function of Nb:STO is around 4.2 eV, here the Schottky barrier height should be less than 0.5 eV.

Current conduction mechanisms in a metal/semiconductor Schottky contact include emission, tunnelling, and/or space-charge-limited conduction, each with a specified relationship between current density and voltage (electric field). We divide the obtained I-V curves into four segments:

1. HRS+: from 0 to +8 V
2. LRS+: from +8 to 0 V
3. LRS−: from 0 to −8 V
4. HRS−: from −8 to 0 V and fitted with different conduction models.

For memristor devices, we are most concerned with low bias regimes. We therefore consider sweeping up from 0 to 0.5 V in segment 1, sweeping down from 1 to 0 V in segment 2, and then sweeping up from 0 to −1 V in segment 3 (in FIG. S9*a* of the ESI of Yun et al. (2021)). A linear fit of log(l)~$V^{1/2}$ is obtained indicating that interface-limited Schottky emission controls the current conduction in the pristine state. Hence, the intrinsic conduction mechanism is controlled by injection of thermally activated carriers from the electrodes into the conduction band of NBT after overcoming the Schottky barrier by the applied electric field. This is shown in FIG. 4 Yun et al. (2021) and discussed below.

Having obtained information about the intrinsic conduction mechanism, we now aim to achieve a clearer picture of the RS process and by doing so, reveal the origin of the switching process and high ON/OFF ratios shown in FIG. 1 of Yun et al. (2021). As already mentioned, Bi vacancies in the NBT film will give rise to $V_o$, which is for reasons of charge compensation. The existence of mobile $V_o$ enables the high ionic conductivity in NBT. FIG. S10 of the ESI of Yun et al. (2021) shows the normalized ionic conductivity as a function of temperature for the NBT film grown at 600° C., where a typical Arrhenius-type behaviour is exhibited, indicating that the conductivity of the film is thermally activated with an activation energy $E_a$=0.51 eV, consistent with the $E_a$ of optimised ionic conductivity in NBT.

In the band diagram in FIG. 4*a* of Yun et al. (2021) in the un-biased state, for the NBT/Nb:STO junction there is a potential barrier for the majority carriers in NBT (holes) right at the interface between the semiconductor film (NBT) and the metallic substrate (Nb:STO). The barrier height can be reduced/increased by an external applied bias, resulting in high/low conduction current. $V_o$ accumulate and/or are depleted near the NBT/Nb:STO interface under an external field. To explain the RS mechanism and the influence of the growth temperature, we consider the migration of mobile $V_o$ near and away from the NBT/Nb:STO interface for controlling the Schottky barrier height and hence the overall $R_{LRS}$.

With a positive bias applied to the Pt top electrode (and the Nb:STO grounded), positively charged Vo in the NBT drift to and accumulate near the NBT/Nb:STO interface, forming a highly positive charge region (FIG. 4*b* of Yun et al. (2021)). A negatively charged region is also formed on the Nb:STO side at the same time due to the accumulation of $O^{2-}$ ions. The increase in Vo concentration near the interface under positive bias, which results in a modified band structure, can further reduce the Schottky barrier height/width. This will thus result in a high electronic conduction current and a low $R_{LRS}$. Here, $R_{LRS}$ is highly dependent on the film growth temperature since the concentration of mobile $V_o$ will change with the film composition. A small amount of Bi deficiency (x of about −0.01) gives a high $V_o$ concentration (consistent with the NBT film grown at 600° C.). As already mentioned, as the growth temperature increases, the Bi vacancy ($V_{Bi}$) concentration increases (FIG. 2 of Yun et al. (2021)). At the same time, the amount of $V_o$–$V_{Bi}$ defect association will increase, leading to a reduction in mobile $V_o$. This means there will be less migration of $V_o$ to and away from the electrodes, and thus a less effective lowering of the barrier height/width. This then explains why $R_{LRS}$ increases as the film growth temperature increases, and consequently, the ON/OFF ratio decreases.

When the positive SET bias is switched off, the LRS is maintained (FIG. 1*b* of Yun et al. (2021)), indicating that the $V_o$ concentration near the interface remains high. When a negative bias is applied, the $V_o$ concentration near the interface is reduced. This Vo depletion near the NBT/Nb:STO interface causes an increase in the Schottky barrier height/width, which leads to a much lower conduction current under negative bias, driving the memory cell to the HRS (FIG. 4*c* of Yun et al. (2021)).

As shown in FIG. 4*b* of Yun et al. (2021), $R_{LRS}$ is lower for the 600° C. sample, where the Vo concentration at the interface is higher than for the 670° C. sample (ii), while $R_{HRS}$ is almost the same for the NBT films grown at different temperatures (FIG. 4*c* of Yun et al. (2021)) because under negative bias, the $V_o$ are fully depleted from the interface (regardless of the initial $V_o$ concentration, i.e., high for the 600° C. sample) (i) and low for the 670° C. sample (ii). Hence, the ON/OFF ratio will be controlled only by the $R_{LRS}$ in our system, which depends highly on the mobile $V_o$ concentration.

The larger hysteresis of the I-V curves of FIG. 1*b* of Yun et al. (2021) under negative bias compared with positive bias can be explained by the different influences of the SET and RESET processes on $V_o$ concentration: under a positive bias, $V_o$ contributes to the shrinkage of the depletion layer width which dominates the current conduction. After the SET process, the current drop generates a small hysteresis due to the remaining accumulation of the $V_o$ near the NBT/Nb:STO interface. On the other hand, under negative bias after the RESET process, the $V_o$ are fully depleted and hence the $V_o$ cannot modulate the depletion layer width and so the change in the Schottky barrier height takes over to dominate the current conduction. Hence, the resistive behaviour will be quite different compared with the positive bias region. Also, the whole system should now become quite insulating due to the depletion of $V_o$ which is reflected by the self-compliance or deep RESET of the current (with nearly negative differential current d//dV on the negative side of FIG. 1*b* of Yun et al. (2021) at 600° C.). Thus, the current will drop dramatically when the negative bias is decreasing, generating a larger hysteresis.

To prove the role of a Schottky barrier height on the RS behaviour, from FIG. S10 of the ESI of Yun et al. (2021) and with relevant parameters listed in Table S1 of the ESI of Yun et al. (2021), we study the zero-bias barrier heights at different resistance states. The zero-bias Schottky barrier height in the initial state or HRS ($e\varphi_{B0H}$) has almost the same value regardless of growth temperature of the film, while the non-bias Schottky barrier height in the LRS ($e\varphi_{B0L}$) decreases with decreasing growth temperature and is closely linked with $R_{LRS}$. These results are consistent with $R_{HRS}$ ($V_o$-depleted-state near the NBT/Nb:STO interface) being high and almost constant with growth temperature and $R_{LRS}$ ($V_o$ accumulated after the SET process) decreasing with decreasing growth temperature when a higher concentration of mobile $V_o$ accumulate near the NBT/Nb:STO interface at positive bias, causing a lower Schottky barrier height.

Accordingly, in Yun et al. (2021), single-phase epitaxial ionic $Na_{0.5}Bi_{0.5}TiO_3$ (NBT) films grown under different conditions were used to demonstrate that a high $V_o$ concentration and a low-level electronic conduction are critical features for forming-free memristors with a high ON/OFF ratio, stable switching, and good endurance/retention via interfacial Schottky barrier-controlled switching. This materials system is unique among perovskites in that low growth temperatures can be used to grow very thin films with high homogeneity, high uniformity and low leakage. This is very different to other widely studied perovskites for memristors. Since NBT can be grown by a variety of physical vapour deposition processes at relatively low temperatures, this makes it a promising, industry-relevant materials system for memristors and neuromorphic computing applications.

Further studies carried out in the inventors' research group have considered the effect of growing the thin film of ionic conducting material layer at significantly lower temperatures than contemplated in Yun et al. (2021). We first briefly explain the work and its significance before setting out further details that are intended to be placed in contrast with the work reported in Yun et al. (2021).

An aim of the embodiments discussed below is to realize a high-performance ultralow power non-volatile memory (NVM) technology for memory storage and neuromorphic computing applications. An ionic conducting material which is a very poor semiconductor is used as the main switching layer. The switching layer contains predominantly oxygen vacancies with a much more minor fraction of electronic (electrons or holes) carriers. Furthermore, this switching later layer should be grown either above or below a semiconductor layer with higher carrier concentration than the switching layer. On top and bottom of the film stack, metallic contacts are applied to act as top electrode and bottom electrode. Highly controllable, homogeneous, and stable resistive switching performance is achieved.

In the new work, various compositions of ionic thin films (with some level of electronic conduction) were investigated, specifically YSZ, NBT, doped $HfO_2$, $WO_3$. These were deposited at low temperature (<400° C. and at lower temperatures, down to room temperature). These films show strong resistive switching performance (endurance, optionally electroforming-free, high on/off ratio (up to $10^5$), high uniformity retention) for memory storage applications as well for neuromorphic computing applications. These are very large and growing fields where there are materials limitations preventing their widespread implementation.

The ionic conducting materials mentioned above have a well-defined concentration of oxygen vacancies controlled by aliovalent ion doping. They are typically nanocrystalline in form (hence not highly crystalline), or amorphous. In other embodiments, they may be amorphous. As explained above, they are non-epitaxial in the embodiments of the invention.

The oxygen vacancies can be accumulated or depleted at the metal/ionic material interface, and they tune the Schottky barrier present there. Charge trapping-detrapping effects can also play a role in controlling the switching at the interface and the vacancy defects can act as traps. The nanocrystalline nature of the material can also lead to traps.

The interface-controlled mechanism brought about by the ionic conducting materials offers a superior advantage over purely filament-based resistive switching memory devices in terms of better reliability, potential scalability, and lower currents (hence less power requirement). The use of controlled oxygen vacancies in the ionic conducting material is advantageous to traditional transition metal-oxide material in which variable oxygen valence is normally present.

We are living in an unprecedented big data era, where artificial intelligences are shaping and will continue to shape the way we live, and in the meantime are providing new solutions for different applications spanning transport, medicine, security, entertainment, neuromorphic computing, all of which will evolve significantly over the next decade. To meet the requirement of a wide range of diverse and hugely growing data-centric technologies, the hardware support to realize high-performance, ultralow power non-volatile memory (NVM) technology faces great demands. NVM is also essential for strongly improving the efficiency of energy-hungry data centres where memory accounts for a large fraction of the overall power usage.

Resistive switching memory, an outstanding class of NVM, has excelled in the past two decades by demonstrating the most promising potential for the above-mentioned applications. The difficulties with filament-based devices which require an initial electroforming process have already been discussed. An alternative approach is to use an interface-controlled mechanism based on transition metal oxides. The transition metal oxides normally have complex cation redox processes, which lead to difficulties for the electron concentration control upon electric field cycling, leading to non-uniformity issues of the resistance states.

In some embodiments, a high performance resistive switching memory device incorporates the following features.

An ionic conducting material (OM) deposited at a low temperature (typically at or below 400° C.) is the key active layer in the resistive switching device for memory storage as well as neuromorphic computing applications. Such OM materials are poor semiconductors containing predominantly oxygen or cation vacancies with a much more minor or insignificant fraction of electron or hole carriers. The active layer may have dopant-controlled oxygen vacancies by aliovalent ion doping. Controlling the oxygen pressure and other deposition parameters during or after the film growth may assist with control over the oxygen vacancies.

The oxide semiconductor (OS) layer adjacent to the OM layer should have a higher electronic carrier concentration than the active layer.

Suitable materials for the active layer include (but are not necessarily limited to) aliovalent-ion-doped $HfO_2$, aliovalent-ion-doped $ZrO_2$ (e.g., the well-known ionic conductor, YSZ), indium gallium zinc oxide (IGZO), sodium bismuth titanate (NBT), aliovalent-ion-doped $SiO_2$, and other mixed ionic electronic conductors or electronically insulating ionic conducting materials.

In the device, the combination of OM and OS layers, together with appropriate electrodes, can result in precise and homogenous interface-controlled resistive switching. The interface barrier at the OM/metal electrode interface can also play a role in interface switching, as is already well studied.

The OS layer can either be grown purposely as this functioning layer or it can be formed at the interface between the OM layer and another layer grown under it or over it which is not an oxide or even a semiconductor, e.g., metallic TiN.

The use of controlled oxygen vacancies in the OM layer is advantageous to standard transition metal oxide materials in which variable oxygen valences are typically present and then it is hard to control the electronic concentrations owing to redox processes.

The low growth temperature of the OM layer is considered to be important for controlling the oxygen vacancy mobility for achieving the right balance of device switching time and retention and it is considered to be important to control the structural properties of the material, e.g. to what degree it is amorphous or nanocrystalline. The ionic mobility should be low enough so that the retention is high enough but not too low so that the switching speed is too slow.

Figure 2:
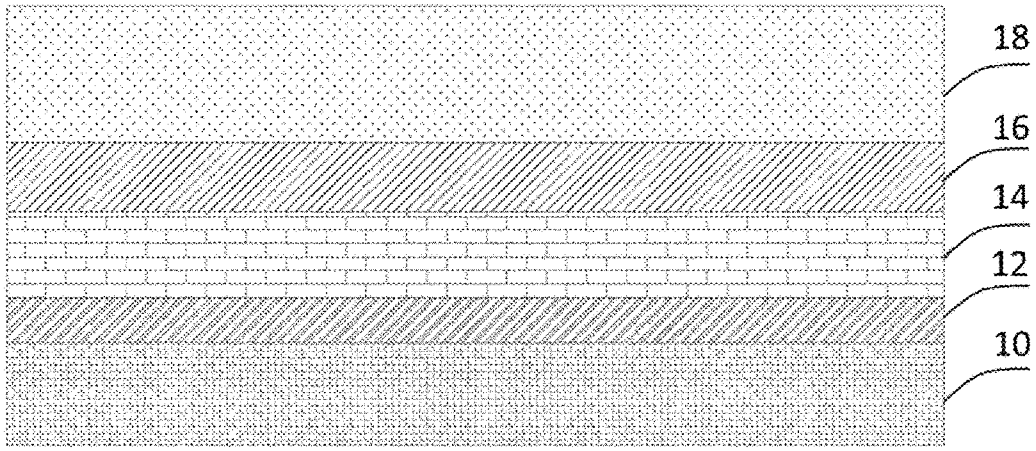
Figure 3:
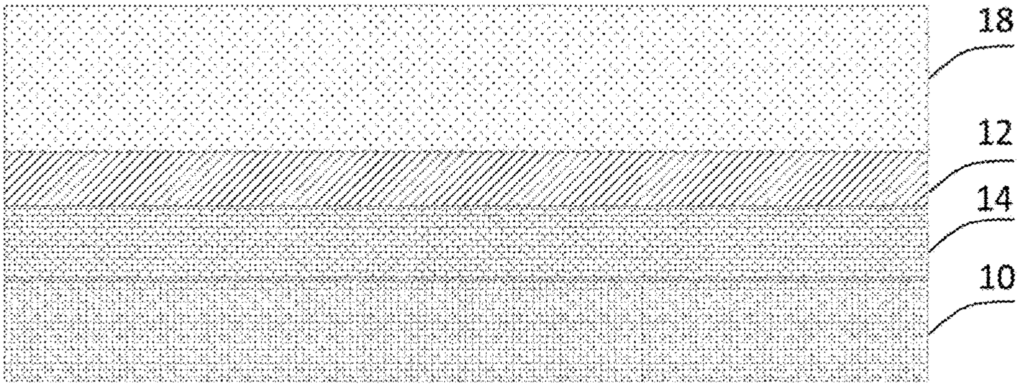

FIGS. 1-3 show schematic cross sectional views through RS devices according to embodiments of the invention.

In FIG. 1, the device comprises a bottom electrode 10, a first oxide semiconductor (OS) layer 12, an ionic conducting oxide (OM) layer 14 and a top electrode 18.

The device of FIG. 2 corresponds to the device of FIG. 1 except that additionally, a second oxide semiconductor (OS) layer 18 is interposed between the ionic conducting oxide (OM) layer 14 and the top electrode 18.

The device of FIG. 3 corresponds to the device of FIG. 1 except that the first oxide semiconductor (OS) layer 12 is interposed between the ionic conducting oxide (OM) layer 14 and the top electrode 18 rather than between the bottom electrode 10 and the ionic conducting oxide (OM) layer 14. The effect of this is that the ionic conducting oxide (OM) layer 14 is formed directly on the bottom electrode 10.

We have developed reliable and superior resistive switching performance with the proposed concepts. In one embodiment, sodium-bismuth-titanate-based (NBT-based) devices developed in our lab demonstrated robust and promising performance (as discussed below with reference to FIGS. 4-7) including resistive switching with an on/off ratio of $>10^5$, switching speed of <20 ns, a high endurance of $>10^7$ cycles, more than 32 distinct resistance levels with sufficient retention for each state (5 bit). All the devices have been scaled down to <10 μm (for device electrodes) while demonstrating reliable and similar performance.

FIG. 4 shows an I-V curve for an NBT-based resistive switching memory device according to an embodiment of the invention. The film was grown at 400° C.

Figure 5:
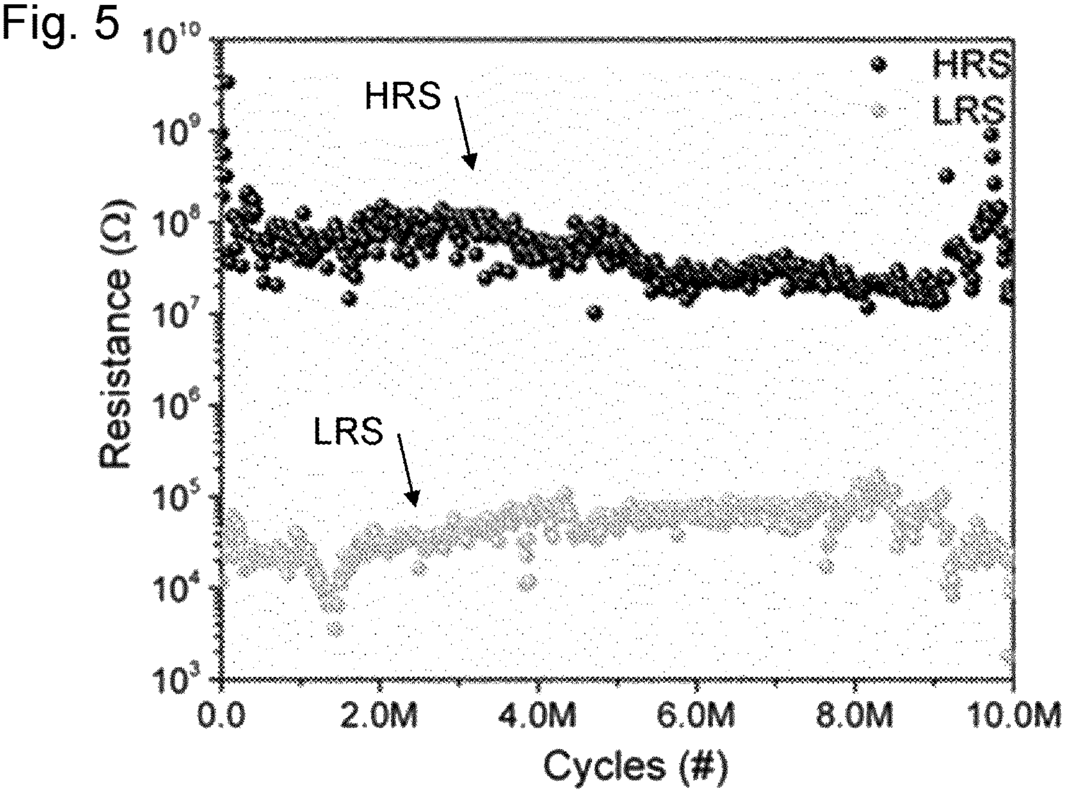
FIG. 5 shows the results of endurance testing for the device tested in FIG. 4.

FIG. 5 shows the results of endurance testing for the device tested in FIG. 4. This shows that the device could be switched between resistance states for more than $10^7$ cycles.

Figure 6:
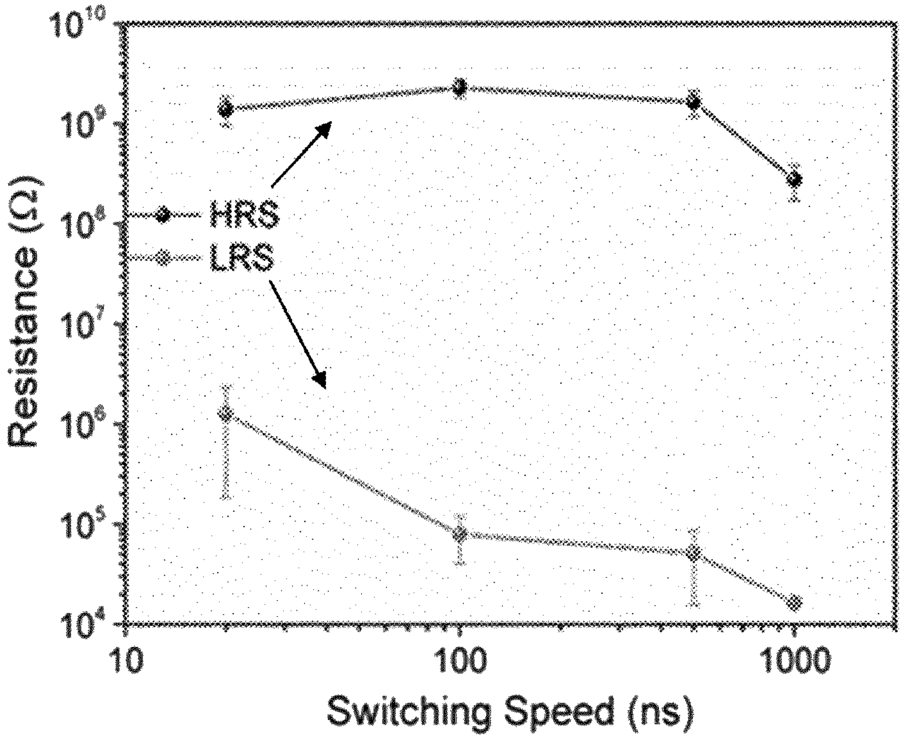
FIG. 6 shows the switching speeds for the device tested in FIG. 4.

FIG. 6 shows switching speeds for the device tested in FIG. 4. Switching speeds were measured down to 20 ns. The device can be programmed by a single pulse which is even faster than 20 ns while maintaining an ON/OFF ratio of 3 orders of magnitude.

Figure 7:
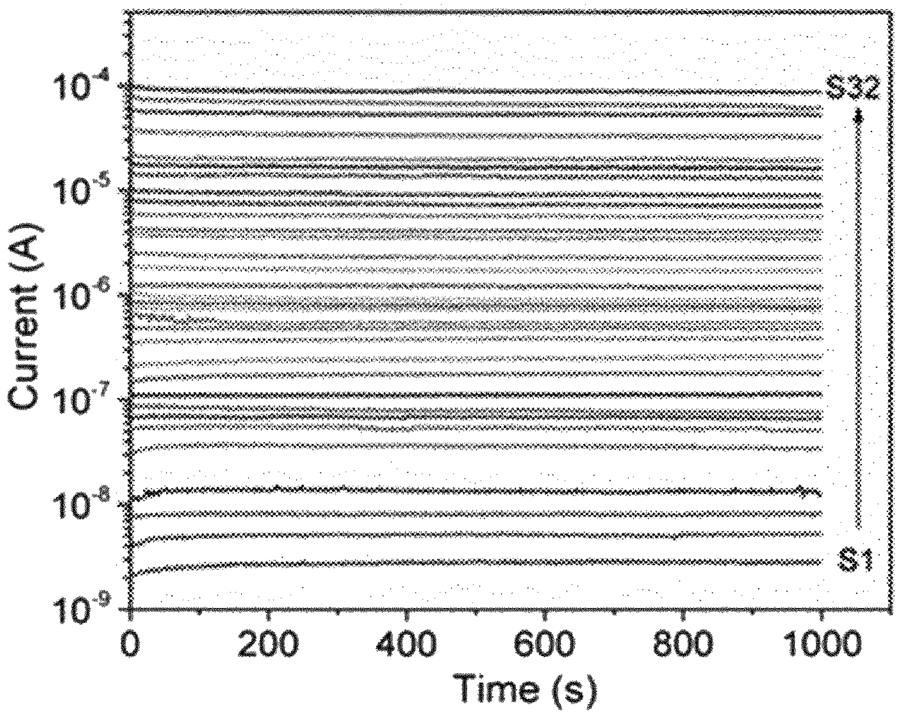
FIG. 7 shows the possibility of providing up to 32 distinguishable resistance states with long retention for each state of 1000 s. In the original drawing the lines are in colour but the colour only served to show that the lines are different. As can be seen from FIG. 7, the lines indicate that distinguishable resistance states can be provided.

FIG. 7 shows the possibility of providing up to 32 distinguishable resistance states with a long retention for each state of 1000 s. In the original drawing the lines are in colour but the colour only served to show that the lines are different. As can be seen from FIG. 7, the lines indicate that distinguishable resistance states can be provided with a retention of at least 1000 s for each state.

In another embodiment, yttrium-stabilized $ZrO_2$ (YSZ) based devices demonstrate reliable, uniform performance including forming-free resistive switching with an ON/OFF ratio of about $10^4$ for $>10^6$ cycles and maintaining the resistance states for $>10^7$ s (more than 4 months).

Figure 8:
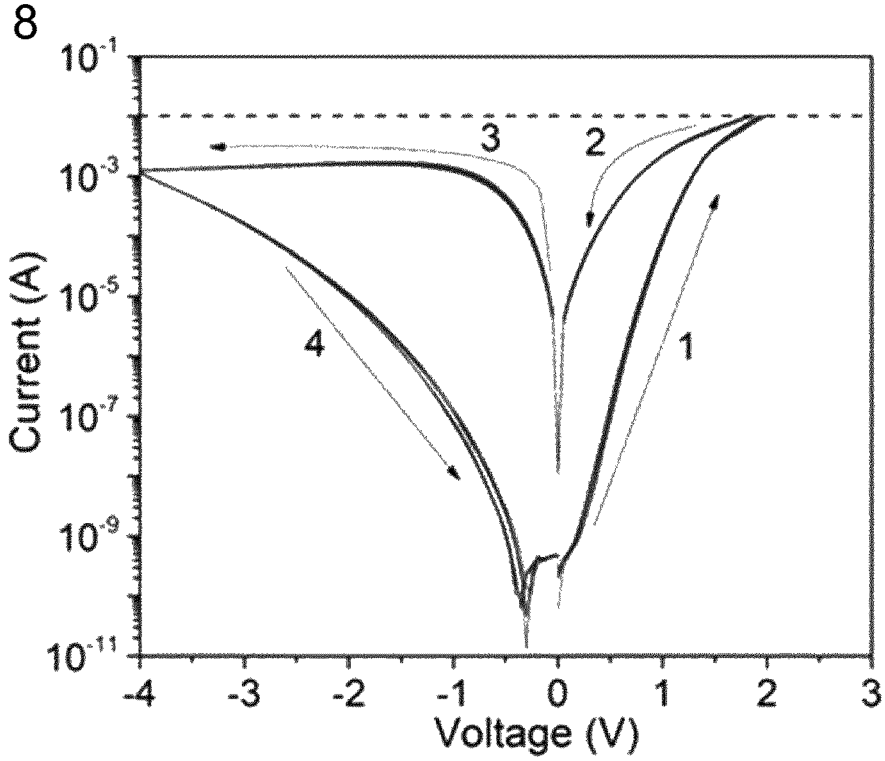
FIG. 8 shows an I-V curve for a YSZ-based resistive switching memory device according to an embodiment of the invention. The film was grown at 400° C.

FIG. 8 shows an I-V curve for a YSZ-based resistive switching memory device according to an embodiment of the invention. The film was grown at 400° C.

Figure 9:
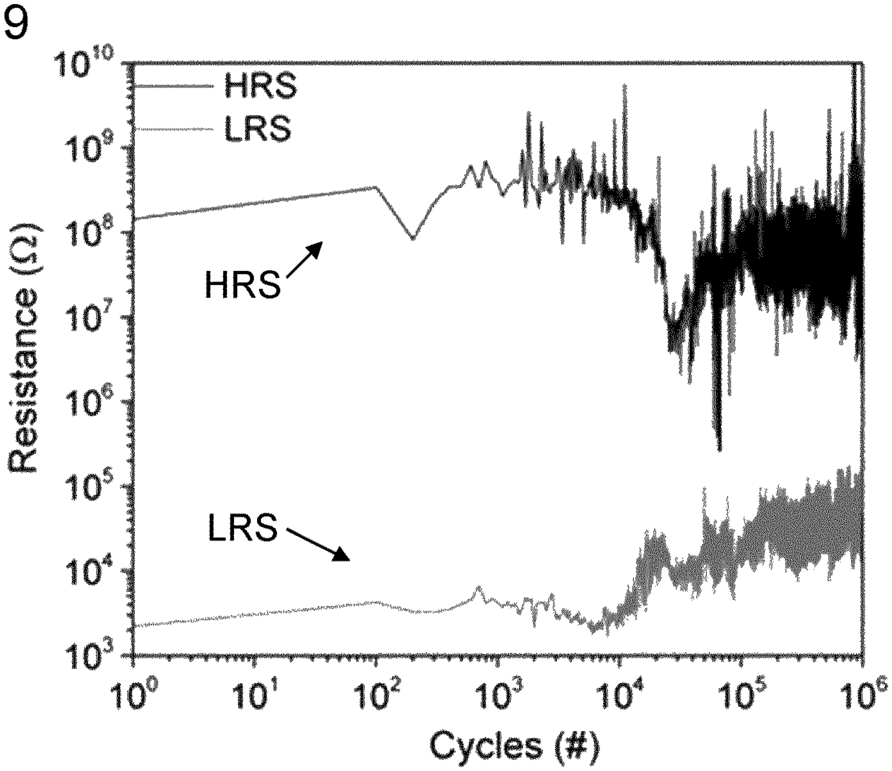
FIG. 9 shows the results of endurance testing for the device tested in FIG. 8.

FIG. 9 shows the results of endurance testing for the device tested in FIG. 8. This shows that the device could be switched between resistance states for more than $10^6$ cycles.

Figure 10:
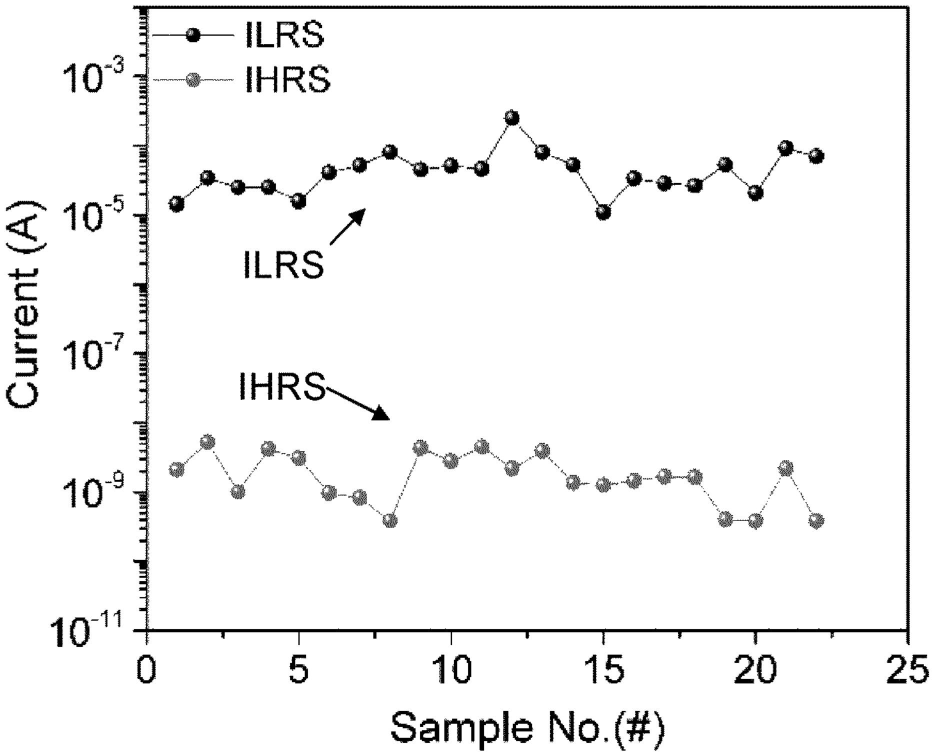
FIG. 10 demonstrates the uniformity of more than 20 YSZ-based devices, similar to the device tested in FIG. 8.

FIG. 10 demonstrates the uniformity of more than 20 YSZ-based devices, similar to the device tested in FIG. 8.

Figure 11:
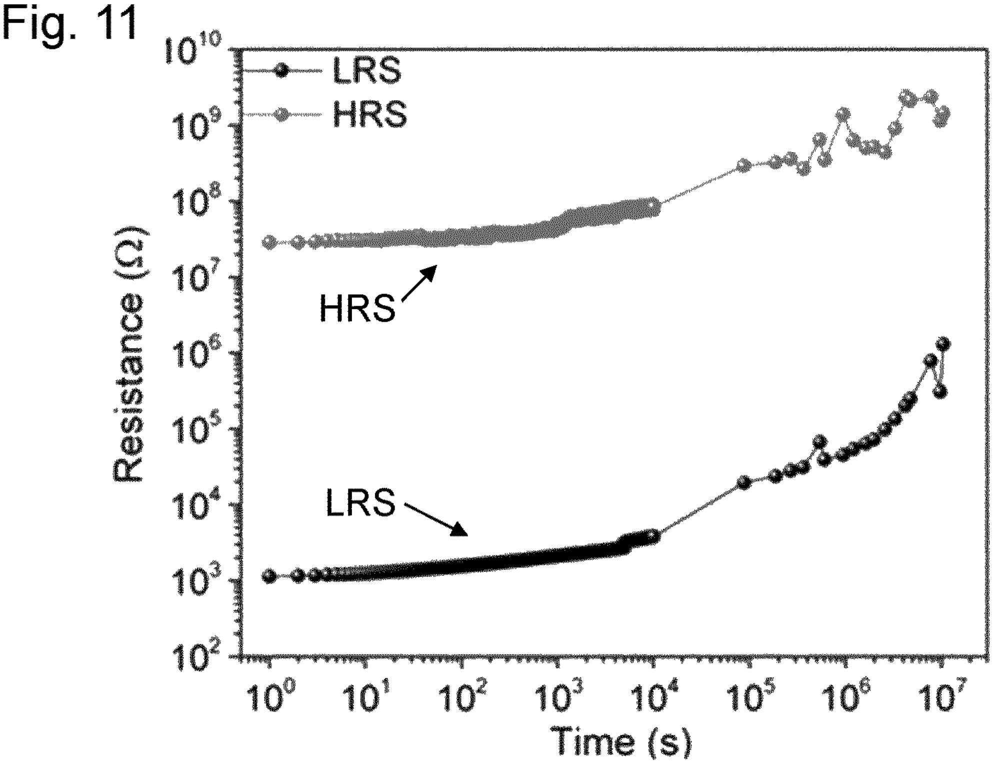
FIG. 11 shows the retention for HRS and LRS for the device tested in FIG. 8.

FIG. 11 shows the retention for HRS and LRS for the device tested in FIG. 8. This shows that the device retained a suitable ON/OFF ratio for more than $10^7$ s.

In the embodiments reported here, the method of depositing the thin film layers in the stack has been pulsed laser deposition. However, other deposition methods can be used including other physical vapor deposition methods, such as magnetron sputtering, e-beam evaporation, etc. with suitable control of the deposition parameters such as source power and oxygen partial pressure in order to obtain comparable device performance.

The active layer in the embodiments is deposited at 400° C. The crystalline properties of the active layer has been assessed using regular XRD and grazing incidence XRD (GIXRD).

Figure 12:
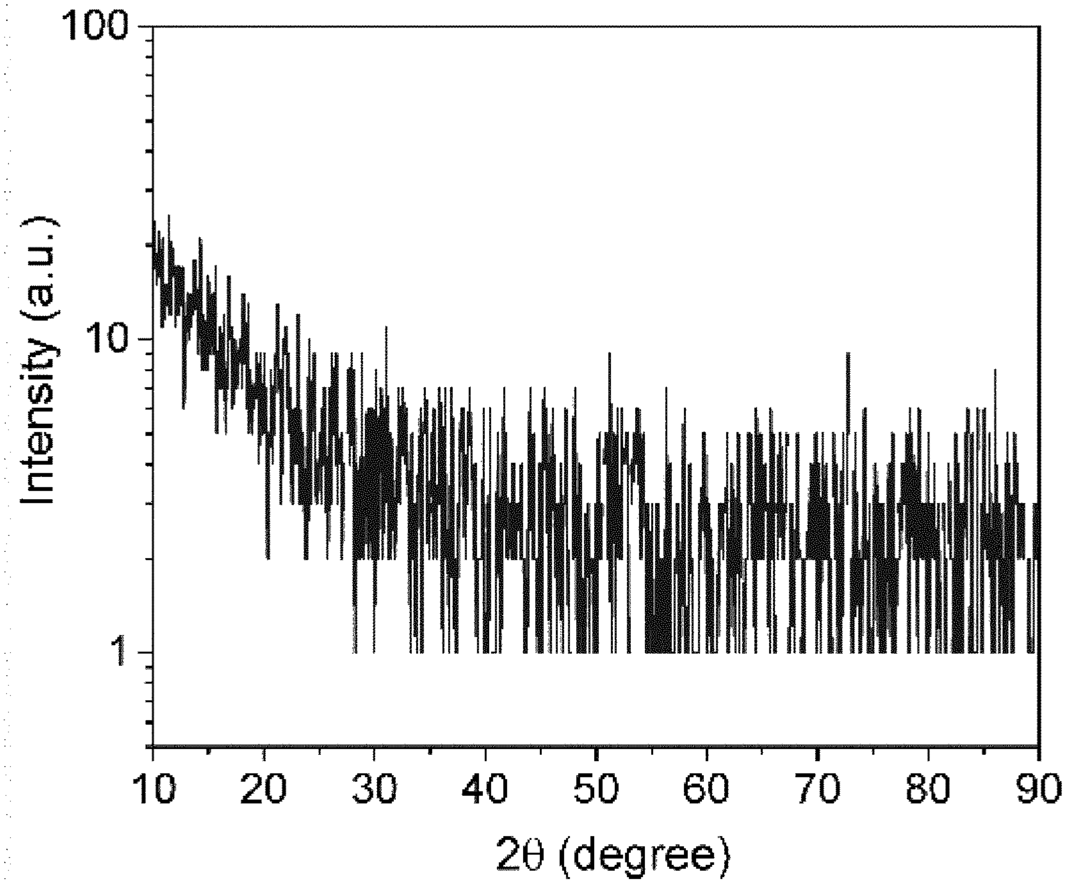
FIG. 12 shows a GIXRD scan for a YSZ active layer deposited at 400° C. on a single crystal Nb:STO substrate.

FIG. 12 shows a GIXRD scan for a YSZ active layer deposited at 400° C. on a single crystal Nb:STO substrate.

Figure 13:
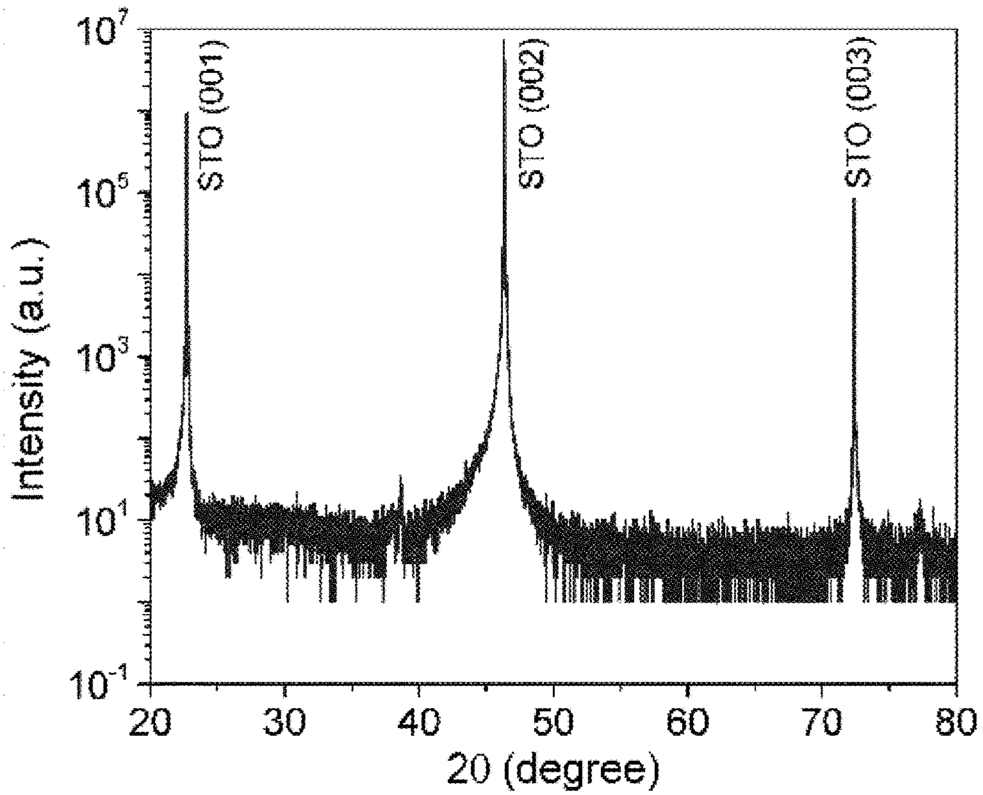
FIG. 13 shows a regular XRD scan for an NBT active layer deposited at 400° C. on a singe crystal Nb:STO substrate.
Figure 14:
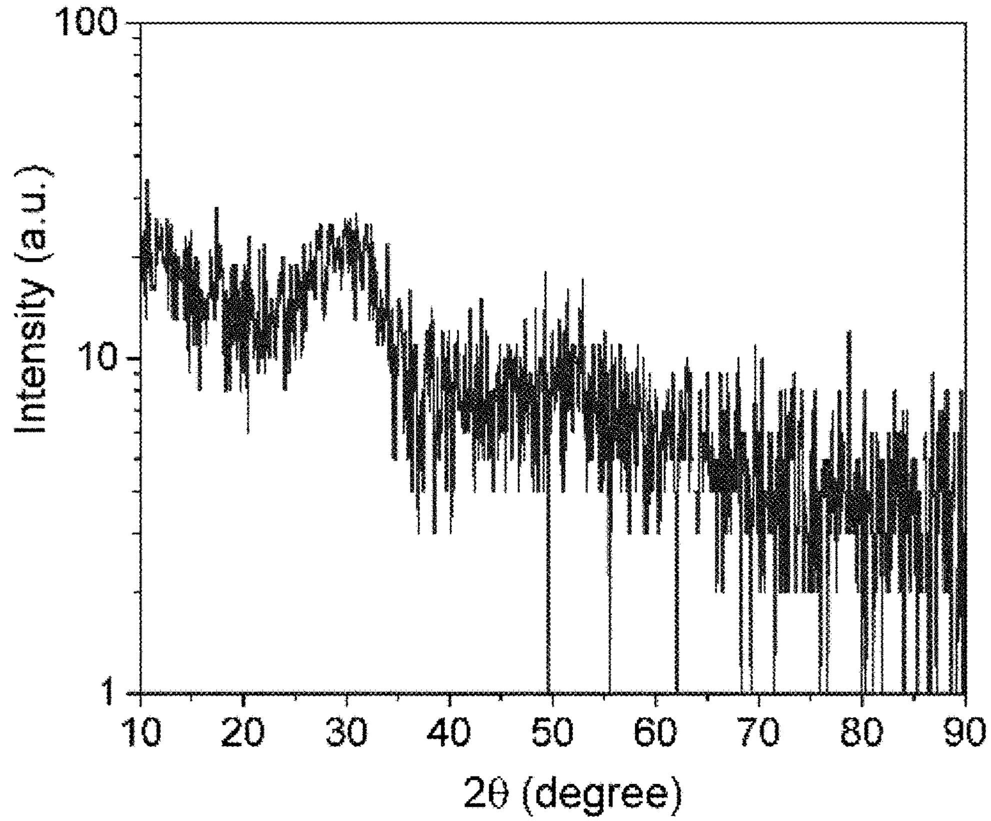
FIG. 14 shows a GIXRD scan for the NBT active layer of FIG. 13.

FIG. 13 shows a regular XRD scan for an NBT active layer deposited at 400° C. on a single crystal Nb:STO substrate. FIG. 14 shows a GIXRD scan for the NBT active layer deposited at 400° C. on the singe crystal Nb:STO substrate.

Considering FIGS. 12 and 14, these scans provide confirmation that the active layers (thickness about 20 nm) are not epitaxial with the Nb:STO substrate. For films of this thickness, if films are epitaxial we would see a series of aligned film peaks. For FIG. 14, we see some broad low intensity peaks, characteristic of poorly crystalline and/or very finely crystalline material.

Figure 15:
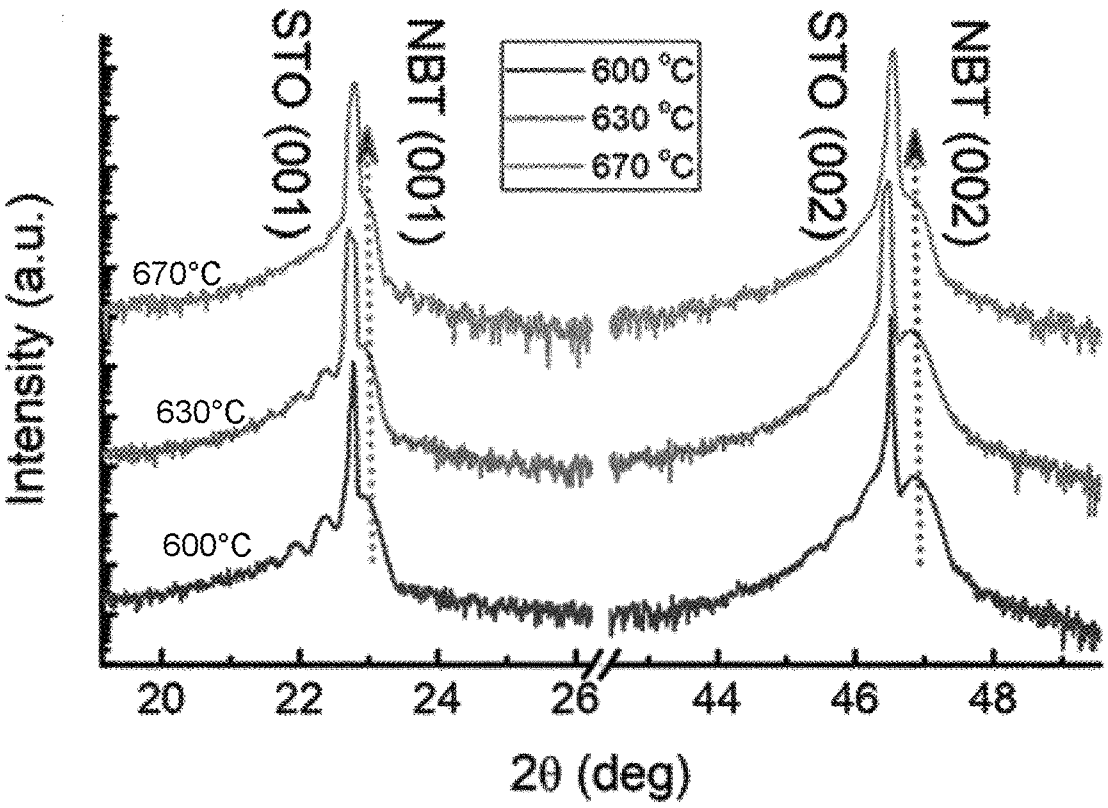
FIG. 15 is taken from Yun et al. (2021) and is identical to FIG. 3(*a*) of Yun et al. (2021), showing regular XRD scans for NBT active layers deposited on single crystal Nb:STO substrates at temperatures of 600, 630, and 670° C.

FIG. 13 in particular can be contrasted with FIG. 15, which is taken from Yun et al. (2021) and is identical to FIG. 3(*a*) of Yun et al. (2021). In FIG. 13, only STO (00I) peaks are observed, in view of the substrate being a single crystal with (001) orientation. Corresponding STO (00I) peaks are seen in FIG. 15 but also seen are NBT (00I) peaks, indicative of epitaxial single crystal NBT formed on the STO substrate at the growth temperatures of 600, 630 and 670° C. used in Yun et al. (2021).

We consider next further details reported in Yun et al. (2021) related to the epitaxial nature of the NBT active layer.

Figure 16:
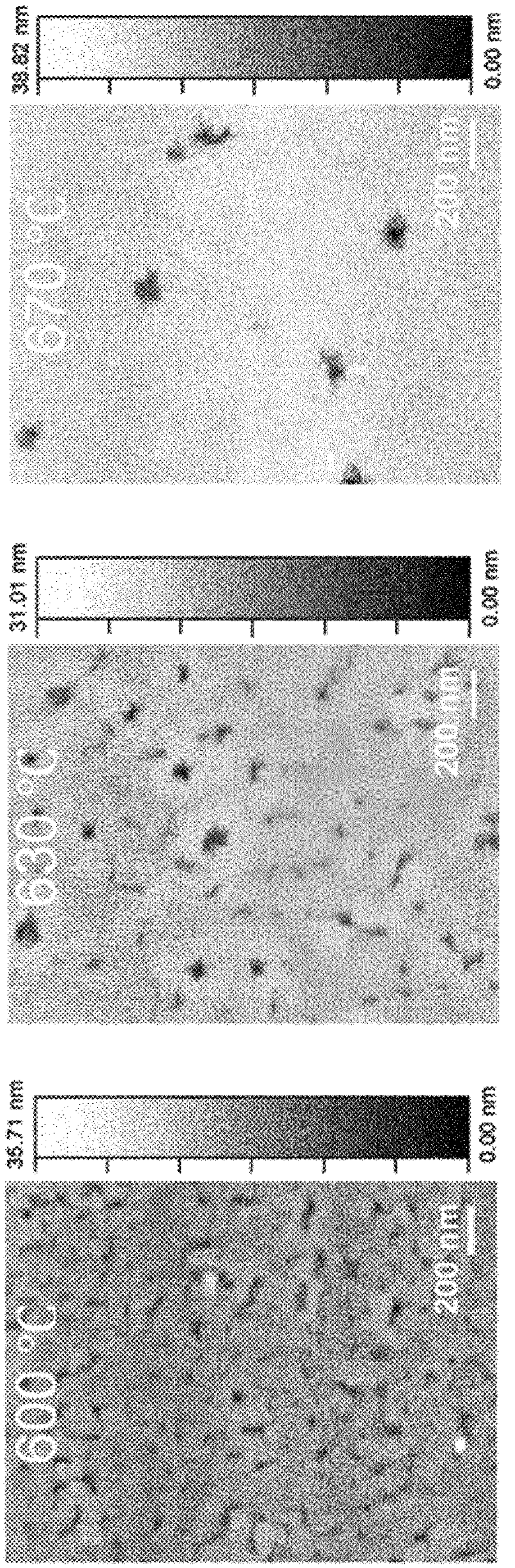
FIG. 16 is taken from Yun et al. (2021) and is identical to FIG. 3(*c*) of Yun et al. (2021).

FIG. 16 is taken from Yun et al. (2021) and is identical to FIG. 3(*c*) of Yun et al. (2021). FIG. 16 shows AFM images of the surface of the NBT film grown on Nb:STO single crystal substrates at deposition temperatures of 600, 630 and 670° C. Later, in the context of discussing FIGS. 26 to 28, it will become evident that AFM scans of the OM layers according to some embodiments of the present invention differ from FIG. 16.

Figure 17:
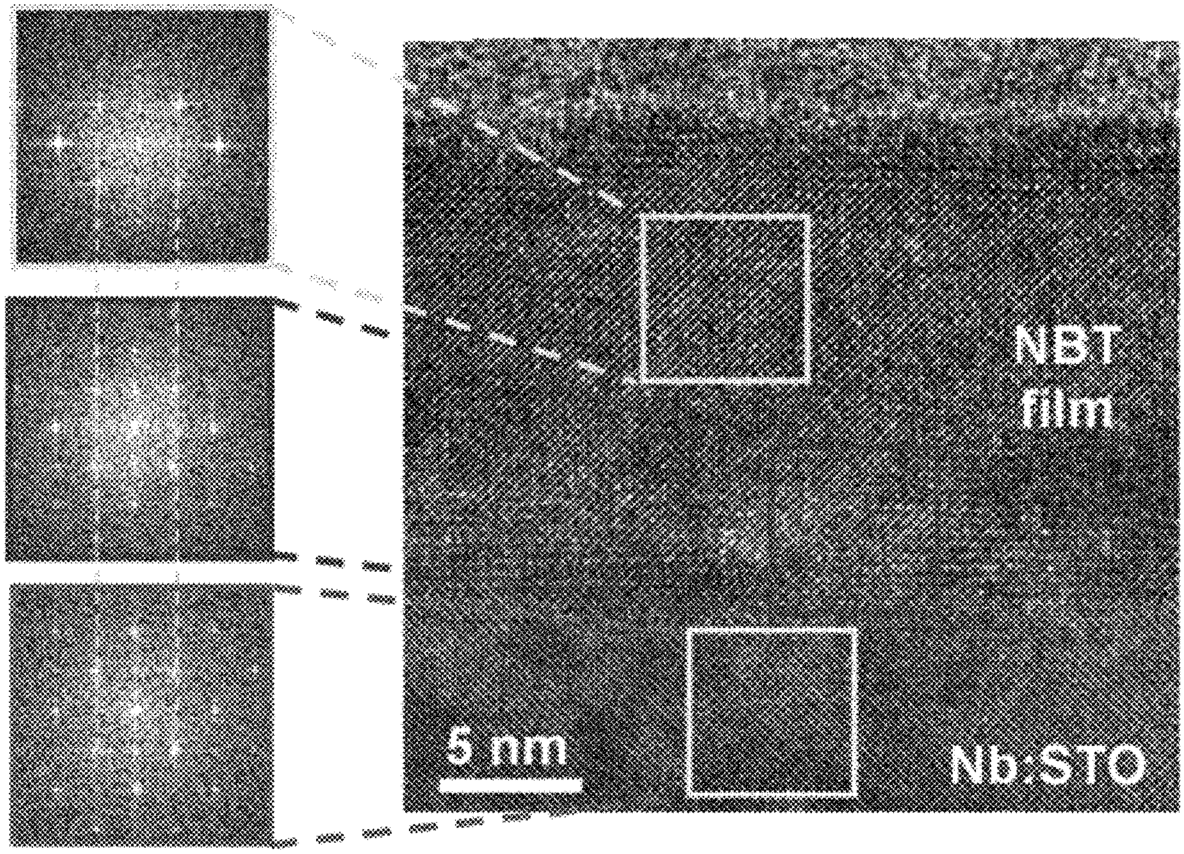
FIG. 17 is taken from Yun et al. (2021) and is identical to FIGS. 3(*d*) and 3(*e*) of Yun et al. (2021).

FIG. 17 is taken from Yun et al. (2021) and is identical to FIGS. 3(*d*) and 3(*e*) of Yun et al. (2021). FIG. 17 shows a cross sectional TEM image for an NBT film grown on an Nb:STO single crystal substrate at a deposition temperature of 630° C. The indicated parts of the sample were used to take Fast Fourier Transform (FFT) images. These results indicate good epitaxy between the NBT film and the Nb:STO single crystal substrate.

Figure 18:
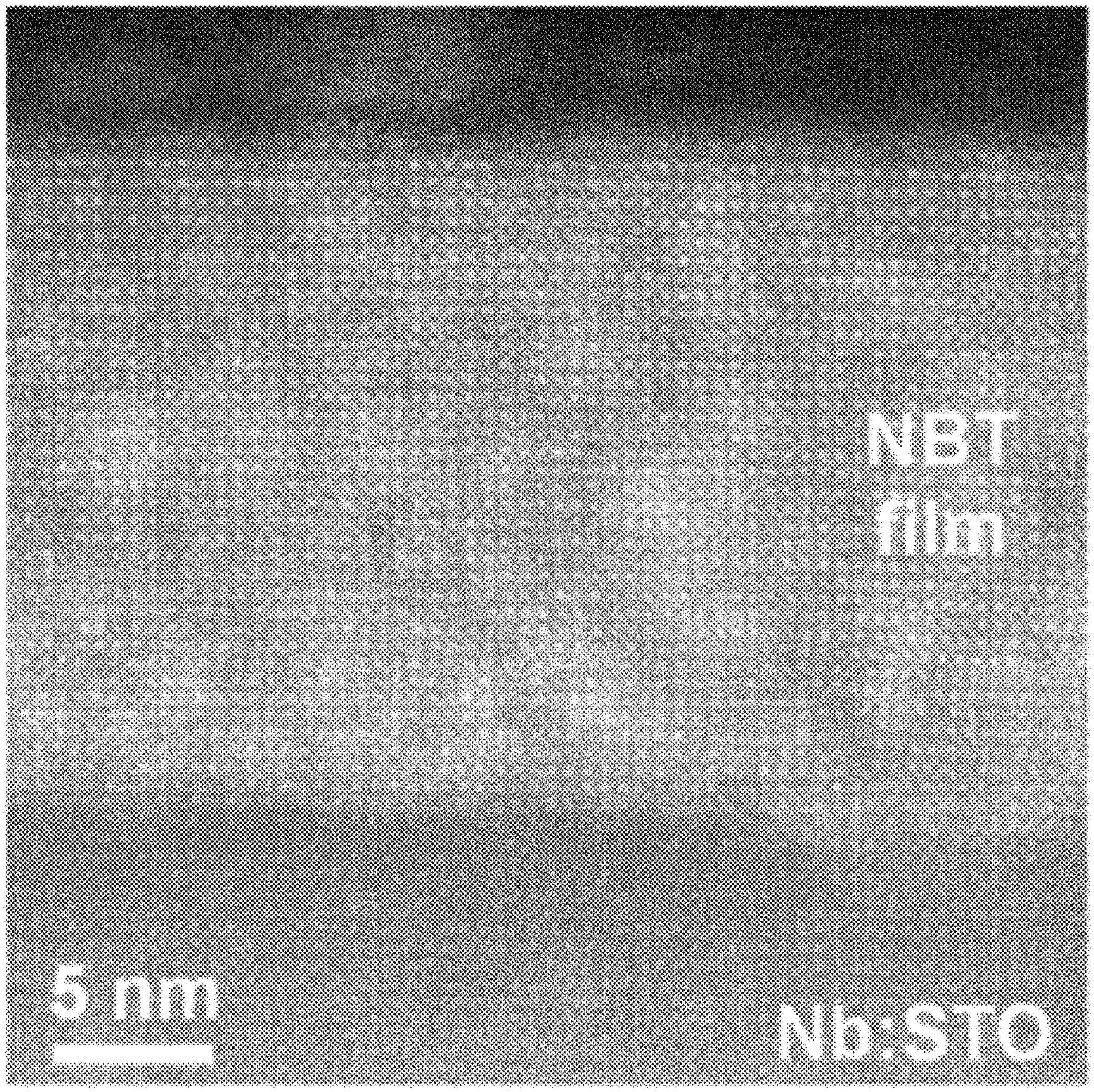
FIG. 18 is taken from Yun et al. (2021) and is identical to FIG. 3(*f*) of Yun et al. (2021).

FIG. 18 is taken from Yun et al. (2021) and is identical to FIG. 3(*f*) of Yun et al. (2021). FIG. 18 shows an STEM image of the NBT film of FIG. 17.

The results reproduced from Yun et al. (2021) show the epitaxy between the NBT active layer and the Nb:STO single crystal substrate. On the basis of FIGS. 13 and 14 compared with the results reproduced form Yun et al. (2021), it is clear that the deposition temperature of 400° C. of the same NBT composition onto an identical (00I) Nb:STO single crystal substrate leads to an NBT layer which is not epitaxial. FIG. 14 suggests that the NBT layer may be nanocrystalline or possibly amorphous.

Similarly, FIG. 12 suggests that the YSZ layer is not epitaxial.

Later, TEM and FFT results discussed in the context of FIG. 44, will provide further evidence that the OM layers produced according to the embodiments of the present invention are indeed not epitaxial with the Nb:STO substrate.

Figure 19:
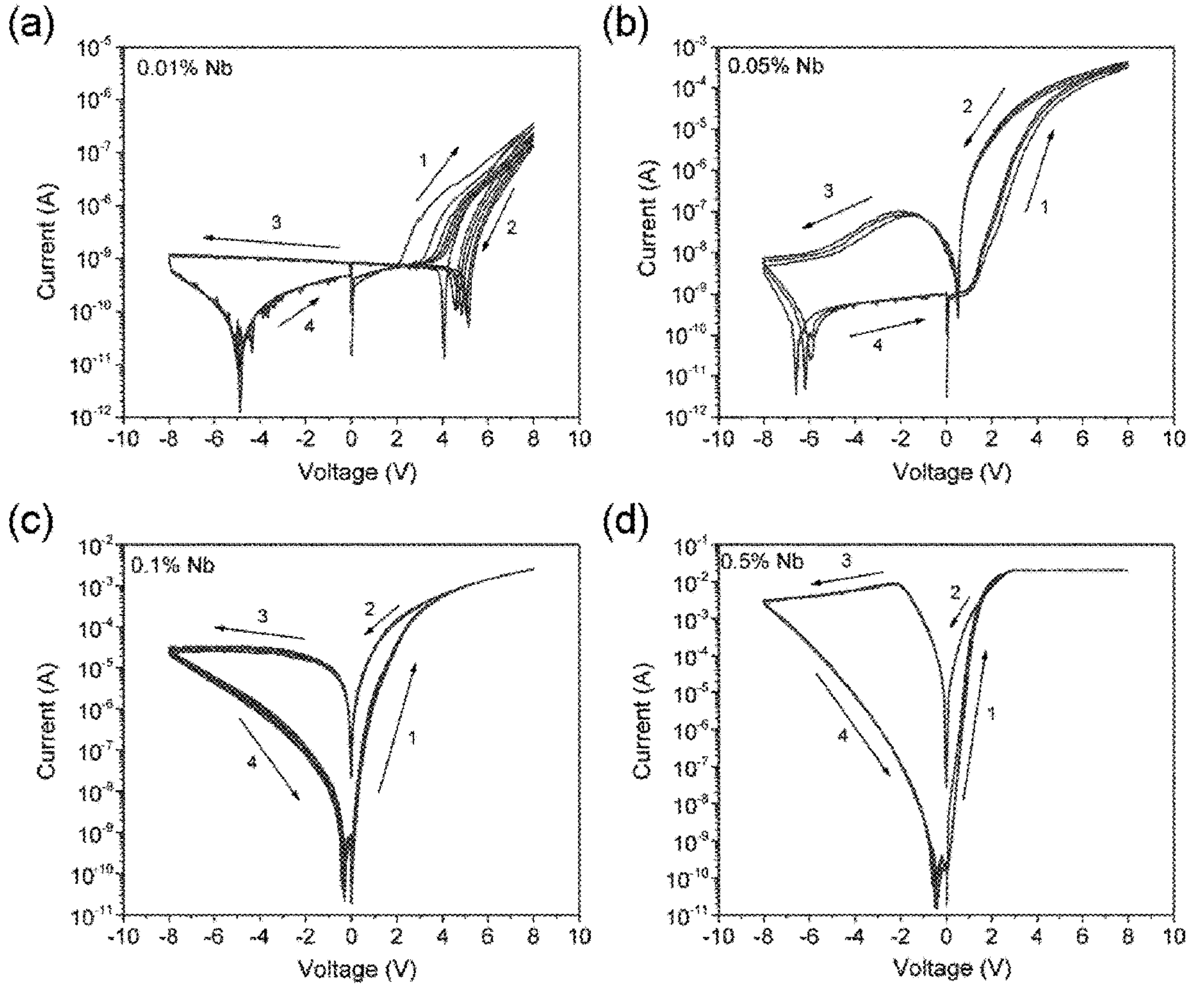
FIG. 19 shows the effect of different dopant concentrations of Nb in the Nb:STO substrate on NBT device performance. Graphs (a-d) show representative I-V curves for different Nb dopant concentrations (0.01% Nb, 0.05% Nb, 0.1% Nb, 0.5% Nb, respectively). In each case the overall device has an NBT active layer deposited at 400° C. on single crystal Nb:STO substrates.

FIG. 19 shows the effect of different dopant concentrations of Nb in the Nb:STO substrate on the NBT device performance. The DC I-V plots shown in (a-d) are for different Nb dopant concentrations. With the increasing Nb concentration, a more pronounced resistive switching behaviour was obtained.

Figure 20:
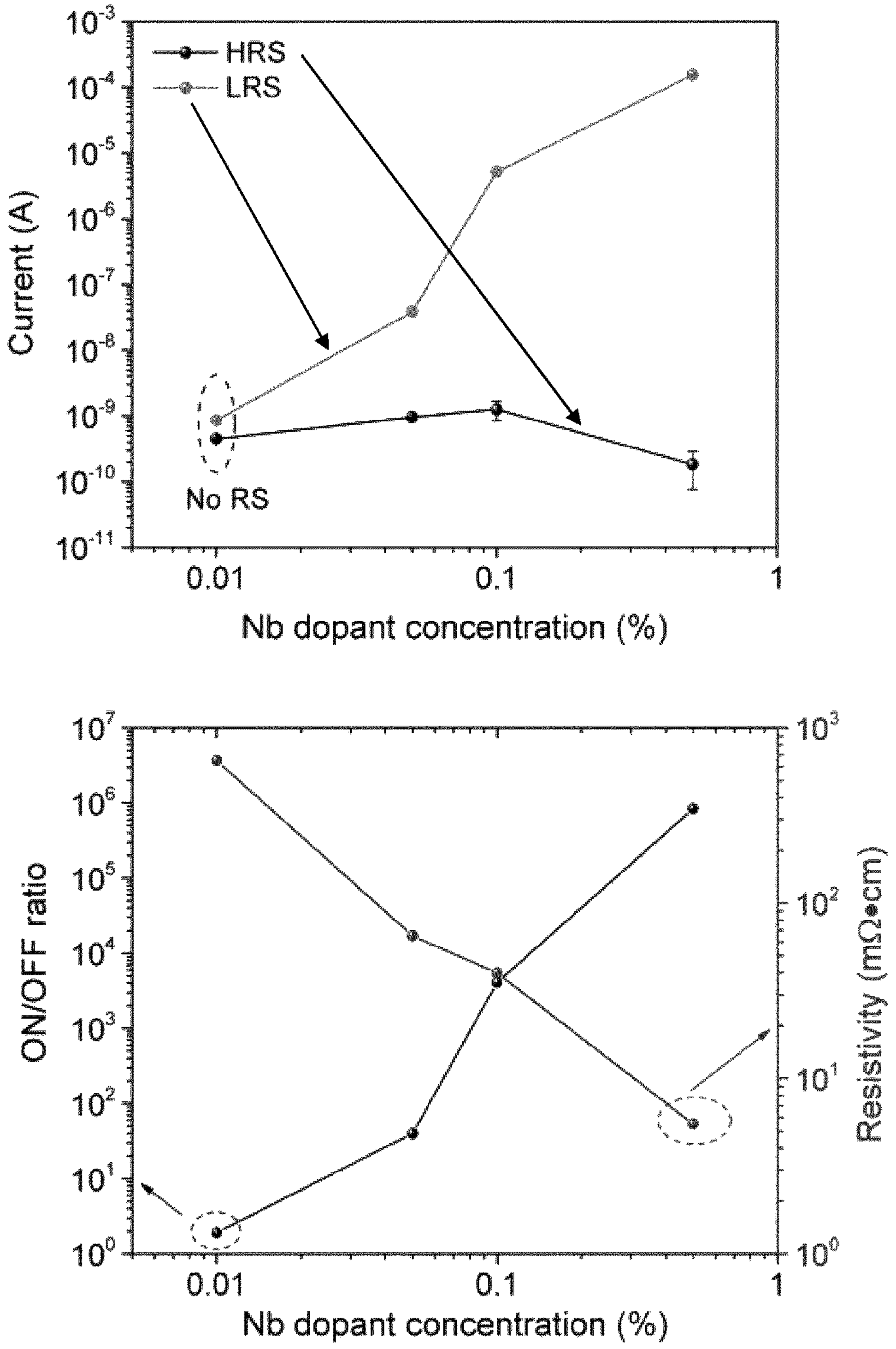
FIG. 20 (top part) shows the extracted current amplitude values from FIG. 19 for HRS and LRS in view of the different Nb dopant concentrations of the Nb:STO substrates.

FIG. 20 (top part) shows the extracted current amplitude values from FIG. 19 for HRS and LRS in view of the different Nb dopant concentrations of the Nb:STO substrates. FIG. 20 (bottom part) shows a summary of the calculated ON/OFF ratios for the devices which differ in view of different Nb dopant concentrations of the Nb:STO substrates and also shows for comparison the sheet resistivity of the different Nb:STO substrates. With an increasing Nb concentration, a more pronounced resistive switching behavior was obtained. The extracted HRS is nearly maintained, suggesting a constant Schottky barrier height at the NBT/Nb:STO interface for the initial state despite different Nb dopant concentrations. The increase of the LRS current with the dopant concentration is attributed to more carriers being injected at the bottom interface under an electric field.

As can be seen from FIGS. 19 and 20, a certain concentration of dopants (determining the level of resistivity) is required in the OS layer to enable good resistive switching performance in the NBT-based devices. This was studied for an OS Nb:STO layer (here the substrate) with different Nb doping levels. Hence for 650 mΩ·cm resistivity (0.01% Nb dopant concentration) we have an ON/OFF ratio of 1.9, whereas the ON/OFF ratio is 40 for 65 mΩ·cm resistivity (for 0.05% dopant concentration) and $8.4\times10^5$ for 5.5 mΩ·cm resistivity (for 0.5% dopant concentration).

The inventors have explored other semiconductor layers in place of the OS layer (e.g. doped Si), and they did not show resistive switching when interfaced with the OM layer. With Si, a native oxide layer will be present on its surface. However, the native oxide layer is insulating, thus preventing resistive switching.

Figure 21:
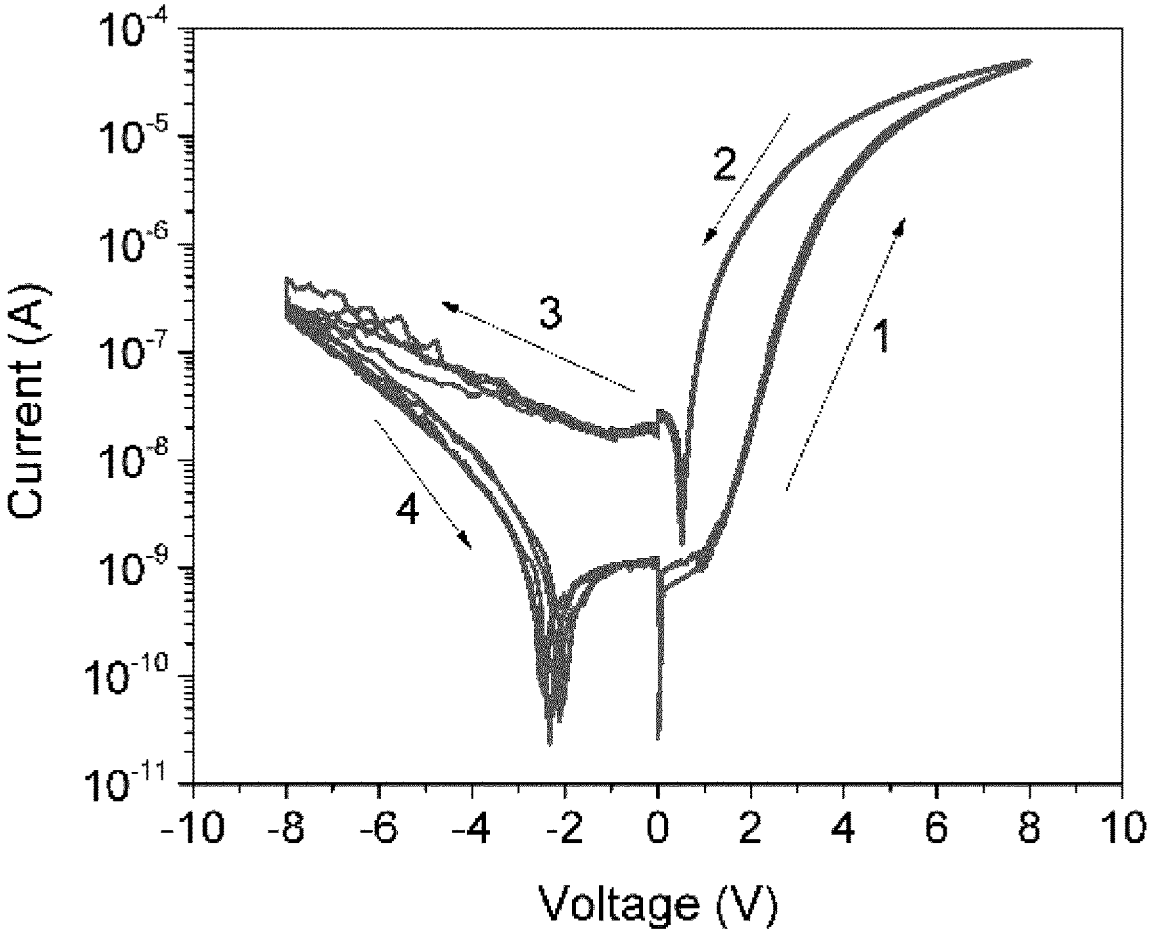
FIG. 21 shows DC I-V curves for a device with an NBT active layer and a TiN bottom electrode and Pt top electrode. The NBT active layer was deposited at 400° C. on the TiN bottom electrode.

The OS layer can be formed either directly by growing an OS layer or by suitably oxidising a non-oxide layer during the deposition process. The inventors have, for example, grown TiN on an insulating MgO substrate and then deposited an OM layer on it (here NBT at 400° C. by PLD in oxygen pressure). The DC I-V curve for such a device is shown in FIG. 21 and shows good resistive switching performance.

In the present disclosure, it is considered that the active layer requires a degree of ionic conductivity and a very low degree of electronic conductivity, hence the occasional reference to a "mixed ionic electronic conducting material". Electronic conductivity is measured simply via electrical resistance measurements. Therefore, additionally, the ionic conductivity of two OM layers (NBT and YSZ grown at 400° C.) were explored.

At a 500° C. measurement temperature, the ionic conductivity of NBT is at most $2.0\times10^{6}$ S/cm. The measured value for NBT is around 2 orders of magnitude smaller than that of NBT as a bulk material ($2\times10^{-6}$ S/cm compared with $5\times10^{-4}$ S/cm) (Reference: Journal of Materials Chemistry A 2018, 6, 5243-5254). The measured value for YSZ is around 20 times smaller (for the same measurement temperature) than that of YSZ grown at 800° C. by PLD (Reference: Nano letters 2015, 15, 7362-9).

Figure 22:
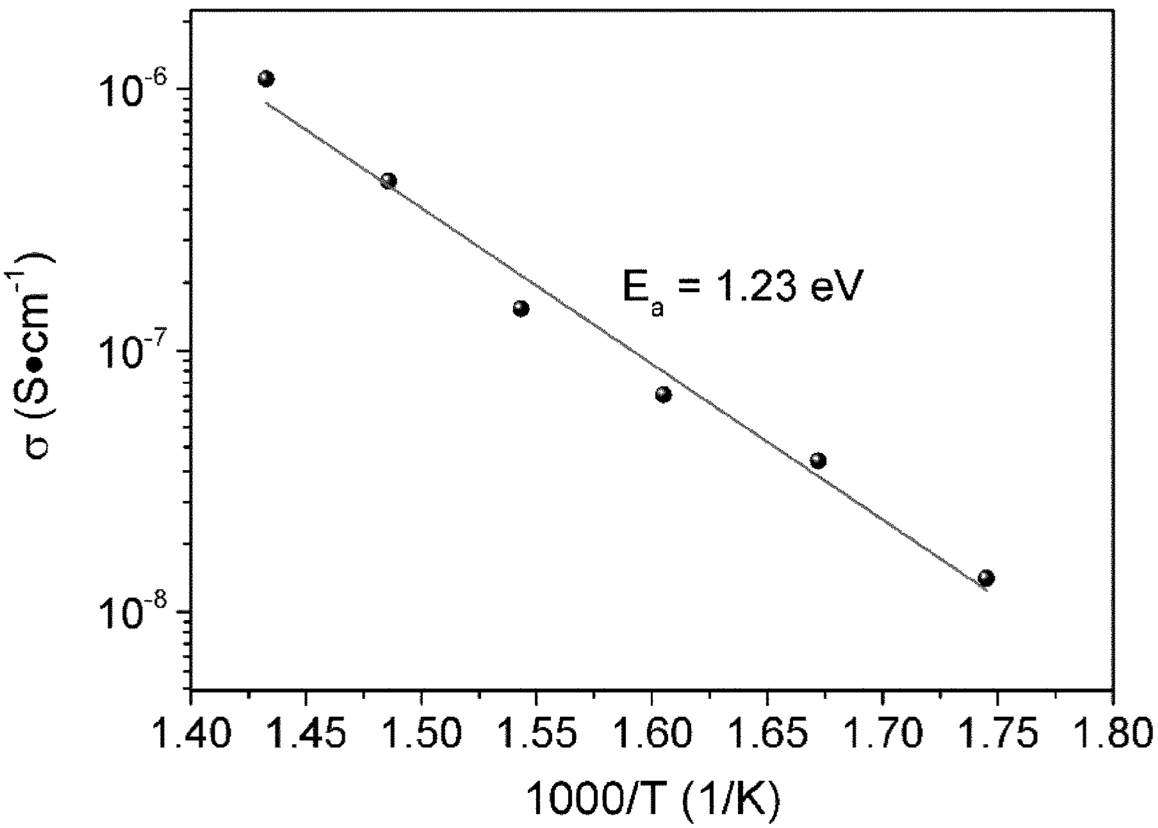
FIG. 22 shows an Arrhenius diagram of an electrical impedance spectroscopy measurement for NBT films (15 nm) deposited at 400° C. at various measurement temperatures, expressed as 1000/T where T is in K.

FIG. 22 shows an Arrhenius diagram of an electrical impedance spectroscopy measurement of an NBT film (15 nm, deposited at 400° C.) on an Nb:STO substrate at various elevated temperatures. The extracted high activation energy value indicates a high ionic migration barrier in the NBT films. The measured ionic conductivity is generally two to three orders of magnitude smaller than that of bulk films with a higher ionic conductivity.

The inventors consider that the ionic conductivity of the active layer should be at a value that balances competing factors. Ionic conductivity should not be so low as to prevent ionic conduction. On the other hand, ionic conductivity should not be so high as to permit deleterious ionic drift. Accordingly, it is considered that suitable ionic conductivity for the active layer provides a strong retention performance since retention can be linked to ionic drift. If the ionic conduction is lower, the drift will be lower and the retention higher.

Figure 23:
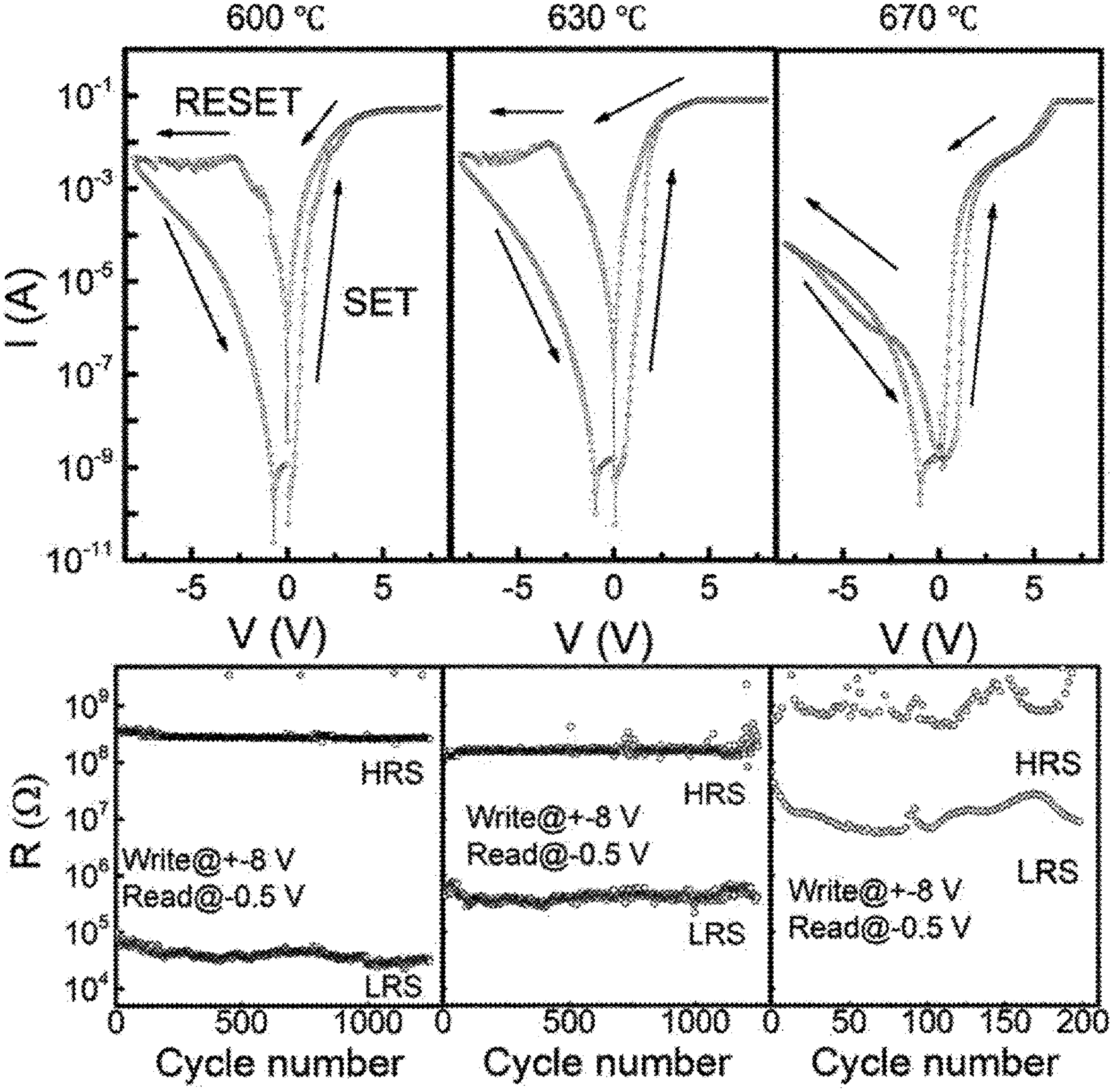
FIG. 23 is taken from Yun et al. (2021) and is identical to FIG. 1(*b*) of Yun et al. (2021). The top graphs in FIG. 23 show the influence of the deposition temperature (600° C., 630° C., and 670° C.) of the NBT active layer on the DC I-V curves of the Pt/NBT/Nb:STO devices. The cycle endurance of these individual devices is shown in the lower graphs in FIG. 23 with write operations at ±8 V and read operations at −0.5 V.

FIG. 23 is taken from Yun et al. (2021) and is identical to FIG. 1(*b*) of Yun et al. (2021). The top graphs in FIG. 23 show the influence of the deposition temperature (600° C., 630° C. and 670° C.) of the NBT active layer on the DC IV curves of the Pt/NBT/Nb:STO devices. The cycle endurance of these individual devices is shown in the lower graphs in FIG. 23 with write operations at ±8 V and read operations at −0.5 V.

Figure 24:
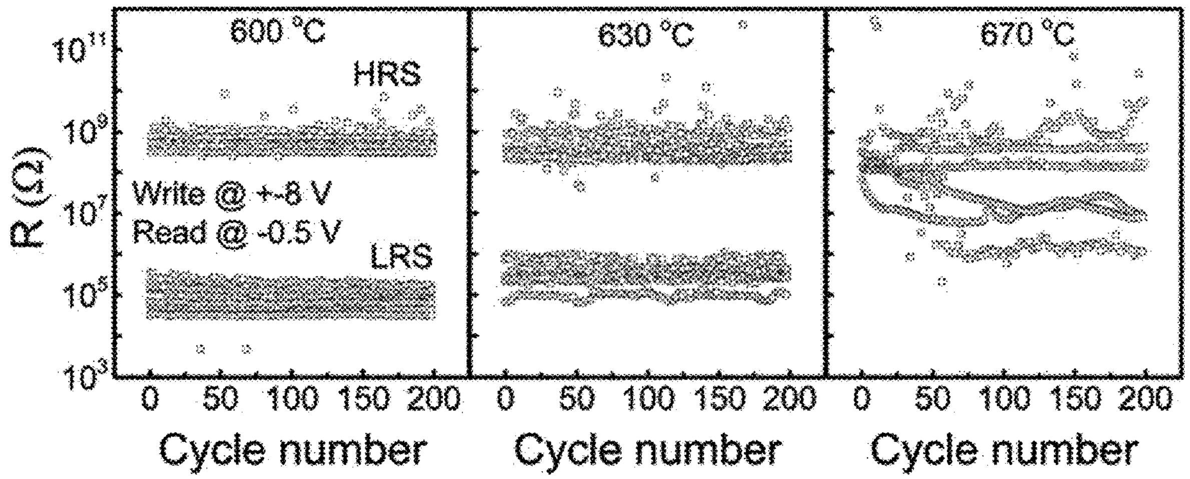
FIG. 24 is taken from Yun et al. (2021) and is identical to FIG. 1(*c*) of Yun et al. (2021). The format of the data is similar to the lower panel of FIG. 23 with write operations at ±8 V and read operations at −0.5 V, except that FIG. 24 shows data for several different devices, indicating reproducibility.

FIG. 24 is taken from Yun et al. (2021) and is identical to FIG. 1(*c*) of Yun et al. (2021). The format of the data is similar to the lower panel of FIG. 23 with write operations at ±8 V and read operations at −0.5 V, except that FIG. 24 shows data for several different devices, indicating reproducibility.

It is instructive to compare FIGS. 4 and 5 (representing an embodiment with NBT active layer deposited at 400° C.) with FIGS. 23 and 24. Evidently, it is found that an NBT active layer deposited at 400° C. has a switching performance comparable to the best device disclosed in Yun et al. (2021) in which the NBT active layer was deposited at 600° C. This is significant because the inventors' previous work suggested that epitaxy between the active layer and the substrate was considered to be of critical importance. The present disclosure indicates that this is not necessarily correct and that deposition temperatures of 400° C. or lower may be used, making the memristive device manufacture compatible with other electronic device industrial manufacturing processes. Furthermore, it is noted that FIG. 5 tests the device of an embodiment of the present disclosure out to 10 million cycles, which is far higher than the reported values in FIGS. 23 and 24.

Figure 25:
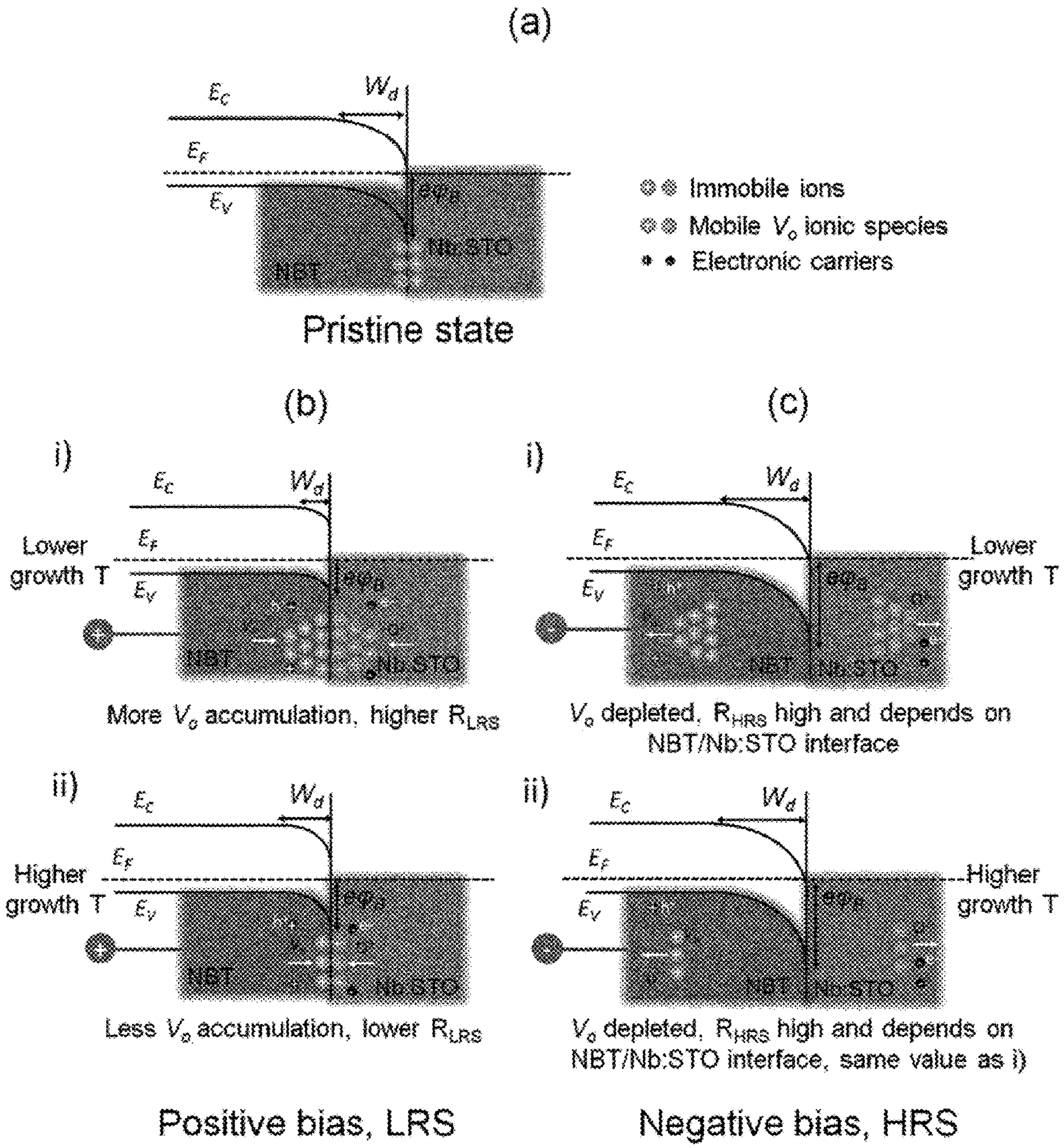
FIG. 25 is taken from Yun et al. (2021) and is identical to FIG. 4 of Yun et al. (2021).

FIG. 25 is taken from Yun et al. (2021) and is identical to FIG. 4 of Yun et al. (2021). FIG. 25 shows schematic diagrams of the conduction process at the Schottky barrier between NBT film and the Nb:STO electrode: (a) the pristine unbiased state; (b) with a positive bias applied; (c) with a negative bias applied. For (b) and (c), the effect of a lower and higher NBT deposition temperature is illustrated. It is considered that the explanation of the conduction process at the Schottky barrier formed at the interface between the NBT film and Nb:STO is similar in embodiments of the present invention, but related to changes in the barrier height of the conduction band of the active layer. This will be discussed further in the context of FIG. 29. Note that $E_C$, $E_V$, $E_F$, $W_d$ and $e\varphi_B$ are the conduction band minimum, valence band maximum, Fermi level, depletion layer width, and the Schottky barrier height, respectively.

Figure 26:
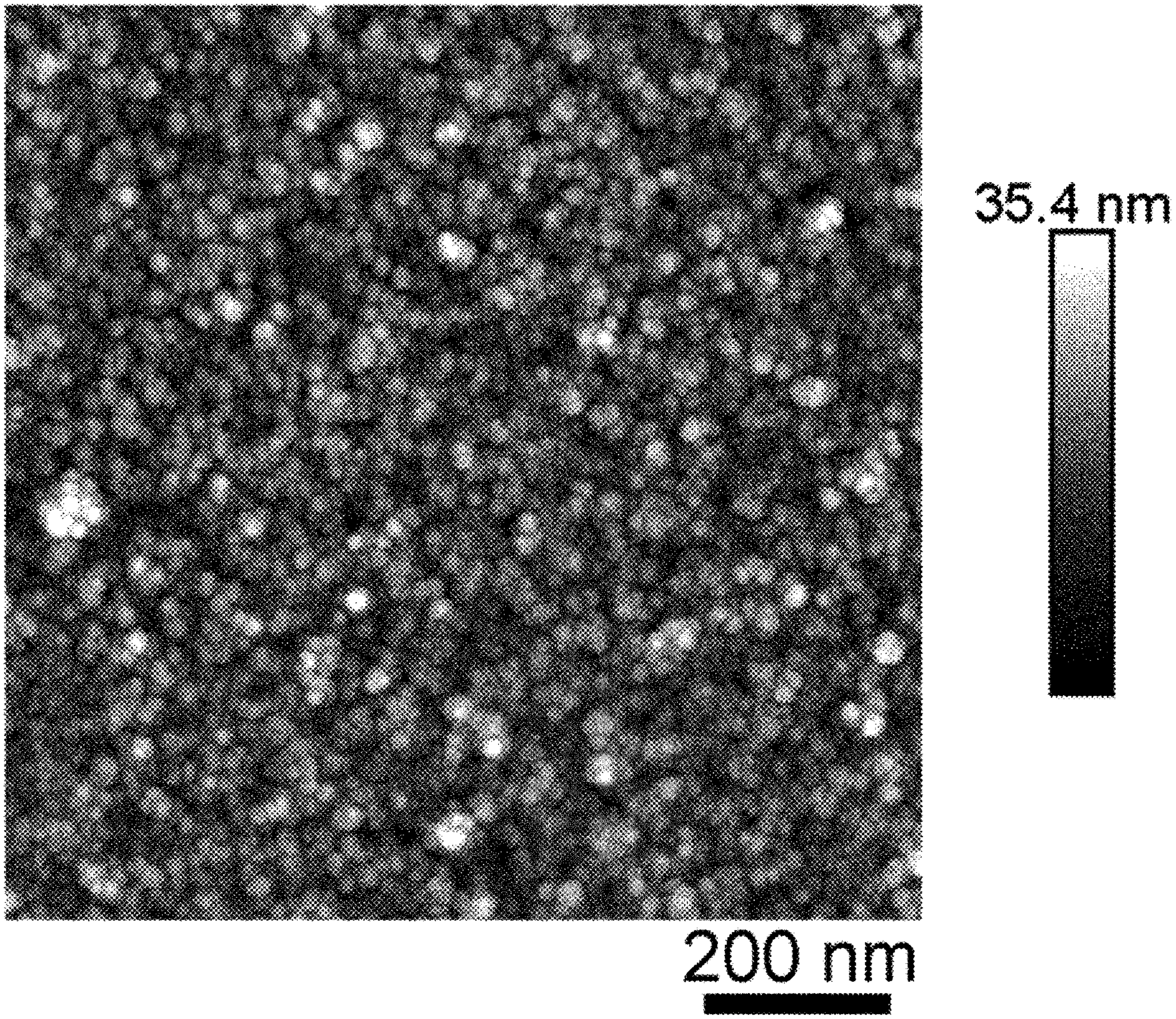
FIG. 26 shows an AFM image for an NBT active layer deposited at 400° C. on a single crystal Nb:STO substrate.

FIG. 26 shows an AFM image for an NBT active layer deposited at 400° C. on a single crystal Nb:STO substrate. Small nanocrystalline grains can be observed. The RMS surface roughness is 3.86 nm. The film has a thickness of about 30 nm.

Figure 27:
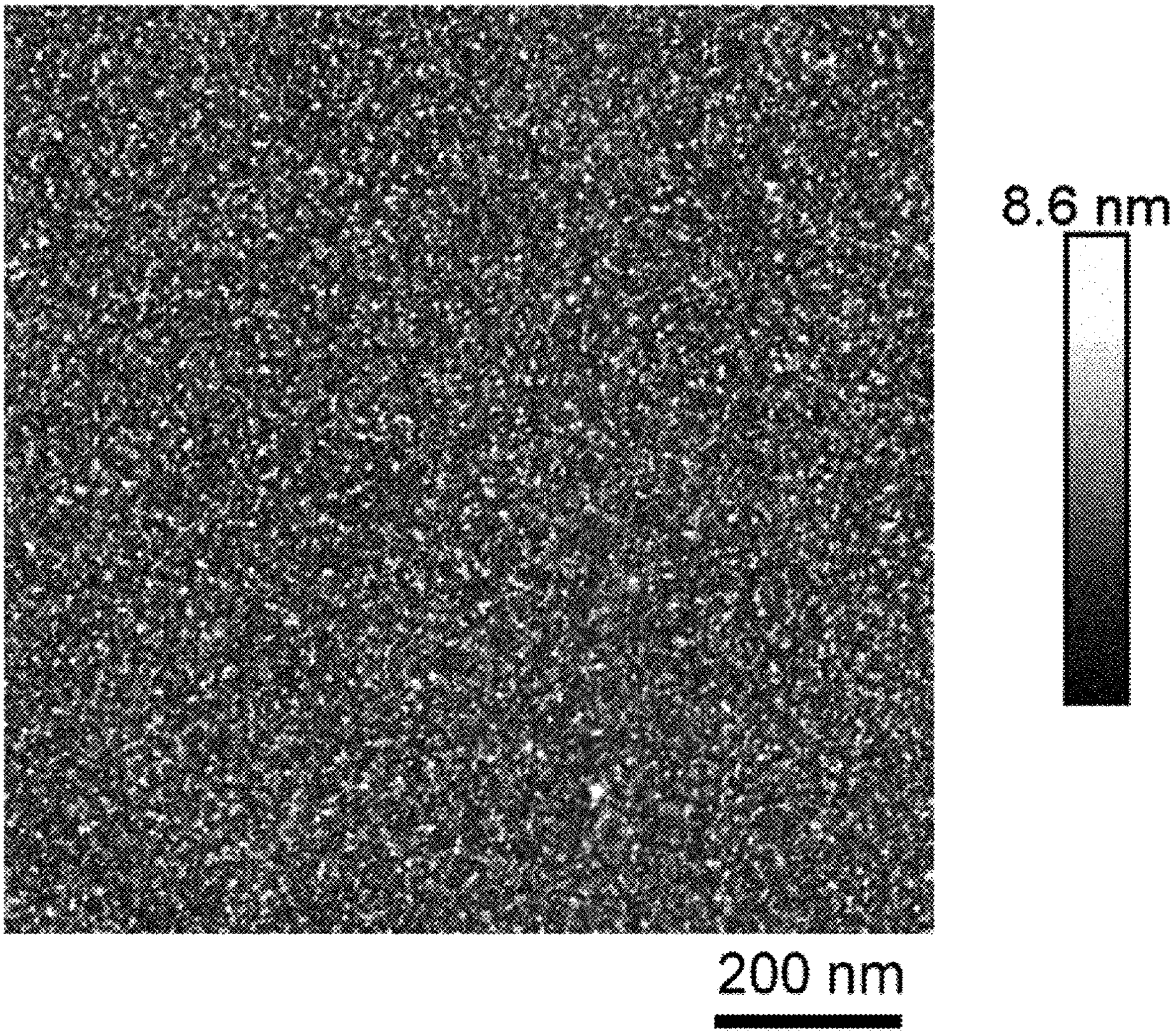
FIG. 27 shows an AFM image for a YSZ active layer deposited at 400° C. on a single crystal Nb:STO substrate.

FIG. 27 shows an AFM image for a YSZ active layer deposited at 400° C. on a single crystal Nb:STO substrate. The film is even more nanocrystalline than the film shown in FIG. 26, as the grains are even smaller than for the NBT film and the surface is very smooth (with a small RMS roughness of 0.95 nm). The film has a thickness of about 20 nm.

Figure 28:
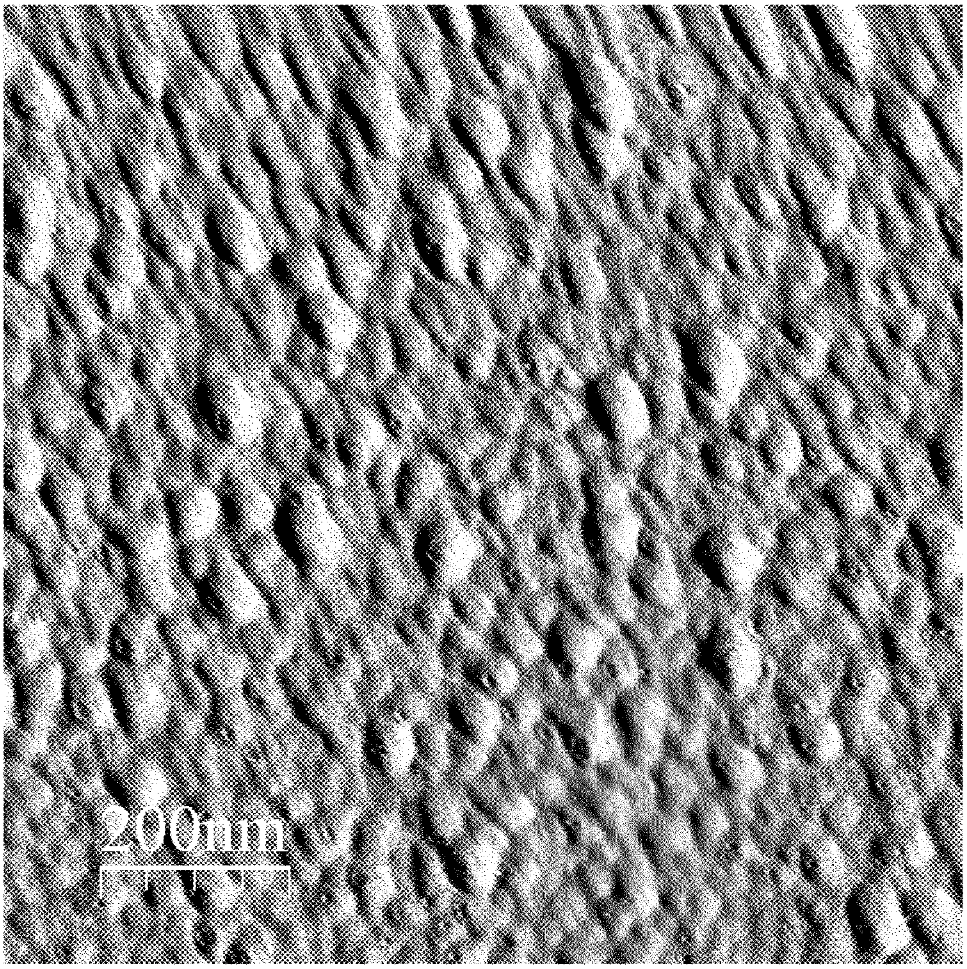
FIG. 28 shows an AFM image for a Ba:$HfO_x$ active layer deposited at 400° C. on a single crystal Nb:STO substrate

FIG. 28 shows an AFM image for a Ba:$HfO_x$ active layer deposited at 400° C. on a single crystal Nb:STO substrate. A small RMS roughness of 1 nm is obtained. The film has a thickness of less than 25 nm.

The inventors have considered further the possible mechanism underlying the operation of devices according to the embodiments disclosed here. Without wishing to be bound by theory, the inventors provide the following discussion of the possible mechanism to switch between low and high resistance states and the gradual change in resistance over time shown in FIG. 11.

Figure 29:
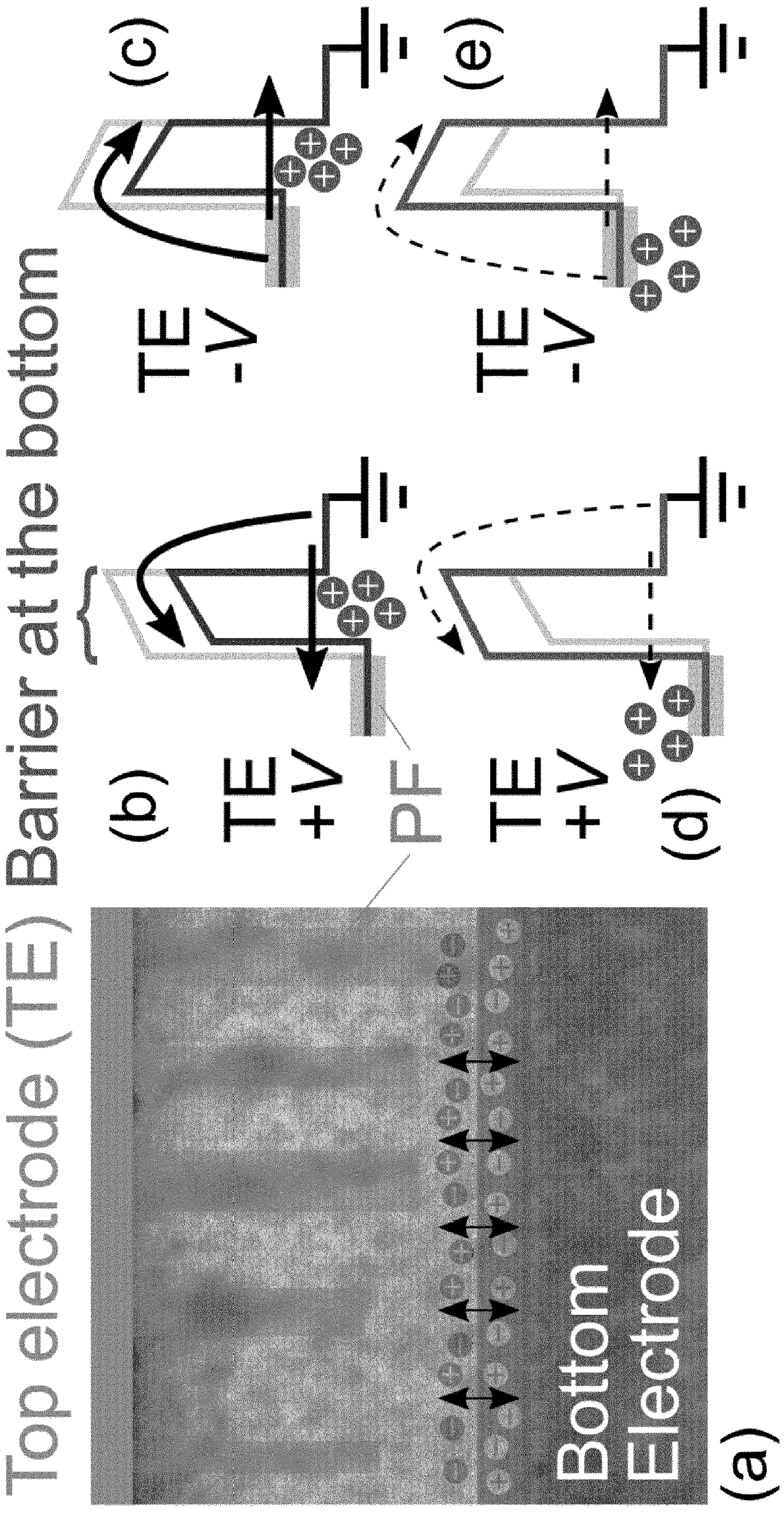
FIG. 29 shows a schematic diagram of a newly proposed mechanism based on the combination of filament formation and interfacial energy barrier control which, it is suggested, may be responsible for the performance seen in the embodiments disclosed herein.

FIG. 29 sets out a schematic of a newly proposed mechanism based on a combination of filament formation and interfacial control of an energy barrier, which, it is suggested (but without wishing to be bound by theory), may be responsible for the performance seen in the embodiments disclosed herein. During the initial forming process, partial filaments are formed through the majority of the thin films, beginning at the top electrode and reaching downwards. Due to the engineered structures of the films, the filaments do not penetrate the complete film thickness and thus do not lead to a complete dielectric breakdown. In the embodiment containing the NBT thin films, for example, this thin layer which the filaments do not penetrate, may be the thin interfacial epitaxial layer of the deposited NBT. A cross-sectional TEM image in FIG. 29(*a*) illustrates this combination of the partial filaments (green shading in the original drawing) and the remaining interlayer (red shading in the original drawing). As the filaments extend from the top electrode (TE) downwards, the top interface of the device is short-circuited, i.e. the Schottky barrier between the TE and the oxide film does not affect the electronic current conduction. Instead, the resistive switching process is governed by the height of an adjustable energy barrier, which is formed by the thin filament-free interfacial layer of the oxide films close to the bottom electrode. Due to the short-circuited top interface, this bottom interface barrier controls the electronic conduction for both positive and negative voltages at the TE. The height of the interfacial energy barrier is changed by the migration of positive and/or negative ions into and out of the interfacial region. This is illustrated in FIG. 29(*b*)-(*e*) together with the adjustable height of the energy barrier and the resulting electronic transport.

On the left-hand side of all four diagrams in FIG. 29(*b*)-(*e*), green shading indicates where the partial filaments meet the energy barrier close to the bottom interface. As the partial filaments short-circuit the top interface, the partial filaments constitute the effective top electrode with respect to the interfacial energy barrier.

FIG. 29(*b*) & (*c*) illustrate the LRS. This configuration is achieved by applying a sufficiently large positive voltage to the TE, which will push positive ions into the barrier region and draw negative ions away from it. This reduces the height (and width) of the interface barrier and this reduced barrier is indicated by the solid dark blue lines. The faint grey barrier shape indicates the barrier before its reduction to provide a visual reference for the change, and red bubbles containing plus signs indicate a high concentration of positively charged ions in the barrier region. The solid black arrows indicate electron transport over and through the energy barrier in the LRS. Since the top interface is short-circuited, the interfacial barrier controls the electronic current for both voltage polarities, thus two separate figures FIG. 29(*b*) & (*c*) for a positive and negative voltage at the TE, respectively.

FIG. 29(*d*) & (*e*) illustrate the barrier configuration in the HRS for both voltage polarities. When a sufficiently large negative voltage is applied to the TE, positive ions are drawn away from the bottom interface and negative ions are pushed towards it. This increases the barrier height, which is indicated by the solid red lines. Similar to before, the faint grey lines provide the barrier shape in the LRS as a comparison with the newly induced HRS. As before, red bubbles containing plus signs indicated the motion of positive ions. The arrows indicating electronic conduction are now drawn as thin dashed lines to illustrate that the electronic current is smaller as compared with the LRS in FIG. 29(*b*) & (*c*).

It is pointed out that ionic movement and electronic current occur at the same time, but with different voltage dependences. FIG. 29(*b*)-(*e*) only illustrate the low-voltage steady state of the devices, i.e. they highlight the electronic current at small read voltages, where the electric field is not large enough to cause significant ionic movement. This suppressed ionic movement at small voltages leads to the excellent measured state retention. A weak decay of the steady state can still occur for example due the concentration-gradient-dependent diffusion of ions and charge trapping and de-trapping, which is always present to varying extents.

The inventors have carried out further studies of devices according to embodiments of the present invention.

Figure 30:
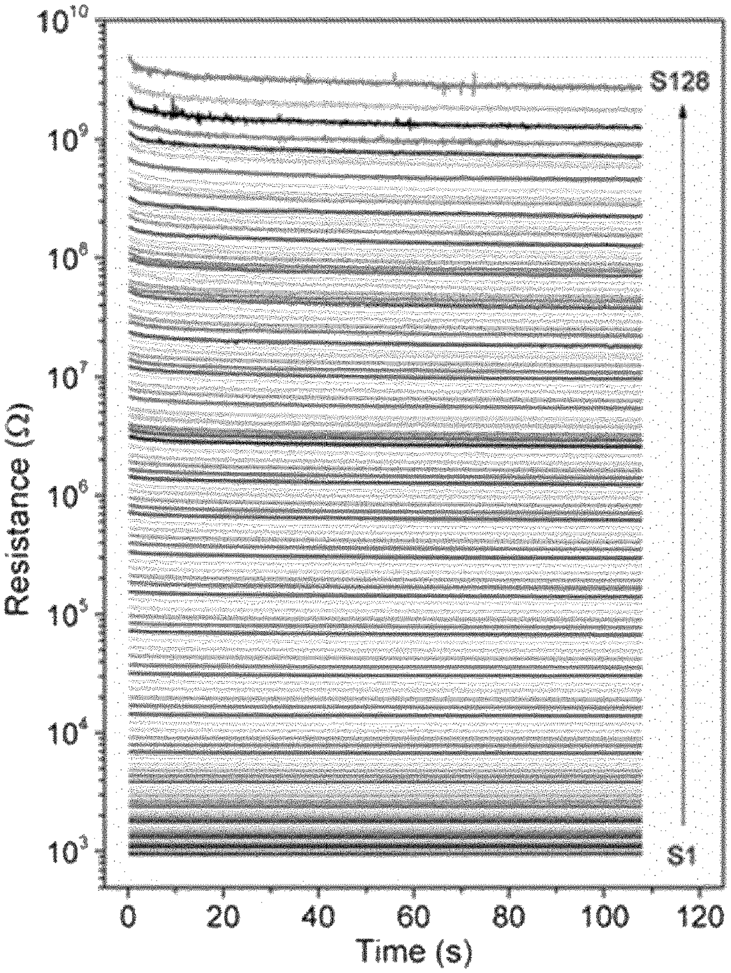
FIG. 30 shows a series of plots of resistance against time for a device incorporating an NBT active layer at different set resistance states marked as S1 to S128, at the read voltage of −0.5 V. Further detail is explained with respect to FIGS. 32-35.
Figure 31:
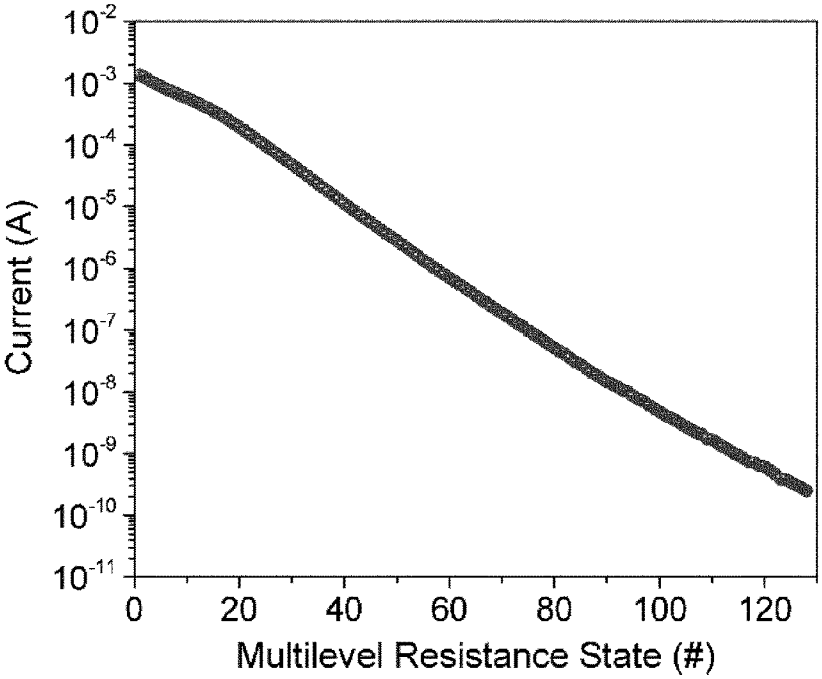
FIG. 31 shows a plot of current against the different multilevel resistance states shown in FIG. 30.
Figure 32:
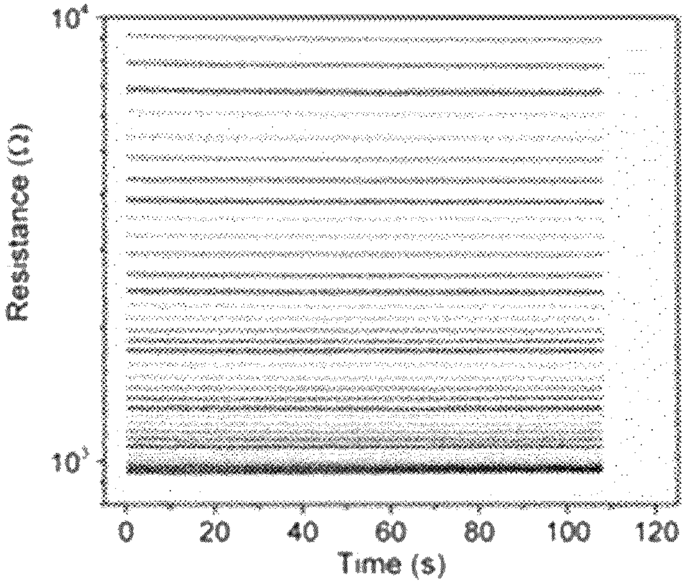
FIG. 32 shows an enlargement of a low resistance area of the plot of FIG. 30.
Figure 33:
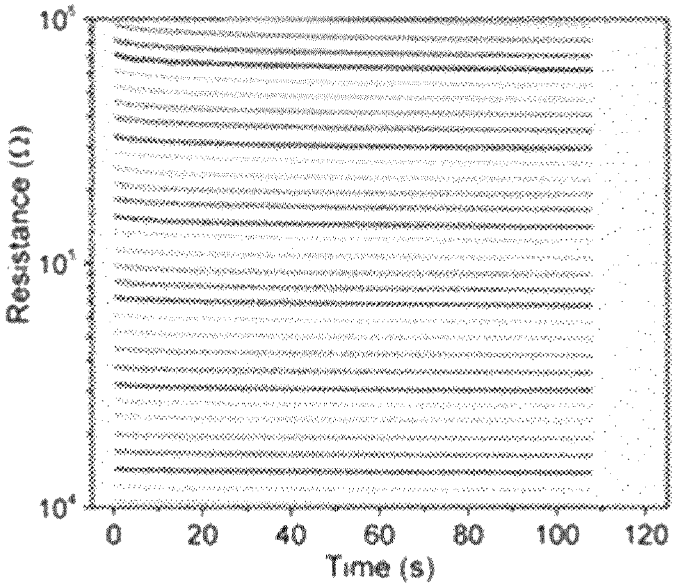
FIG. 33 shows an enlargement of a medium low resistance area of the plot of FIG. 30.
Figure 34:
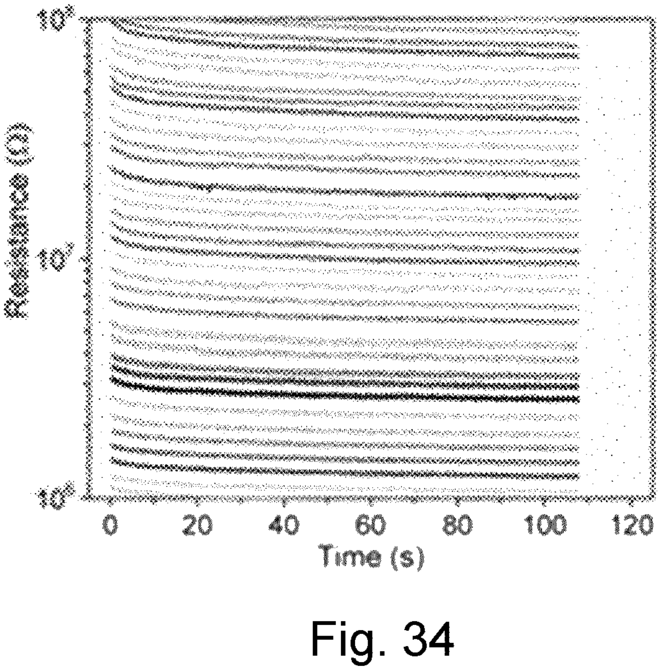
FIG. 34 shows an enlargement of a medium high resistance area of the plot of FIG. 30.
Figure 35:
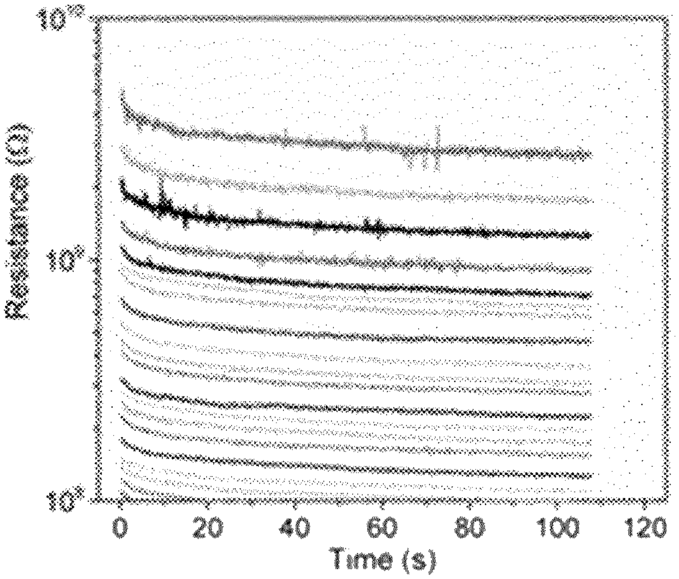
FIG. 35 shows an enlargement of a high resistance area of the plot of FIG. 30.

FIG. 30 shows a series of plots of resistance against time for a device incorporating an NBT active layer at different set resistance states marked as S1 to S128, at the read voltage of −0.5 V. FIGS. 32-35 show, respectively, enlargements of different areas of the plot of FIG. 30 corresponding to subranges of the resistance range shown on the vertical axis of FIG. 30. FIG. 31 shows a plot of current vs multilevel resistance state, corresponding to the resistance states indicated in FIG. 30.

The significance of these results is that the device demonstrates that it is possible to provide a very large number of resistance states using the present invention. In this embodiment, different reset voltages were used (in the range −2.5 V to −8 V) in order to provide the different intermediate resistance states. The reset voltage was gradually changed from −2.5 V to −8 V. The read voltage was −0.5 V. As demonstrated, it is possible to provide more than 128 different resistance levels with robust retention over at least 100 seconds. In this embodiment, the resistance states changed from about $9.5\times10^2$ Ω to about $5\times10^9$ Ω, i.e. >6 orders of magnitude.

The results show the stability of the resistance levels with time and an extrapolation of the data shows that it can be expected to be stable for even longer periods. The calculated fluctuation level for each of the resistance state (defined by the ratio of the standard deviation and the mean value of the resistance) is less than 3%, suggesting a highly stable behaviour for each of the resistance states for a long period. Furthermore, the calculated relative change among adjacent resistance states is around 10%, which is sufficient for multilevel memory storage applications.

The 128 non-volatile resistance levels demonstrated are, to the best knowledge of the inventors, higher than any previous attempts before the present disclosure.

Figure 37:
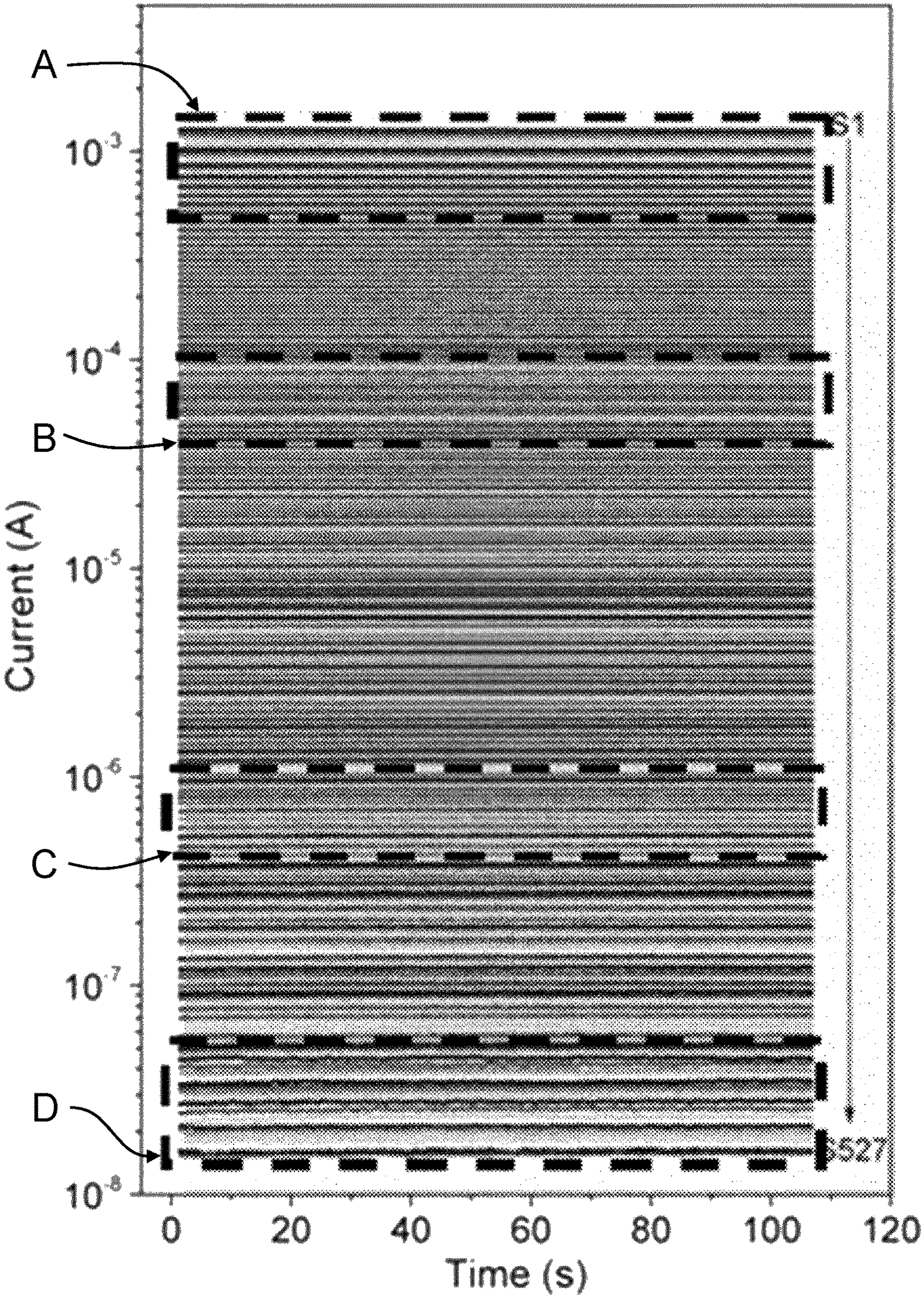
FIG. 37 shows a series of plots of current against time for a device incorporating an NBT active layer at different set resistance states marked as S1 to S527, at the read voltage of −0.5 V. Further detail is explained with respect to FIGS. 38-41.
Figure 38:
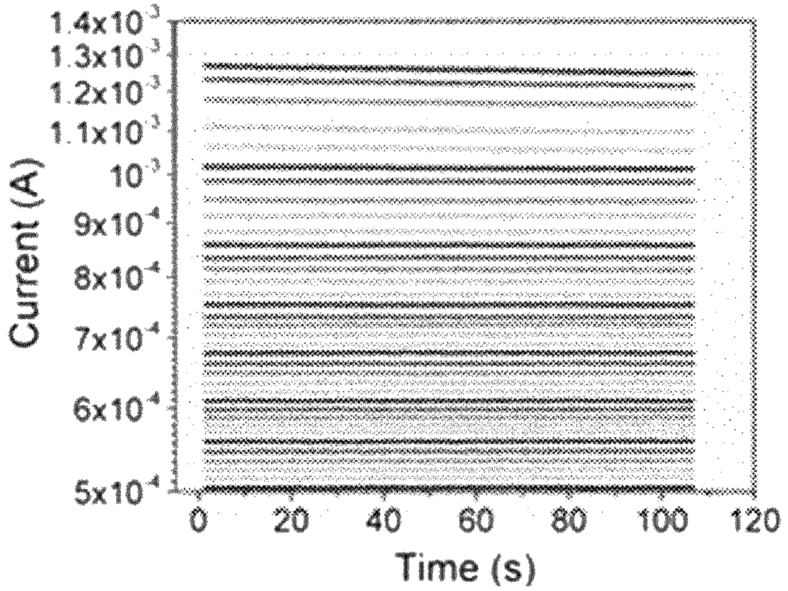
FIG. 38 shows an enlargement of the area of the plot of FIG. 37 indicated as area A.
Figure 39:
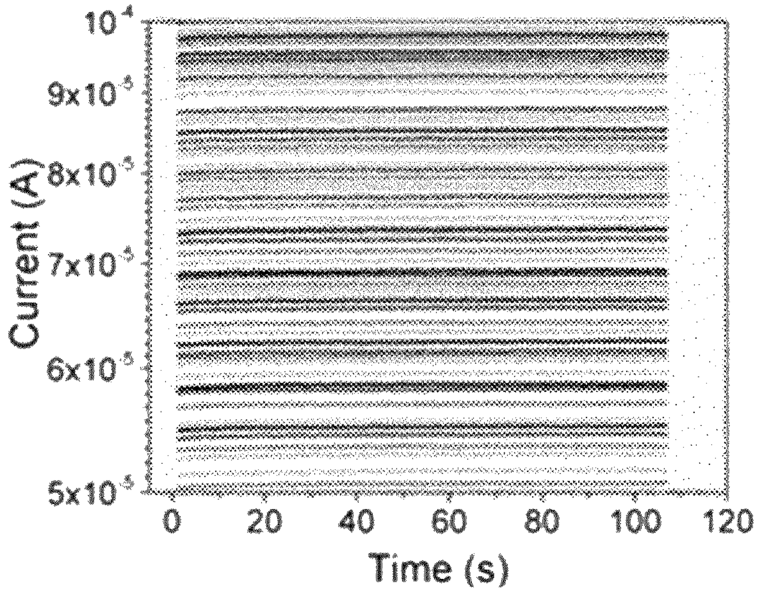
FIG. 39 shows an enlargement of the area of the plot of FIG. 37 indicated as area B.
Figure 40:
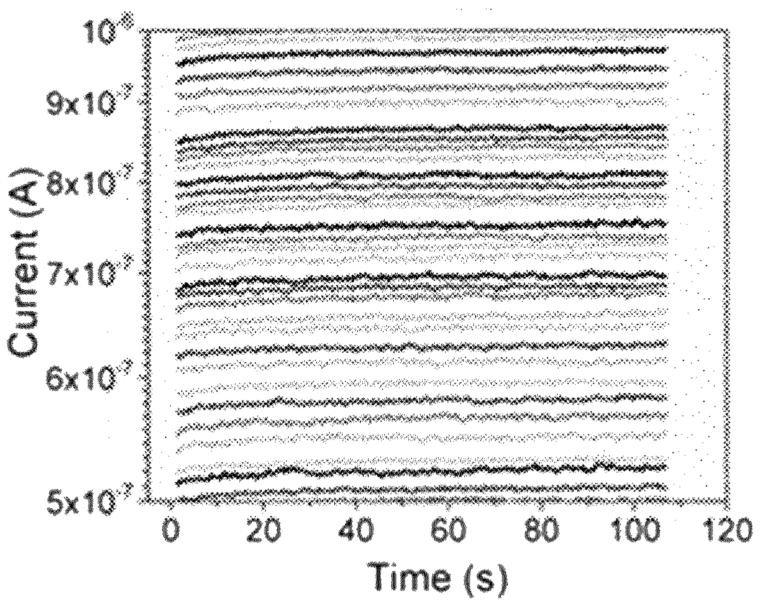
FIG. 40 shows an enlargement of the area of the plot of FIG. 37 indicated as area C.
Figure 41:
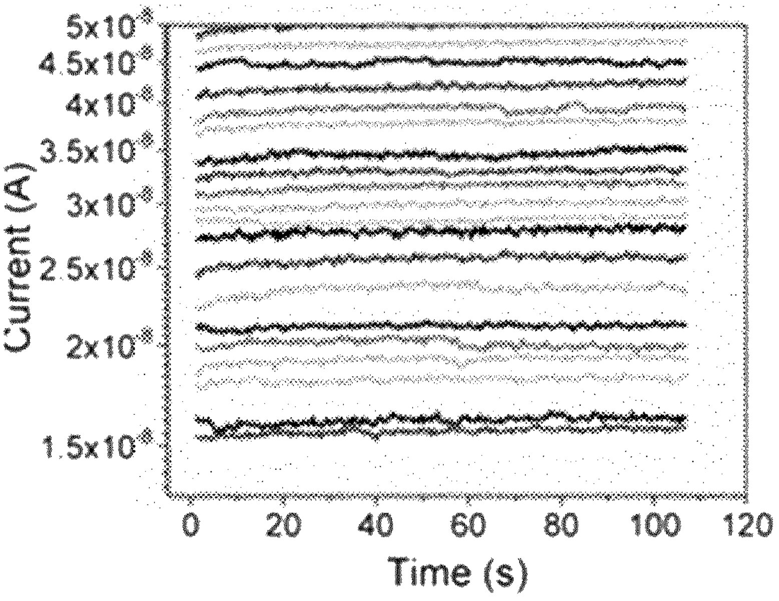
FIG. 41 shows an enlargement of the area of the plot of FIG. 37 indicated as area D.

Providing a wide range of resistance values (7 orders of magnitude) yields superior advantages for multilevel memory storage applications to be robust to current fluctuation and noise during reading. FIG. 37 proves that further fine tuning of the step size of the reset voltage provides an even larger number of distinguishable non-volatile resistance states.

Figure 36:
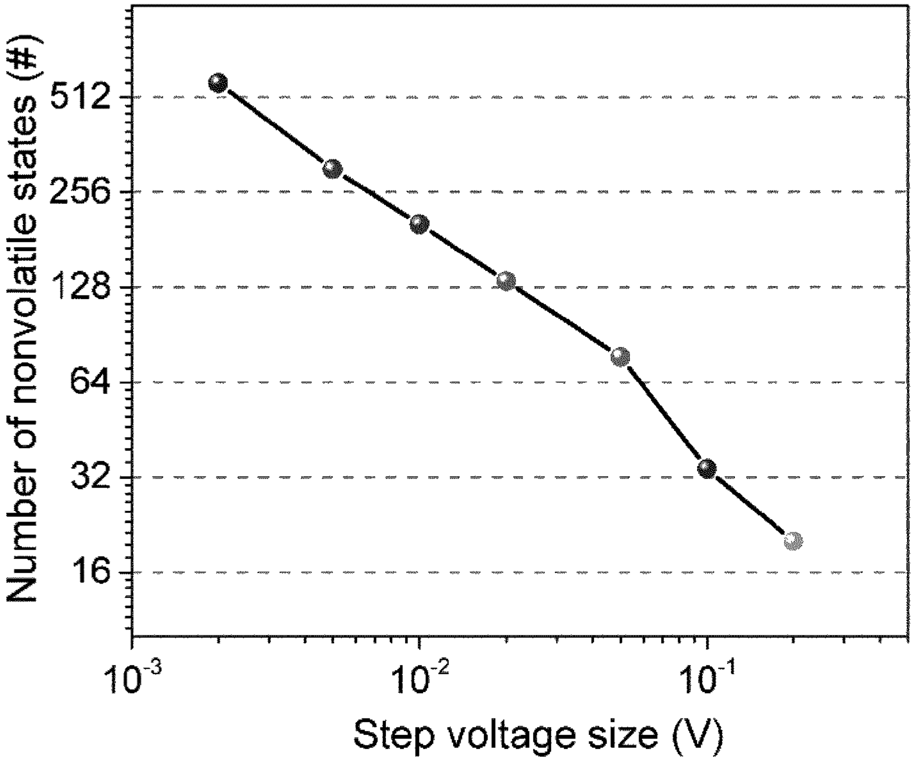
FIG. 36 shows a plot of the number of distinguishable non-volatile resistance states for a device according to an embodiment of the invention against the voltage step size when gradually increasing the reset voltage from −2.0 V.

FIG. 36 shows a plot of the number of distinguishable non-volatile resistance states for a device according to an embodiment of the invention against voltage step size when gradually increasing the reset voltage from −2.0 V.

FIG. 37 shows a series of plots of current against time for a device incorporating an NBT active layer at different set resistance states marked as S1 to S527, at the read voltage of −0.5 V. FIGS. 38-41 show enlargements of the areas of the plot of FIG. 37 indicated as areas A, B, C and D respectively.

As can be seen from FIGS. 36 and 37, it is possible to obtain even more distinguishable non-volatile resistance levels using a device according to an embodiment of the present invention. Note that FIGS. 30 and 37 represent series of measurements that can be compared with the measurements reported in FIG. 7—the difference being the number of different resistance states to which the devices measured in FIGS. 30 and 37 were set.

Figure 42:
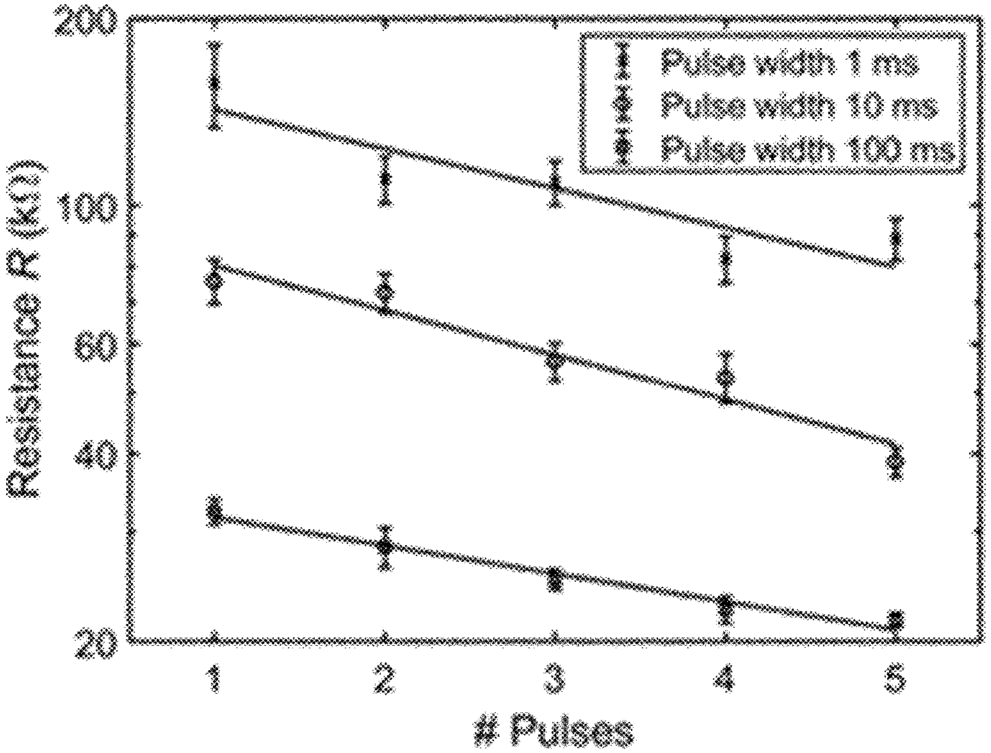
FIG. 42 shows a plot of the effect of the applied number of pulses and the pulse width on the resistance of a device.
Figure 43:
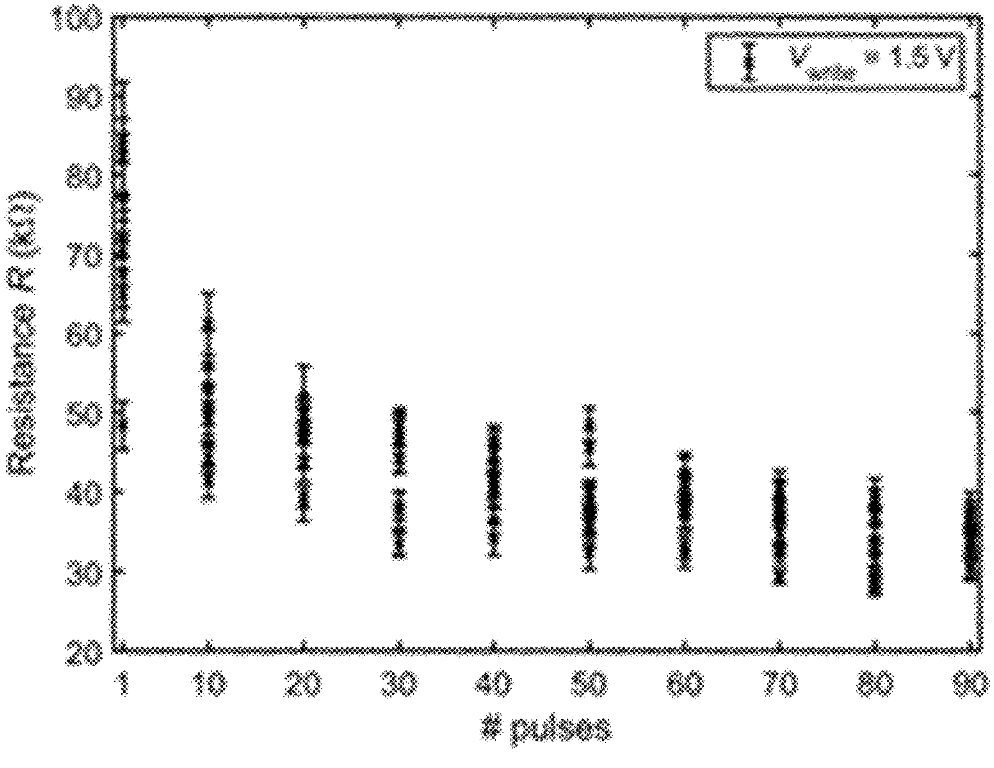
FIG. 43 shows a plot of the effect of the number of applied pulses on the range of resistance seen for the device

The change of resistance in the device is not only determined by the pulse amplitude, but also by the pulse width and pulse number. This is indicated in FIGS. 42 and 43. Under the same pulse amplitude, FIG. 42 shows that increasing pulse widths lead to a larger resistance change, while increasing the number of identical pulses also leads to a gradual resistance change (see both FIGS. 42 and 43). The gradual change of the resistance by a suitably designed pulse scheme (No. of pulses, pulse width and pulse amplitude) is considered to be highly desired for in-memory computing applications since it can mimic the analogue weight change in neural network computing.

A high number of resistance states with a long period of retention for each state is not only desired for memory storage applications but is also desired for neural network applications. This is because by providing a higher number of non-volatile resistance states it is possible to achieve a higher accuracy of neural network simulations.

The inventors also have further insights into the microstructure of the devices according to embodiments of the invention and in particular in relation to the active layer. As discussed above, the active layer may be nanocrystalline or amorphous or a combination of nanocrystalline and amorphous in the sense of some regions of the active layer being nanocrystalline and some regions being amorphous.

It is now additionally found that in some embodiments, there may be a small thickness of active layer material that is epitaxial with respect to the substrate. Typically, this amounts to a thickness of a few unit cells. The remainder of the active layer has nanocrystalline or amorphous microstructure as previously described. This remainder of the active layer is non-epitaxial with respect to the substrate and with respect to the small thickness of active layer material is epitaxial with the substrate.

Without wishing to be bound by theory, the inventors consider that where the device has a few-unit-cell epitaxial layer on the substrate surface, with either an amorphous or nanocrystalline layer on top, this may provide advantages. It is possible that the multilevel resistance states are assisted by the few-unit-cell epitaxial layer and that the excellent retention behaviour is assisted by the lower crystallinity active layer which may prevent oxygen diffusing away from the interface region.

Figure 44:
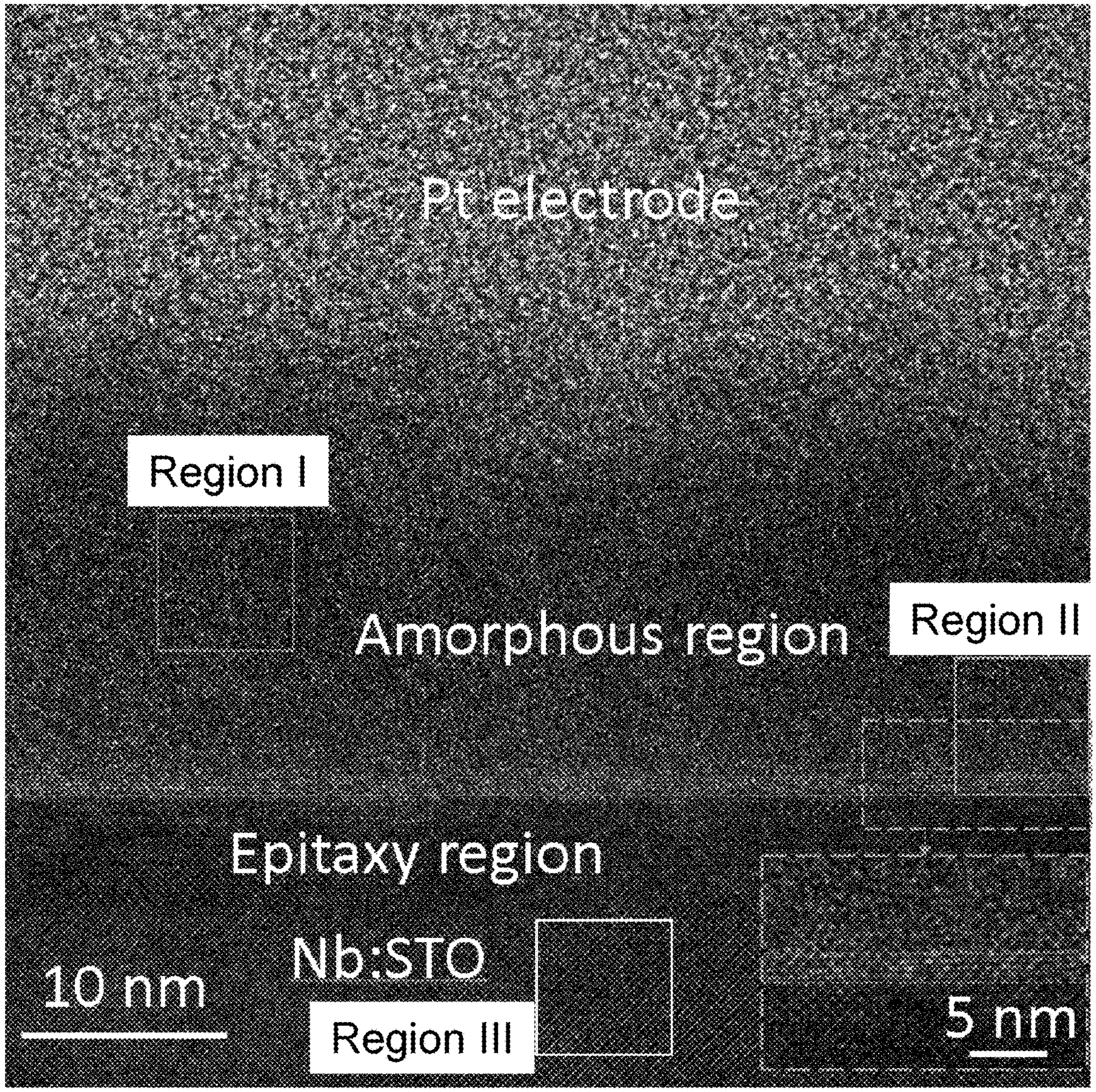
FIG. 44 shows a cross-sectional TEM characterization of an NBT film on an Nb:STO substrate. The dashed boxes indicate a region which is shown slightly enlarged in the lower right corner of the image.
Figure 45:
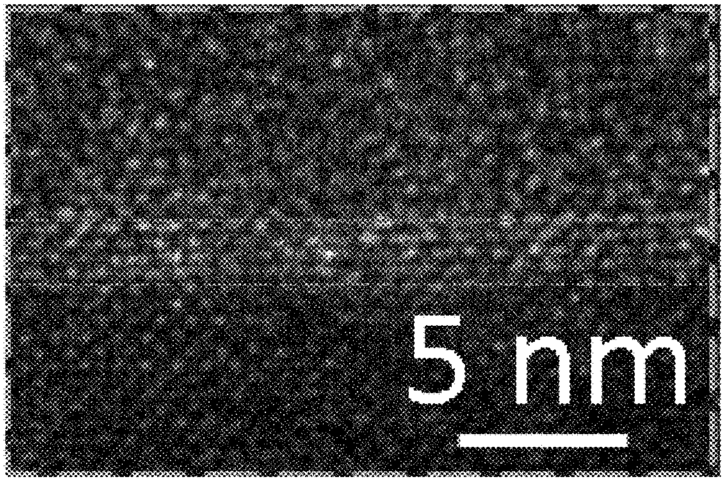
FIG. 45 shows a further enlarged view of the area of the sample shown with the dashed box in FIG. 44.
Figure 46:
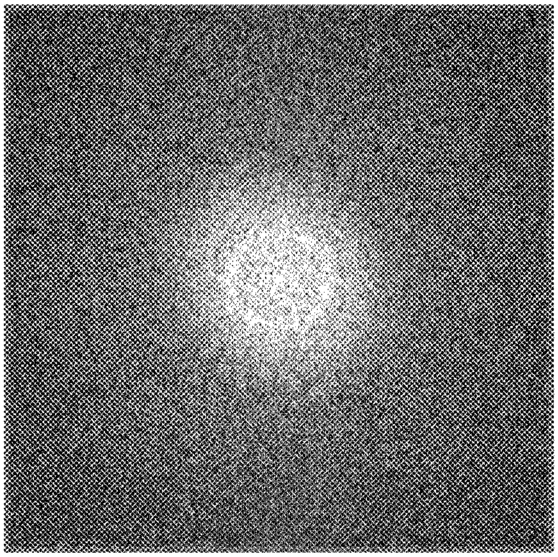
FIGS. 46, 47 and 48 respectively show Fast Fourier Transform (FFT) analyses of the regions of FIG. 44 indicated as Region I, Region II, and Region III.
Figure 47:
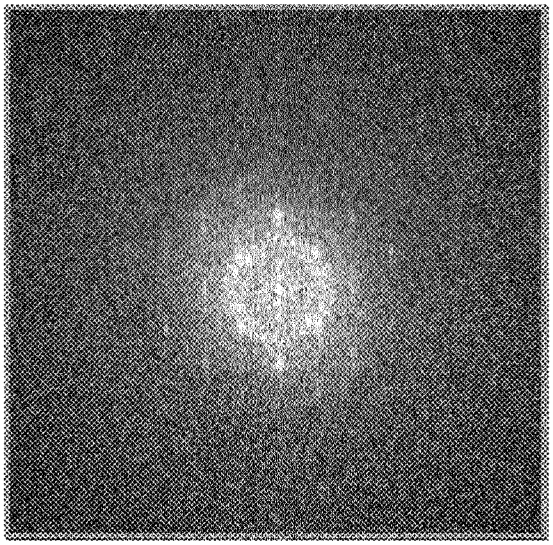
Figure 48:
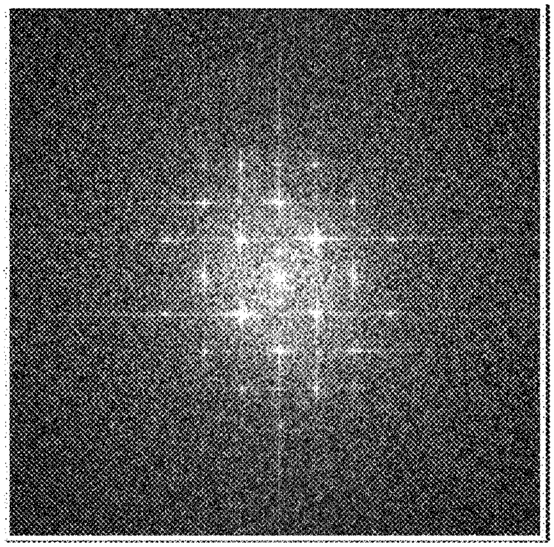
Figure 49A:
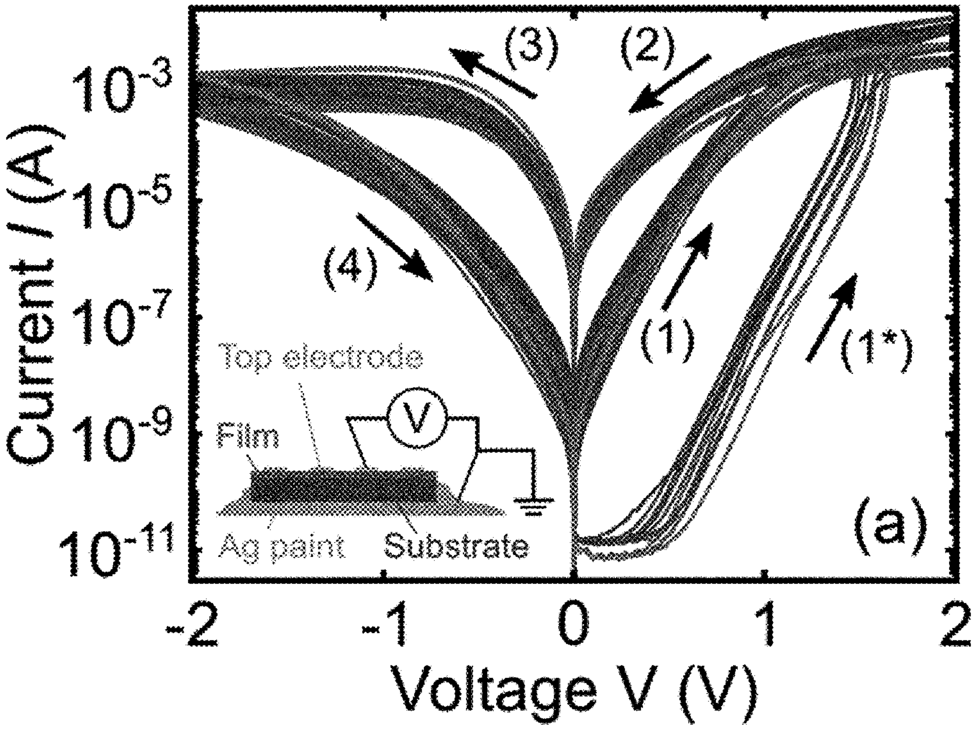
FIG. 49(*a*) shows initial five IV curves of ten different pristine amorphous nanocomposite devices with Ba:$HfO_x$ deposited at 400° C. (In the original of this plot, each device is shown in a different colour.) TE diameters were 100 μm and 50 μm. A clear forming process (1*) is observed during the first voltage application, but it does not require a higher voltage than the subsequent switching. The switching sequence is indicated by numbered arrows and the curves of all devices overlap each other closely. The inset of FIG. 49(*a*) shows a schematic of the device and the measurement geometry for devices with Nb:STO BEs.
Figure 49B:
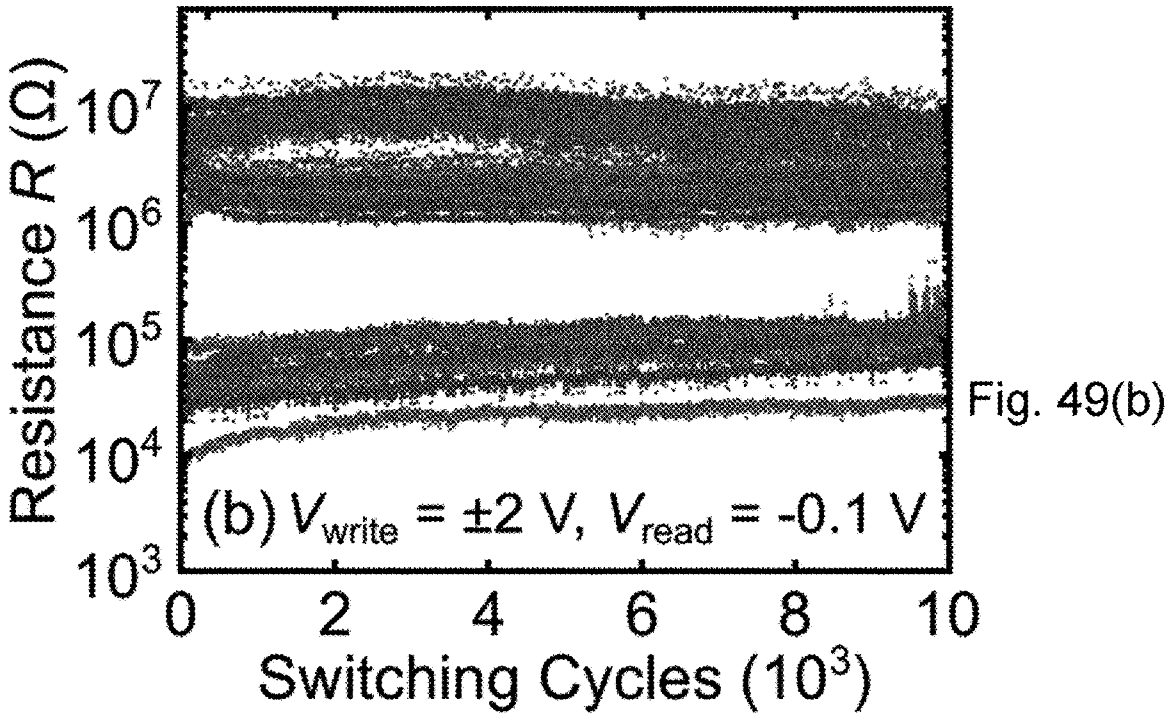
Figure 49C:
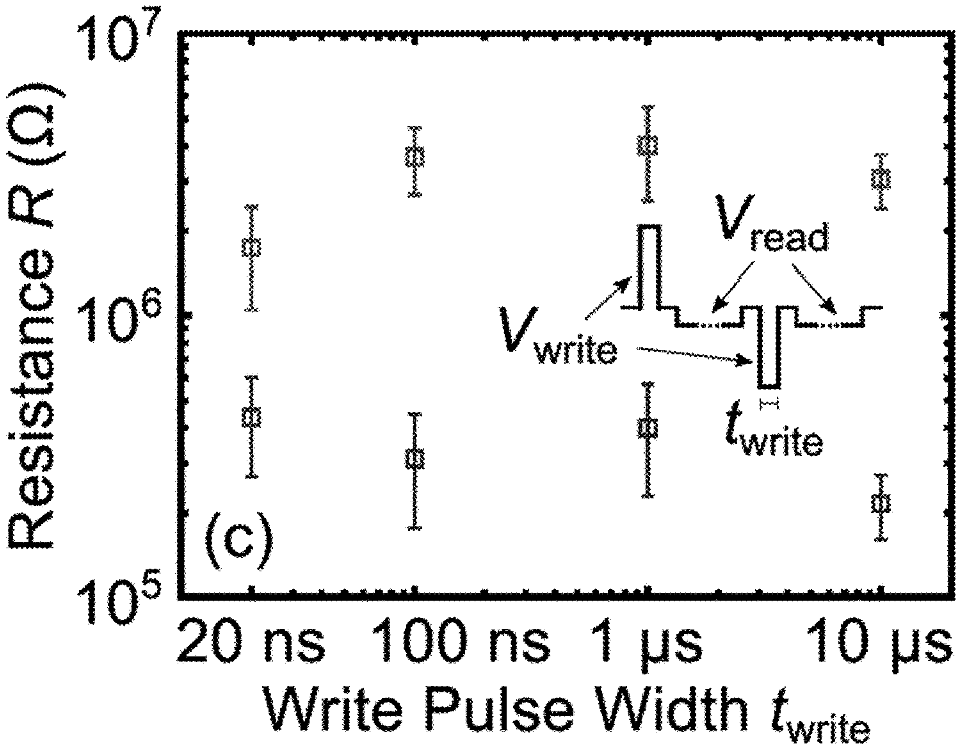
Figure 49F:
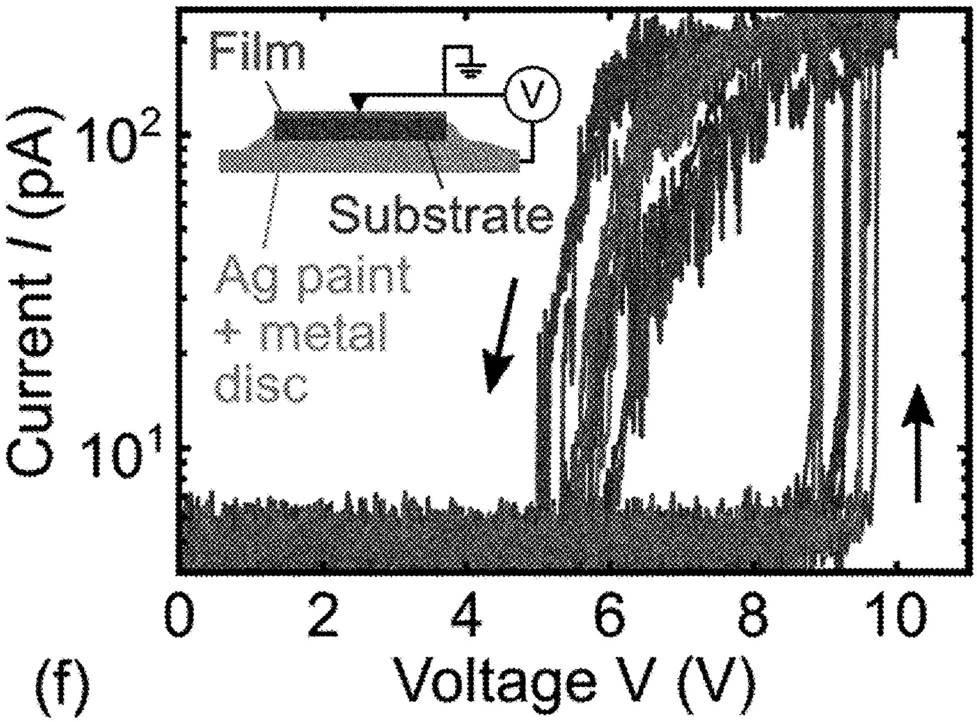
Figure 49D:
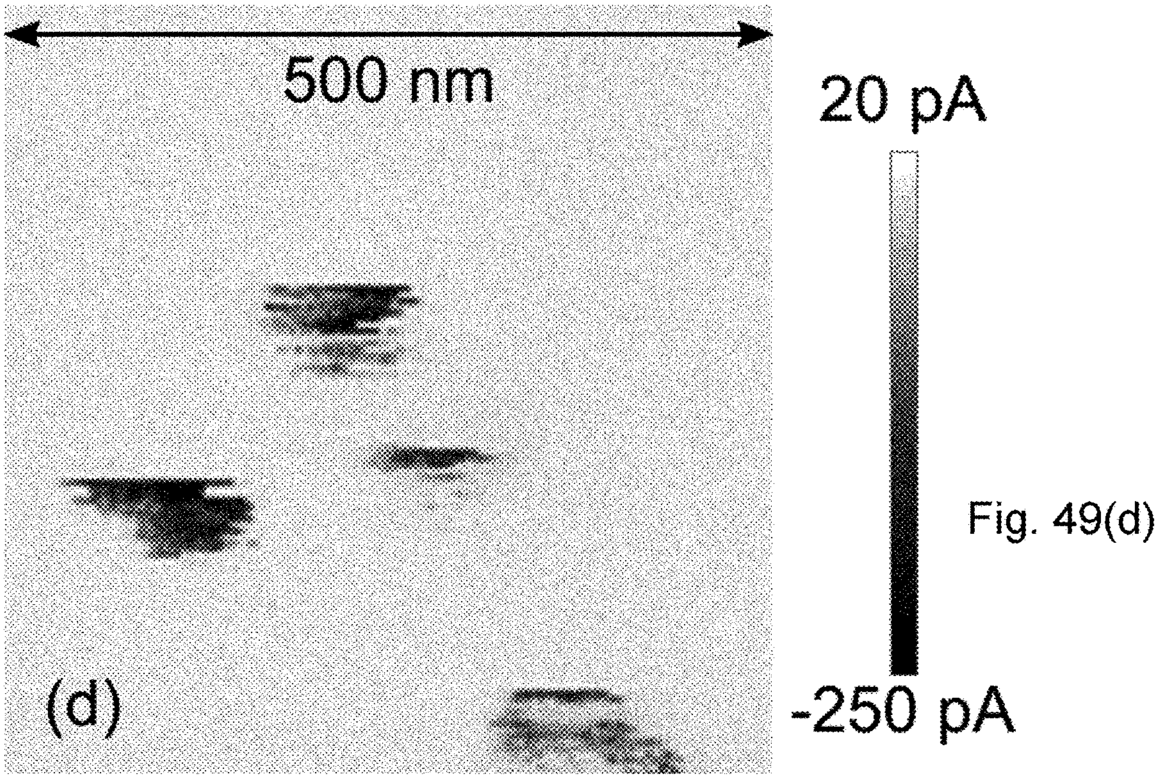
Figure 49E:
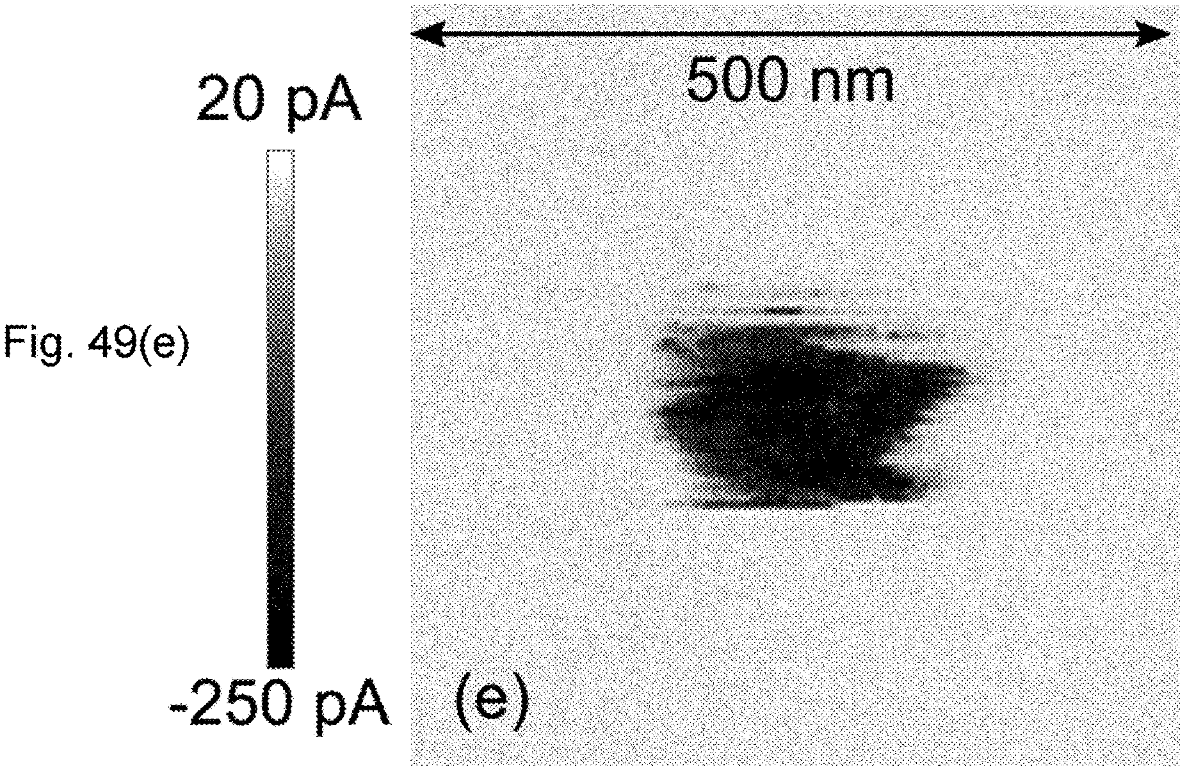
Figure 50A:
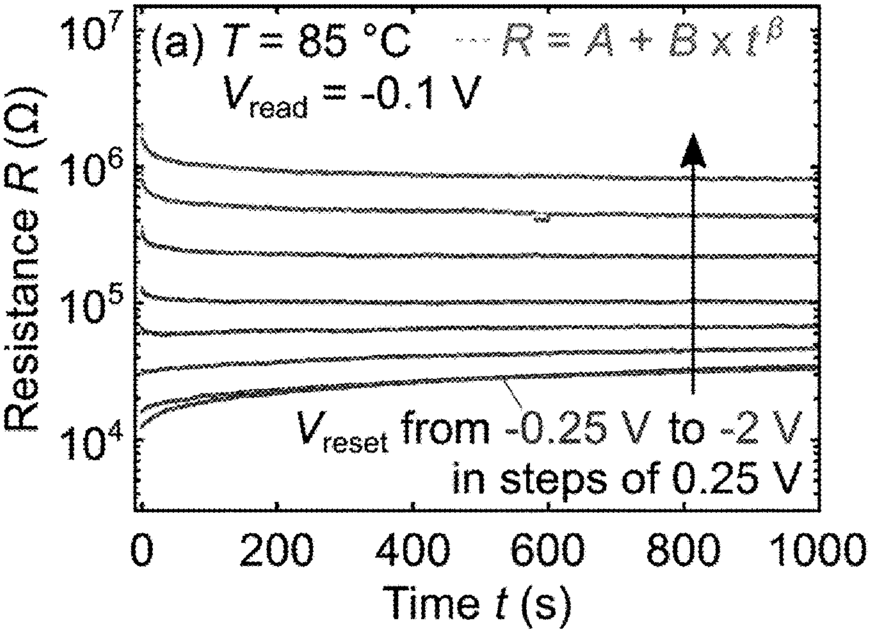
FIG. 50 shows multiple-state retention at T=85° C. for negative reset voltages (FIG. 50(*a*)) and for positive set voltages (FIG. 50(*b*)). The same device was used in FIG. 50(*a*) and (*b*). In between set/reset operations, the device was reset/set with ∓2 V. In a limited range of the measured 1000 s, the states can be clearly distinguished. Dashed lines (red dashed lines in the original of the plot) on top of the different measured traces are fits to the power law $R=A+B\times t^{\beta}$with A, B>0 and $|\beta|<1$.
Figure 50B:
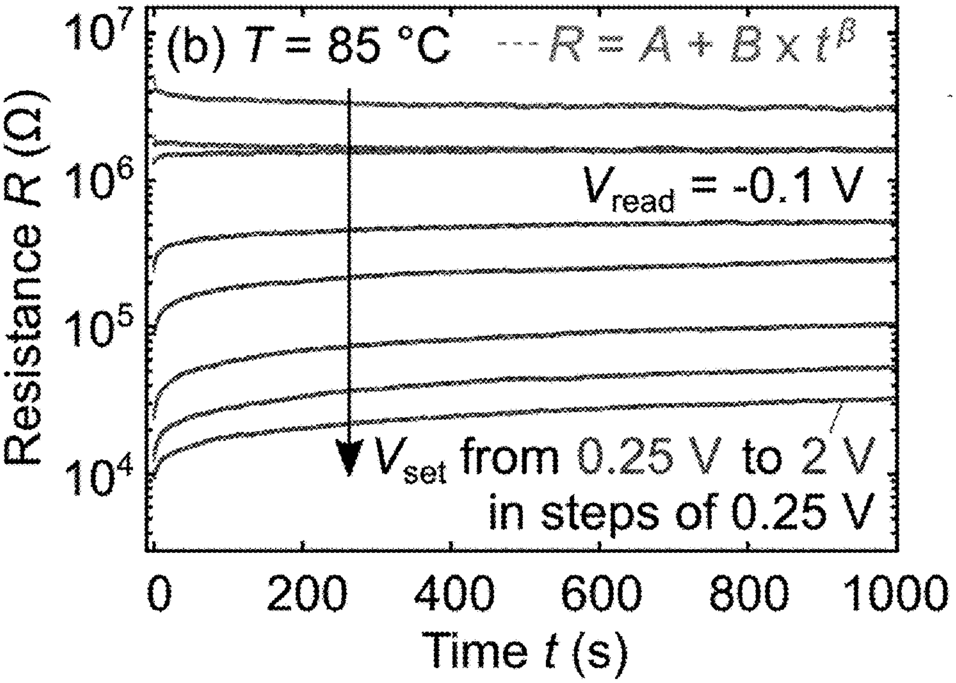
Figure 50C:
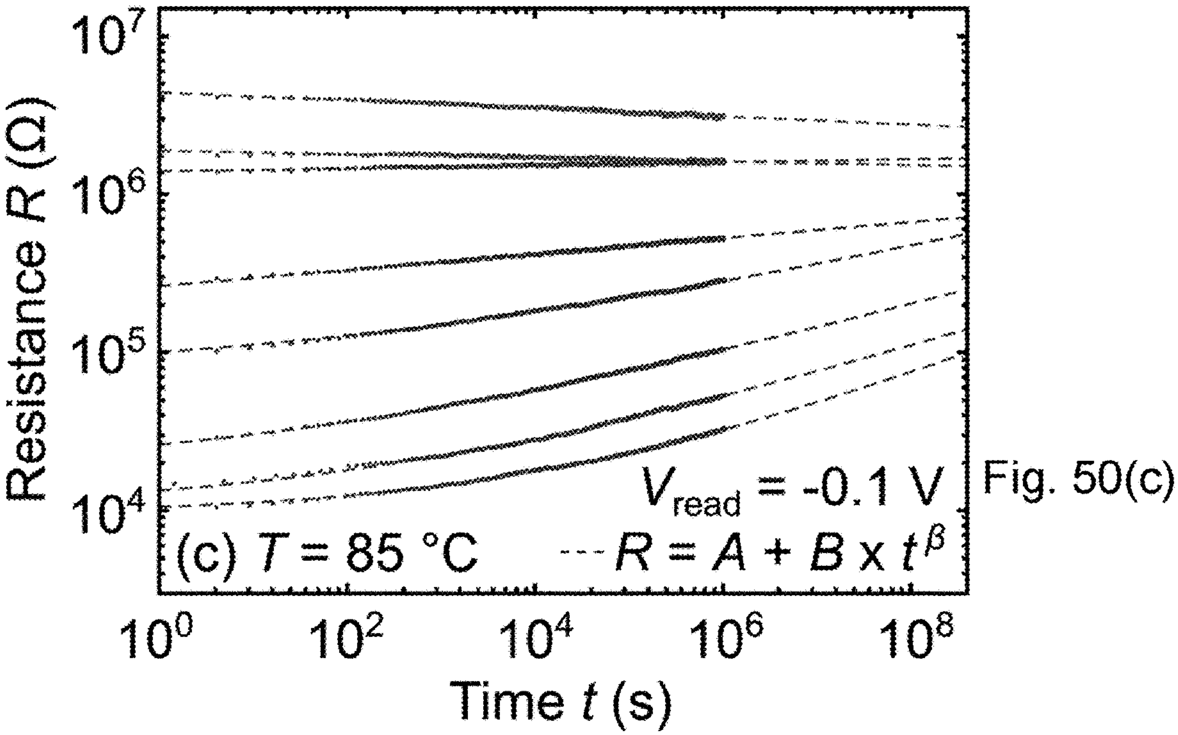
Figure 50D:
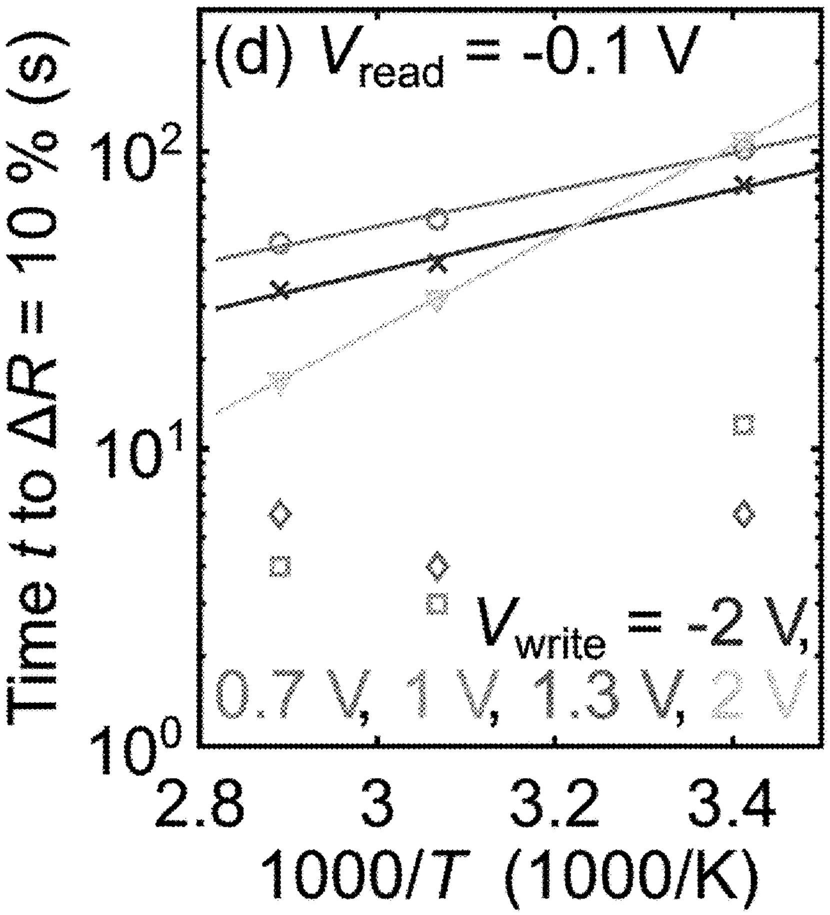

FIG. 44 shows a cross-sectional TEM characterization of a NBT film on a Nb:STO substrate. The dashed boxes (blue in the original of this image) indicate a region which is shown slightly enlarged in the lower right corner of the image. FIG. 45 shows a further enlarged view of the area of the sample shown with the dashed box in FIG. 44. The horizontal dashed lines (red in the original of these images) indicate a region of epitaxy in the active layer. This can be assessed visually by considering FIG. 45 which clearly shows epitaxial arrangement of the active layer with respect to the Nb:STO single crystal substrate. However, further into the thickness of the active layer, the material is amorphous. These points are confirmed by the FFT images presented in FIGS. 46, 47 and 48, corresponding respectively to Region I (red solid box in the original image) in the amorphous region of the active layer; Region II (blue solid box in the original image) in the region including the epitaxial portion of the active layer, and Region III (yellow solid box in the original image) in the single crystal Nb:STO substrate.

The inventors have carried out still further studies in this technical area and in particular have considered amorphous nanocomposite thin films, which leads to uniform and reproducible interfacial resistive switching (RS). In the field of RS, amorphous nanocomposite thin films are an underexplored class of materials as composite thin films typically consist either of phase-separated epitaxial materials or of homogeneously mixed epitaxial or amorphous composites. Here, about 20 nm-thin, phase-separated amorphous nanocomposites are formed by incorporating an average of about 7% Ba into hafnium oxide during pulsed laser deposition at temperatures not greater than 400° C. The incorporation of Ba reduces the propensity of the films to crystallize and leads to thin films consisting of an amorphous HfOx host matrix interspersed with about 2-nm-wide, about 5-to-10-nm-pitch Ba-rich amorphous nanocolumns penetrating about two thirds of the thickness through the films. These nanocolumns are considered to guide the formation of partial conductive filaments while preventing complete dielectric breakdown as in purely filamentary RS devices. The remainder of the films establishes an interfacial Schottky-like energy barrier for electron transport and its magnitude is tuned by ionic migration under an applied electric field.

Devices based on these films exhibit stable cycle-to-cycle, device-to-device, and sample-to-sample reproducibility with a measured switching endurance of at least $10^4$ cycles for a memory window at least 10 and without the abrupt current changes characteristic of filament-controlled devices. Instead, each device can be set to multiple resistance states by applying appropriate voltages between ±2 V, highly competitive with other memory applications, and it enables neuromorphic functionality such as spike-timing-dependent plasticity.

The demonstration of these example amorphous nanocomposite materials systems therefore allows the manufacture of a large array of similar composite thin films with a wide range of electronic applications.

Owing to the simplicity of fabrication and CMOS compatibility, resistive switching (RS) devices are among the prime contenders for future energy-efficient memory and computing technologies such as neuromorphic or in-memory computing [1, 2, 3]. RS in a device refers to its ability to exhibit different controlled electrical resistance states between its electrical contacts.

For large-scale industrial integration, such RS functionality needs to be realized with materials which are well-established in industry, and one such material is amorphous hafnium oxide, which is widely used as the gate oxide in semiconductor field-effect transistors. Compared with other industry-compatible RS oxides such as TiOx [4], it offers the additional versatility of possessing ferroelectric (crystalline) phases [5], which may provide an additional edge among the competition for future memory and neuromorphic devices. While there have been numerous demonstrations of RS in hafnium-oxide-based devices, however, the vast majority of those relied on the reversible dielectric breakdown of the devices, i.e. the reversible formation of a conductive filament through the otherwise insulating film [6, 7, 8, 9, 10]. In an amorphous material, the formation of such a filament is inherently stochastic and typically, it is accompanied by very abrupt changes in the device current. This switching stochasticity induces inherent variability both in terms of cycle-to-cycle repeatability within the same device and in terms of device-to-device consistency, which in turn undermine reliable circuit integration [11, 12]. In addition, often an initial forming step is required with a higher voltage than subsequent device operation and with an external current compliance, to create the very first filaments [13]. So far, demonstrations of gradual RS in amorphous hafnium oxide required an additional layer in the oxide stack such as sub-stoichiometric AlOx [14], TiOx [15], or WOx [16], which adds additional fabrication steps and requires additional materials control, and/or data on endurance and/or retention were missing or not reported in detail [14, 15, 17]. In addition, even if the observed RS is gradual, often it is still not clear whether the switching is interface-controlled, or whether it is effectively filamentary switching with a series resistance due to the added layers. Reports of interfacial/gradual RS in many other materials systems were based on complex perovskites [18], which are not industry-compatible, or they relied on the incorporation of other industry-incompatible materials in otherwise compatible oxides, such as Pt nanoparticles dispersed in $SiO_2$ [19]. Furthermore, the focus of these and similar reports is often on individual device demonstrations, but it is important to achieve and report uniform performance beyond single devices [20].

Here, we demonstrate uniform and stable cycle-to-cycle, device-to-device, and sample-to-sample repeatability in interfacial resistive switching devices based on only one deposited hafnium oxide layer. To achieve this, we designed a novel self-assembled amorphous nanocomposite thin film, deposited at CMOS-compatible temperatures of not greater than 400° C., which consists of a parent amorphous hafnium-oxide-based matrix and nanoscale columnar second-phase regions to support the resistive switching process. To create this amorphous nanocomposite, Ba was added to hafnium oxide during the single-step thin film deposition, and due to its simplicity of compositional control, pulsed laser deposition (PLD) was used to deposit the films. The PLD target had a Ba: Hf cation ratio of 1:2, which exceeds the solubility limit of dopants (with large atomic radii) in (crystalline) hafnium oxide, so that the formation of a second (amorphous) phase could be expected [21].

The incorporation of Ba in the hafnium oxide thin films is considered to induce three key effects which produce high-performance interfacial RS in the films: (i) It leads to materials amorphization, which causes material uniformity on a microscopic level, more so than any pure PLD hafnium oxide deposited over a wide range of temperatures. (ii) It reduces the relative oxygen content of the films and the Hf oxidation states, which makes the films more electronically conducting and thus prevents the build-up of large electric fields over the films, which would lead to dielectric breakdown. (iii) It produces second-phase nanocolumnar structures in the thin films, which facilitate the controlled forming of only partial filaments without a complete dielectric breakdown, and the corresponding forming voltage of 2 V is the same as the subsequent maximum (positive) switching voltage. These columns extend from the top electrode (TE) of the devices, where they short-circuit any Schottky-like barrier, and because they are reaching about ⅔ through the film thickness, they restrict the RS process to the Schottky-like barrier at the bottom interface. As a result, the Ba:HfOx nanocomposite films exhibit uniform RS with low variability and low switching voltages of ±2 V, and without the abrupt current changes characteristic of filamentary switching, which predominates for RS in standard single-layer amorphous hafnium oxide thin films. To date, we are not aware of any demonstration of similarly stable and repeatable interface-controlled RS in single-film hafnium-oxide-based devices.

Besides the realization of interface RS in single-film hafnium oxide, this demonstration of amorphous phase-separated nanocomposite thin films is significant because so far, for RS applications, the vast majority of composite thin films consisted either of phase-separated epitaxial composites (e.g. [22]) or of homogeneously mixed amorphous or crystalline films such as the widely studied (ferroelectric) doped hafnium oxide [5]. As demonstrated in the following, phase-separated amorphous oxide nanocomposites have the potential to add an additional tuneable dimension to the design of thin film functionality, and the principle can be extended to other industrially important materials systems such as SiOx.

We first present and discuss the electrical performance of the devices and then present the materials analysis data. Based on this, we propose an explanation for the switching and conduction mechanisms.

Ba:HfOx thin films were deposited directly on electrically conductive single-crystal (001) Nb-doped strontium titanate (Nb:STO) substrates with a supplier-provided resistivity ρ of about 5.5 mΩcm at 300 K. Nb:STO was chosen as the initial substrate to study our new thin film design concept with a 'clean' (conductive, no native oxides, minimal surface roughness) reference bottom electrode (BE). While a commercial process for the integration of STO on 200 mm Si wafers has been demonstrated [23], Nb:STO is at present typically not regarded as an industry-compatible electrode. Thus, we also present initial data of our films deposited on TiN. The thin films were deposited by PLD from an oxide ceramic target consisting of $HfO_2$ and $BaHfO_3$ in a molar ratio of 1:1. TiN was deposited by PLD as well. Circular Pt or W (for industry compatibility) top electrodes (TEs) with diameters of 10-100 μm were fabricated by a standard UV lithography lift-off process and sputtering. For electrical measurements, devices were contacted in a probe station, where in the case of an Nb:STO BE, rather than employing an elaborate via process, the bottom contact was established through conductive Ag paint in contact with the Nb:STO. The complete measured structures thus comprised probe tip—TE—thin film—Nb:STO substrate—Ag paint—probe tip, as illustrated in the inset of FIG. 49(*a*). For devices with TiN BEs, a small area of TiN was masked off during film deposition so that the TiN could be contacted directly in the probe station. For all probe station measurements, voltages were applied to the TE with the BE grounded and currents were measured at the TE.

Figure 55:
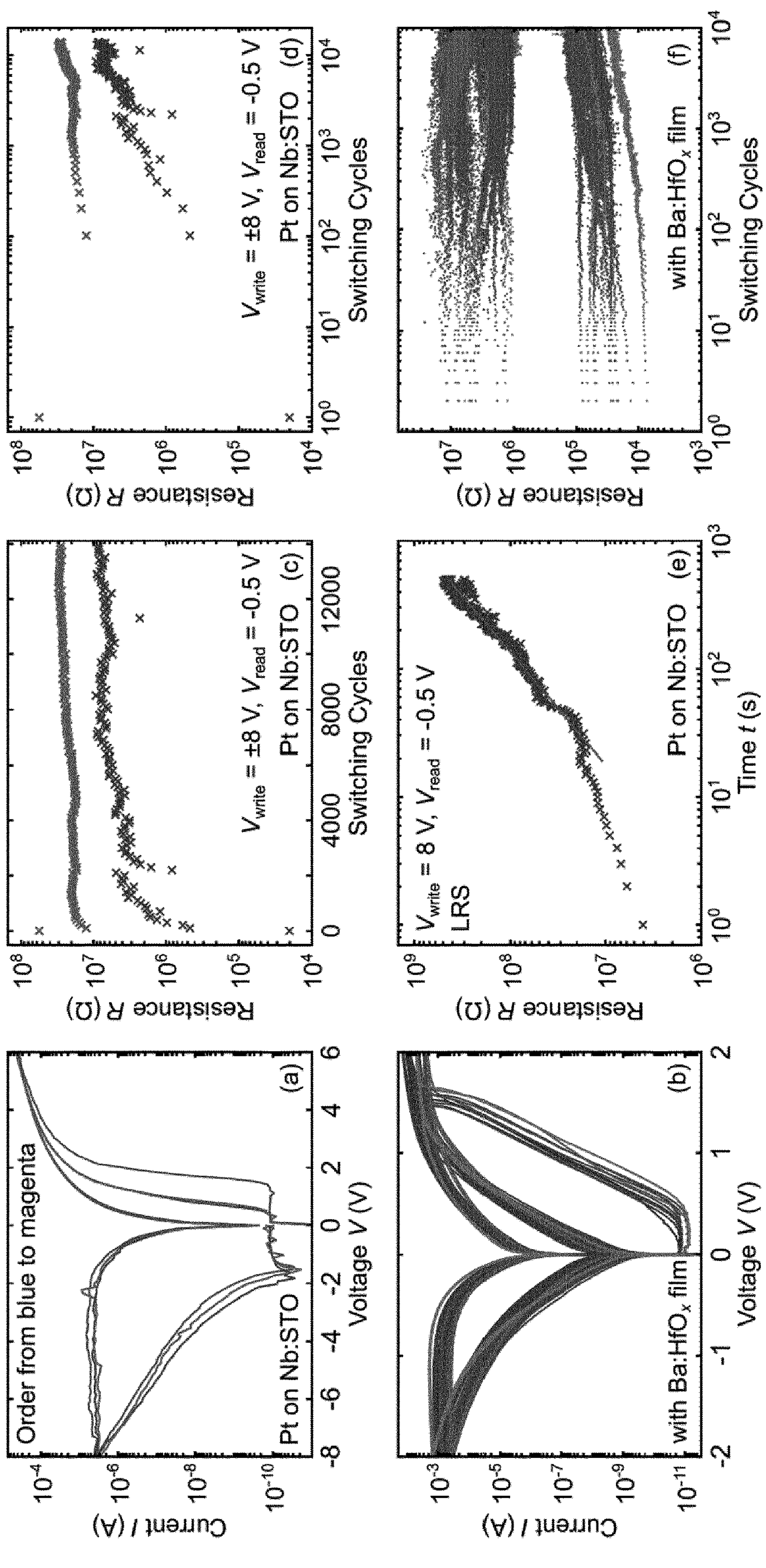
FIG. 55 shows Pt on Nb:STO reference measurements.

For reference, it is established in the literature that metal contacts deposited directly on Nb:STO can lead to a substantial hysteresis in the current-voltage (IV) curves, e.g. due to charge trapping or proton exchange [25], and in FIG. 55, measurements are presented on a Pt-on-Nb:STO reference sample, which, except for thin film deposition, underwent the same fabrication process steps as the devices presented here. It is evident that the shape of the reference IV curves is consistently and markedly different from the nanocomposite films discussed in the following. In particular, the endurance and retention performances are much worse for the Pt—Nb:STO devices compared with the nanocomposite films, and higher voltages are required to switch the former.

Figure 56:
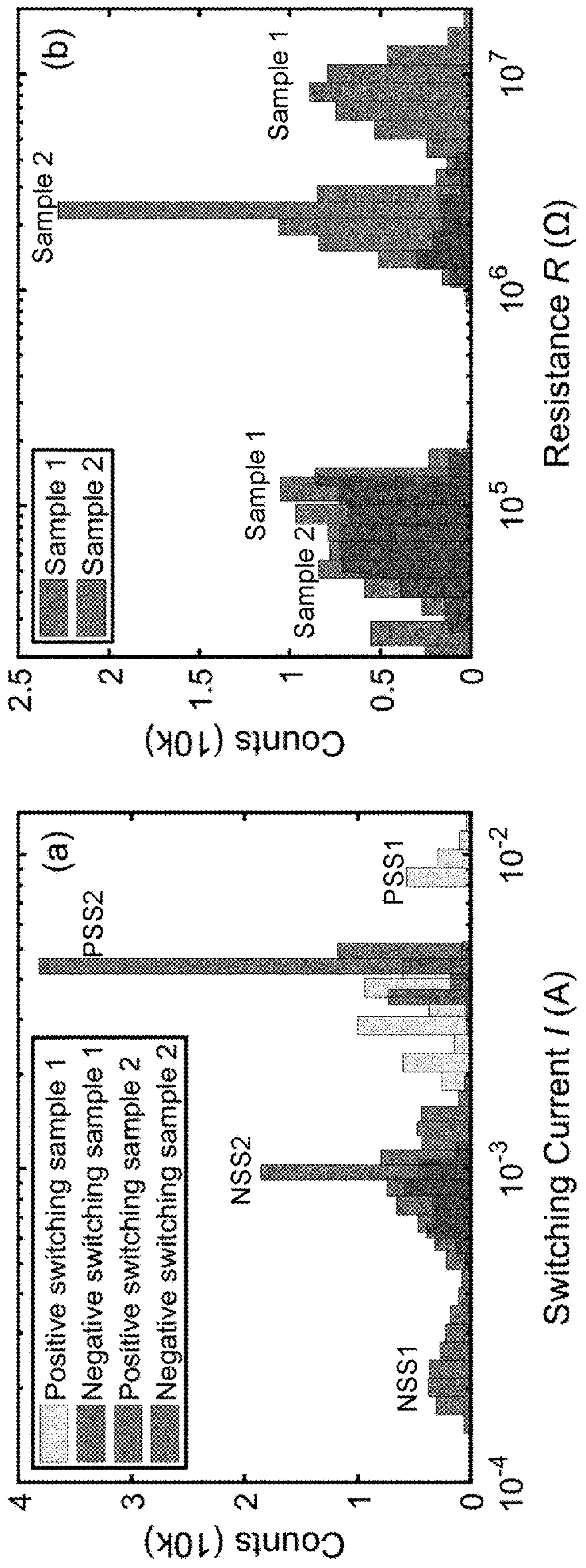
FIG. 56 shows histograms of endurance measurements.
Figure 57:
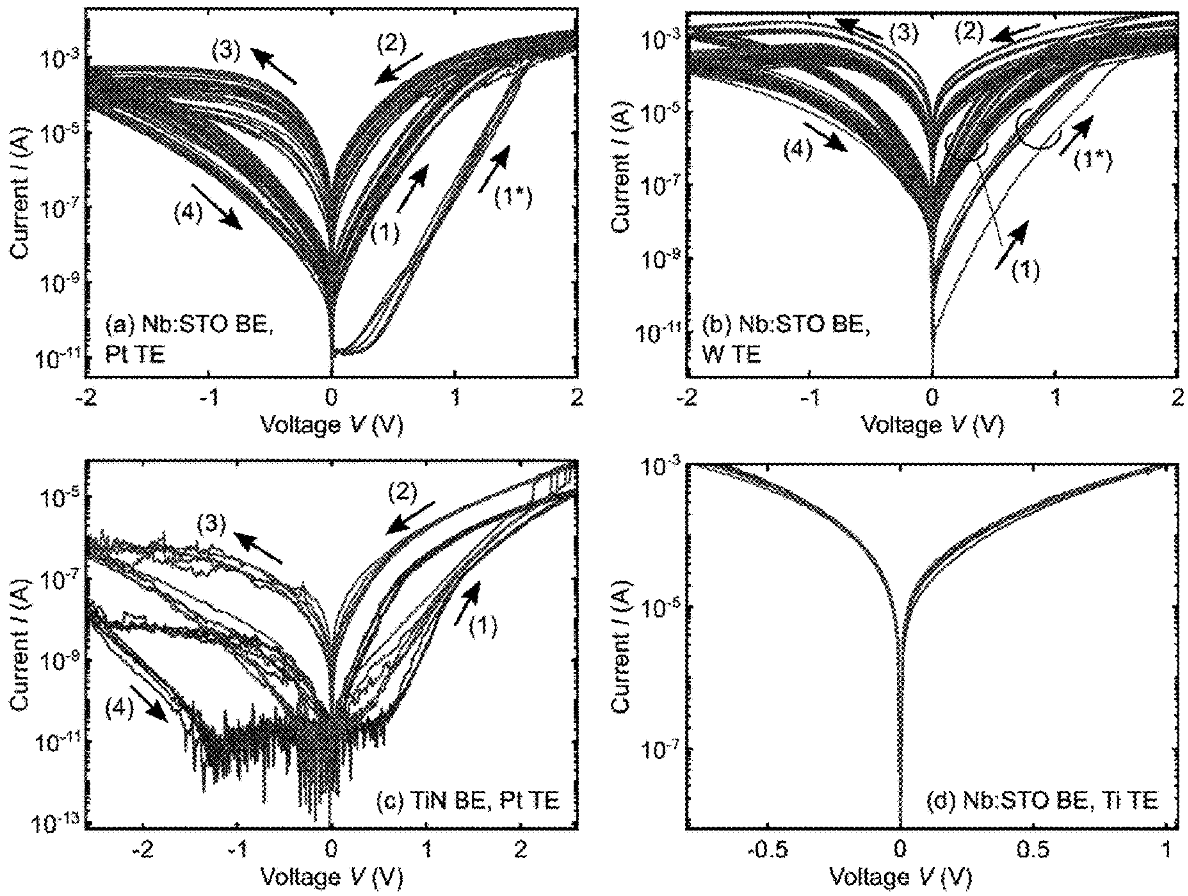
FIG. 57 shows the effect of different electrode materials.

The best electrical performance was achieved for the nanocomposite devices based on thin films with thicknesses between 15 and 25 nm, deposited at 400° C. (Reference films will be discussed later.) The initial five IV curves for each of ten different pristine devices on the same sample are presented in FIG. 49(*a*) and endurance data for five of these devices and five devices from a second sample are presented in FIG. 49(*b*), where every single switching cycle is recorded as recommended in [20]. Histograms of the measured endurance performance are provided in FIG. 56 and the IV curves for the second sample are provided in FIG. 57(*a*) and had the same shape as in FIG. 49(*a*), only with slightly lower currents. FIG. 57(*c*) also includes IV curves for a sample with W TEs and their shapes are very similar to the ones in FIG. 49(*a*), too, but the off-state current is higher than in the samples with Pt TEs. A comparison of IV curves from devices with Ba:HfOx films and pure HfOx films of similar thickness in FIG. 58 clearly demonstrates that the pure HfOx films are more insulating, noisy, and less reproducible. Finally, FIG. 57(*c*) presents hysteretic IV curves for a sample with a TiN BE instead of Nb:STO. While these IV curves are less uniform and more noisy, they prove that the observed RS is not originating from the Nb:STO alone, but is a combination of film and electrode. Further optimization of the TiN can be expected to result in the same highly uniform performance as the model Nb:STO electrode. For example, initial data (not shown) suggest that the surface roughness of the TiN has a critical impact on the device reliability, as already during initial iterations, in-house deposited TiN provided better results than commercially available TiN wafers. However, an optimization for complete back end of line compatibility is beyond this initial study of the newly proposed materials system. It is in part on the basis of these observations that the inventors consider that it may not be necessary for the device to include a semiconductor layer in contact with the active layer. In a simple embodiment, the device may comprise a bottom electrode (e.g. comprising metallic TiN), an active layer (e.g. according to the disclosure provided elsewhere herein) and a top electrode.

While it is clear from the IV curves in FIG. 49(*a*) that the devices undergo a forming step during the first voltage application, this forming does not require a higher voltage than the subsequent switching voltages. (The forming step will be discussed in a later section along with the subsequent RS mechanism.) The switching voltages for all IV and endurance measurements were ±2 V, just as for the IV curves. This is lower than the about ±4 V of other recently reported hafnium-oxide-based multi-level RS devices [17, 26], much lower than the 10 V still required for (experimental) 28 nm NAND Flash [27], and approaching the about 1-2 V of state-of-the-art DDR SDRAM [28].

The results in FIGS. 49(*a*) and (*b*) demonstrate small cycle-to-cycle and device-to-device variability as well as reliable sample-to-sample reproducibility. Out of the 51 devices measured across the two samples from FIG. 49, 75% exhibited stable hysteretic IV curves and 71% out of these could maintain a memory window of about 10 for up to $10^4$ switching cycles, as presented in FIG. 49(*b*). In a dedicated cleanroom fabrication environment (unlike a multi-user, multi-process university lab), these numbers can be expected to increase further. For the same reason of a non-ideal university fabrication environment, the yield of devices with stable electrical performance decreased for devices with smaller electrode diameters than the 50 and 100 um in FIG. 49. Nonetheless, similarly uniform and stable endurance performance for devices with 10 um diameters is presented in FIG. 59 with the same switching voltages and memory window as the larger devices in FIG. 49.

Furthermore, the extremes of the scalability of the observed switching mechanism (discussed later) were confirmed by measuring hysteretic IV curves by conductive atomic force microscopy (CAFM), where a bias was applied to the BE of the sample and the CAFM tip was grounded, as illustrated in the inset of FIG. 49(*f*). When scanning a pristine section of a film with −10 V applied to the BE, at first, the film was very insulating with measured currents below a few pA, which is the instrument noise floor (FIG. 60(*a*)). After one full scan, small areas of the film had become conductive as illustrated in FIG. 49(*d*) FIG. 1(*d*), which presents a second scan of the same area, but this time with −7 V applied to the BE to prevent forming of the complete area. In a more controlled variation of this experiment, a smaller scan area of 100×100 $nm^2$ was scanned a few times with-10 V applied to the BE, followed by the larger 500×500-$nm^2$ scan presented in FIG. 49(*e*). It is clear that the initial smaller area had become more conductive, whereas the previously untouched area was still insulating. When the CAFM tip was kept constant in one position within the formed area of FIG. 49(*e*) and the voltage was cycled from 0 V to −10 V and back to 0 V, a clear hysteresis was observed in the corresponding current with the same polarity as in the probe station IV measurements. The absolute values of the voltage and current for ten repetitions of such a measurement are presented in FIG. 49(*f*). While the voltages at which the hysteresis appears are much larger than in the probe station IV measurements, this is attributed to the large contact resistance between the CAFM tip and effects of current crowding at the tip, which are common observations in CAFM measurements. Also, despite being nominally in a fixed position, the CAFM tip was drifting slightly during these measurements, which means that the ten repetitions presented in FIG. 49(*f*) were not measured in the exact the same spot. They were all within the same formed area, however, and prove promising uniformity even at the nanoscale. While the CAFM tip diameter of 25 nm was too large to resolve individual conductive nanocolumns, the conductance contrasts within the conductive areas of FIG. 49(*d*) and (*e*) may well be traces of these individual columns.

Since the endurance data were measured with a standard Source/Measure Unit (Keysight B2912A), the widths of the write and read pulses (see inset FIG. 49(*c*) were on the order of milliseconds. To test the limits of the switching speed, the effect of write pulses with different lengths was measured with a Keithley 4200A-SCS and a Keysight B1500 parameter analyzer and the results are presented in FIG. 49(*c*). For this measurement, the width of the write pulses was changed as displayed on the x-axis of FIG. 49(*c*) and the width of the subsequent read pulse was kept on the order of milliseconds. The same voltage amplitudes of ±2 V were used as for the endurance measurements. A memory window of about 10 is maintained for write pulse widths down to 100 ns and a degradation is only observed for write pulse widths of 20 ns. As the measurement setup used DC probe tips and electrode layouts, it is likely that the degradation of the memory window for write pulses of 20 ns is actually caused by the measurement setup and electrode design rather than the switching mechanism itself [29]. This is further supported by the time-resolved current data during fast measurements, presented in FIG. 61, where the current during switching is completely dominated by a typical ringing due to RC constants in the signal path. The separate read pulses with longer rise time and pulse width prove that the devices switch regardless of the ringing and once the ringing subsides at switching voltage rise times of 1 μs, FIG. 52, the current follows the voltage instantaneously. For proper fast real-time current-vs-time measurements, dedicated probe pads and tips are required, as demonstrated in e.g. [19], but the development of a corresponding fabrication process was beyond this study.

As the final standard figure of merit for novel RS devices, the state retention at different temperatures is presented in FIG. 50. In FIG. 50(*a*) and (*b*), at a sample temperature of 85° C., eight different reset and set voltages were applied with negative and positive polarity, respectively, which resulted in seven different states for either polarity, as two states were indistinguishable in either case. For negative reset voltages, the device was set with 2 V in between set operations and for positive set voltages it was reset with −2 V in between set operations. In a limited range of the measured 1000 s, the different resistance states can be distinguished clearly, and their spacing suggests that additional intermediate states can be programmed. Note that the different resistance states were achieved purely based on voltage application and no current compliance was required, as is often the case for multi-level performance in filamentary devices [30].

For non-volatile memory applications, the typically required (extrapolated) retention time is ten years. The measured results in FIG. 50(*a*) and (*b*) can be fitted with a power law of the form $R=A+B\times t^{\beta}$ with $|\beta|<1$. The average adjusted $R^2$ for these fits is at least 0.93 with A and B restricted to positive values which can be identified with the measured resistances. This way, the fitted equations can be identified with a physical processes, the Curie-von Schweidler law, which is understood to occur due to time-dependent charge redistribution in dielectrics, e.g. due to charge trapping/de-trapping or ionic motion [31]. Under the assumption that this process governs the state decay, from FIG. 50(*c*) it is clear that the different resistance states cannot be distinguished for the required 10 years.

As another standard characterization for state retention at elevated temperatures, FIG. 50(*d*) presents the time t until the initially set resistance R had changed by 10%, measured at different temperatures T for different resistance states in the same device. For this type of characterization, it is typically assumed that at higher temperatures, any degradation process is accelerated due to the higher thermal energy at the disposal of the atoms in the device, and often, this can be modelled with and Arrhenius-type equation $\propto\exp[-E_a/(k_B T)]$ with an activation energy $E_a$ and the Boltzmann constant $k_B$. Here, in the measured temperature range, only some of the measured states decayed according to such a dependence, but for example, an extrapolation of the LRS with $V_{write}$=2 V indicates that a 90% state retention for 10 years requires a temperature as low as 132 K.

While this might be useful for cryogenic memory applications such as space or quantum computing applications, it not sufficiently non-volatile for conventional long-term data storage. However, the observed state decay may actually be of advantage for neuromorphic applications [32], where especially the rapid initial state decay can be identified with 'forgetting' or 'short-term plasticity' [34]. Thus, in the following section, we demonstrate neuromorphic functionality of the presented devices, where non-volatility is not as critical, or sometimes not even as desirable as for data storage applications.

Neuromorphic, or 'brain-inspired', computing is one of the most promising approaches to overcoming the von Neumann bottleneck, i.e. the bandwidth limitation between memory and processor. In a biological brain, information is stored in the strength (or 'weight') of synapses, which connect neurons, and learning (and forgetting) is consequently realized by changing the strength of these connections [35]. One widely accepted model to achieve such changes is called spike-timing-dependent plasticity (STDP) [33], which refers to the timing of electric pulses being created in neurons on either side of a synapse. In terms of non-biological electrical devices such as RS devices, the synaptic strength can be modelled as the controllable resistance of such a device. The following results are based on the more industry-compatible devices with W TEs.

Figure 51:
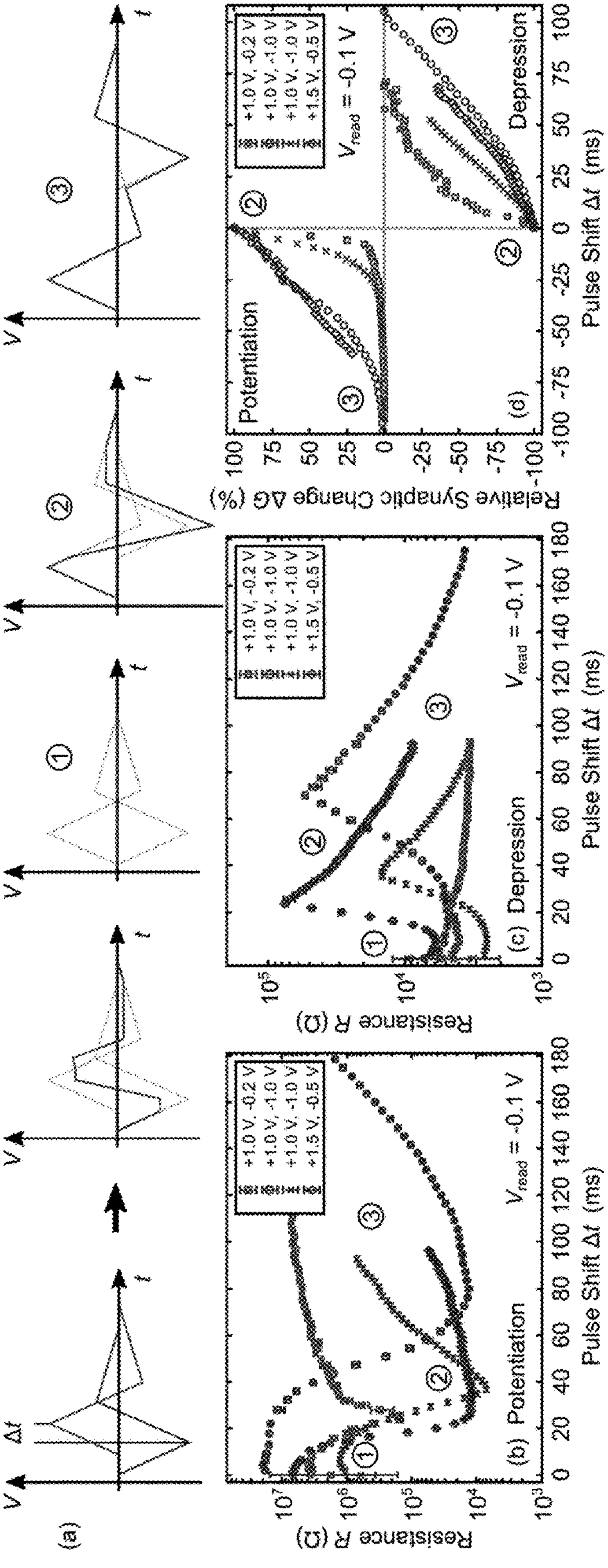
FIG. 51(*a*) shows schematics of the neuromorphic voltage profiles: Two mirrored voltage profiles with a total period of about 150 ms are shifted consecutively as displayed on the x-axes of FIG. 51(*b*) and (*c*). The profile with an initial negative amplitude (blue in the original plot) corresponds to the pre-synaptic pulse. After shifting, the two profiles are added and applied to the TE. The sub-figures marked with 1, 2 and 3 in circles illustrate the three 'extreme' cases where the two voltage profiles add to zero, to the maximum voltage across the device, and two separate profiles, respectively.
Figure 52A:
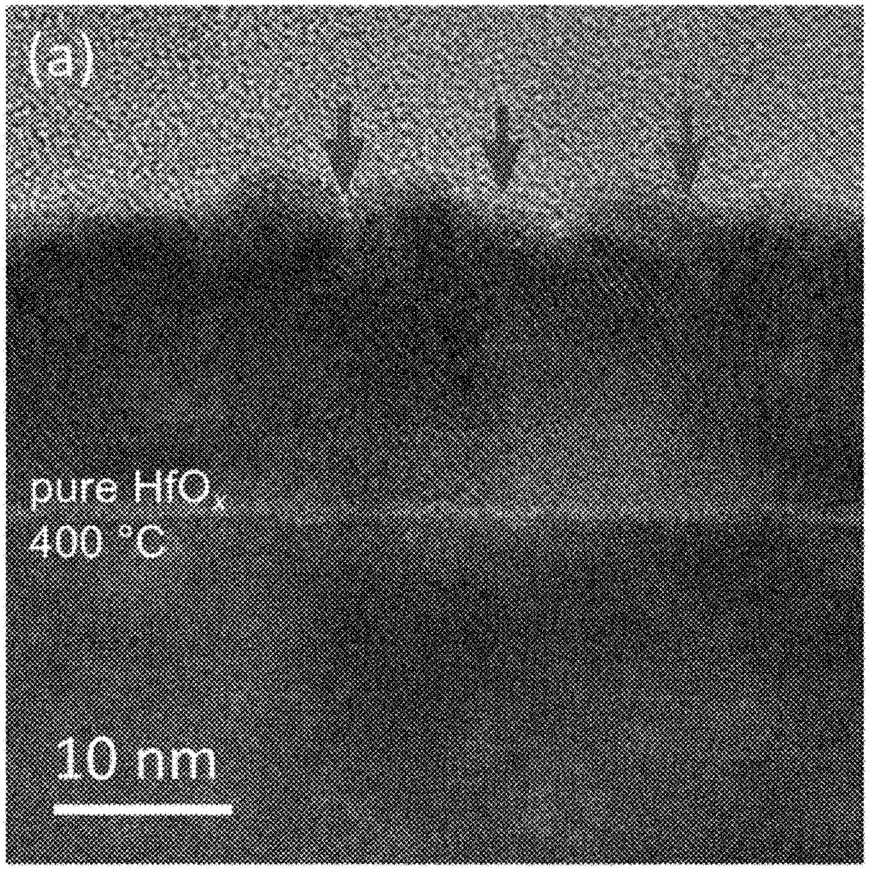
FIGS. 52(*a*)-(*f*) show cross-sectional transmission electron microscopy (TEM) images and energy-dispersive X-ray (EDX) measurements from high angle annular dark field scanning TEM (HAADF-STEM) for different thin films.
Figure 52B:
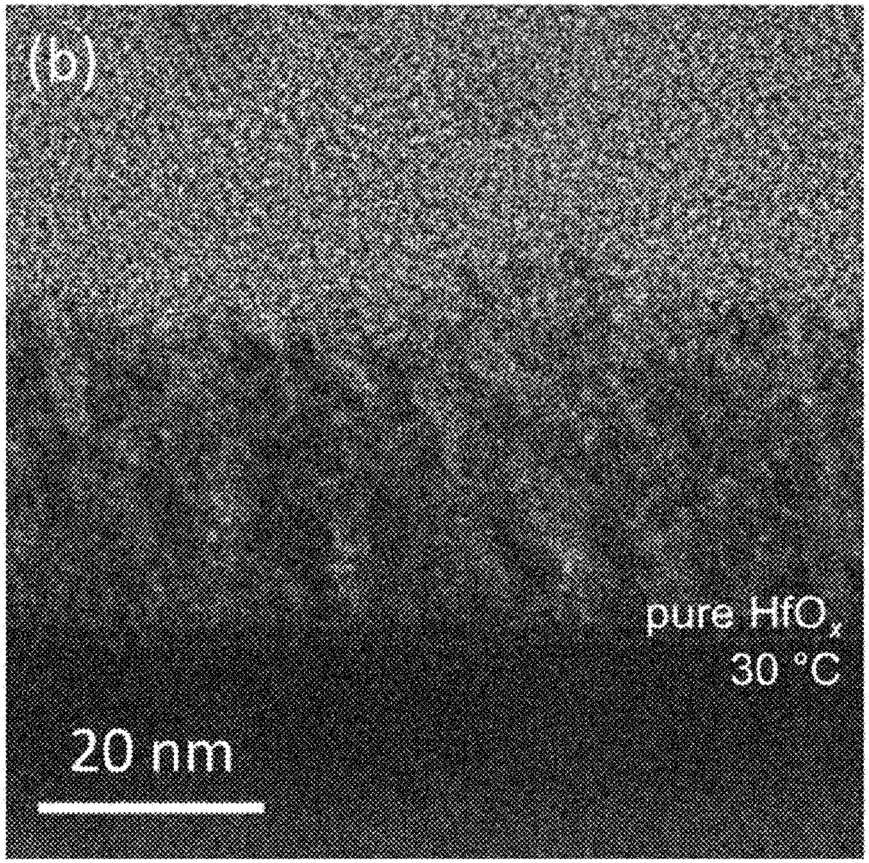
Figure 52C:
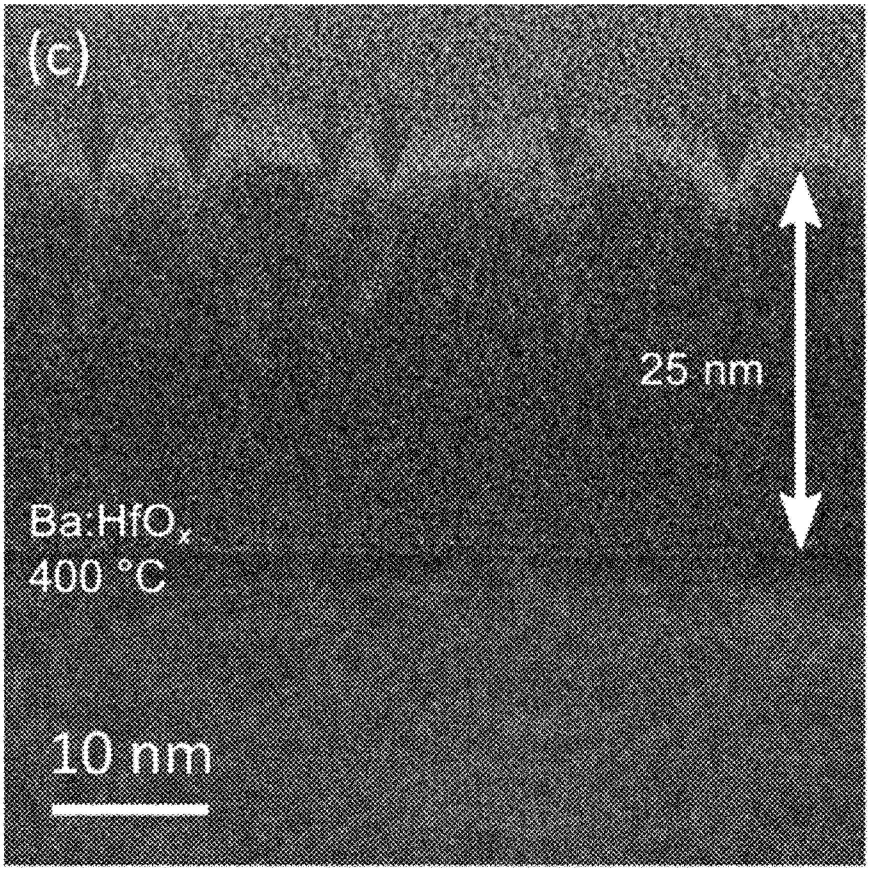
Figure 52D:
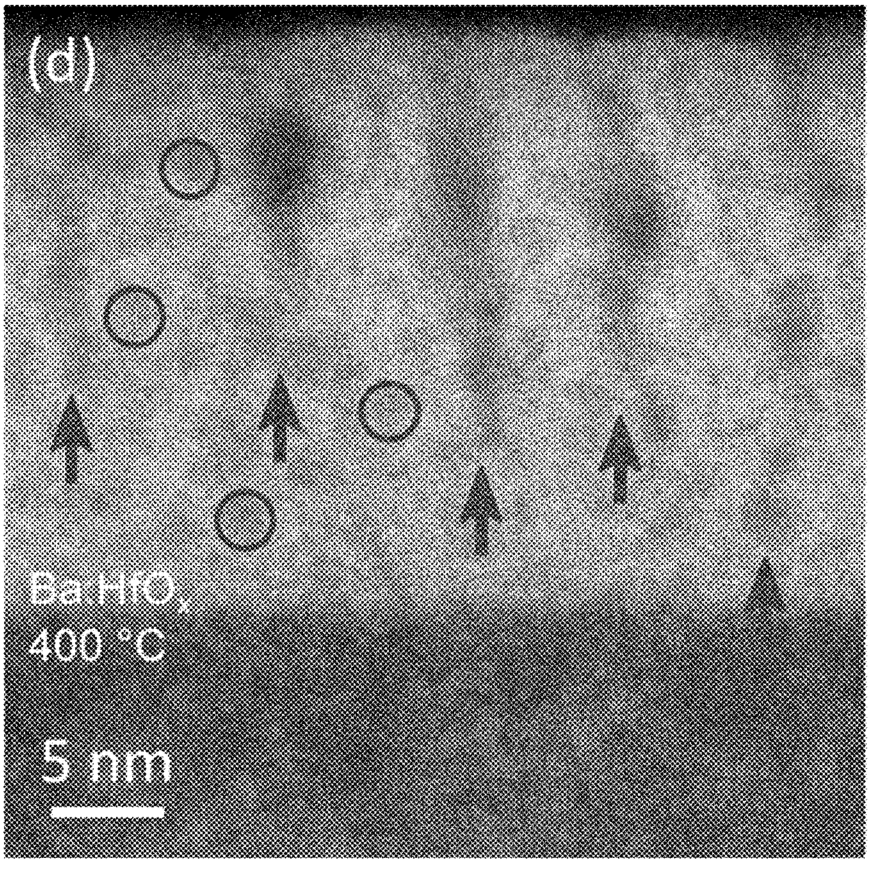
Figure 52E:
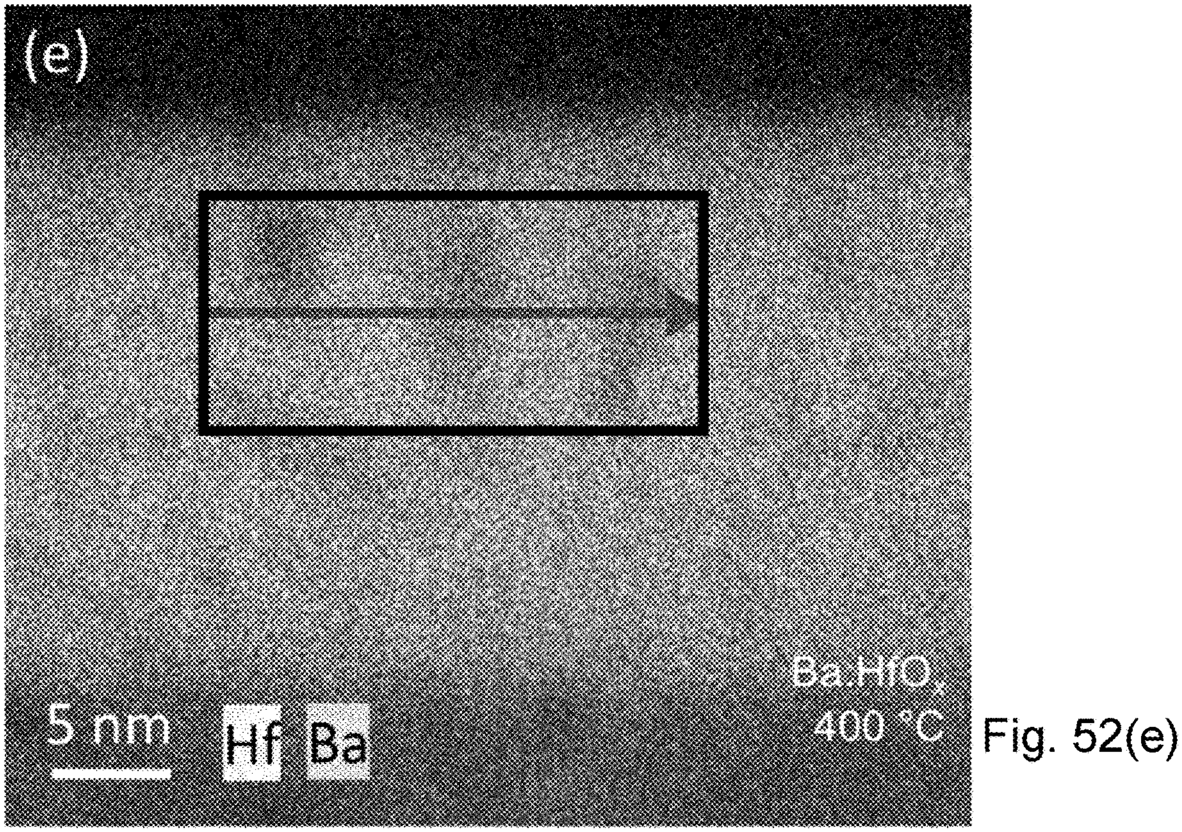
Figure 52F:
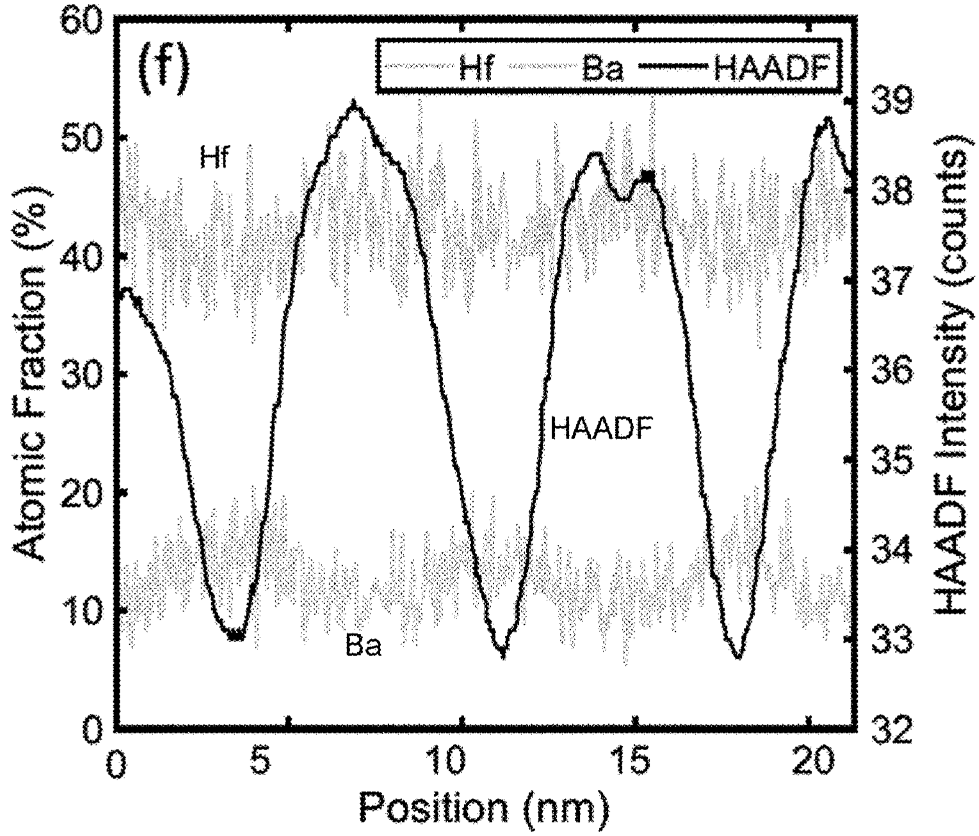

FIG. 51(*b*) and (*c*) present potentiation (reducing resistance→'strengthening connection') and depression (increasing resistance→'weakening connection') for four different devices and voltage profiles. The pre- and post-synaptic voltage profiles to emulate neuronal action potentials consisted of two triangular parts to resemble qualitatively the shape of the biological action potentials identified by Hodgkin and Huxley [36]; a first triangular part for the action potential itself and a second one for the following hyperpolarisation ('recovery'). As only two-terminal devices were measured, rather than applying the voltage profiles physically on either side of the devices, the profile corresponding to the BE was inverted and added to the profile of the TE. Before addition, the two profiles were systematically shifted with respect to each other in time by an amount At and the resulting resistance was measured as the average of 100 data points at a constant read voltage $V_{read}$=−0.1V. The construction of these voltage profiles is illustrated in FIG. 51(*a*) and the respective amplitudes for the profiles are provided in the legends of FIG. 51(*b*) and (*c*) alongside the measured results. The total profile periods were about 150 ms. This is about an order of magnitude slower than typical time scales in biological processes [37], but was limited by the measurement setup rather than the tested devices (see FIG. 49(*c*) for device speed). The measurement of each time shift was repeated ten times and the data points in FIG. 51(*b*) and (*c*) correspond to the mean value of these ten repetitions. The error bars were calculated by standard error propagation from the standard deviations of the 100-point averages while neglecting the small error of the read voltage and the small resulting errors reveal once again the superior device stability. FIG. 51(*d*) presents the relative synaptic weight change ΔW resulting from FIG. 51(*b*) and (*c*) in terms of the corresponding conductance G=1/R. Here, $\Delta t=t_{pre}-t_{post}$; for potentiation $(\Delta t<0)\Delta G=(G-G_{min})/(G_{max}-G_{min})$, and for depression $(\Delta t<0)\Delta G=(G-G_{max})/(G_{max}-G_{min})$. Δt=0 in FIG. 51(*d*) corresponds to the overlap of the maximum of one of the voltage profiles with the minimum of the other, i.e. to the largest total voltage across the device. This normalization was chosen to compare whether the shapes of the potentiation/depression curves could be varied by choosing different voltage profiles, but from these initial measurements, no clear trend can be discerned, and more detailed future work will be required.

Either way, the general capability of the tested devices to emulate STDP is clear from FIG. 51(*b*) to (*d*) as the voltage profiles with different At result in gradually tuneable resistance states. As expected from the multiple resistance states in FIG. 50, the largest change in resistance is achieved when the maximum positive voltage of one of the voltage profiles coincides with the minimum voltage of the other profile, i.e. the maximum total voltage across a device. This is indicated by 2 (circled) in the figures. The further away from this condition the two profiles are with respect to each other, the smaller the total voltage across the device and the smaller the change in resistance. This applies both for potentiation and depression. The two 'extrema' in these cases are indicated by 1 (circled) and 3 (circled) in the figures, which is when the opposite profiles cancel each other and are completely separated, respectively.

Similar neuromorphic functionality based on hafnium oxide thin films has only been demonstrated in devices with additional layers in the oxide stack, both for gradual [17, 26, 14, 15] and filamentary [30] switching, or in ferroelectric systems [38], all of which require more stringent materials control than the devices presented here. The demonstration of STDP presented here opens up a whole range of more intricate learning implementations for future work and demonstrates an easy-to-fabricate synapse device based on amorphous hafnium oxide and similar materials.

To elucidate the relation between the electrical performance and the materials properties, reference devices based on different thin film deposition conditions were fabricated for the purposes of comparison. With these reference devices, the separate effects of Ba addition and deposition temperature on the film crystallinity were studied.

Main system of study: Ba:$HfO_x$ deposited at 400° C. (PLD target Ba:Hf 1:2).

Reference samples:

(i) pure $HfO_x$ deposited at 400° C.

(ii) pure $HfO_x$ deposited at 30° C.

(iii) pure $HfO_x$ deposited at 800° C.

(iv) Ba:$HfO_x$ deposited at 800° C. from the same target as the main system of study For all reference samples, the IV curves were less uniform and less repeatable (see e.g. FIG. 58) than for the Ba:$HfO_x$ films deposited at 400° C. (main system of study), and only a small percentage of measured devices maintained a memory window of at least 10 for at least $10^3$ switching cycles. In light of this instability at the level of IV curves and endurance, retention was not characterized. The only outlier in this regard was the Ba:$HfO_x$ film deposited at 800° C., which maintained a much more stable retention (see FIG. 63, memory window $>10^4$ for $>10^5$ s at room temperature) than devices based on any of the other films, but the high deposition temperature renders it unsuitable for CMOS integration.

The main effect of the Ba addition to hafnium oxide can be discerned from the cross-sectional transmission electron microscopy (TEM) images in FIG. 52, which compares the microstructure of the different films. The reference films of (i) pure $HfO_x$ deposited at 400° C., FIG. 52(*a*), and (ii) pure $HfO_x$ deposited at 30° C., FIG. 52(*b*), are structurally much less uniform than the Ba:$HfO_x$ film, as is evident when comparing them with FIG. 52(*c*). For reference (i), large crystallites with different lattice orientations are visible with grain boundaries reaching throughout the whole thickness of the film. For reference (ii), the cross-sectional TEM shows an amorphous, but very rough and irregular texture.

In the Ba:$HfO_x$ film deposited at 400° C., FIG. 52(*c*), such features are completely absent and the film appears amorphous, very smooth, and regular. However, there are vertically aligned regions with a pitch of about 5-10 nm and widths of about 2 nm embedded in the regular host matrix and penetrating at least two thirds of the way through the film. These columns are indicated by single ended arrows (red arrows in the original of these images) in FIG. 52(*c*) and (*d*), and to distinguish them more clearly, FIG. 52(*d*) presents a high-angle annular dark-field (HAADF) scan of the film, where the vertical nanocolumns appear darker than the surrounding matrix. Besides the nanocolumns, it also reveals the presence of similar darker regions in other parts of the film as about 2-nm-wide nanoparticles, some of which are indicated by circles (red circles in the original of these images) in FIG. 52(*d*). Neither the host matrix of the films, nor the darker regions are crystalline, which explains why neither phase can be observed by X-ray diffraction (XRD) measurements (see FIG. 64(*c*). The darker colour in the HAADF scans indicates a higher concentration of a relatively lighter element and the energy-dispersive X-ray diffraction (EDX) presented in FIG. 52(*e*) and (*f*) confirms that these regions are Ba-rich compared with the surrounding matrix. This local Ba segregation as well as the overall film amorphization can be explained by the Ba solubility in crystalline $HfO_x$ being exceeded, which destabilizes any crystalline phase and leads to the forming of a separate amorphous Ba-rich phase [21]. The limited Ba solubility in $HfO_x$, together with a reported Ba volatility especially during low-temperature PLD [39, 40], can explain why the observed nanocolumns only start forming after a certain film thickness has been reached. During deposition of the first few layers, the minute Ba solubility in $HfO_x$ favors a Ba segregation to the top of the films and some of it may be lost to the deposition atmosphere. Only after a certain amount of Ba has been incorporated into the films and sufficient regions of the second Ba-rich phase have formed can they coalesce into the observed nanocolumns.

From FIG. 52(*f*), the Ba cation fraction in the matrix is about 10/(10+45) (i.e. about 0.18) and it is higher in the nanocolumnar second phase region, varying between about 0.25 and about 0.33. Since the nanocolumnar regions are only a few nanometers in diameter, EDX scans across them will also sample some of the matrix in which they are embedded. Thus, the local Ba content in the nanocolumns cannot be measured to a high degree of accuracy and is likely higher than what can be concluded from FIG. 52(*f*). Irrespective of the exact materials composition, the higher Ba content in the amorphous columnar regions is evident.

The fine nature of the second phase interspersed in the Ba:$HfO_x$ matrix is expected at the deposition temperature of 400° C., where the diffusion kinetics are insufficient for long-range atomic diffusion or the formation of crystalline material. The columnar regions are formed where short-range diffusion kinetics are sufficient for nanoparticle regions to coalesce. As will be discussed in a later section, these second-phase columnar regions can facilitate RS and electronic conduction.

Figure 64:
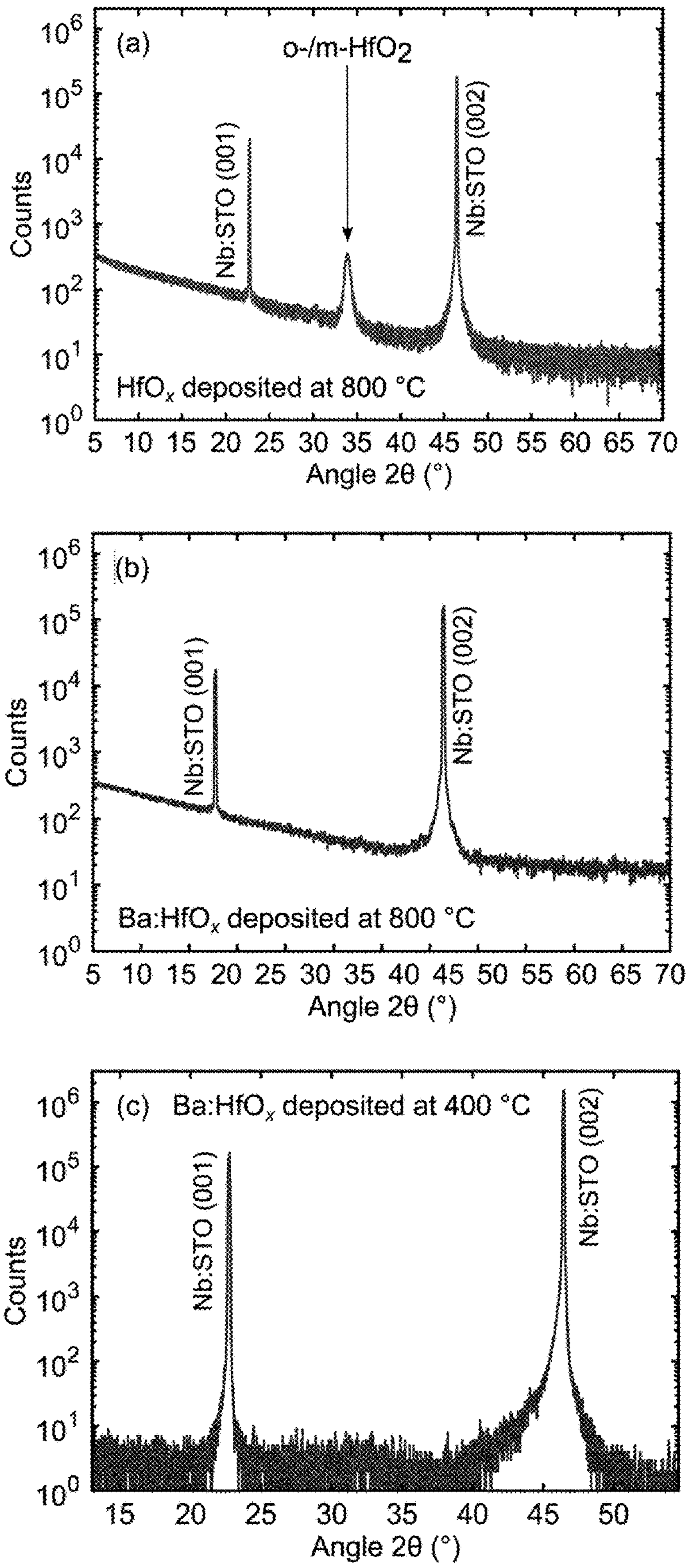
FIG. 64 shows XRD scans for different films deposited at different temperatures.
Figure 65:
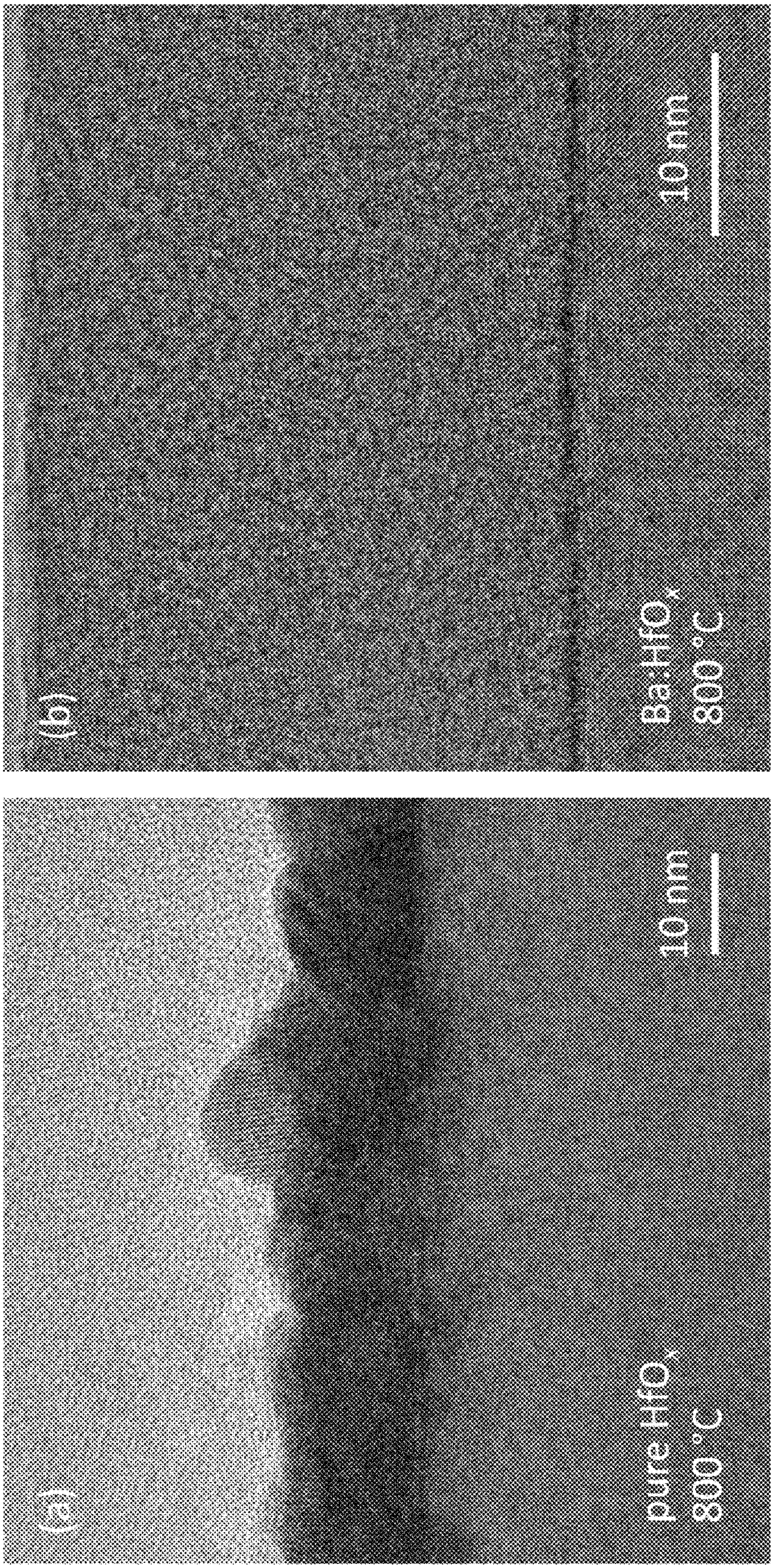
FIG. 65 shows TEM images of films deposited at 800° C.

The strong suppression of 'large' (on the order of the film thickness) crystallite formation is evident also at the high deposition temperatures of 800° C., which is documented in FIG. 64 (XRD) and FIG. 65 (TEM). Again, pure $HfO_x$ forms clearly polycrystalline films, whereas films deposited from the composite target form tiny (order of unit cell) nanocrystals at best or most likely are amorphous. From these TEM studies, it can be concluded that the addition of Ba has a stronger effect on the materials amorphization than the deposition temperature.

For a detailed analysis of the materials compositions and especially the effect of the added Ba, Rutherford backscattering spectrometry (RBS) was carried out on two Ba:$HfO_x$ composite films and two pure $HfO_x$ films, all deposited at 400° C. on commercial 200-um-thick thermally formed $SiO_2$ on top of a Si substrate; for either material, films were deposited with about 15 nm (similar to the device thickness) and with about 120/100 nm thickness (to evaluate the homogeneous elemental distributions and the effect of electronic stopping cross sections on the film compositions [41]). In addition, the chemical bonding and oxidation states of Ba:$HfO_x$ and $HfO_x$ thin films on top of Nb:STO were analyzed by depth-resolved X-ray photoelectron spectroscopy (XPS) and compared with reference films deposited on commercial Si. The RBS and XPS results are summarized in FIG. 53.

Figure 53:
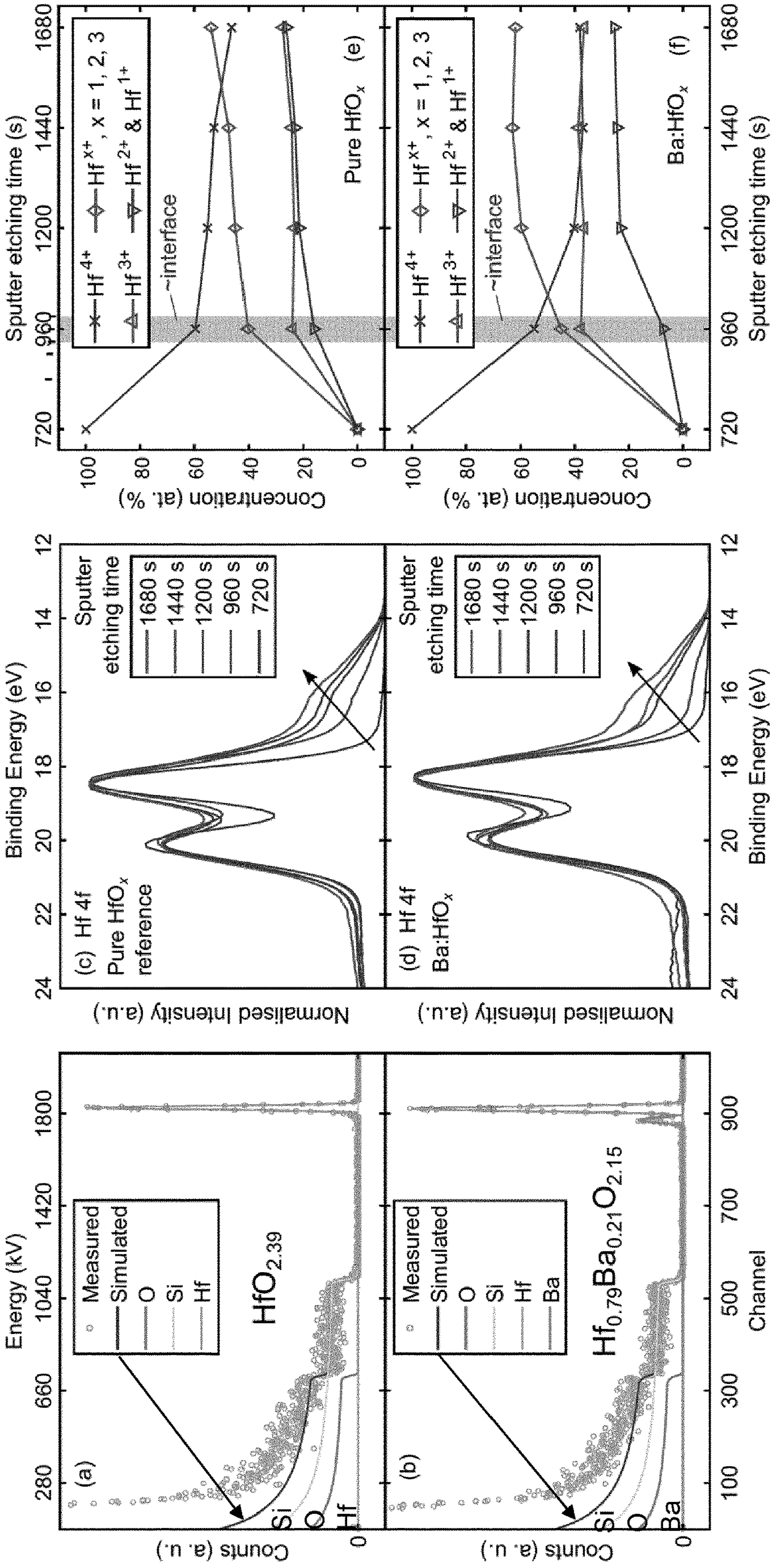
FIG. 53 shows Rutherford backscattering spectrometry (RBS) and depth-resolved X-ray photoelectron spectroscopy (XPS) results.
Figure 66:
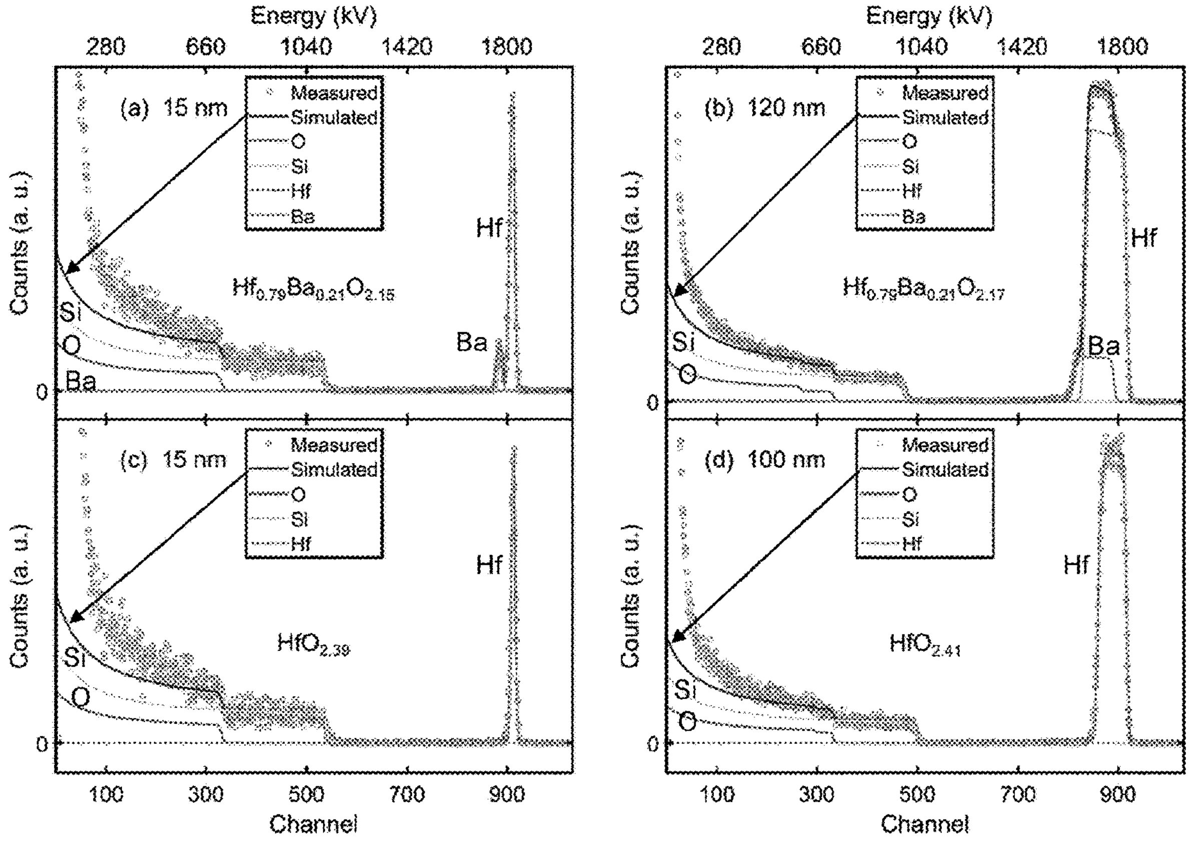
FIG. 66 shows RBS spectra for different films.

The RBS results for the thinner films of either material are provided in FIG. 53(*a*) and (*b*) with more details on RBS in FIG. 66. The thin and thick films of pure $HfO_x$ yielded compositions of $HfO_{2.39}$ and $HfO_{2.41}$, respectively, and for the Ba:$HfO_x$ films the compositions were $Hf_{0.79}Ba_{0.21}O_{2.15}$ and $Hf_{0.79}Ba_{0.21}O_{2.17}$ for the thin and thick film, respectively. The close agreement in compositions obtained from films with different thicknesses proves a highly accurate quantification and homogeneous elemental distributions throughout the films with no effects of electronic stopping cross sections on the film compositions. Furthermore, the Ba fraction in Ba:$HfO_x$ as obtained from RBS is close to that measured by EDX, cf. FIG. 52(*f*). The Ba deficiency with respect to the PLD target composition of Ba:Hf 1:2 can be explained by the volatility of Ba during low-pressure deposition, especially at temperatures below 600° C. [39, 40].

Based on the total Ba/Hf fraction of about 27% in the films (from RBS, Table 1 below) and the $HfO_x$ host matrix making up about 70-80% of the total film volume fraction $V_f$ (from FIG. 52(*d*)) with a Ba/Hf fraction of 10/45 (i.e. about 0.22) (from EDX, FIG. 52(*f*)), the Ba/Hf cation ratio α in the nanocolumns can be estimated from $\alpha V_f$(columns)+$0.22V_f$ (columns)=0.27, which results in α of about 0.4-0.5. This implies that the nanocolumns most likely consist of $BaHfO_3$ (rather than BaO).

As to the oxygen composition of the films, RBS analysis revealed an excess of oxygen (compared with stoichiometric films) for the four different films studied ($HfO_x$ and Ba:$HfO_x$ films of two different thicknesses each, FIG. 66) and such excess oxygen has been reported in hafnium oxide films both experimentally and theoretically by DFT [43]. As neither RBS nor time-of-flight elastic recoil detection analysis (ToF-ERDA) detected any significant amounts of impurities which could explain the excess oxygen, the most likely cause here is the presence of cation vacancies. Such cation vacancies can be expected to form both in amorphous hafnium oxide, especially under oxygen-rich deposition conditions [44], and in the Ba-rich second phase (e.g. if it were $BaHfO_3$ [45, 46]). We note that the presence of oxygen interstitials in the film could provide an additional explanation for the measured excess oxygen [44], but the presence of cation vacancies is a more conventional explanation for the nominal excess oxygen. Irrespective of the exact reason for the excess oxygen, the key point about the oxygen content in this work is its relative change upon the addition of Ba (about $O_{2.4}$ for $HfO_x$ vs. about $O_{2.16}$ for Ba:$HfO_x$). For both the thin and thick films studied, the oxygen content is about 10% lower in the films containing Ba. This is expected, because if a lower-valent ion substitutes for a higher-valent ion (i.e. $Ba^{2+}$ instead of $Hf^{4+}$), a loss of oxygen is necessary for charge compensation.

To conclude the compositional analysis, depth-resolved XPS was carried out to reveal whether the addition of Ba to hafnium oxide influences the chemistry or oxidation states of the different elements in addition to suppressing crystallization. Details of how the XPS data was fitted are provided in FIG. 68. The major difference between Ba:$HfO_x$ and $HfO_x$ in this analysis is the increase in the relative concentration of Hf sub-oxidation states, i.e. $Hf^{x+}$ with x<4, in the films containing Ba from 40% in pure $HfO_x$ to about 63% in Ba:$HfO_x$. Since the $HfO_x$ conduction band is predominantly formed by the Hf 5d orbitals [47], the higher electron density resulting from the increased concentration of Hf sub-oxidation states may well contribute to the higher conductivity of the Ba:$HfO_x$ films, which was pointed out earlier.

For the XPS experiments, the Ba:$HfO_x$ and reference $HfO_x$ thin films were deposited in the same way as the films for the RS devices, but instead of depositing top electrodes, they were capped in-situ (i.e. without venting the PLD chamber) with a TiN layer to protect their top surfaces from oxygen exchange after air exposure and to avoid any initial core level change ('damage') induced by Ar ion sputter etching. FIG. 53(*c*) and (*d*) present the Hf 4f core level spectra obtained from the reference $HfO_x$ and Ba:$HfO_x$ films as a function of sputter-etching time t, starting at t=720 s, which corresponds to the time required to remove most of the protective TiN layer. At this point, the top surface of the oxide thin films could be measured before the onset of sputter damage which changes the chemical bonds. The actual surface of the oxide thin films is thus between t=720 s and 960 s as indicated by the shaded area in FIG. 53(*e*) and (*f*). Ba 3d and O 1s spectra corresponding to the Hf 4f ones are provided in FIG. 67. The peak intensities of all spectra are normalized and the energy shifts in peak positions were corrected to compare changes in the shapes of the spectra.

The Hf 4f spectra acquired from both samples ($HfO_x$ and Ba:$HfO_x$) at t=720 s consist of 4f7/2 and 4f5/2 peaks, which are fitted well with a single doublet pair corresponding to fully oxidized Hf, i.e. $Hf^{4+}$. The broader spectra obtained for t greater than or equal to 960 s, however, can only be fitted as convoluted spin-split 4f7/2-4f5/2 doublet electron states, and the doublets at lower binding energies reveal the additional presence of $Hf^{3+}$.

In addition to the peak convolution, a large shoulder with lower intensity starts appearing at lower binding energies for the Hf 4f spectra of both films, which reveals the presence of $Hf^{2+}$ and $Hf^{1+}$ oxidation states. For increased sputter times, in addition to a gradual peak broadening of the 4f7/2-4f5/2 doublets, the area below this shoulder increases. Both observations can be attributed to sputter damage induced by the Ar ion etching [48], but as evidenced by further reference measurements discussed in more detail below (with reference to FIG. 67, this is not the only cause in the samples investigated here. Instead, the gradual increase of the shoulder area as a function of depth reveals a changing concentration of Hf sub-oxides intrinsic to the films.

This change is resolved in FIG. 53(*e*) and (*f*) as a function of the sputter etching time t and thus film depth for the reference $HfO_x$ and Ba:$HfO_x$, respectively. In general, for both materials, the $Hf^{4+}$ concentration decreases with increasing depth, while the total concentration of $Hf^{x+}$ with x=3, 2, 1 increases. While the two figures look very similar due to the normalization, critically, a detailed comparison of how the $Hf^{x+}$ concentration changes in the two materials reveals that the addition of Ba to $HfO_x$ increases the relative amount of sub oxides $Hf^{x+}$ with x<4 from about 40% in pure $HfO_x$ to about 63% in the Ba:$HfO_x$ nanocomposite. As mentioned before, this is expected as the lower-valent $Ba^{2+}$ substituting on the $Hf^{4+}$ site leads to oxygen loss in order to achieve charge compensation and the resulting higher electron density can lead to increased film conductivity. Oxygen vacancies and other materials defects are well known to act as charge traps and to affect electronic conductivity in hafnium oxide [50]. This will be important later on to explain the observed stable RS.

Similar changes as for the Hf spectra would be expected in the Ba 3d and O 1s spectra. However, after normalizing the peak intensities and correcting the peak position shifts, all Ba 3d and O 1s spectra of both oxide films maintain very similar peak shapes with no detectable peak splitting, see FIG. 67. This can be attributed mainly to the peak positions of Ba 3d and O 1s with different oxidation states being very close, and the changes in the concentration of their oxidation states not being sufficiently high in the films to result in a visible variation in peak shapes.

To understand the reason for the uniform RS of the Ba:$HfO_x$ films, a number of key observations are itemized below to allow identification of the switching mechanism.

(i) In double-logarithmic plots with absolute current values such as in FIG. 49(*a*), the switching polarity is counter-clockwise for both positive and negative voltages (counter-clockwise/clockwise if the current is not in absolute values). If charged particles such as oxygen vacancies or electrons are involved in the switching process, which is widely assumed for bipolar RS, this allows only two scenarios. If only one type of charged particle is involved, only one interface or area can dominate the resistance. If the resistance is controlled by two interfaces/areas, different charged particles with opposite sign have to be involved.

(ii) As top electrodes with very different work functions $\Phi$ (Pt, $\Phi_{Pt}$ of about 5.8 eV; W, $\Phi_W$ of about 4.7 eV [51]) resulted in very similar IV curves, while changing the bottom electrode from Nb:STO to TiN requires great care in the optimization of TiN (FIG. 57), it is clear that the interface with the bottom electrode dominates the switching process. Thus, most likely, only one type of charged particle is involved in the RS.

(iii) The heavily n-type Nb:STO BE requires electronic conduction to occur due to electrons (as opposed to holes), as the large band gap of Nb:STO (see FIG. 54) strongly suppresses the minority carrier holes concentration.

(iv) The low device-to-device variation suggests that the switching is based on the average of a large number of contributions such as the evenly spaced generation of materials defects [52], charge trapping [53], or ionic motion [54] rather than on one dominant stochastic process such as the reversible formation of a filament.

Figure 69:
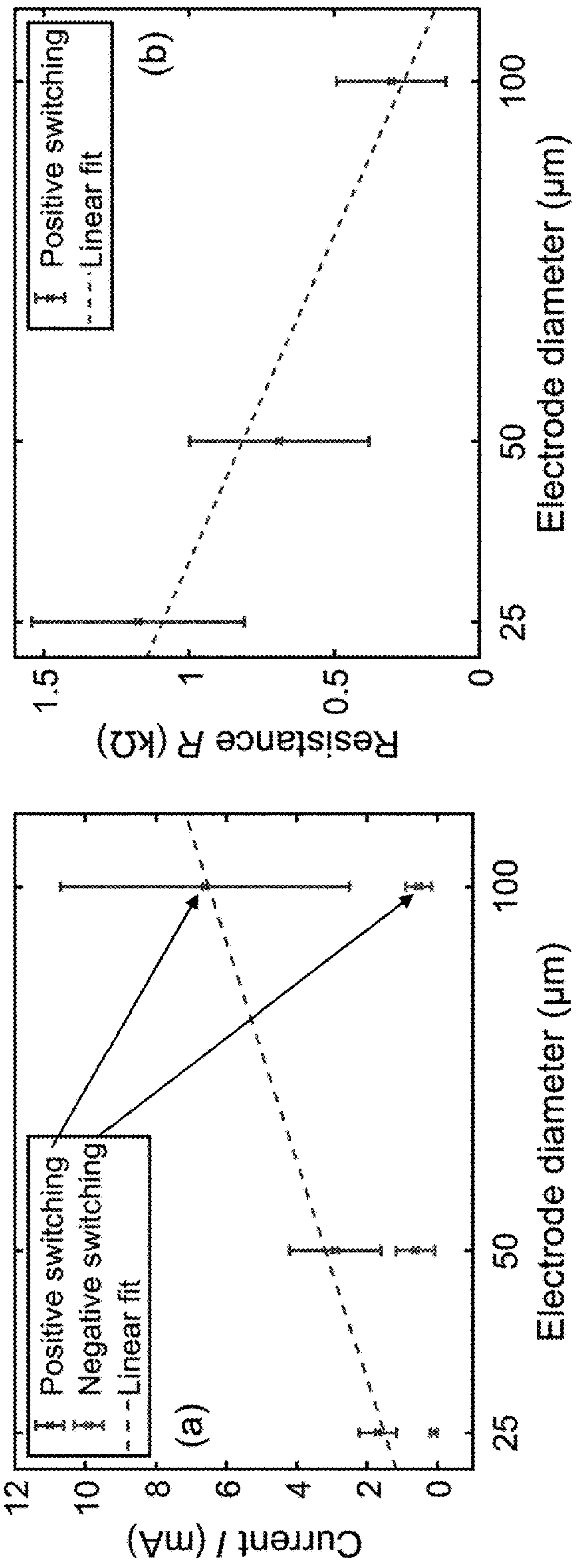
FIG. 69 shows the area dependence of switching currents.

(v) The switching currents at +2 V and the corresponding resistances increase/decrease linearly with the electrode diameter (FIG. 69). This excludes RS due to a single filament, as in this case, there would be no scaling with the electrode diameter. At the same time, RS does not seem to be fully interface-controlled, as in this case, the current should scale linearly with the electrode area instead of their diameter [55]. In anticipation of the explanation following below, the most likely reason for this 'in-between' observation is the growth of Ba-rich nanocolumns with different lengths, which can be seen in FIG. 52(*d*). When the nanocolumns form preferred electronic conduction paths, as resolved with the CAFM measurements in FIG. 49(*d*) to (*f*), columns of different lengths contribute differently to the total current, thus resulting in the current scaling to appear diameter-dependent.

(vi) The IV hysteresis during voltage sweeping is established by gradual, rather than by abrupt current changes which would be characteristic of filament formation.

(vii) For complete filaments reaching through the whole film, the device resistance should be dominated by the BE series resistance. Based on the resistivity of the Nb:STO BE and the device sizes, the measured resistances, FIG. 69 (*b*), are more than an order of magnitude too high to originate from the BE resistance, as for the measured electrode diameters of 25 to 100 μm, the Nb:STO should only contribute a maximum of 60 to 3 Ω to the total resistance.

(viii) The programmed resistance states decay according to a power law as demonstrated in FIG. 50. This behaviour is understood to result from time-dependent charge redistribution in the dielectric film, such as charge trapping or ionic motion [31]. While charge trapping is ubiquitous in amorphous oxides [56], the sign of the electronic charges does not agree with the clear identification of the n-type bottom interface as being the critical one. On the other hand, while oxygen (vacancy) movement in (amorphous) hafnium oxide decreases rapidly with temperature [57], it has been shown that the presence of an electric field vastly reduces the required activation energy for such movement and also for the generation of additional vacancies [52]. In addition, it is established that locally high temperatures due to Joule heating strongly affect RS and can easily dominate over the ambient temperature [58].

(ix) Ti TEs on Ba:$HfO_x$ films resulted in purely resistive IV curves without any RS (FIG. 57). It is known that Ti scavenges large amounts of oxygen from oxide films, which makes them more conductive [50, 59]. This indicates that the concentration of oxygen (vacancies) plays a role in RS in the Ba:$HfO_x$ devices here as well. Thus, from the observations so far, the oft-cited motion of oxygen (vacancies) is the most likely cause for RS in the presented Ba:$HfO_x$ devices. As the compositional analysis revealed an initial relative excess of oxygen, instead of positively charged oxygen vacancies, negatively charged oxygen ions are more likely to be the moving species.

Figure 70:
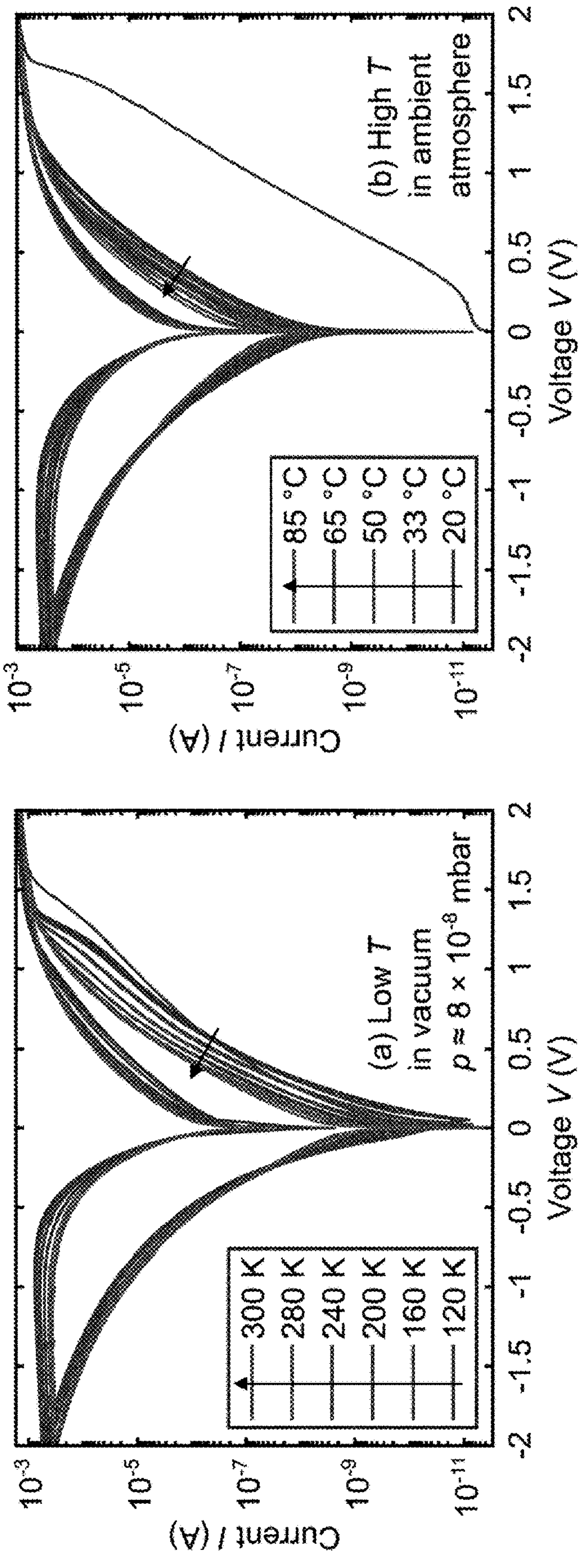
FIG. 70 shows temperature-dependent IV measurements.

(x) RS was observed in standard as well as in vacuum atmosphere (about $8\times10^{-8}$ mbar, FIG. 70). This implies that RS does not occur due to a reversible exchange of oxygen between the films and the surrounding atmosphere, as reported for devices with an STO switching layer [60]. Instead, the ions seem to move just within the dielectric and or the BE.

(xi) The measured IV curves provide clear evidence of thermionically limited electronic conduction in the low and medium current ranges, and the limiting factor is the height of an adjustable energy barrier. A detailed discussion of this point is provided further below.

(xii) Finally, to reconcile the above observations with the band structure across the fabricated devices and identify consistent conduction and switching mechanisms, ultraviolet photoelectron spectroscopy (UPS, FIG. 74) and ultraviolet-visible spectroscopy (UV-vis) were carried out on Nb:STO and on Ba:$HfO_x$ films on top of Nb:STO. UV-vis with wavelengths between 280 and 1300 nm was used to measure the Nb:STO band gap (about 3.3 eV); the Ba:$HfO_x$ band gap is larger than 4.43 eV, which is the maximum measurable value for the used wavelengths. Based on the UPS and UV-vis results, an approximate band diagram was constructed, presented schematically in FIG. 54(*a*). It will be noted that FIG. 6 is similar to FIG. 29 but with an additional illustration of energy levels provided in the band gap diagram of FIG. 54(*a*). Based on these observations, two major conclusions can be drawn. First, the observed RS is not filamentary, as the switching currents are gradual rather than abrupt and they scale with the diameter of the electrodes, both of which would not be the case for filamentary switching. Instead, second, the observed RS is controlled by an energy barrier for electrons between the nanocomposite films and the BE. In the following, we provide a model for the switching and conduction mechanisms which can explain all of these observations and conclusions.

Evidently, an irreversible structural change occurs in the devices during the initial low-voltage forming step. In the literature, such changes have been revealed e.g. as oxygen loss to the surroundings [59], charge-trapping-assisted generation of oxygen vacancies [52], or the generation of other additional defects in the vicinity of pre-existing local disorder [61]. All of these explanations seem feasible for our devices, but further measurements would be required to draw a convincing conclusion.

Figure 54:
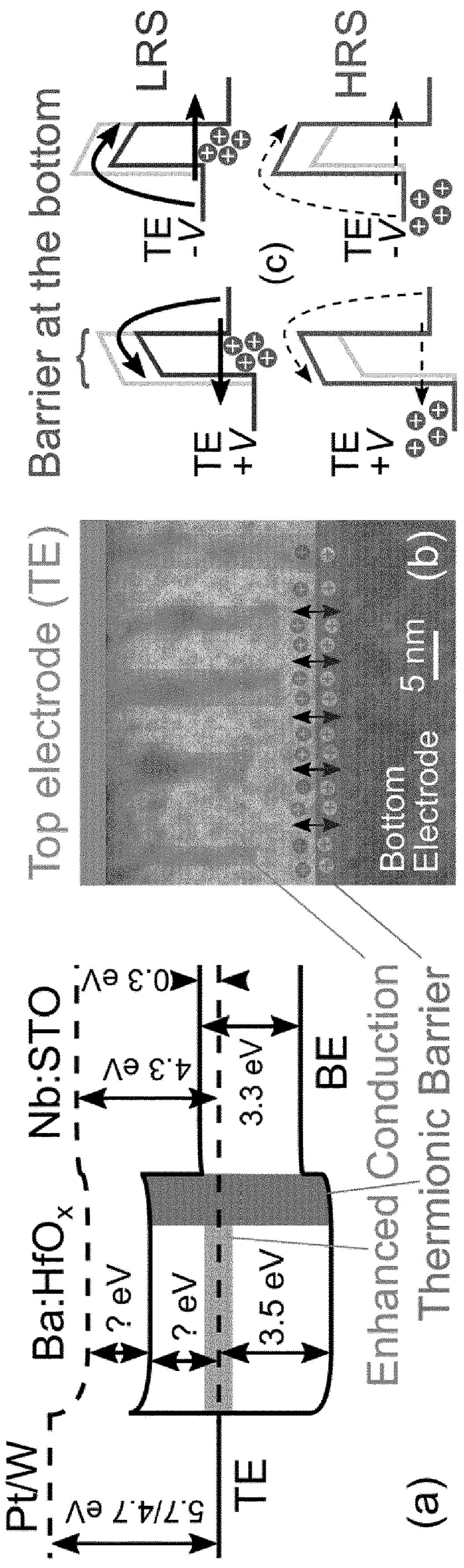
FIG. 54 shows, in FIG. 54(*a*) a schematic band diagram of the RS devices. The values for the metal work functions are taken from the literature, as they did not make much of a difference for the device performance. The difference between the Fermi level and the Ba:$HfO_x$ conduction band as well as the Ba:$HfO_x$ electron affinity are marked as unknown, as the uncertainty of their values does not allow it to estimate a barrier height for electronic conduction. All other provided values were measured.

With the nanoscale CAFM resolution of the forming process in FIG. 49(*d*) to (*f*) and previous reports that pre-existing local disorder facilitates the formation of filaments [61], it can be concluded that the columnar Ba-rich regions highlighted in FIG. 52(*d*) and FIG. 54(*b*) fulfil their design purpose of acting as such primary locations to guide the controlled formation of preferred electronic conduction channels. Note, however, that these nanocolumns do not reach all the way to the BE, and the measured IV curves exhibit clear signs of a thermally activated electronic transport process limited by an adjustable energy barrier. This leads to the conclusion that rather than causing a complete dielectric breakdown as in filamentary devices, the bottom part of the Ba:$HfO_x$ film near the bottom interface remains unaffected by the guided filament formation and acts as the thermionic energy barrier for electronic transport. For this reason, we refer to the formed channels as 'partial filaments' and they explain the almost symmetric shape of the IV curves, as well as the absence of a notable change in their shape when comparing top electrodes with different work functions. (At higher voltages, the films break down irreversibly. This would correspond to the breakdown of the remaining about ⅓ of the film, which is not penetrated by the Ba-rich columns.) Thus, these partial filaments in the devices fulfil two roles. Their uniform spatial distribution leads to the uniform electrical device behaviour, and they short-circuit any Schottky-like contact between the TE and the Ba:$HfO_x$ to restrict the RS to the bottom interface.

The role of the partial filaments as the effective TEs is indicated as a green defect band in FIG. 54(*a*) and (*b*). The exact position of this defect band in energy was not measured, but it is well established that in hafnium oxide, a wide defect band tends to form slightly above the middle of the band gap [62] and its exact position determines the barrier height for currents under negative voltages at the TE, i.e. the energy offset between the energy level of the filament and the bottom energy barrier.

The RS control by this energy barrier is supported by the shape of the measured IV curves. With details provided further below, they can be fitted very consistently with different thermionic emission models. The best fits, i.e. over the largest current ranges both for positive and negative bias, for the electronic conduction in all RS devices (>50 across three samples) are consistently achieved with the Schottky emission model for a reverse-biased Schottky contact at low to medium currents, and with a space-charge-limited conduction (SCLC) model in the presence of charge traps or trap-assisted tunnelling (TAT) for the highest currents. It is pointed out explicitly that the expression for a forward-biased Schottky contact ($\propto \exp(V)$ instead of $\propto \exp(\sqrt{V})$) does not fit the measured IV curves.

Since several thermionic current mechanisms have similar exponential dependencies on the applied electric field, the good fits by the Schottky emission model are not a claim to the singular presence of this mechanism. At different current levels, other thermionic mechanisms such as Poole-Frenkel (PF) emission or TAT can describe intervals of the IV curves as well and it is very likely that different mechanisms are at play at the same time. Similar arguments hold for the SCLC/TAT fits at the highest current levels.

For the sake of argument, the Schottky emission model can be used to illustrate how the changing energy barrier height sets the resistance states. For the ten devices in FIG. 49(*a*), the calculated Schottky barrier heights are 0.65±0.03 eV and 0.62±0.03 eV for the HRS in the positive and negative voltage directions, respectively, and 0.46±0.03 eV and 0.47±0.03 eV for the LRS in the positive and negative voltage ranges, respectively. The other >40 devices across different samples yielded virtually the same values and while with different absolute values, PF emission and TAT yielded qualitatively similar changes for the respective barrier heights. The almost completely symmetrical values for the SBH under forward and reverse bias dictate that either, there are two barriers of the same height, or there is only one effective dominant barrier. As discussed, the observed IV switching polarity indicates current limitation by only one barrier, and its height is controlled by the concentration of ions in its proximity.

Upon application of a positive voltage to the TE, positive ions such as oxygen vacancies are pushed towards the bottom interface and thus into the barrier region, and negative ions such as oxygen ions are drawn away from it, both of which reduces the height (and width) of the barrier height [54]. This leads to the LRS. Conversely, a negative voltage at the TE draws positive ions away from the bottom interface and drives negative ones towards it, which increases the barrier height (and width) and leads to the HRS.

These processes are sketched in FIG. 54(*c*). Different intermediate resistance states as demonstrated in FIG. 50 can be explained by different amounts of ion migration to or away from the barrier region Finally, the state decay at small read voltages can be explained as a concentration-gradient-induced back diffusion of ions and/or a secondary charge (de-)trapping effect. (Note, for example, how some of the decaying slopes in FIG. 50(*c*) have opposite signs. This indicates the involvement of charge carriers with opposite charge. For example, at the highest set (lowest reset) voltages, significant amounts of electrons can be trapped (de-trapped) in defects accumulating at the bottom interface [56], and the opposite sign of the trapped electrons counteracts some of the barrier lowering due to positive ions.)

While the valence band offset of about 0.6 eV between Nb:STO and Ba:$HfO_x$ in the band diagram in FIG. 54(*a*) is deceptively close to the electrically measured Schottky barrier heights, the heavy n-type doping and the large band gap of the Nb:STO BE rule out hole conduction. (If it were the case after all, the change in the valence band barrier height would be related to electron trapping rather than to ionic movement.)

As a final verification, a rough estimation of the ionic defect concentration involved in changing the barrier height can be calculated. Additional charge at a conduction band Schottky barrier changes the built-in potential Vbi and thus the barrier height (and width) so that the new built-in potential $V'_{bi}$ is [66]:

$$V'_{bi} = V_{bi} - \frac{\sigma}{\epsilon_0 \epsilon_r}\delta \quad \text{(Equation 1)}$$

where $\sigma$ is the additional surface charge projected to a distance $\delta$ from the interface, and $\epsilon_0$ and $\epsilon_r$ are the vacuum and oxide relative dielectric permittivity, respectively. Based on (Equation 1), the effective addition of a positive charge o near the interface will decrease the barrier height, whereas a negative charge density will increase it. As a plausibility check, with (Equation 1), a value for o can be calculated which corresponds to the measured difference in the Schottky barrier height between HRS and LRS $\Delta V_{bi}$ of about 0.18 eV=$\sigma\delta/(\epsilon_0\epsilon_r)$. When assuming $\delta$=1 nm and $\epsilon_r$=15 as an estimation for a low-quality hafnium oxide [67], $\sigma$=0.024 C/$m^2$=2.4 μC/$cm^2$, which corresponds to a sheet charge density of $1.5\times10^{13}$ $cm^{-2}$. This value is well within commonly observed ranges for electrically active defect densities at or close to interfaces between hafnium oxide and a semiconductor [68], so this simplified assumption of a changing Schottky barrier height due to the movement of oxygen ions seems physically reasonable. In addition, the value of 2.4 μC/$cm^2$ is not far off from FE switching [5].

In conclusion of this section, stable and uniform resistive switching was engineered in amorphous hafnium oxide nanocomposite thin films and the underlying mechanisms were analyzed in detail. The thin films were deposited at the CMOS-compatible temperature of 400° C. and lead to low cycle-to-cycle, device-to-device, and sample-to-sample variability. This was achieved based on the addition of Ba to the system (i) enabling smooth amorphous films, (ii) reducing the oxygen concentration and Hf oxidation states, thus increasing the film conductivity, and (iii) creating a nano-columnar Ba-rich second phase which can facilitate the formation of partial filaments without causing a complete dielectric breakdown. These nano-engineered materials properties are considered to be desirable for the resistive switching mechanism, which was identified as the adjustable height of a thermionic barrier by ionic migration. Switching endurances of $>10^4$ cycles with a memory window at least 10 and switching speeds down to about 20 ns were demonstrated for a large number of devices. With the gradual changeability of resistance states, device-inherent spike-timing-dependent plasticity was demonstrated as a promising basis for neuromorphic applications. Finally, this conceptual demonstration of amorphous phase-separated nanocomposite thin films has the potential to open up a whole new range of thin film properties design parameters.

There now follows a more details explanation of the methods and materials used in relation to the above disclosure with reference to FIGS. 49 to 54.

Pulsed laser deposition targets: For the pure hafnium oxide target, $HfO_x$ powder of purity >99.9% was ground for 40 minutes, pressed into a pellet, then sintered at 1400° C. for eight hours. For the composite target, $BaCO_3$ and $HfO_2$ powders of purity >99.9% were weighed in a stoichiometric ratio, ground for 40 minutes, distributed on a flat surface, and calcinated at 850-950° C. for two hours. Afterwards, the calcinated powder was mixed with $HfO_2$ powder in a ratio 1:1, ground again for 40 minutes, pressed into a pellet, and sintered at 1250° C. for eight hours.

Pulsed laser deposition of oxide thin films: Except for the temperature, which was varied as described above, the following parameters were used for all depositions. Fluence F=2 J/cm$^2$, growth time t=12 min for all samples except for the thicker samples, where t=120 min, frequency f=2 Hz, oxygen pressure p=0.13 mbar, oxygen flow Q=6 sccm (gas at room temperature). After deposition, the heater was cooled down to 200° C. at 5 or 10° C./min in the same oxygen atmosphere as during deposition, but without continuous flow, and at 200° C., the heating current was switched off to let the heater cool down on its own.

Film thickness measurements: To measure the thickness of layers deposited by PLD, some samples had one corner covered with $TiO_2$ during deposition. After the deposition, the $TiO_2$ was removed and the resulting step height measured by standard tapping mode atomic force microscopy. For all TEM samples, the thickness was also confirmed by TEM.

X-ray diffraction (XRD) measurements: XRD measurements were carried out using a Panalytical Empyrean system with parallel beam optics, $CuK_{\alpha 1}$ radiation, a single-point proportional detector, or a PIXcel3D position-sensitive detector.

Sample fabrication: Two different substrates were used, either Nb:STO or MgO. For Nb:STO, the oxide thin films were deposited directly onto the substrate. For MgO, about 36 nm of TiN was deposited by PLD (T=650° C., F=1 J/cm$^2$, t=50 min, vacuum p of about $1\times10^{-5}$ mbar) as the bottom electrode and the films were deposited on top. For all samples, top electrodes were deposited in a standard lift-off process. The positive UV photoresist AZ 4533 was spin-coated (8000 rpm for 30 s, acceleration time 10 s, deceleration time 5 s) onto the samples surface, soft-baked at about 100° C. for two minutes, and exposed to UV light for 11.5 s through a mask. The resist was developed with the AZ 351 B developer and the top metal Pt or W was sputtered on. Afterwards, the resist lift-off was carried out by submerging the samples in ethanol for about 20 min and carefully sonicating the containing beaker to remove the unexposed UV resist and lift off the metal on top.

Electrical measurements: All electrical measurements except for the pulse width dependence were carried out with a computer-controlled Keysight B2912A, connected to an Everbeing manual probe station with triax cables. For the pulse-width-dependent measurements, a Keithley 4200-SCS parameter analyzer with a dedicated ultra-fast pulse measure unit was employed, connected to a Cascade manual probe station. For Nb:STO substrates, samples were glued to a glass slide with conductive Ag paste and the Ag was contacted by a probe tip. It was verified that the conductivity of the Ag was only a few Ohms.

Transmission electron microscopy (TEM) and energy-dispersive X-ray spectroscopy (EDX): Cross-sectional TEM samples were manually fabricated in three steps. First, for each TEM sample, two rectangular pieces (about 1.5 mm×2.5 mm) cut from the samples of interest were pasted film-to-film with m-bond at 220° C. for four hours and then cooled to room temperature. The glued sample was then ground with 600 grits, followed by a fine polishing process using silica diamond papers in the sequence of 15 μm, 6 μm, 3 μm, and 1 um to ensure the flatness of the lamella. Finally, the lamella underwent an ion-milling process using a PIPS II precision ion polishing system to reach the required thickness for TEM (about 100 nm). TEM, scanning TEM (STEM), and EDX were performed using a Talos F200X G2 TEM with a gun brightness of 200 kV. Bright field mode was used to capture TEM images and high angle annular dark field (HAADF) imaging was used for STEM.

Rutherford backscattering spectrometry (RBS): Dedicated samples for RBS were fabricated by depositing films of different thickness (15 nm and 100/120 nm) on commercial thermally formed $SiO_2$ on top of Si. RBS was carried out in a 5-MV 15SDH-2 tandem accelerator to obtain the elemental compositions of the oxide thin films. 2-MeV $4He^+$ ions were employed for the RBS measurements, in which backscattered ions were detected at a scattering angle of 170°. The possible ion-channelling effects in both substrates and thin films were minimised by adjusting the incidence angle to 5° with respect to the surface normal and performing multiple-small-random-angular movements within a range of 2° during data acquisition. SIMNRA [69], version 7.02, was used for simulating the RBS spectra and determining the elemental compositions of the films. For all measured compositions, the maximum systematic uncertainty arising from the effect of stopping cross sections is <0.8%, and the maximum statistic uncertainty from the number of experimental counts is <1.1%.

Time-of-flight elastic recoil detection analysis (ToF-ERDA): In these measurements, recoils were detected at an angle of 45° with respect to the incident beam in a telescope that measured ToF, using a foil-detector, and energy in a gas ionization chamber in coincidence. This approach results in mass resolved data in ToF-vs-Energy plots. Recoils were created using a 44-MeV$^{127}$ $I^{8+}$ beam incident at 67.5° with respect to the sample surface normal. ERDA was carried out using the same 5-MV 15SDH-2 tandem accelerator as used for RBS.

Depth-resolved X-ray photoelectron spectroscopy: The surface chemistry (chemical bonding and oxidation states) evolution of the oxide layers was analyzed as a function of depth by X-ray photoelectron spectroscopy (XPS) in a Kratos Axis Ultra DLD instrument. To avoid the destructive effects of $Ar^+$ ion sputter etching on XPS core levels [48], the surface of the oxide thin films was capped in-situ with a few-nm-thick TiN layer in the same PLD system as the film deposition before air exposure. High-energy-resolution core level XPS spectra were acquired employing monochromatic $AlK_{\alpha}$ radiation (hv=1486.6 eV). Sputter etching was carried out using a 0.5 keV $Ar^+$ ion beam incident at 70° with respect to the sample normal. The analyzed sample areas were 0.3×0.7 mm$^2$, located in the centre of 0.3×0.7 mm$^2$ sputter-etched regions. The binding energy scales were calibrated against the Fermi edge recorded from the sputter-etched layers to avoid uncertainties arising from employing the C 1s peak from adventitious carbon [70]. Hf 4f XPS core-level spectra were de-convoluted with the CasaXPS software (http://www.casaxps.com/) and the accuracy of the de-convolutions was ensured by maintaining the same line shapes, 4f7/2-4f5/2 binding energy separation, peak-to-area ratio, and full width at half maximum (FWHM) values, while varying the peak areas and positions. As the thin films (15 nm) were in electrical contact with the sample holder through the conductive substrate, any peak shifts are unlikely to occur due to sample charging, which is typically observed for insulating samples without proper electric contact to the sample holder. The backgrounds of all spectra were subtracted using the Shirley approach [71], and quantification was performed by employing elemental sensitivity factors provided by Kratos Analytical Ltd (CasaXPS KratosAxis-F1s).

Ultraviolet photoelectron spectroscopy (UPS): UPS measurements were performed at the He-I line (21.21 eV) using a SPECS UVS 10/35 differentially pumped capillary discharge vacuum ultraviolet source in an ultra-high vacuum chamber. The system work function was calibrated using clean Ag and Au foils. A bare Nb:STO substrate and a Ba:$HfO_x$ film on Nb:STO were annealed in vacuum at 240° C. to remove carbon contaminates and then vacuum-transferred to the UPS chamber. High resolution scans were measured around the secondary electron cutoff and the valence band maxima (VBM) for the two samples were determined by line fits, which yielded a SE cutoff of 16.92±0.02 eV and 16.98±0.02 eV for Nb:STO and Ba:$HfO_x$ respectively, indicating a vacuum offset of −0.06±0.04 eV. Similarly, the VBM were determined to be 2.98±0.2 eV for Nb:STO and 3.49±0.2 eV for Ba:$HfO_x$. With the Fermi edge calibrated as 0 eV for Nb:STO by the Ag and Au references, the substrate work function Φ is calculated to be 4.29 eV (101 $=hv-E_{cutoff}-E_{Fermi}$), well aligned with literature values [72].

FIG. 55 shows: (a) Reference measurement of Pt electrodes deposited directly onto Nb:STO, three cycles on the same device, representative of the overall sample behaviour. Note especially the different shape of the curves and the large difference in voltages when compared with the devices with Ba:$HfO_x$ films. (b) Same figure as in FIG. 49(*a*) for ease of comparison. In the original images, there is one colour used for each of ten devices, with five repetitions for each device. It is clear that the shape and uniformity of the IV curves as well as the voltage range required for resistive switching change significantly when inserting the Ba:HfOx nanocomposite film between TE and the Nb:STO substrate.

FIG. 55(*c*) and (*d*): Endurance for Pt on Nb:STO with a linear and logarithmic x-axis, respectively. After a rapid collapse of an initially large memory window, this material stack cannot maintain a memory window >10 beyond a few 100 cycles.

FIG. 55(*e*): Retention of the LRS. After the first few seconds, the decay follows a power law $R=A\times t^{\beta}$, the Curie-von Schweidler law, similar to the decay of the devices with a thin film in between. For Pt on Nb:STO, it is established that charge trapping is the major contribution to hysteretic IV curves [S1], but a decay due to the Curie-von Schweidler law in general only indicates a time-dependent charge redistribution in a dielectric [S2] and can just as well be due to ionic migration. The differing slope at lower times t can be attributed to a secondary effect with different time constants.

FIG. 55(*f*) shows the same endurance data as FIG. 49(*b*) (for devices with Ba:$HfO_x$ thin films), but with a logarithmic x-axis.

FIG. 55 shows histograms for the measured switching endurance summarized above. FIG. 56(*a*): Positive and negative switching currents. The original image uses colour-yellow and blue: sample 1, purple and red: sample 2. While for sample 2, the positive and negative switching currents are limited to one distribution each, sample 1 displays two bimodal distributions, which reveals that the variation among devices on this sample appears in two 'classes' of devices. FIG. 56(*b*) shows resistances of high and low resistance states. The original image uses colour-blue: sample 1, red: sample 2. Corresponding to the two bimodal distributions of switching currents in FIG. 56(*a*), the HRS of sample 1 displays a bimodal distribution of resistance states. When comparing with FIG. 56(*a*), a similar bimodal distribution is discernible from the two bins with the lowest resistances as a consequence of the bimodal switching current distribution. While the HRS and LRS each stretch over about an order of magnitude, they are also separated by about an order of magnitude, resulting in a constant minimum memory window.

FIG. 57 shows representative IV curves of additional samples, five repetitions per colour (colour is used in the original images). Numbered arrows indicate the switching polarity, where (1*) indicates the forming step. FIG. 57(*a*) shows the IV curves for a second sample with a Pt—Ba:$HfO_x$—Nb:STO stack demonstrating good device-to-device and sample-to-sample reproducibility. The IV curves have the same shape and similar uniformity as the sample reported in FIG. 1*a*.

FIG. 57(*b*) shows IV curves for a sample with a W—Ba:$HfO_x$—Nb:STO stack demonstrating that Pt is not critical as the top electrode. Despite the different metal work functions, similar IV curve shapes and uniformity are achieved as on the samples with Pt top electrodes. This sample with W TE was used for all neuromorphic demonstrations.

FIG. 57(*c*) shows two IV curve shapes on the same device based on a Pt—Ba:HfOx—TiN stack, where the TiN was deposited by pulsed laser deposition on an insulating MgO substrate. The original plot, the lines are in colour. The lower curves (blue in the original) are the initial five sweeps, the upper curves (red in the original) are after a retention measurement. While the curves are more noisy and change over time, they demonstrate that a similar hysteresis can be achieved without an Nb:STO substrate. The lack of uniformity and stability can be attributed to the TiN not having been optimized, and better uniformity can be expected after the respective optimization. The small rapid current increases at the highest positive voltages for the upper (red in the original) curves support the assumption of the involvement of a (partial) filament in addition to the actually dominant resistive switching process.

FIG. 57(*d*) shows IV curves for a device with a Ti top electrode. No resistive switching could be achieved, and the devices are very conductive. Most likely, the oxide films become so conductive because the Ti scavenges a lot of oxygen from them.

Figure 58:
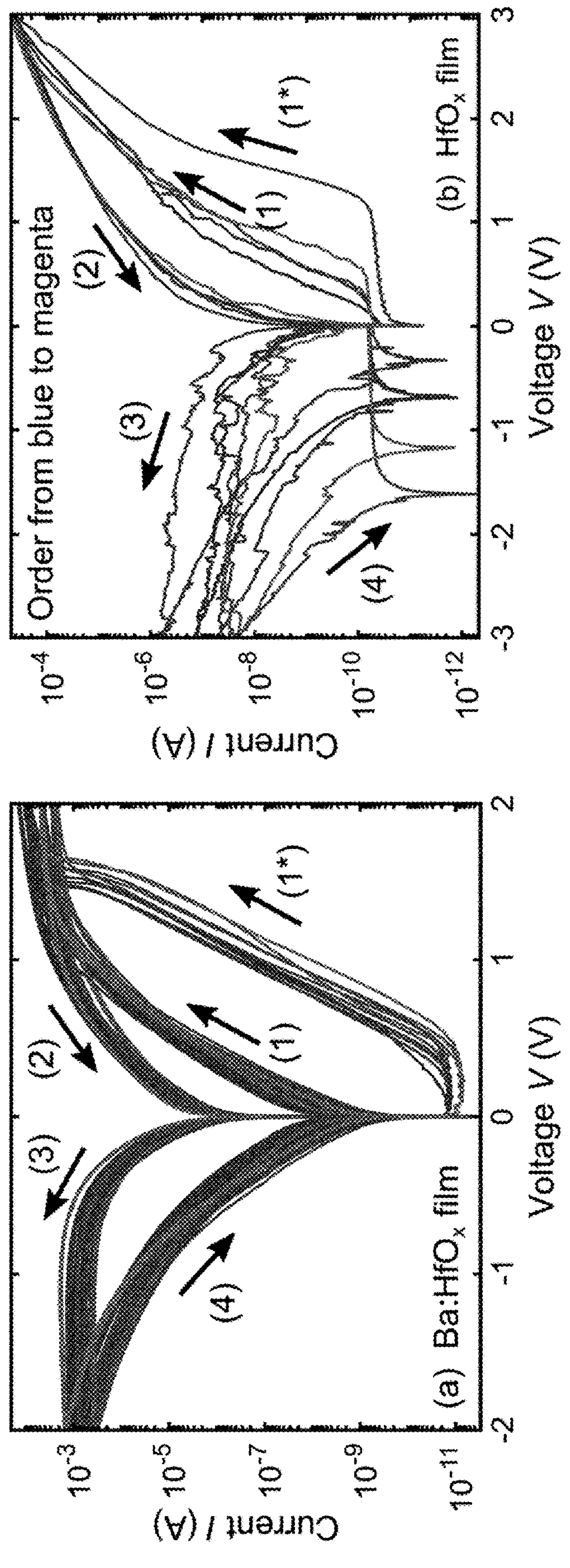
FIG. 58 shows a comparison with pure $HfO_x$ films.

FIG. 58 shows a comparison of IV curves from devices as follows: FIG. 58(*a*) Ba:$HfO_x$ films (same as FIG. 49(*a*) for convenience of comparison) and FIG. 58(*b*) pure $HfO_x$ films (single device, five IV repetitions). Numbered arrows indicate the switching polarity, where (1*) indicates the forming step. The pure $HfO_x$ films are less conductive, and even within the same device, the IV curves are less stable than with the Ba:$HfO_x$ films.

Figure 59:
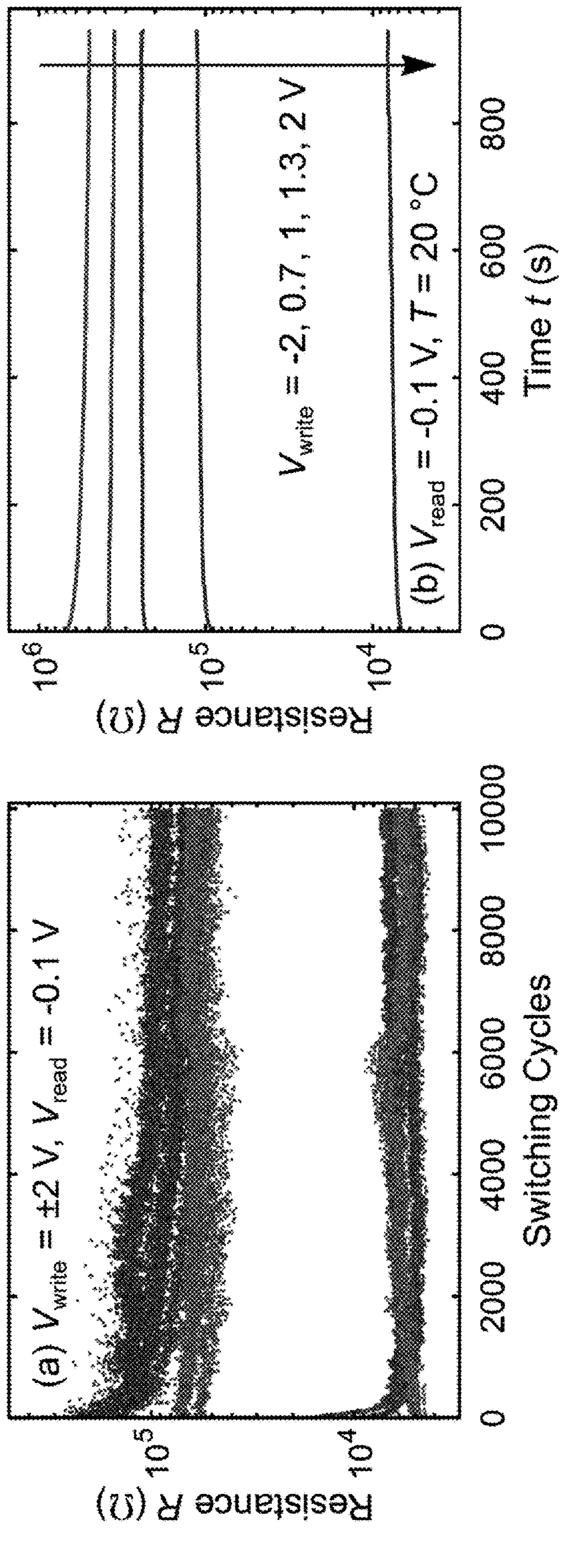
FIG. 59 shows endurance and retention data for 10 μm devices.

FIG. 59(*a*) shows example data for the switching endurance of three different devices with 10 μm top electrode diameter. FIG. 59(*b*) shows multi-level state retention of one of these devices.

In FIG. 59(*a*) (which has colour in the original, differentiating between the three different devices) while two of the devices undergo some form of 'endurance relaxation' during the first switching cycles, the endurance performance is not degraded compared with the larger devices presented above for FIG. 49. Note, however, that the devices here have W top electrodes and these devices had higher off-state currents than the Pt devices (see FIG. 57(*a*) and (*b*)). As a consequence, the absolute resistance values for the endurance measurement are lower than the ones in the endurance FIG. 49(*b*), but the memory window is similar at about 10.

In FIG. 59(*b*) it is shows that the same logic applies to the multi-level state retention when compared with the larger devices presented in FIG. 50 above as again, especially the resistance in the HRS is lower in the W devices here, but no performance degradation is observed with respect to the number of resistance levels, their spacing, or retention. The $V_{write}$ applied is indicated in the order shown by the arrow. (Further for a fair comparison, note that the data here was measured at room temperature, whereas the data presented in FIG. 50 were measured at T=85° C. Thus, the data here looks more stable than in FIG. 50.)

Figure 60:
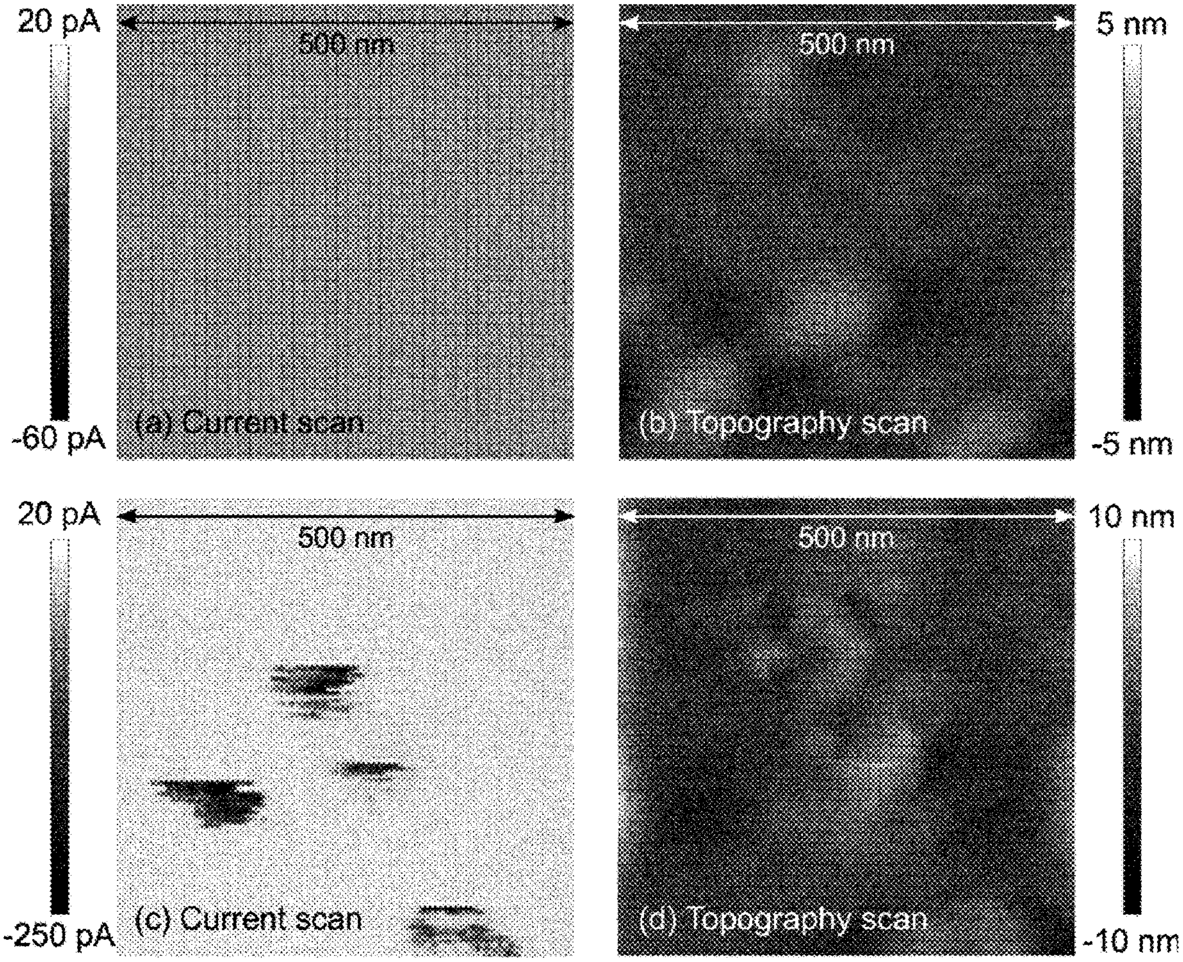
FIG. 60 shows CAFM and topography scans of a bare Ba:$HfO_x$ film.

FIG. 60(*a*) and (*c*) show conductive atomic force microscopy (CAFM) scans of a bare Ba:$HfO_x$ film deposited at 400° C. FIG. 60(*a*) shows a pristine film. FIG. 60(*c*) shows the same area after forming conductive paths.

FIG. 60(*b*) and (*d*) show topography scans recorded simultaneously with FIG. 60(*a*) and (*c*), respectively.

As shown in FIG. 60(*a*), before any forming, the films are insulating with measured currents below a few pA, the instrument noise floor. FIG. 60(*b*) shows a topography scan of FIG. 60(*a*). Root mean square surface roughness <1 nm.

Note that FIG. 60(*c*) is the same as shown in FIG. 49(*d*) above, presented here again for ease of comparison. After scanning the area in FIG. 60(*a*) a few times with −10 V applied to the substrate, small conductive areas form in parts of the film. FIG. 60(*c*) was recorded with a substrate voltage of −7 V to avoid forming the complete area.

FIG. 60(*d*) shows a topography scan of FIG. 60(*c*). The appearance of conductive areas does not coincide with topographic features. However, the repeated scanning between the recording of FIGS. 60(*a*) and (*c*) increased the RMS surface roughness to 2.6 nm. Most likely, this is due to scratching the surface during scanning, as CAFM is a contact-mode technique.

Figure 61:
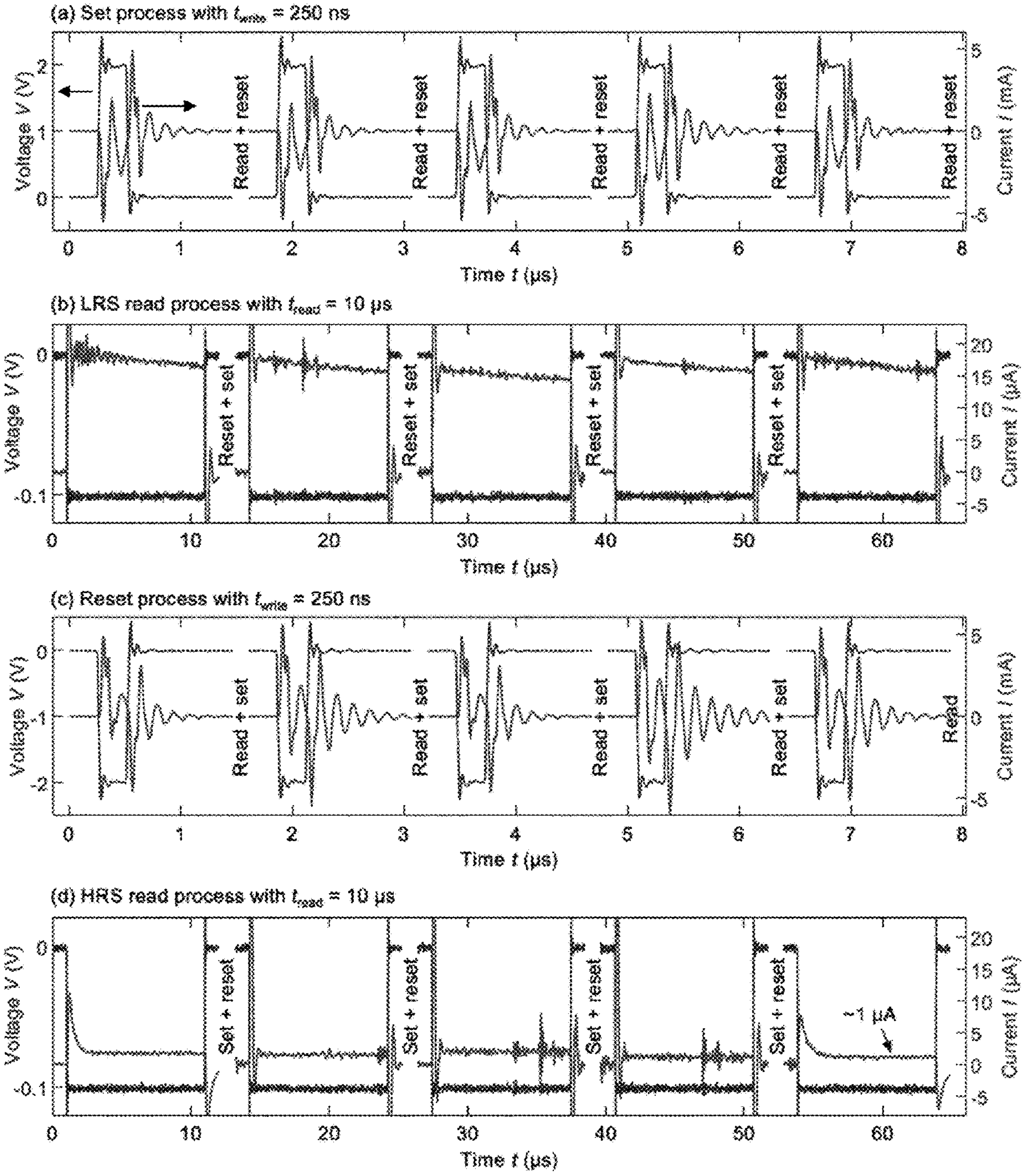
FIG. 61 shows switching measurement with 250 ns pulse widths.

FIG. 61 plots voltages (left y-axis) and currents (right y-axis) as a function of time during fast switching measurements, here exemplary with 250 ns switching pulse widths and 10 ns rise time (in the original plots, voltage is shown in blue and current in red). (20 ns example to follow below.) Note that the four respective operations (set, read, reset, read) are summarized in a single figure each (e.g. all set operations in one figure), but the processes were carried out in the 'usual' order, i.e. set, then read, then reset, then read.

FIG. 61(a) and(*c*) show voltages and currents during switching pulses. In FIG. 61(*a*) this is for the set operation, FIG. 61(*c*) this is for the for reset. It is clear that the fast voltage rise time causes a strong current ringing due to RC time constants in the signal path and the actual switching current cannot be observed. Dedicated high-frequency probe pads and ground-signal-ground probe tips would be required for this.

FIG. 61(*b*) and (*d*) show separate read pulses with 10 μs widths evidence that the devices switch between LRS and HRS regardless of the ringing. As the voltage signal suffers from much less ringing and the devices switch at much larger programming pulses, too (of the order of ms in FIG. 49 above), it is also clear that the ringing is not in fact required for the devices to switch. For 'clean' real-time current-vs-time measurements, dedicated probe pads and tips are required, as demonstrated in e.g. [S3], but the development of a corresponding process was beyond this study.

Figure 62:
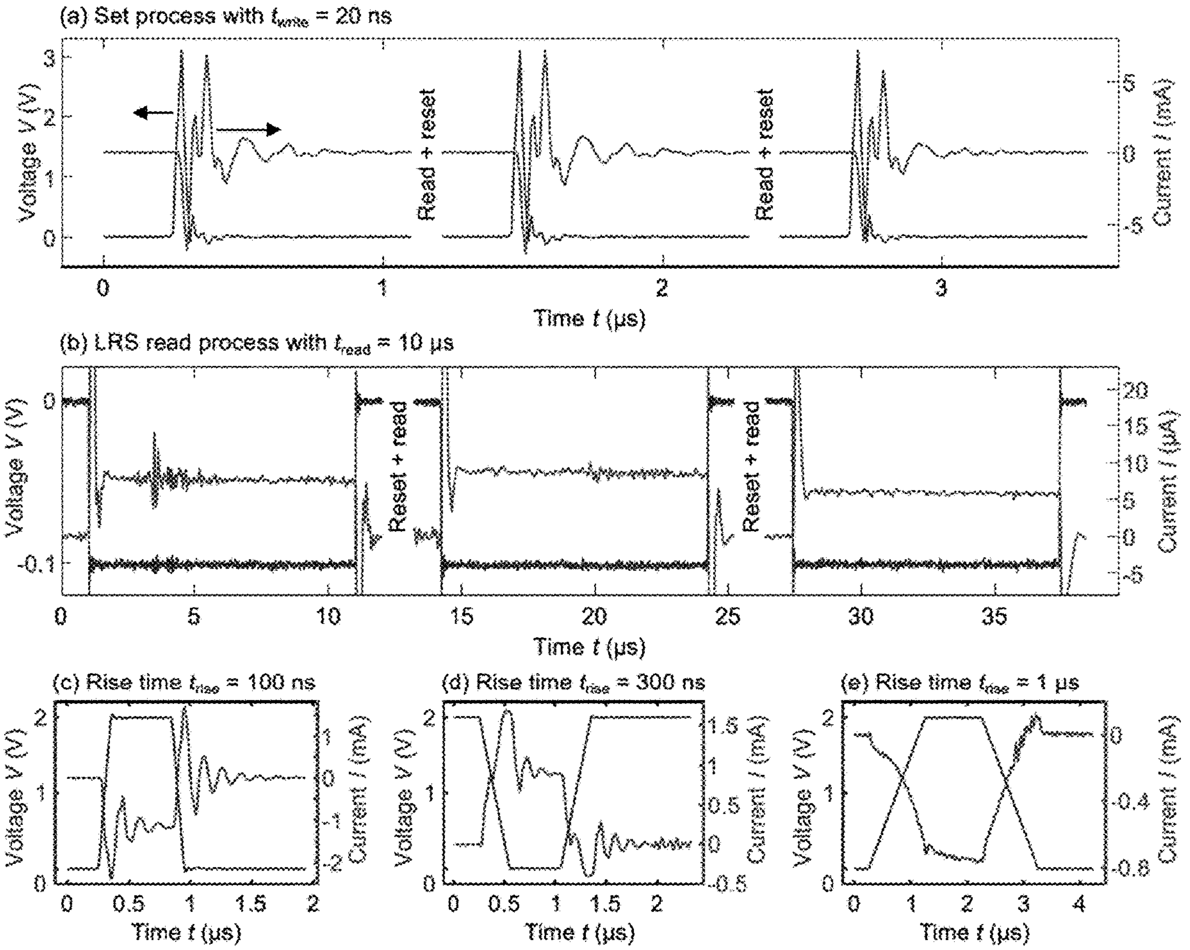
FIG. 62 shows switching measurement with 20 ns pulse widths; different rise times.

FIG. 62(*a*) and (*b*) show voltages (blue in the original, left y-axis) and currents (red in the original, right y-axis) for 20 ns switching (a) and subsequent read operations. In FIG. 62(*a*) note that the nominal set voltage was still 2 V, but the increased ringing at these short times lead to a more pronounced voltage overshoot. In between the three presented pulses, the state was read out as presented in FIG. 62(*b*) and the device was reset (not shown). FIG. 62(*b*) when compared with the read operations in FIG. 61(*b*), it is clear that now the memory window is considerably smaller.

FIG. 62(*c*), (*d*) and (*e*) show the effect of increasing switching pulse rise times from 100 ns to 1 μs. With increasing rise times, the current ringing decreases until it subsides for 1 μs rise times, when the current follows the voltage instantaneously.

Figure 63:
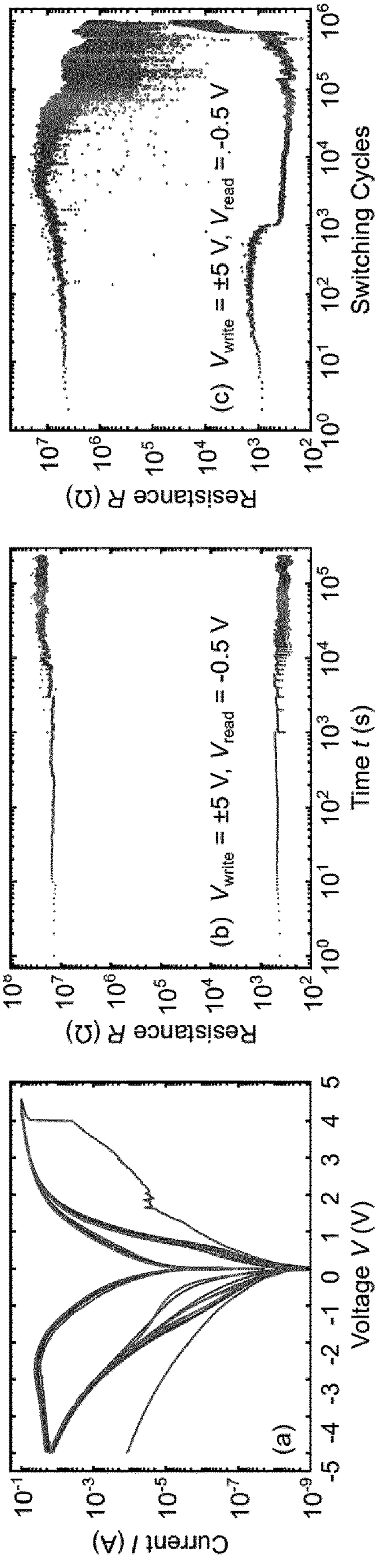
FIG. 63 shows data for devices with reference films deposited at 800° C.

FIG. 63 shows IV, retention, and endurance examples from devices made from Ba:$HfO_x$ thin films deposited at 800° C. FIG. 63(*a*) shows initial ten IV curves for a pristine device, (order from blue to red in the original plot, the blue curve being the curve more separated from the pack). As it required ±5 V to form the device, ±5 V was adopted for the retention and endurance measurements, too. The only reason why the IV cycling started at −5 V instead of 0 V was that the later standard cycling protocol had not been implemented yet.

FIG. 63(*b*) shows the retention of a memory window $>10^4$ without any sign of degradation for $>10^5$ s. The small bumps are a result of intermittent data transfers between the measurement instrument and the computer; no re-programming occurred at these points.

FIG. 63(*c*) shows endurance measurement for the same device. While the initial 1000 cycles are stable at a memory window $>10^3$, the device degrades beyond that, first the HRS, later also the LRS. As the switching currents at ±5 V are about an order of magnitude higher than in the devices presented as the main results, and there is a characteristic rapid current increase during forming, it is likely that in these devices with films deposited at 800° C. the switching mechanism is filamentary. This would also explain the excellent retention properties.

FIG. 64 shows X-ray diffraction spectra for thin films deposited at 800° C. [FIG. 64(*a*) and (*b*)], and at 400° C. [FIG. 64(*c*)].

FIG. 64(*a*) shows the X-ray diffraction spectrum for pure $HfO_x$—the peak at 34° can be identified as monoclinic (0 0 2), (0 0 −2), (2 0 0), (−2 0 0), or orthorhombic (0 0 2), (0 0 −2). As $HfO_x$ preferentially grows in the monoclinic phase, this is the more likely one.

FIG. 64(*b*) shows that in the Ba:$HfO_x$ nanocomposite films, there is no indication of any long-range crystallinity even at the deposition temperature of 800° C. The Ba clearly suppresses the formation of crystallites even at high deposition temperatures.

As shown in FIG. 64(*c*), the same observation holds for Ba:$HfO_x$ composite films deposited at 400° C.; there is no sign of any long-range crystallinity. The different noise floors and intensities are a result of having had to use different detectors for the measurements. FIGS. 64(*a*) and (*b*) were measured with a PIXcel3D position sensitive detector, whereas FIG. 64(*c*) was measured with a single-point proportional detector.

FIG. 65 shows transmission electron micrographs of reference films deposited at 800° C. FIG. 65(*a*) is of pure $HfO_x$ with clear signs of polycrystallinity. Curiously, the films are less well oriented than the ones deposited at 400° C. FIG. 65(*b*) shows that the addition of Ba completely suppresses the formation of crystallites and makes the films amorphous or possibly very-short-range-order nanocrystalline. These TEM scans correspond to the films in FIGS. 64(*a*) and (*b*).

FIG. 66: Rutherford backscattering spectrometry revealed the total composition of the thin films deposited at 400° C. In all plots, (grey) circles correspond to the measured spectra and lines (coloured in the original plots) visualize the compositions calculated to match the experimental results. Labels are added for the elements of the modelled lines. SIMNRA [4], version 7.02, was used for the calculated results. The total film compositions are provided in the figures.

FIGS. 66(*a*) and (*b*) show 15-nm-and 120-nm-thick Ba:$HfO_x$ composite films. FIGS. 66(*c*) and (d) show 15-nm- and 100-nm-thick pure hafnium films. The modelled atomic fractions, based on the measurements in FIG. 66, are listed in Table 1 below.

TABLE 1

RBS results, values in atomic percentage; compositions $Hf_{1-x}Ba_xO_y$ with x = Ba/(Hf + Ba) and y = O/(Hf + Ba).

| Sample | Ba | Hf | O | Composition |
|---|---|---|---|---|
| Pure $HfO_x$ 100 nm | 0 | 29.3 | 70.7 | $HfO_{2.41}$ |
| Pure $HfO_x$ 15 nm | 0 | 29.5 | 70.5 | $HfO_{2.39}$ |
| Ba:$HfO_x$ 120 nm | 6.7 | 24.8 | 68.5 | $Hf_{0.79}Ba_{0.21}O_{2.17}$ |
| Ba:$HfO_x$ 15 nm | 6.7 | 25 | 68.3 | $Hf_{0.79}$ $Ba_{0.21}O_{2.15}$ |

Figure 67:
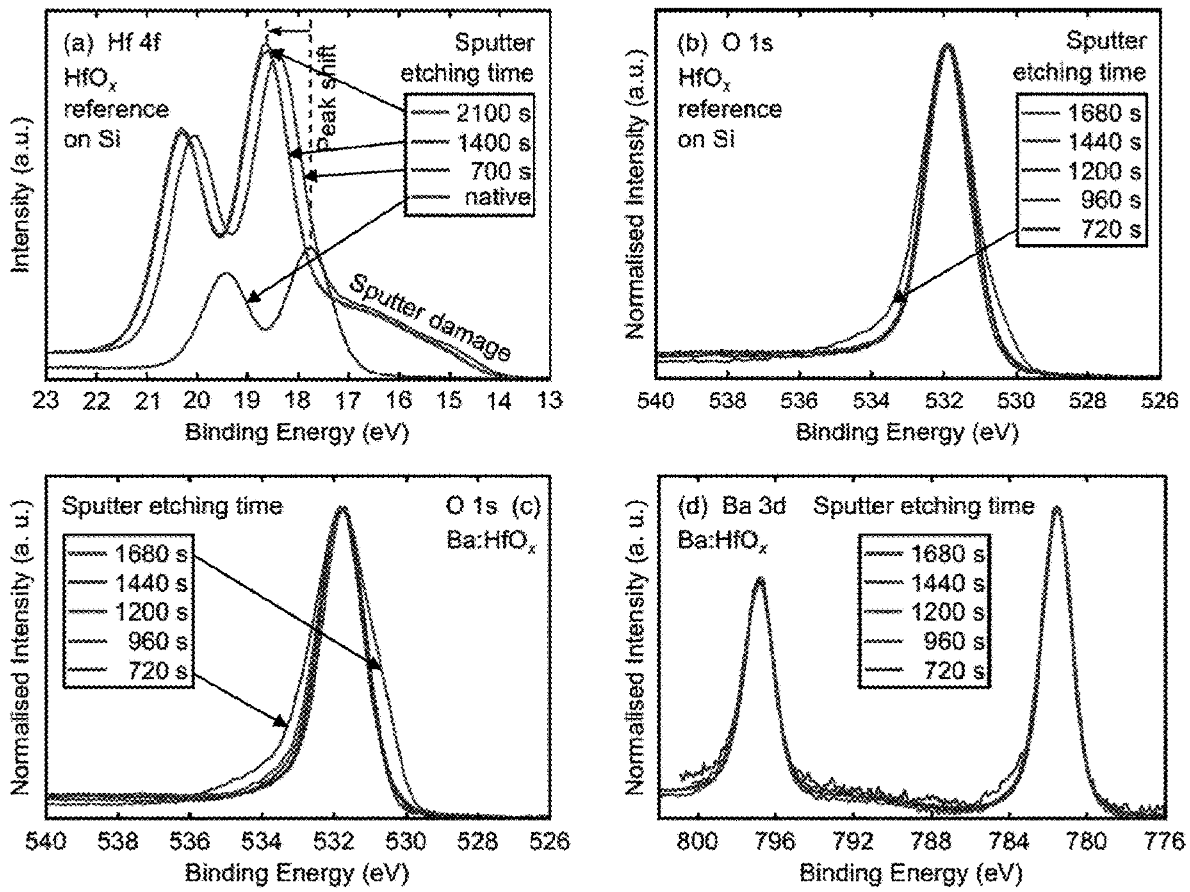
FIG. 67 shows XPS spectra for different films.

FIG. 67 shows core spectra for depth-resolved XPS, all films deposited at 400° C. FIG. 67(*a*) shows Hf 4f reference core spectra for $HfO_x$ deposited on Si to reveal the effect of Ar ion sputter damage. For these reference measurements, about 30 nm of pure $HfO_x$ were deposited with the same deposition parameters as the RS devices (except longer deposition time and no TiN capping) on a Si substrate. (The plot uses colour in the original and arrows have been added to show the different curves for different sputter etching times.) As presented in FIG. 67(*a*), the experiment confirmed that sputter etching results in a peak shift, peak broadening, and the formation of a broad shoulder in the lower-binding-energy range of the Hf 4f spectra. However, different from the measurements presented in FIG. 53(*c*) and (*d*) above, in these reference Hf 4f core level spectra for t>700 s the shape of and area below the low-energy shoulder remain the same with increasing sputter time. This proves that the gradual increase of the shoulder in FIG. 53(*c*) and (*d*) is not an artifact from sputter damage but inherent to the films. The increasing shoulder thus reveals a significant change of the concentration of Hf sub-oxidation states as a function of depth towards the Nb:STO substrate. However, as there are no reliable references available for the peak modelling of such features which are intermixed with the influence of sputter damage, this part of the Hf 4f spectra was not de-convoluted and instead fitted with only one broad peak comprising both $Hf^{2+}$ and $Hf^{1+}$ components. It is pointed out that the Hf 4f spectra of neither sample contained any metallic $Hf^0$ component, which would have appeared at about 14 eV.

FIG. 67(*b*) and (*c*): O 1s core spectra for $HfO_x$ reference (on Nb:STO) and Ba:$HfO_x$ composite film. 9Again, I the original plots colour in used but in FIG. 67(*b*) only the 720 s line is indicated, the other lines are substantially overlaid by each other.) There is no significant change with increasing sputter time. The high-and low-energy shoulder can be attributed to O—N bonds to the protective TiN capping layer and oxygen from the substrate, respectively.

FIG. 67(*d*) shows Ba 3d core spectra for a Ba:$HfO_x$ sample. No significant change occurs with increasing sputter time.

Figure 68:
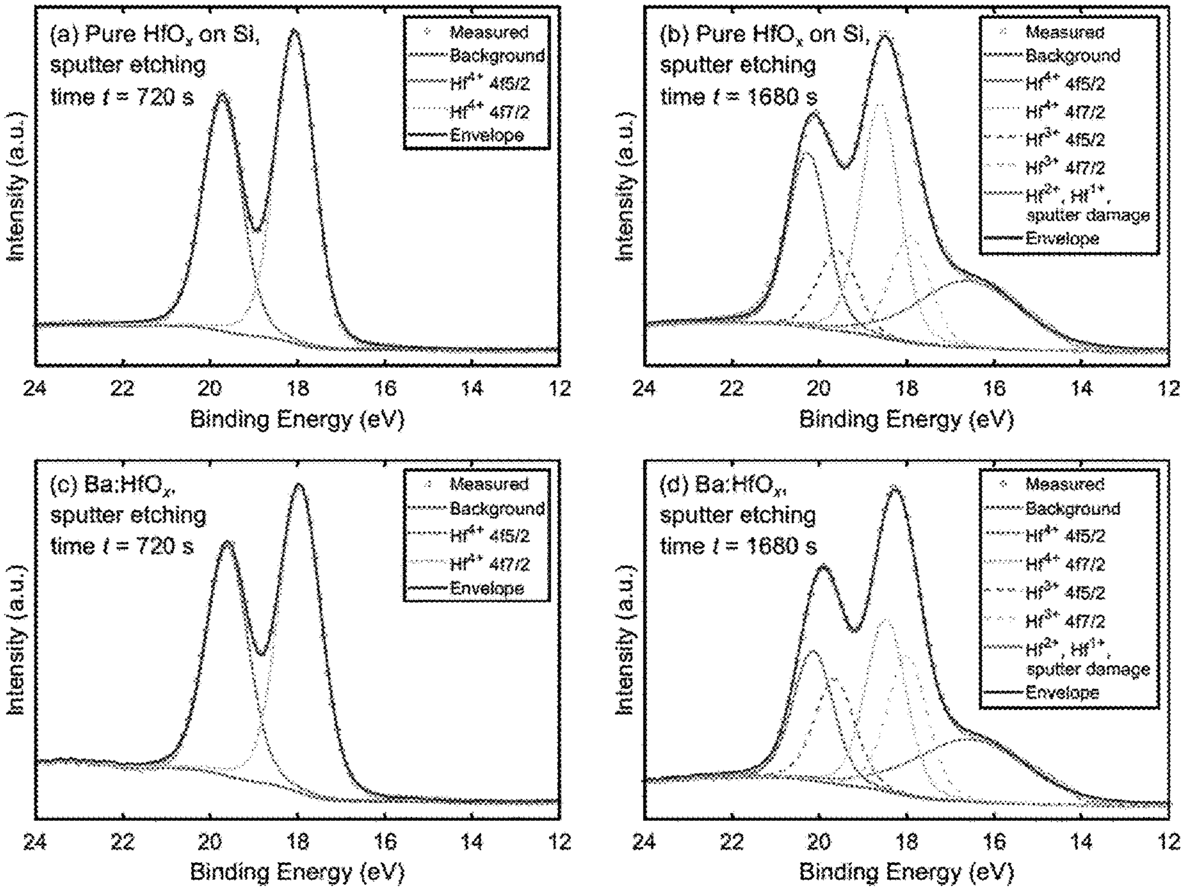
FIG. 68 shows examples for fitted XPS spectra.

FIG. 68 shows examples of how the XPS data was fitted. FIGS. 68(*a*) and (*b*) show Hf 4f core spectra of a pure $HfO_x$ reference film after 720 s and 1680 s, respectively. FIGS. 68(*c*) and (*d*) show Hf 4f core spectra of a Ba:$HfO_x$ nanocomposite film after 720 s and 1680 s, respectively. (The original plots use colour.) For accurate fitting results, the distance between the 4f5/2 and 4f7/2 peaks was kept constant at 0.6 eV for $Hf^{4+}$ and at 0.4 eV for $Hf^{3+}$ for all sputter etch times, while the area ratio between 4f5/2 and 4f7/2 was kept constant at 75% both for $Hf^{4+}$ and $Hf^{3+}$ for all sputter etch times.

FIG. 68(*a*) and (*c*) show pure $HfO_x$ and $BaHfO_x$ composite film, respectively, after 720 s of etching. This etching time removed most of the TiN capping layer, but without damaging the actual films yet, so that the observed peaks do not contain any sign of sputter damage. For both films, the two peaks can be fitted well with single doublet pairs of 4f7/2 and 4f5/2 states corresponding to fully oxidized Hf, i.e. $Hf^{4+}$.

FIG. 68(*b*) and (*d*) show the same films after 1680 s of etching. A clear peak broadening is observed, so that now, the 4f7/2 and 4f5/2 peaks can only be fitted by spin-split 4f7/2-4f5/2 doublet states, which reveals the additional presence of $Hf^{3+}$. Both $Hf^{3+}$ and $Hf^{4+}$ are shown in the figures. In addition, the shoulder corresponding to $Hf^{2+}$ and $Hf^{1+}$ is clearly visible.

As discussed above (FIG. 67), a constant contribution to this shoulder results from sputter damage to the films, but as is evident from the progressively increasing shoulder presented in FIG. 53, the remaining part is due to an actual change in the film composition. However, just as mentioned before, as there are no reliable references available for the peak modelling of such features which are intermixed with the influence of sputter damage, this part of the Hf 4f spectra was not de-convoluted and instead fitted with only one broad peak comprising both $Hf^{2+}$ and $Hf^{1+}$ components.

FIG. 69 shows the effect of area scaling of: FIG. 69(*a*): the switching currents of the Ba:$HfO_x$ IV curves, i.e. the currents at ±2 V, and FIG. 69(*b*): the corresponding resistances at +2 V. In FIG. 69 (*a*), for switching at +2 V: despite the increasing error bars for the measured currents, a linear function of the electrode diameter can be fitted to the average values. The currents increase by a factor of about 2 when the electrode diameter is doubled. For switching at −2 V, no obvious dependence is shown of the high resistance state on the electrode diameter.

FIG. 69(*b*) shows resistances corresponding to the positive switching currents in FIG. 69(*a*) with a linear fit. The (higher) resistances corresponding to the negative switching are not shown so as not to distort the y-axis and thus render the linear fit for the positive switching resistances indiscernible. (Also, as pointed out, no linear trend is observed for the negative switching.)

Error bars present the standard deviation of the measurement of different devices; five devices each for 25 and 50 μm diameters, ten devices for 100 μm diameter. Note that different from the measured IV curves of FIG. 49, the y-axes are on a linear scale here, so that the error bars appear larger. The linear scaling of the current with the electrode diameter can be explained (qualitatively) by the observation of different lengths of the Ba-rich columns in FIG. 52. With a certain lengths distribution where not all columns contribute to the device current equally, the current can scale with the diameter instead of the area.

FIG. 70 shows temperature-dependent IV measurements of two different devices based on Ba:$HfO_x$ films deposited on Nb:STO at 400° C. with Pt top electrodes. In FIG. 70(*a*) the measurement temperatures were varied from 120 K to 300 K as indicated in the legend and the measurements were carried out in a vacuum of pressure about $8\times10^{-8}$ mbar. Three IV cycles per temperature. The device had been formed before the temperature-dependent measurements. In FIG. 70(*b*) the temperatures were varied from 20° C. to 85° C. as indicated in the legend. Five IV cycles per temperature.

The strongest temperature dependence can be observed for the HRS (lower current branch) at positive voltages. The other branches are significantly less temperature-dependent or even have an inverted temperature dependence in comparison with the positive-voltage HRS. As will be discussed later on, the currents are controlled mainly by Schottky emission at low and medium currents (with possible contributions from Poole-Frenkel emission) and by space-charge-limited conduction (SCLC) or trap-assisted tunnelling (TAT) at the highest currents. Since the dominant current mechanisms change along the IV curves, so do the temperature dependences. Also, at high temperatures, the resistance of Nb:STO increases rapidly, almost exponentially, so while it should not limit the currents at room temperature and below, the increasing resistance can be expected to affect the currents at higher temperatures and interfere further with the temperature dependence of the film and barrier.

We now consider fitting of electrical data.

To support identifying the electronic transport mechanisms in the fabricated devices, different electronic conduction models were fitted to the measured data: the Schottky emission (SE) model, the space-charge-limited conduction (SCLC) model, the Poole-Frenkel (PF) emission model, and a trap-assisted tunnelling (TAT) model were compared. In summary, based on electrical measurements, clear evidence is found for a thermionically controlled current injection into the switching insulator at low and intermediate currents with SCLC or TAT taking over at higher currents. As many thermionic processes have similar exponential dependences on the electric field (due to the Boltzmann approximation), a singular mechanism cannot be identified purely by electrical measurements and most likely, several processes occur in parallel. The detailed results are as follows.

For Schottky emission over a reverse-biased Schottky barrier [S5] in a metal-insulator-semiconductor stack, $$J_{SE} = A^* T^2 \exp\left[\frac{q}{k_B T}\left(\sqrt{\frac{qV}{4\pi\epsilon_{op}\epsilon_0}} - \Phi_B\right)\right] \quad \text{(Equation 2)}$$

where $J_{SE}$ is the measured current density, $A^*=\lambda A_0$ is the effective Richardson constant, where $A_0=1.2\times10^6$ $Am^{-2}K^{-2}$ and A is typically of the order 0.5 [S6], T=291 K is the measurement temperature, q the elemental charge, $k_B$ the Boltzmann constant, V the applied voltage, $\epsilon_{op}$ the optical dielectric constant of the thin film, $\epsilon_0$ the vacuum permittivity, $t_{ox}$ the thin film thickness, and $\Phi_B$ the interface barrier height, which is to be calculated. This equation assumes full depletion of the dielectric so that the electric field across it can be approximated as $E=V/t_{ox}$. Note that in the presence of partial filaments the effective thickness for establishing the electric field is smaller than the actual oxide film thickness. For the calculated barrier height values, the exact electric field will induce a shift of the values, since the effect will be similar for the barrier heights in the high and low resistance states, a qualitative comparison will not be affected by this. A comparison with the forward direction of a Schottky contact ($\propto$ V instead of $\propto\sqrt{V}$) revealed that the forward direction does not fit the measured values. From fits of (Equation 2), the barrier height $\Phi_B$ can be calculated.

The only assumptions required for calculating $\Phi_B$ from (Equation 2) is that of $\lambda A_0$, which on top of being the only input parameter appears in a logarithm when fitting the model so that its impact on the final result is minor. Here, $\lambda=0.5$ was assumed as a typical value and $A_0$ varies only with the effective mass m-as $A_0=4\pi qm\cdot k^2$ $B/h^3$, where h is Planck's constant [S6]. The only other unknown in (Equation 2) is $\epsilon_{op}$, SO its resulting value after fitting was used to gauge the physical reasonability of the fitting results. (This can be done independently from calculating $\Phi_B$ as $\epsilon_{op}$ is calculated from the fitted slope, whereas $\Phi_B$ is calculated from the y-intercept.) For all fits, $\epsilon_{op}$ was on the order of one, which is a very reasonable value for hafnium oxide, even in the presence of dopants [S7]. From linear regression fits of In(J) to $\sqrt{V}$ (see FIG. 71) for the ten devices in FIG. 49(*a*), $\Phi_B$ calculated with (Equation 2) and $m^*=0.11m_0$ [S8] ($m_0$ electron rest mass) is 0.65±0.03 eV and 0.62±0.03 eV for the HRS in the positive and negative voltage directions, respectively, and 0.46±0.03 eV and 0.47±0.03 eV for the LRS in the positive and negative voltage ranges, respectively. When varying m* between $0.11m_0$ and $1m_0$, these values increased by about 0.05-0.1 eV. The excellent fits, consistent for 50 devices, indicate that while again, no singular current mechanism can be identified reliably, Schottky emission seems to contribute a dominant portion of it. None of the other models yielded similarly close and consistent fits over the same current ranges.

To support the conclusion of Schottky emission as one of the dominant current transport mechanisms, besides calculating $\Phi_B$ by fitting (Equation 2) as a function of voltage, it can also be fitted as a function of temperature. The results are presented in FIG. 72. The barrier heights calculated from these Arrhenius plots, however, are lower than the ones calculated from fitting SE as a function of voltage; 0.23±0.05 eV from temperature dependence vs. 0.65±0.03 eV from voltage dependence.

For SCLC, mathematical expressions vary depending on whether or not charge traps are involved while changing voltages [S9]. The 'extreme' cases for this are $I\propto V^2$ in the case of trap-free materials and I∝exp(V) in the case of traps uniformly distributed in energy and throughout the material. For different trap distributions in space and energy, virtually any exponent is possible for the voltage dependence. Thus, here, a linear fit was applied to In(I) vs. In(V) to reveal the exponent. Example fits are provided in FIG. 71(*c*) to (*e*).

Figure 71:
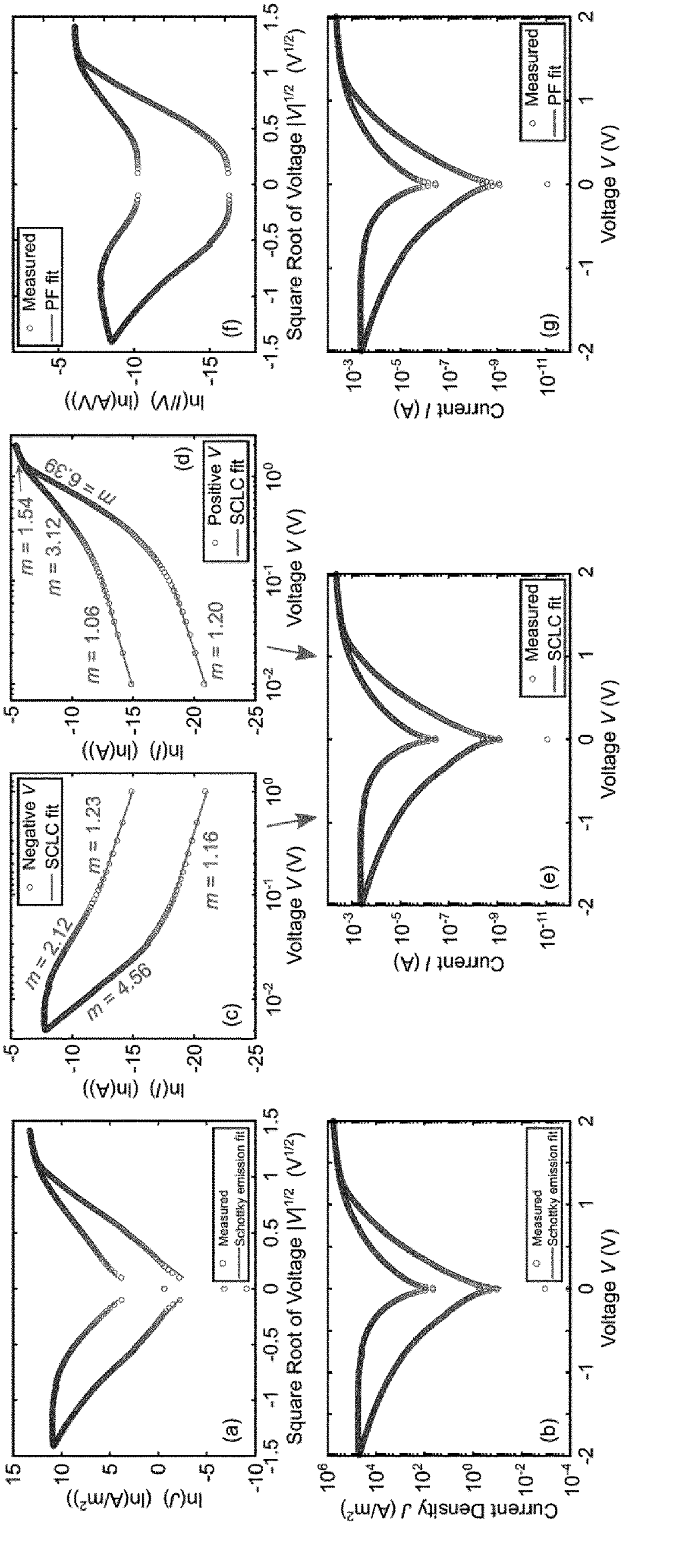
FIG. 71 shows fitting of Schottky emission, space-charge-limited conduction, and Poole-Frenkel emission.

FIG. 71 therefore shows different electron transport models fitted to the measured IV curves. FIG. 71(*a*) shows Schottky emission: In(J) vs. $\sqrt{V}$, FIG. 71(*b*) shows a fitted model curve on top of measured IV curve. Space-charge-limited conduction (SCLC): In(I) vs. V for FIG. 71(*c*) negative voltage range with inverted x-axis and FIG. 71(*d*) shows the positive voltage range, FIG. 71(*e*) shows the fitted model curve on top of measured IV curve. FIG. 71(*f*) shows Poole-Frenkel emission: In(I/V) vs. $\sqrt{V}$. FIG. 71(*g*) shows a fitted model curve on top of measured IV curve.

Figure 72:
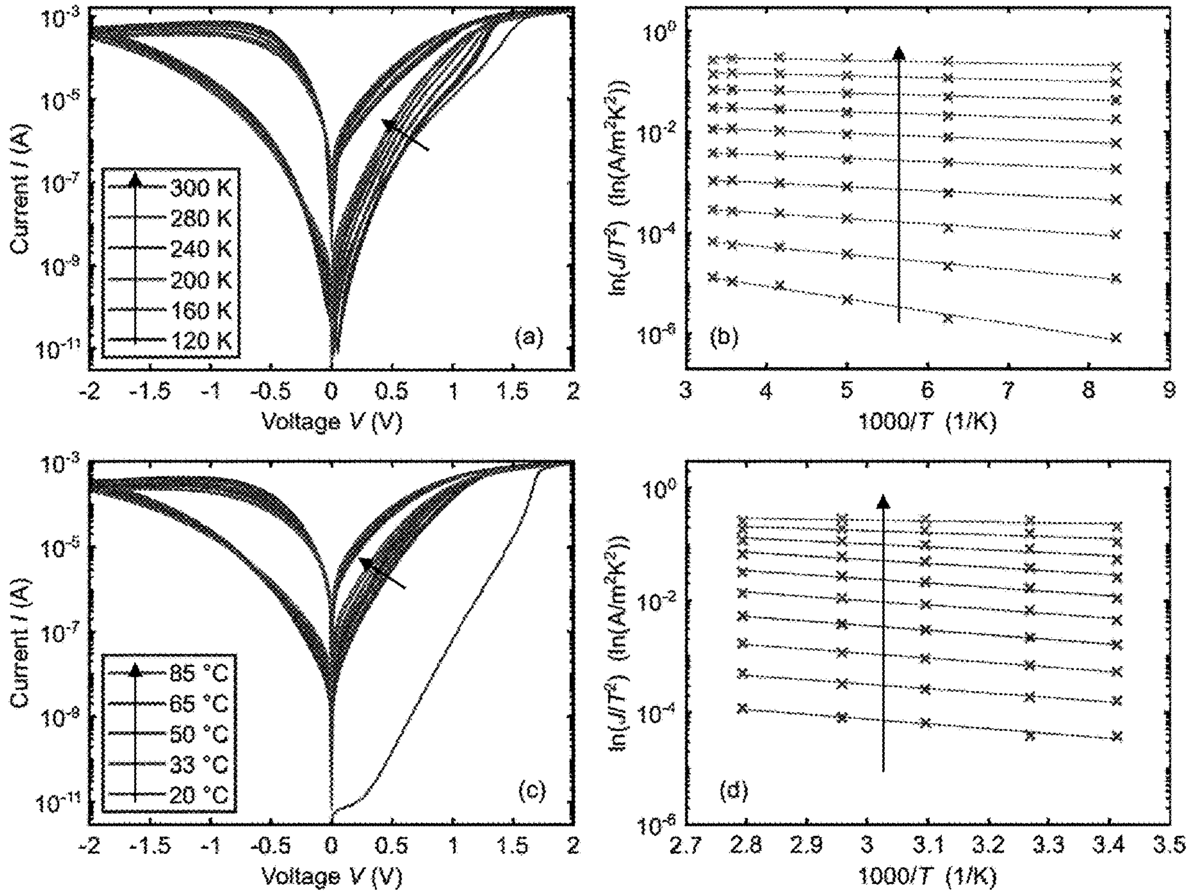
FIG. 72 shows Arrhenius plots for electronic transport.

FIG. 72 shows IV curves and Arrhenius plots for Ba:$HfO_x$ devices at temperatures from 120 K to 360 K.

FIGS. 72(*a*) and (*c*) show the same plots as FIG. 70, for reference. In the HRS for positive voltages, a clear temperature dependence is visible. In the other branches of the IV curves, the dependence is much less pronounced and in may even change sign. Note especially the crossing of IV curves for the HRS in the negative voltage ranges. This will be discussed below.

FIG. 72(*b*) and (*d*) show that the currents in the lower current branch at positive voltages, i.e. HRS, follows an Arrhenius-like temperature dependence. The data points marked in (b) and (d) correspond to voltages from 0.1 V to 1 V in steps of 0.1 V.

Linear fits in the double-logarithmic plots yield solid results in two different voltage ranges, with slopes of about 1 for low, and >2 for larger voltages. In the literature, this is often interpreted as a transition from ohmic transport (slope 1) due to thermionically generated charge carriers inside a material to SCLC in the presence of traps (slope >2). As the slope of about 1 only applies to a few data points at low voltages, we differ from this interpretation in concluding that at low voltages, SE is dominant, which then transitions to SCLC in the presence of traps at higher voltages, when large amounts of charge carriers are injected into the oxide. This is consistent with the ubiquity of traps in amorphous hafnium oxide. As an alternative, TAT dominates the high-current ranges, as discussed in the following.

The observed crossing of the IV curve in the negative-voltage HRS has been investigated in detail in e.g. [S10] and provides further evidence as to the presence of different conduction mechanisms. In [S10], TAT was identified as playing an important role in the current transport, so it is investigated here in the following and it turns out that this model can indeed describe the measured currents at the highest current levels. As TAT is temperature-independent, the inverted temperature difference of the measured IV curves in the negative-voltage after the IV crossing can then be explained by a phonon-limited bulk effect in the Ba:$HfO_x$ films.

The equation used for fitting the TAT model is [S11]:

$$J_{TAT} = C \times \exp\left[-\frac{8\pi\sqrt{2qm^*}}{3hE}\Phi_T^{3/2}\right] \quad \text{(Equation 3)}$$

where C is a summary of constants, q the elemental charge, $m^*=0.11m_0$ the effective mass in the oxide (with $m_0$ the electron rest mass) as before [S8], h is Planck's constant, E the electric field approximated as $E=V/t_{ox}$ with the applied voltage V and the oxide thickness t, and $\Phi_T$ is the depth in energy of the involved traps. As before, note that the effective thickness $t_{ox}$ is lower in the presence of partial filaments, which effectively 'short-circuit' part of the film thickness. It is appropriate to use the highest applied voltages for the fitting as it is usually assumed that electrons tunnel into states into the oxide conduction band via traps, rather than tunnelling through the whole oxide thickness. (In this case, a hopping conduction mechanism would be more appropriate.) At low voltages, the conduction band edge is too high for electrons to tunnel into, i.e. there are no available states to tunnel into, and it requires a certain electric field to lower part of the conduction band below the energy level of the involved traps. The good fits with both the TAT and SCLC model at the highest currents suggest that they describe electron transport appropriately in these regions.

As with the thermionically assisted mechanisms before, the fits of (Equation 3) to the high and low resistance state results in higher and lower energy levels for $\Phi_T$, although for the TAT model, the interpretation for this difference is less straightforward than for a changing energy barrier height. One possible explanation would be the field-induced reversible creation and recombination of traps which add and remove defect levels at different $\Phi_T$. As at this point, however, there is no further evidence for this, this is a conjecture which we will not take any further. Instead, we just want to point out that for all of the investigated models, the high and low resistance state clearly reveal a change of the height or depth of the involved energy levels.

Figure 73:
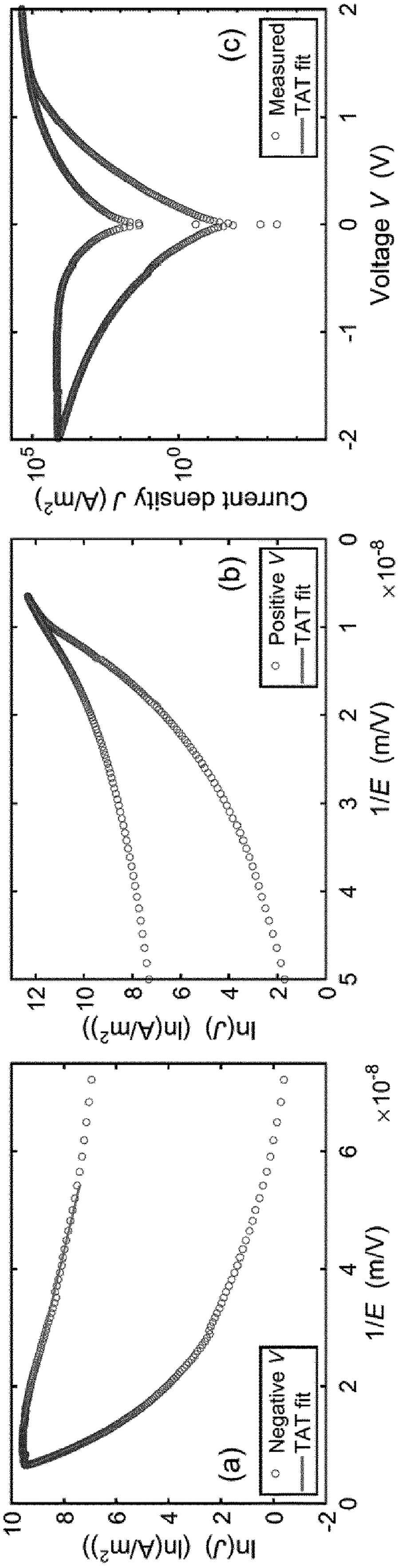
FIG. 73 shows fitting of trap-assisted tunnelling transport.

FIG. 73 shows fits of the trap-assisted tunnelling (TAT) model to a measured IV curve. FIG. 73(*a*) and (b) show negative and positive voltage range, respectively. FIG. 73(*c*) shows fitted data plotted on top of the originally measured data.

Figure 74:
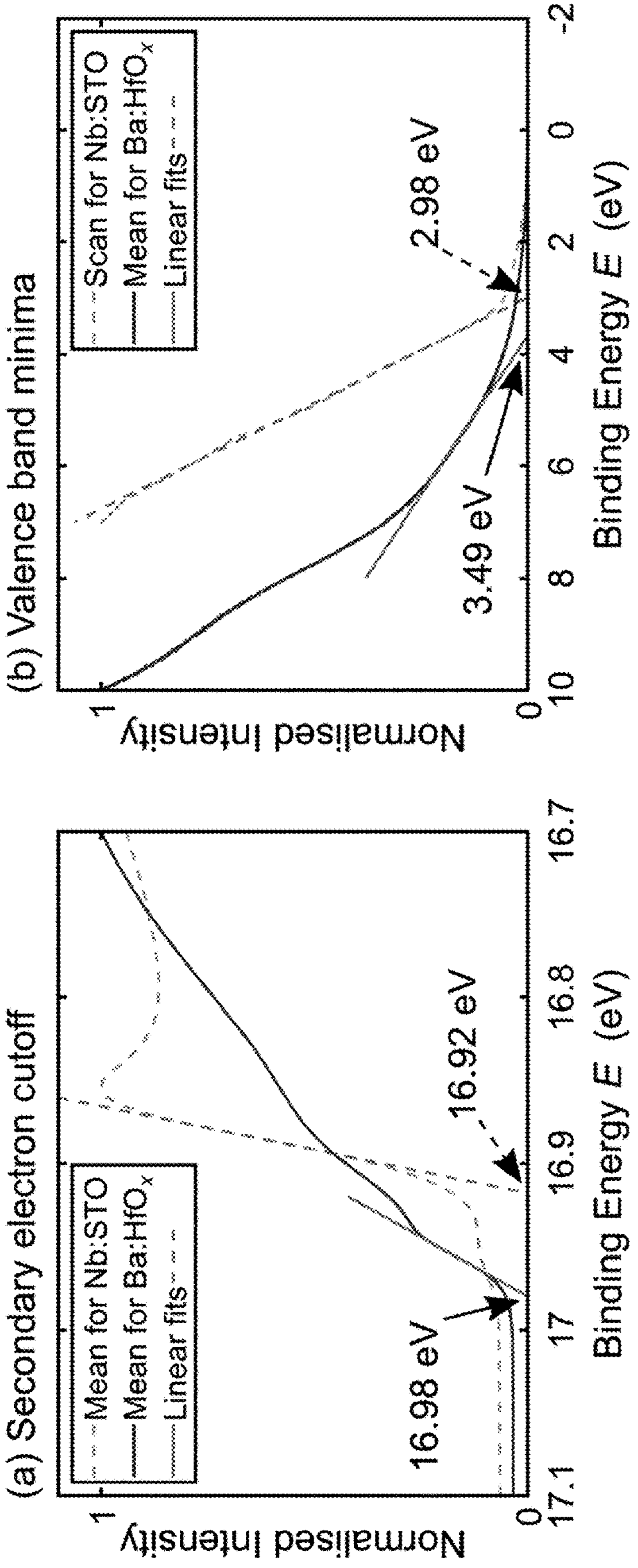
FIG. 74 shows the results of ultraviolet photoemission spectroscopy.

FIG. 74 shows ultraviolet photoelectron spectroscopy spectra to determine: FIG. 74(*a*) the vacuum offset between the substrate and the Ba:$HfO_x$ film, and FIG. 74(*b*) the difference between the valence band minima (VBM). For Ba:$HfO_x$, the plotted spectra are the mean value of three measured scans. For FIG. 74(*a*), the Nb:STO spectrum is the average of two scans, and for FIG. 74(*b*), only one scan was carried out for the Nb:STO. The values provided in the figures are the extrapolated intersections with the x-axis.

In the devices discussed above, HfOx is doped with an aliovalent ion (in this case Ba2+). This leads to the creation of more oxygen vacancies. We show this from Rutherford backscattering spectroscopy. More vacancies are formed and furthermore are formed in a more controlled way, leading to better control of the interface switching mechanism.

Furthermore, the aliovalent ion (Ba) doping leads to the formation of a second phase which leads to filament seeds. This has the effect of making switching of the device more uniform because it is possible to create filaments of high density and with device uniformity.

It is found that Ba doping leads to amorphisation of $HfO_2$. This means that the $HfO_2$ is more uniform in terms of microstructure. This is considered to be because, if amorphous $HfO_2$ is grown at room temperature, it is likely to be non-uniform because the sticking coefficient to substrate is not suitable. However, if growth takes place at a higher temp (e.g. 400° C. as here), it will become crystalline and rough filaments will form at a range of angles and be non-uniform. Therefore that is also not suitable. However, if $Ba^{2+}$ is added it is possible to grow the active layer at 400° C. and the active layer is both amorphous and adheres well to the substrate.

The inventors have realised that these results extend directly to $SiO_2$ and more generally to $SiO_x$. Amorphous $SiO_2$ is widely studied and of great interest to industry. Amorphous $SiO_2$ has many parallels with amorphous $HfO_2$. It is a high K dielectric and it is easy to manufacture in amorphous form. It has a 4+ cation, i.e. $Si^{4+}$, like $Hf^{4+}$.

Accordingly, within the scope of the present disclosure is a resistive switching memory device comprising an active layer comprising an ionic conducting aliovalent ion doped $SiO_x$, wherein the device exhibits hysteretic I-V behaviour to permit switching of the electrical resistance of the device between different resistance states, wherein the active layer is amorphous or nanocrystalline and wherein the active layer comprises a nanocomposite structure with an arrangement of columns of a second phase extending in a thickness direction of the active layer within a matrix of a first phase, and wherein, in use of the device, the columns guide the formation of partial conductive filaments in the active layer. It is considered that substantially the same considerations apply to such a device as to the aliovalent ion doped $HfO_x$ active layer device disclosed and discussed in extensive detail above.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

A number of publications are cited above in order to more fully describe and disclose the invention and the state of the art to which the invention pertains. The entirety of each of these references is incorporated herein.

LIST OF REFERENCES

[1] A. Chen. "A review of emerging non-volatile memory (NVM) technologies and applications". In: Solid-State Electronics 125 (2016), pp.25-38. ISSN: 00381101. DOI: 10.1016/j.sse.2016.07.006.

[2] S. Kamba W. Banerjee A. Kashir. "Hafnium Oxide (HfO2)—A Multifunctional Oxide: A Review on the Prospect and Challenges of Hafnium Oxide in Resistive Switching and Ferroelectric Memories". In: Small 18 (23 2022), p.2107575. ISSN: 16136829. DOI: 10.1002/smll.202107575.

[3] S. Datta S. Salahuddin K. Ni. "The era of hyper-scaling in electronics". In: Nature Electronics 1 (8 2018), pp.442-450. ISSN: 25201131. DOI: 10.1038/s41928-018-0117-x.

[4] B. Govoreanu, L. Di Piazza, J. Ma, T. Conard, A. Vanleenhove, A. Belmonte, D. Radisic, M. Popovici, A. Velea, A. Redolfi, O. Richard, S. Clima, C. Adelmann, H. Bender, and M. Jurczak. "Advanced a-VMCO resistive switching memory through inner interface engineering with wide (>$10^2$) on/off window, tunable μA-range switching current and excellent variability". In: 2016 IEEE Symposium on VLSI Technology. 2016, pp.1-2. DOI: 10.1109/VLSIT.2016.7573387.

[5] M. Lederer, D. Lehninger, T. Ali, and T. Kämpfe. "Review on the Microstructure of Ferroelectric Hafnium Oxides". In: Physica Status Solidi—Rapid Research Letters 16 (10 2022), p.2200168. ISSN: 18626270. DOI: 10.1002/pssr.202200168.

[6] S. Dirkmann, J. Kaiser, C. Wenger, and T. Mussenbrock. "Filament Growth and Resistive Switching in Hafnium Oxide Memristive Devices". In: ACS Applied Materials and Interfaces 10 (17 2018), pp.14857-14868. ISSN: 19448252. DOI: 10.1021/acsami.7b19836.

[7] H. Y. Lee, Y. S. Chen, P. S. Chen, P. Y. Gu, Y. Y. Hsu, S. M. Wang, W. H. Liu, C. H. Tsai, S.S. Sheu, P. C. Chiang, W. P. Lin, C. H. Lin, W. S. Chen, F. T. Chen, C. H. Lien, and M. J. Tsai. "Evidence and solution of over-RESET problem for HfOX based resistive memory with sub-ns switching speed and high endurance". In: 2010 International Electron Devices Meeting. 2010, pp.19.7.1-19.7.4. DOI: 10.1109/IEDM.2010.5703395.

[8] W. Kim, A. Hardtdegen, C. Rodenbucher, S. Menzel, D. J. Wouters, S. Hoffmann-Eifert, D. Buca, R. Waser, and V. Rana. "Forming-free metal-oxide ReRAM by oxygen ion implantation process". In: 2017 International Electron Devices Meeting. 2017, pp. 4.4.1-4.4.4. DOI: 10.1109/IEDM.2016.7838345.

[9] S. Petzold, A. Zintler, R. Eilhardt, E. Piros, N. Kaiser, S. U. Sharath, T. Vogel, M. Major, K. P. McKenna, L. Molina-Luna, and L. Alff. "Forming-Free Grain Boundary Engineered Hafnium Oxide Resistive Random Access Memory Devices". In: Advanced Electronic Materials 5 (10 2019), p. 1900484. ISSN: 2199160X. DOI: 10.1002/aelm.201900484.

[10] M. S. Ram, K.-M. Persson, A. Irish, A. J"onsson, R. Timm, and L.-E. Wernersson. "High-density logic-in-memory devices using vertical indium arsenide nanowires on silicon". In: Nature Electronics 4 (12 2021), pp.914-920. ISSN: 25201131. DOI: 10. 1038/s41928-021-00688-5.

[11] A. Fantini, L. Goux, R. Degraeve, D. J. Wouters, N. Raghavan, G. Kar, A. Belmonte, Y. Y. Chen, B. Govoreanu, and M. Jurczak. "Intrinsic switching variability in HfO2 RRAM". In: 2013 5th IEEE International Memory Workshop, IMW 2013. 2013, pp.30-33. ISBN: 9781467361675. DOI: 10.1109/IMW.2013.6582090.

[12] S. Ambrogio, S. Balatti, A. Cubeta, A. Calderoni, N. Ramaswamy, and D. Ielmini. "Statistical fluctuations in HfOx resistive-switching memory: Part I-Set/Reset variability". In: IEEE Transactions on Electron Devices 61 (8 2014), pp.2912-2919. ISSN: 00189383. DOI: 10.1109/TED.2014.2330200.

[13] A. Chen. "Area and thickness scaling of forming voltage of resistive switching memories". In: IEEE Electron Device Letters 35 (1 2014), pp.57-59. ISSN: 07413106. DOI: 10.1109/LED.2013.2288262.

[14] S. Kim, J. Chen, Y. C. Chen, M. H. Kim, H. Kim, M. W. Kwon, S. Hwang, M. Ismail, Y. Li, X. S. Miao, Y. F. Chang, and B. G. Park. "Neuronal dynamics in $HfO_x/AlO_y$ based homeothermic synaptic memristors with low-power and homogeneous resistive switching". In: Nanoscale 11 (1 2019), pp.237-245. ISSN: 20403372. DOI: 10.1039/c8nr06694a.
[15] W. Wu, H. Wu, B. Gao, N. Deng, S. Yu, and H. Qian. "Improving Analog Switching in $HfO_x$-Based Resistive Memory with a Thermal Enhanced Layer". In: IEEE Electron Device Letters 38 (8 2017), pp. 1019-1022. ISSN: 07413106. DOI: 10.1109/LED.2017.2719161.
[16] Q. Luo, X. Zhang, Y. Hu, T. Gong, X. Xu, P. Yuan, H. Ma, D. Dong, H. Lv, S. Long, Q. Liu, and M. Liu. "Self-Rectifying and Forming-Free Resistive-Switching Device for Embedded Memory Application". In: IEEE Electron Device Letters 39 (5 2018), pp.664-667. ISSN: 1558-0563. DOI: 10.1109/LED.2018.2821162.
[17] J. J. Ryu, K. Jeon, S. Yeo, G. Lee, C. Kim, and G. H. Kim. "Fully "Erase-free" Multi-Bit Operation in HfO2-Based Resistive Switching Device". In: ACS Applied Materials and Interfaces 11 (8 2019), pp. 8234-8241. ISSN: 19448252. DOI: 10.1021/acsami.8b20035.
[18] S. Bagdzevicius, K. Maas, M. Boudard, and M. Burriel. "Interface-type resistive switching in perovskite materials". In: Journal of Electroceramics 39 (1-4 2017), pp.157-184. ISSN: 15738663. DOI: 10.1007/s10832-017-0087-9.
[19] B. J. Choi, A. C. Torrezan, K. J. Norris, F. Miao, J. P. Strachan, M.-X. Zhang, D. A. A. Ohlberg, N. P. Kobayashi, J. J. Yang, and R. S. Williams. "Electrical Performance and Scalability of Pt Dispersed $SiO_2$ Nanometallic Resistance Switch". In: Nano Letters 13 (7 2013), pp.3213-3217. ISSN: 1530-6984. DOI: 10.1021/nl401283q.
[20] M. Lanza, H. S. P. Wong, E. Pop, D. Ielmini, D. Strukov, B. C. Regan, L. Larcher, M. A. Villena, J. J. Yang, L. Goux, A. Belmonte, Y. Yang, F. M. Puglisi, J. Kang, B. Magyari-Köpe, E. Yalonand A. Kenyon, M. Buckwell, A. Mehonic, A. Shluger, H. Li, T. H. Hou, B. Hudec, D. Akinwande, R. Ge, S. Ambrogio, J. B. Roldan, E. Miranda, J. Sũne, K. L. Pey, X. Wu, N. Raghavan, E. Wu, W. D. Lu, G. Navarro, W. Zhang, H. Wu, R. Li, A. Holleitner, U. Wurstbauer, M. C. Lemme, M. Liu, S. Long, Q. Liu, H. Lv, A. Padovani, P. Pavan, I. Valov, X. Jing, T. Han, K. Zhu, S. Chen, F. Hui, and Y. Shi. "Recommended Methods to Study Resistive Switching Devices". In: Advanced Electronic Materials 5 (1 2019), p.1800143. ISSN: 2199160X. DOI: 10.1002/aelm.201800143.
[21] J. L. Jones B. Johnson. "Structures, phase equilibria, and properties of $HfO_2$". In: Ferroelectricity in Doped Hafnium Oxide: Materials, Properties and Devices. 2019, pp.25-45. ISBN: 9780081024300. DOI: 10.1016/B978-0-08-102430-0.00002-4.
[22] S. Cho, C. Yun, S. Tappertzhofen, A. Kursumovic, S. Lee, P. Lu, Q. Jia, M. Fan, J. Jian, H. Wang, S. Hofmann, and J. L. MacManus-Driscoll. "Self-assembled oxide films with tailored nanoscale ionic and electronic channels for controlled resistive switching". In: Nature Communications 7 (2016). ISSN: 20411723. DOI: 10.1038/ncomms12373.
[23] X. Gu, D. Lubyshev, J. Batzel, J. M. Fastenau, W. K. Liu, R. Pelzel, J. F. Magana, Q. Ma, L. P. Wang, P. Zhang, and V. R. Rao. "Commercial molecular beam epitaxy production of high quality $SrTiO_3$ on large diameter Si substrates". In: Journal of Vacuum Science and Technology B 27 (3 2009), p.1195. ISSN: 10711023. DOI: 10.1116/1.3130165.
[24] E. Mikheev, B. D. Hoskins, D. B. Strukov, and S. Stemmer. "Resistive switching and its suppression in Pt/Nb: $SrTiO_3$ junctions". In: Nature Communications 5 (1 2014), pp.1-9. ISSN: 20411723. DOI: 10.1038/ncomms4990.
[25] S. Kunwar, C. B. Somodi, R. A. Lalk, B. X. Rutherford, Z. Corey, P. Roy, D. Zhang, M. Hellenbrand, M. Xiao, J. L. MacManus-Driscoll, Q. Jia, H. Wang, J. J. Yang, W. Nie, and A. Chen. "Protons: Critical Species for Resistive Switching in Interface-Type Memristors". In: Advanced Electronic Materials 9.1 (2023), p.2200816. ISSN: 2199-160X. DOI: https://doi.org/10.1002/aelm.202200816.
[26] E. R. Hsieh, K. T. Chen, P. Y.Chen, S. S. Wong, and S. S. Chung. "A FORMing-Free $HfO_2$-/HfON-Based Resistive-Gate Metal-Oxide-Semiconductor Field-Effect-Transistor (RG-MOSFET) Nonvolatile Memory with 3-Bit-Per-Cell Storage Capability". In: IEEE Transactions on Electron Devices 68 (6 2021), pp.2699-2704. ISSN: 15579646. DOI: 10.1109/TED.2021.3074354.
[27] H. Shin, J. Kim, S. Kang, and S. Kwak. "A 28 nm 10 Mb Embedded Flash Memory for IoT Product with Ultra-Low Power Near-1V Supply Voltage and High Temperature for Grade 1 Operation". In: IEEE Symposium on VLSI Circuits. 2020. DOI: 10. 1109/VLSI-Circuits18222.2020.9162813.
[28] S. Schlachter and B. Drake. Introducing Micron®DDR5 SDRAM: More Than a Generational Update. White Paper. Micron Technology, Inc., 2019. URL: https://www.micron.com/-/media/client/global/documents/products/whitepaper/ddr5%5C_more%5C_than%5C_a%5C_generational%5C_update%5C_wp.pdf?la=en.
[29] A. Wadsworth. "Time Dependent and High-Speed Measurements". In: The Parametric Measurement Handbook. Keysight Technologies, 2017. Chap. 5. ISBN: 5992-2508EN.
[30] S. Yu, Y. Wu, R. Jeyasingh, D. Kuzum, and H. S. P. Wong. "An electronic synapse device based on metal oxide resistive switching memory for neuromorphic computation". In: IEEE Transactions on Electron Devices 58 (8 2011), pp.2729-2737. ISSN: 00189383. DOI: 10.1109/TED.2011.2147791.
[31] V. Pandey. "Origin of the Curie-von Schweidler law and the fractional capacitor from time-varying capacitance". In: Journal of Power Sources 532 (2022), p.231309. ISSN: 03787753. DOI: 10.1016/j.jpowsour.2022.231309.
[32] Z. Wang, H. Wu, G. W. Burr, C. S. Hwang, K. L. Wang, Q. Xia, and J. J. Yang. "Resistive switching materials for information processing". In: Nature Review Materials 5 (3 2020), pp.173-195. ISSN: 2058-8437. DOI: https://doi.org/10.1038/s41578-019-0159-3.
[33] L. F. Abbott and S. B. Nelson. "Synaptic plasticity: Taming the beast". In: Nature Neuroscience 3 (11s 2000), pp.1178-1183. ISSN: 15461726. DOI: 10.1038/81453.
[34] M. Henning. "Theoretical models of synaptic short term plasticity". In: Frontiers in Computational Neuroscience 7 (April 2013 2013), p.45. ISSN: 16625188. DOI: 10.3389/fncom.2013.00045.
[35] Y. Munakata and J. Pfaffly. "Hebbian learning and development". In: Developmental Science 7 (2 2004), pp.141-148. ISSN: 1363755X. DOI: 10.1111/j.1467-7687.2004.00331.x.

[36] A. L. Hodgkin and A. F. Huxley. "A quantitative description of membrane current and its application to conduction and excitation in nerve". In: The Journal of Physiology 117 (4 1952), pp.500-544. ISSN: 14697793. DOI: 10.1113/jphysiol. 1952.sp004764.

[37] W. B. Levy and O. Steward. "Temporal contiguity requirements for long-term associative potentiation/depression in the hippocampus". In: Neuroscience 8 (4 1983), pp.791-797. ISSN: 03064522. DOI: 10.1016/0306-4522(83)90010-6.

[38] B. Max, M. Hoffmann, H. Mulaosmanovic, S. Slesazeck, and T. Mikolajick. "Hafnia-based double-layer ferroelectric tunnel junctions as artificial synapses for neuromorphic computing". In: ACS Applied Electronic Materials 2 (12 2020), pp. 4023-4033. ISSN: 26376113. DOI: 10.1021/acsaelm.0c00832.

[39] M. Koleva, P. Atanasov, R. Tomov, O. Vankov, C. Matin, C. Ristoscu, I. Mihailescu, D. lorgov, S. Angelova, Ch. Ghelev, and N. Mihailov. "Pulsed laser deposition of barium hexaferrite ($BaFe_{12}O_{19}$) thin films". In: Applied Surface Science 154 (2000), pp.485-491. ISSN: 01694332. DOI: 10.1016/S0169-4332(99)00404-3.

[40] H. Bae, Y. Lee, K. J. Kim, and G. M. Choi. "Effects of fabrication conditions on the crystallinity, barium deficiency, and conductivity of $BaZr_{0.8}Y_{0.2}O_{3-\delta}$ films grown by pulsed laser deposition". In: Fuel Cells 15 (2 2015), pp. 408-415. ISSN: 16156854. DOI: 10.1002/fuce.201400004.

[41] B. Bakhit, D. Primetzhofer, E. Pitthan, M. A. Sortica, E. Ntemou, J. Rosen, L. Hultman, I. Petrov, and G. Greczynski. "Systematic compositional analysis of sputter-deposited boron-containing thin films". In: Journal of Vacuum Science & Technology A 39 (6 2021), p.063408. ISSN: 0734-2101. DOI: 10.1116/6.0001234.

[42] R. C. Smith, T. Ma, N. Hoilien, L. Y. Tsung, M. J. Bevan, L. Colombo, J. Roberts, S. A. Campbell, and W. L. Gladfelter. "Chemical vapour deposition of the oxides of titanium, zirconium and hafnium for use as high-k materials in microelectronic devices. A carbon-free precursor for the synthesis of hafnium dioxide". In: Advanced Functional Materials 10 (3-5 2000), pp.105-114. ISSN: 1616301X. DOI: 10.1002/1099-0712 (200005/10)10:3/5<105::aid-amo402>3.0.co;2-j.

[43] A. S. Foster, F. Lopez Gejo, A. L. Shluger, and R. M. Nieminen. "Vacancy and interstitial defects in hafnia". In: Physical Review B-Condensed Matter and Materials Physics 65 (17 2002), pp.1741171-17411713. ISSN: 01631829. DOI: 10.1103/PhysRevB.65.174117.

[44] C. Tang and R. Ramprasad. "Point defect chemistry in amorphous $HfO_2$: Density functional theory calculations". In: Physical Review B—Condensed Matter and Materials Physics 81 (16 2010), p. 161201.ISSN: 10980121. DOI: 10.1103/PhysRevB.81.161201.

[45] M. G. Blamire, J. L. MacManus-Driscoll, N. D. Mathur, and Z. H. Barber. "The materials science of functional oxide thin films". In: Advanced Materials 21 (38-39 2009), pp.3827-3839. ISSN: 09359648. DOI: 10.1002/adma.200900947.

[46] S. M. Alay-E-Abbas and A. Shaukat. "First-principles study of thermodynamic stability and the electronic properties of intrinsic vacancy defects in barium hafnate". In: Journal of Physics Condensed Matter 26 (43 2014), p. 435501. ISSN: 1361648X. DOI: 10.1088/0953-8984/26/43/435501.

[47] T. V. Perevalov, V. A. Gritsenko, S. B. Erenburg, A. M. Badalyan, H. Wong, and C. W. Kim. "Atomic and electronic structure of amorphous and crystalline hafnium oxide: Xray photoelectron spectroscopy and density functional calculations". In: Journal of Applied Physics 101 (5 2007), p.53704. ISSN: 00218979. DOI: 10.1063/1.2464184.

[48] G. Greczynski and L. Hultman. "Towards reliable X-ray photoelectron spectroscopy: Sputter-damage effects in transition metal borides, carbides, nitrides, and oxides". In: Applied Surface Science 542 (2021), p.148599. ISSN: 01694332. DOI: 10.1016/j.apsusc.2020.148599.

[48] K. Xiong and J. Robertson. "Point defects in HfO2 high K gate oxide". In: Microelectronic Engineering 80 (SUPPL. 2005), pp. 408-411. ISSN: 01679317. DOI: 10.1016/j.mee.2005.04.098.

[50] E. Hildebrandt, J. Kurian, M. M. Müller, T. Schroeder, H. J. Kleebe, and L. Alff. "Controlled oxygen vacancy induced p-type conductivity in HfO2−x thin films". In: Applied Physics Letters 99 (11 2011), p. 112902. ISSN: 00036951. DOI: 10.1063/1.3637603.

[51] G. D. Derry, M. E. Kern, and E. H. Worth. "Recommended values of clean metal surface work functions". In: Journal of Vacuum Science & Technology A: Vacuum, Surfaces, and Films 33 (6 2015), p. 060801. ISSN: 0734-2101. DOI: 10.1116/1.4934685.

[52] J. Strand, P. La Torraca, A. Padovani, L. Larcher, and A. L. Shluger. "Dielectric breakdown in $HfO_2$ dielectrics: Using multiscale modeling to identify the critical physical processes involved in oxide degradation". In: Journal of Applied Physics 131 (23 2022), p.234501. ISSN: 0021-8979. DOI: 10.1063/5.0083189.

[53] T. Grasser. "Stochastic charge trapping in oxides: From random telegraph noise to bias temperature instabilities". In: Microelectronics Reliability 52 (1 2012), pp.39-70. ISSN: 00262714. DOI: 10.1016/j.microrel.2011.09.002.

[54] C. Baeumer, C. Schmitz, A. Marchewka, D. N. Mueller, R. Valenta, J. Hackl, N. Raab, S. P. Rogers, M. I. Khan, S. Nemsak, M. Shim, S. Menzel, C. M. Schneider, R. Waser, and R. Dittmann. "Quantifying redox-induced Schottky barrier variations in memristive devices via in operando spectromicroscopy with graphene electrodes". In: Nature Communications 7 (1 2016), pp.1-7. ISSN: 20411723. DOI: 10.1038/ncomms12398.

[55] A. Sawa. "Resistive switching in transition metal oxides". In: Materials Today 11 (6 2008), pp.28-36. ISSN: 13697021. DOI: 10.1016/S1369-7021(08) 70119-6.

[56] B. Kaczer, T. Grasser, Ph. J. Roussel, J. Martin-Martinez, R. O'Connor, B. J. O'Sullivan, and G. Groeseneken. "Ubiquitous relaxation in BTI stressing-new evaluation and insights". In: IEEE International Reliability Physics Symposium Proceedings. 2008, pp.20-27. DOI: 10.1109/RELPHY.2008.4558858.

[57] M. Schie, M. P. Müller, M. Salinga, R. Waser, and R. A. De Souza. "Ion migration in crystalline and amorphous $HfO_x$". In: Journal of Chemical Physics 146 (9 2017), p.094508. ISSN: 00219606. DOI: 10.1063/1.4977453.

[58] R. Waser, R. Dittmann, C. Staikov, and K. Szot. "Redox-based resistive switching memories nanoionic mechanisms, prospects, and challenges". In: Advanced Materials 21 (25-26 2009), pp. 2632-2663. ISSN: 09359648. DOI: 10.1002/adma.200900375.

[59] S. Stille, Ch. Lenser, R. Dittmann, A. Koehl, I. Krug, R. Muenstermann, J. Perlich, C. M. Schneider, U. Klemradt, and R. Waser. "Detection of filament formation in forming-free resistive switching $SrTiO_3$ devices with Ti top electrodes". In: Applied Physics Letters 100 (22 2012), p.223503. ISSN: 00036951. DOI: 10.1063/1.4724108.

[60] D. Cooper, C. Baeumer, N. Bernier, A. Marchewka, C. La Torre, R. E. Dunin-Borkowski, S. Menzel, R. Waser, and R. Dittmann. "Anomalous Resistance Hysteresis in Oxide ReRAM: Oxygen Evolution and Reincorporation Revealed by In Situ TEM". In: Advanced Materials 29 (23 2017), p.1700212. ISSN: 15214095. DOI: 10.1002/adma.201700212.

[61] R. Muenstermann, T. Menke, R. Dittmann, M. Shaobo, C. L. Jia, D. Park, and J. Mayer. "Correlation between growth kinetics and nanoscale resistive switching properties of SrTiO3 thin films". In: Journal of Applied Physics 108 (12 2010), p.124504. ISSN: 00218979. DOI: 10.1063/1.3520674.

[62] T. V. Perevalov, V. Sh. Aliev, V. A. Gritsenko, A. A. Saraev, and V. V. Kaichev. "Electronic structure of oxygen vacancies in hafnium oxide". In: Microelectronic Engineering 109 (2013), pp.21-23. ISSN: 01679317. DOI: 10.1016/j.mee.2013.03.005.

[63] S. M. Sze and Kwok K. Ng. "Metal-Insulator-Semiconductor Capacitors". In: Physics of Semiconductor Devices. Hoboken, NJ, USA: John Wiley & Sons, JNC., 2007. Chap. 4. ISBN: 978-0-47 1-1 4323-9.

[64] M. A. Lampert. "Simplified theory of space-charge-limited currents in an insulator with traps". In: Physical Review 103 (6 1956), pp.1648-1656. ISSN: 0031899X. DOI: 10.1103/PhysRev.103.1648.

[65] M. P. Houng, Y. H. Wang, and W. J. Chang. "Current transport mechanism in trapped oxides: A generalized trap-assisted tunneling model". In: Journal of Applied Physics 86 (3 1999), pp.1488-1491. ISSN: 00218979. DOI: 10.1063/1.370918.

[66] L. Pintilie and M. Alexe. "Metal-ferroelectric-metal heterostructures with Schottky contacts. I. Influence of the ferroelectric properties". In: Journal of Applied Physics 98 (12 2005), p.124103. ISSN: 00218979. DOI: 10.1063/1.2148622.

[67] A. Toriumi, K. Kita, K. Tomida, and Y. Yamamoto. "Doped HfO2 for Higher-k Dielectrics". In: ECS Transactions 1 (5 2006), pp.185-197. ISSN: 1938-5862. DOI: 10.1149/1.2209268.

[68] P. K. Hurley, K. Cherkaoui, E. O'Connor, M. C. Lemme, H. D. B. Gottlob, M. Schmidt, S. Hall, Y. Lu, O. Buiu, B. Raeissi, J. Piscator, O. Engstrom, and S. B. Newcomb. "Interface Defects in $HfO_2$, $LaSiO_x$, and $Gd_2O_3$ High-k/Metal-Gate Structures on Silicon". In: Journal of The Electrochemical Society 155 (2 2008), G13. ISSN: 00134651. DOI: 10.1149/1.2806172.

[69] M. Mayer, W. Eckstein, H. Langhuth, F. Schiettekatte, and U. Von Toussaint. "Computer simulation of ion beam analysis: Possibilities and limitations". In: Nuclear Instruments and Methods in Physics Research, Section B: Beam Interactions with Materials and Atoms. 2011, pp.3006-3013. DOI: 10.1016/j.nimb.2011.04.066.

[70] G. Greczynski and L. Hultman. "X-ray photoelectron spectroscopy: Towards reliable binding energy referencing". In: Progress in Materials Science 107 (2020), p.100591. ISSN: 00796425. DOI: 10.1016/j.pmatsci.2019.100591.

[71] D. A. Shirley. "High-resolution x-ray photoemission spectrum of the valence bands of gold". In: Physical Review B 5 (12 1972), pp.4709-4714. ISSN: 01631829. DOI: 10.1103/PhysRevB.5.4709.

[72] M. Minohara, I. Ohkubo, H. Kumigashira, and M. Oshima. "Band diagrams of spin tunnelling junctions $La_{0.6}Sr_{0.4}MnO_3$/Nb:$SrTiO_3$ and $SrRuO_3$/Nb:$SrTiO_3$ determined by in situ photoemission spectroscopy". In: Applied Physics Letters 90 (13 2007), p. 132123. ISSN: 00036951. DOI: 10.1063/1.2717517.

[S1] E. Mikheev, B. D. Hoskins, D. B. Strukov, and S. Stemmer. "Resistive switching and its suppression in Pt/Nb:$SrTiO_3$ junctions". In: Nature Communications 5 (1 2014), pp.1-9. ISSN: 20411723. DOI: 10.1038/ncomms4990.

[S2] V. Pandey. "Origin of the Curie-von Schweidler law and the fractional capacitor from time-varying capacitance". In: Journal of Power Sources 532 (2022), p.231309. ISSN: 03787753. DOI: 10.1016/j.jpowsour.2022.231309.

[S3] B. J. Choi, A. C. Torrezan, K. J. Norris, F. Miao, J. P. Strachan, M.-X. Zhang, D. A. A. Ohlberg, N. P. Kobayashi, J. J. Yang, and R. S. Williams. "Electrical Performance and Scalability of Pt Dispersed $SiO_2$ Nanometallic Resistance Switch". In: Nano Letters 13 (7 2013), pp.3213-3217. ISSN: 1530-6984. DOI: 10.1021/nl401283q.

[S4] M. Mayer, W. Eckstein, H. Langhuth, F. Schiettekatte, and U. Von Toussaint. "Computer simulation of ion beam analysis: Possibilities and limitations". In: Nuclear Instruments and Methods in Physics Research, Section B: Beam Interactions with Materials and Atoms. 2011, pp.3006-3013. DOI: 10.1016/j.nimb.2011.04.066.

[S5] S. M. Sze and Kwok K. Ng. "Metal-Insulator-Semiconductor Capacitors". In: Physics of Semiconductor Devices. Hoboken, NJ, USA: John Wiley & Sons, JNC., 2007. Chap. 4. ISBN: 978-0-47 1-1 4323-9.

[S6] C. R. Crowell. "The Richardson constant for thermionic emission in Schottky barrier diodes". In: Solid State Electronics 8 (4 1965), pp.395-399. ISSN: 00381101. DOI: 10.1063/1.2717517.

[S7] H. Dou, N. Strkalj, Y. Zhang, J. L. MacManus-Driscoll, Q. Jia, and H. Wang. "Optical dielectric properties of $HfO_2$-based films". In: Journal of Vacuum Science & Technology A 40 (3 2022), p.033412. ISSN: 0734-2101. DOI: 10.1116/6.0001651.

[S8] S. Monaghan, P. K. Hurley, K. Cherkaoui, M. A. Negara, and A. Schenk. "Determination of electron effective mass and electron affinity in $HfO_2$ using MOS and MOSFET structures". In: Solid-State Electronics 53 (4 2009), pp.438-444. ISSN: 00381101. DOI: 10.1016/j.sse.2008.09.018.

[S9] M. A. Lampert. "Simplified theory of space-charge-limited currents in an insulator with traps". In: Physical Review 103 (6 1956), pp.1648-1656. ISSN: 0031899X. DOI: 10.1103/PhysRev.103.1648.

[S10] C. Funck, A. Marchewka, C. Bäumer, P. C. Schmidt, P. Müller, R. Dittmann, M. Martin, R. Waser, and S. Menzel. "A Theoretical and Experimental View on the Temperature Dependence of the Electronic Conduction through a Schottky Barrier in a Resistively Switching $SrTiO_3$-Based Memory Cell". In: Advanced Electronic Materials 4 (7 2018), p.1800062. ISSN: 2199160X. DOI: 10.1002/aelm.201800062.

[S11] M. P. Houng, Y. H. Wang, and W. J. Chang. "Current transport mechanism in trapped oxides: A generalized trap-assisted tunneling model". In: Journal of Applied Physics 86 (3 1999), pp.1488-1491. ISSN: 00218979. DOI: 10.1063/1.370918.

The invention claimed is:

1. A resistive switching memory device comprising an active layer comprising an ionic conducting material, the active layer being disposed on a substrate, the device further comprising:

a first electrode, a second electrode, and a first semiconductor layer, wherein one of the first electrode, second electrode and first semiconductor layer is the substrate for the active layer and wherein the active layer and the first semiconductor layer contact each other at an interface, wherein the device exhibits hysteretic I-V behaviour to permit switching of the electrical resistance of the device between different resistance states, and wherein the active layer is non-epitaxial with respect to the substrate.

2. The resistive switching memory device according to claim 1 wherein the substrate is a single crystal substrate.

3. The resistive switching memory device according to claim 1 wherein the first semiconductor layer is interposed between the first electrode and the active layer.

4. The resistive switching memory device according to claim 1 wherein the active layer is itself not single crystalline.

5. The resistive switching memory device according to claim 1 wherein the active layer is nanocrystalline.

6. The resistive switching memory device according to claim 1 wherein the active layer is amorphous.

7. The resistive switching memory device according to claim 1 wherein there is additionally provided an epitaxial layer of said ionic conducting material between the substrate and the non-epitaxial active layer.

8. The resistive switching memory device according to claim 1 wherein the active layer, in its pristine state, has an electronic conductivity of not higher than 2.86 S/m, measured at room temperature.

9. The resistive switching memory device according to claim 1 wherein the active layer, in its pristine state, has an ionic conductivity of at least $10^{-10}$ S/cm, measured at 500° C.

10. The resistive switching memory device according to claim 1 wherein the device, with the active layer in its pristine state, has an electrical resistivity at room temperature of at least $10^6$ Ω·m.

11. The resistive switching memory device according to claim 1 wherein the thickness of the active layer is not more than 100 nm.

12. The resistive switching memory device according to claim 1 wherein the ionic conducting material has oxygen ion conductivity.

13. The resistive switching memory device according to claim 1 wherein the first semiconductor layer is an oxide semiconductor layer.

14. The resistive switching memory device according to claim 1 wherein the first semiconductor layer has a lower electrical resistivity than the active layer.

15. The resistive switching memory device according to claim 1 wherein the active layer comprises a nanocomposite structure with an arrangement of columns of a second phase extending in a thickness direction of the active layer within a matrix of a first phase, and wherein, in use of the device, the columns guide the formation of conductive filaments in the active layer.

16. The resistive switching memory device according to claim 1 wherein the material of the active layer is selected from:

aliovalent-ion-doped $HfO_x$, aliovalent ion doped $ZrO_x$, indium gallium zinc oxide (IGZO), sodium bismuth titanate (NBT), and aliovalent-ion-doped $SiO_x$.

17. A method of operating a resistive switching memory device, the resistive switching memory device comprising an active layer comprising an ionic conducting material, the active layer being disposed on a substrate, the device further comprising:

a first electrode, a second electrode, and a first semiconductor layer wherein one of the first electrode, second electrode and first semiconductor layer is the substrate for the active layer and wherein the active layer and the first semiconductor layer contact each other at an interface, wherein the device exhibits hysteretic I-V behaviour to permit switching of the electrical resistance of the device between different resistance states, and wherein the active layer is non-epitaxial with respect to the substrate, the method including one of (i) and (ii):

(i) carrying out a set and read operation by, with the device in a first, high resistance state, setting the resistance to a second, lower resistance state, and subsequently reading the second, lower resistance state;

carrying out a set and read operation by, with the device in a first, low resistance state, setting the resistance to a second, higher resistance state, and subsequently reading the second, higher resistance state.

18. The method according to claim 17 in which the device is set to one of at least 4 different available non-volatile resistance states by suitable selection of resistance state set conditions.

19. A method of manufacturing a resistive switching memory device comprising an ionic conducting material, the active layer being disposed on a substrate, the device further comprising:

a first electrode, a second electrode, and a first semiconductor layer wherein one of the first electrode, second electrode and first semiconductor layer is the substrate for the active layer and wherein the active layer and the first semiconductor layer contact each other at an interface, wherein the device exhibits hysteretic I-V behaviour to permit switching of the electrical resistance of the device between different resistance states, and wherein the active layer is deposited at a temperature of not more than 400° C.

20. A resistive switching memory device comprising an active layer comprising an ionic conducting material, the active layer being disposed on a substrate, the device further comprising:

a first electrode, and a second electrode, wherein one of the first electrode and the second electrode is the substrate for the active layer, wherein the device exhibits hysteretic I-V behaviour to permit switching of the electrical resistance of the device between different resistance states, and wherein the active layer is non-epitaxial with respect to the substrate.

21. A method of operating a resistive switching memory device, the resistive switching memory device comprising an active layer comprising an ionic conducting material, the active layer being disposed on a substrate, the device further comprising:

a first electrode, and a second electrode, wherein one of the first electrode and the second electrode is the substrate for the active layer, wherein the device exhibits hysteretic I-V behaviour to permit switching of the electrical resistance of the device between different resistance states, and wherein the active layer is non-epitaxial with respect to the substrate, the method including one of (i) and (ii):

(i) carrying out a set and read operation by, with the device in a first, high resistance state, setting the resistance to a second, lower resistance state, and subsequently reading the second, lower resistance state;

(ii) carrying out a set and read operation by, with the device in a first, low resistance state, setting the resistance to a second, higher resistance state, and subsequently reading the second, higher resistance state.

22. A method of manufacturing a resistive switching memory device comprising an ionic conducting material, the active layer being disposed on a substrate, the device further comprising:

a first electrode, and a second electrode, wherein one of the first electrode and the second electrode is the substrate for the active layer, wherein the device exhibits hysteretic I-V behaviour to permit switching of the electrical resistance of the device between different resistance states, and wherein the active layer is deposited at a temperature of not more than 400° C.

* * * * *